US012256588B2

(12) United States Patent
Huang et al.

(10) Patent No.: US 12,256,588 B2
(45) Date of Patent: Mar. 18, 2025

(54) PEROVSKITE SOLAR CELLS WITH NEAR-INFRARED SENSITIVE LAYERS

(71) Applicant: The University of North Carolina at Chapel Hill, Chapel Hill, NC (US)

(72) Inventors: Jinsong Huang, Chapel Hill, NC (US); Yuze Lin, Chapel Hill, NC (US); Shangshang Chen, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 300 days.

(21) Appl. No.: 17/604,015

(22) PCT Filed: Apr. 17, 2020

(86) PCT No.: PCT/US2020/028853
§ 371 (c)(1),
(2) Date: Oct. 15, 2021

(87) PCT Pub. No.: WO2020/215014
PCT Pub. Date: Oct. 22, 2020

(65) Prior Publication Data
US 2022/0231233 A1 Jul. 21, 2022

Related U.S. Application Data

(60) Provisional application No. 62/835,981, filed on Apr. 18, 2019.

(51) Int. Cl.
*H10K 30/50* (2023.01)
*H10K 30/10* (2023.01)
(Continued)

(52) U.S. Cl.
CPC ............ *H10K 30/50* (2023.02); *H10K 30/10* (2023.02); *H10K 30/57* (2023.02); *H10K 30/81* (2023.02);
(Continued)

(58) Field of Classification Search
CPC ........ H10K 85/50; H10K 30/10; H10K 30/50; H10K 30/57
See application file for complete search history.

(56) References Cited

U.S. PATENT DOCUMENTS

| | | | |
|---|---|---|---|
| 8,598,448 B2 | 12/2013 | Lu et al. | |
| 2016/0111224 A1 | 4/2016 | Charbonneau et al. | |

(Continued)

FOREIGN PATENT DOCUMENTS

| | | | |
|---|---|---|---|
| CN | 107170891 A * | 9/2017 | ............ B82Y 20/00 |
| WO | WO 2018-065350 A1 | 4/2018 | |

OTHER PUBLICATIONS

English machine translation of CN 107170891A. (Year: 2017).*
Dong et al., "Unraveling the High Open Circuit Voltage and High Performance of Integrated Perovskite/Organic Bulk-Heterojunction Solar Cells," Nano Lett., 17:5140-5147, (2017).

(Continued)

*Primary Examiner* — Lindsey A Buck
(74) *Attorney, Agent, or Firm* — Alston & Bird LLP

(57) ABSTRACT

The present disclosure is directed to perovskite-based solar cell device structures and compositions comprising one or more near infrared sensitive semiconducting materials. The near infrared sensitive semiconducting materials can extend the photoresponse spectra of the devices to the near infrared region, thereby improving the power conversion efficiency of the solar cell.

9 Claims, 8 Drawing Sheets

(51) Int. Cl.

| | |
|---|---|
| ***H10K 30/57*** | (2023.01) |
| ***H10K 30/81*** | (2023.01) |
| ***H10K 85/10*** | (2023.01) |
| ***H10K 85/30*** | (2023.01) |
| ***H10K 85/50*** | (2023.01) |
| ***H10K 85/60*** | (2023.01) |

(52) U.S. Cl.

CPC ......... *H10K 85/113* (2023.02); *H10K 85/322* (2023.02); *H10K 85/371* (2023.02); *H10K 85/381* (2023.02); *H10K 85/50* (2023.02); *H10K 85/654* (2023.02); *H10K 85/655* (2023.02); *H10K 85/6572* (2023.02); *H10K 85/6576* (2023.02)

(56) References Cited

U.S. PATENT DOCUMENTS

| | | | | |
|---|---|---|---|---|
| 2016/0218308 | A1* | 7/2016 | Desilvestro | H10K 85/00 |
| 2016/0351342 | A1* | 12/2016 | Zakeeruddin | H01G 9/2018 |
| 2018/0175112 | A1* | 6/2018 | Robinson | H10K 30/20 |
| 2018/0219166 | A1 | 8/2018 | Ellingson et al. | |

OTHER PUBLICATIONS

Hao et al., "Lead-free solid-state organic-inorganic halide perovskite solar cells," Nature Photonics, 8:489-494, (2014).

Jeon et al., "A fluorene-terminated hole-transporting material for highly efficient and stable perovskite solar cells," Nature Energy 3:682-689, (2018).

Li et al., "Broadening the photoresponse to near-infrared region by cooperating fullerene and nonfullerene acceptors for high performance ternary polymer solar cells," Macromolecular Rapid Communications, 39(1700492):1-8, (2018).

Liu et al., "Integrated Perovskite/Bulk-Heterojunction toward Efficient Solar Cells," Nano Lett., 15:662-668, (2015).

Noel et al., "Lead-free organic-inorganic tin halide perovskites for photovoltaic applications," Energy Environ. Sci., 7:3061-3068, (2014).

Wu et al., "Perovskite/Organic Bulk-Heterojunction Integrated Ultrasensitive Broadband Photodetectors with High Near-Infrared External Quantum Efficiency over 70%," Small, 14:1802349, (2018).

Xu et al., "Integrating Ultrathin Bulk-Heterojunction Organic Semiconductor Intermediary for High-Performance Low-Bandgap Perovskite Solar Cells with Low Energy Loss," Advanced Functional Materials, 28:1804427, (2018).

WIPO Application No. PCT/US2020/028853, PCT International Preliminary Report on Patentability mailed Oct. 28, 2021.

* cited by examiner

FIG. 2A
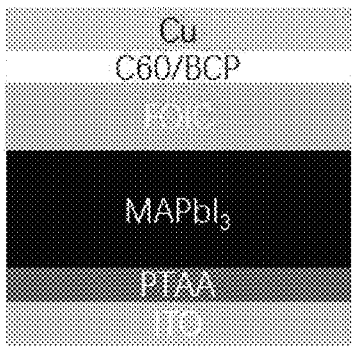
FIG. 2B
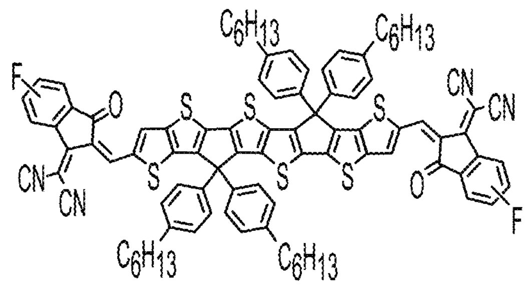
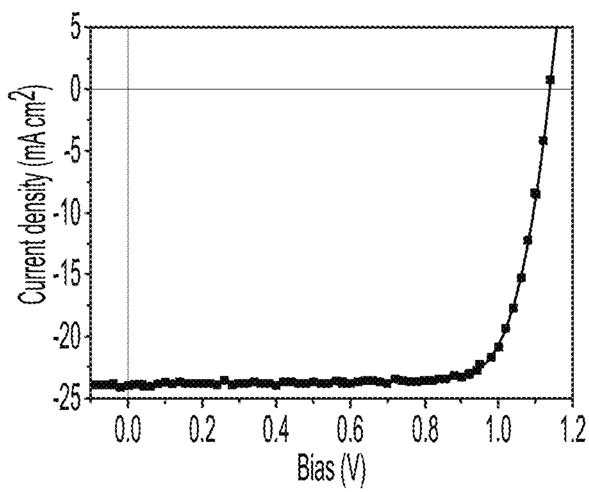
FIG. 2C
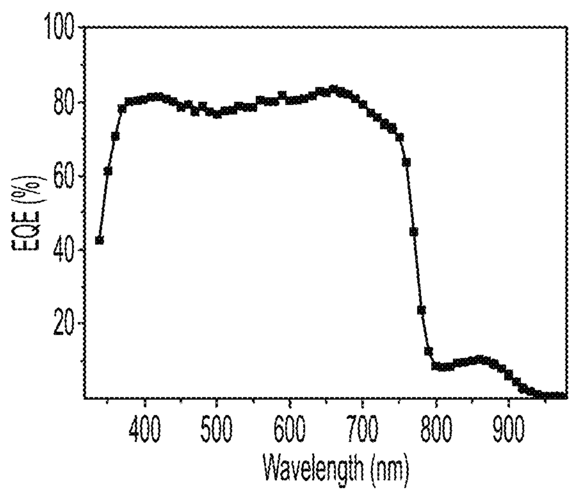
FIG. 2D

FIG. 3A
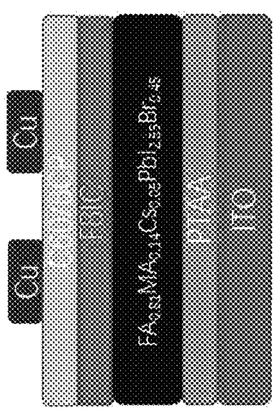
FIG. 3B
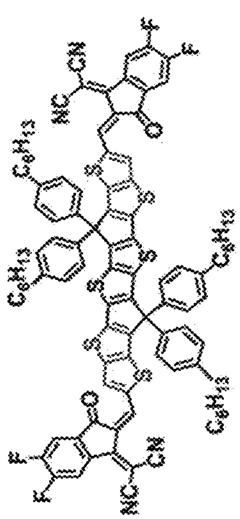
F8IC
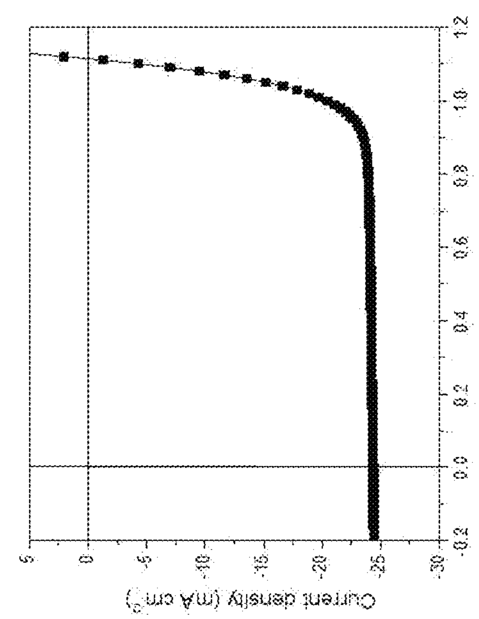
FIG. 3C
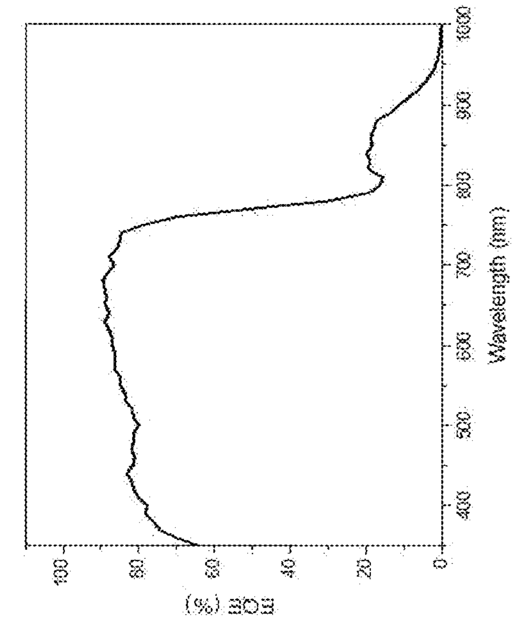
FIG. 3D

FIG. 5A
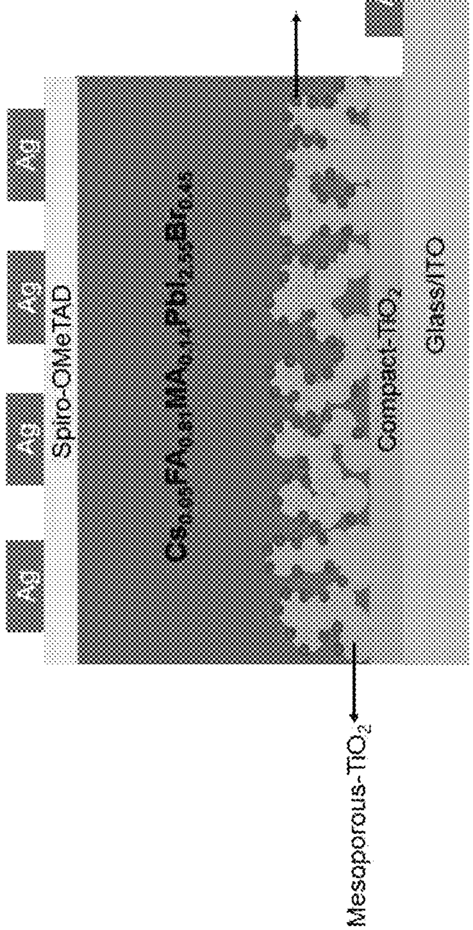
FIG. 5B
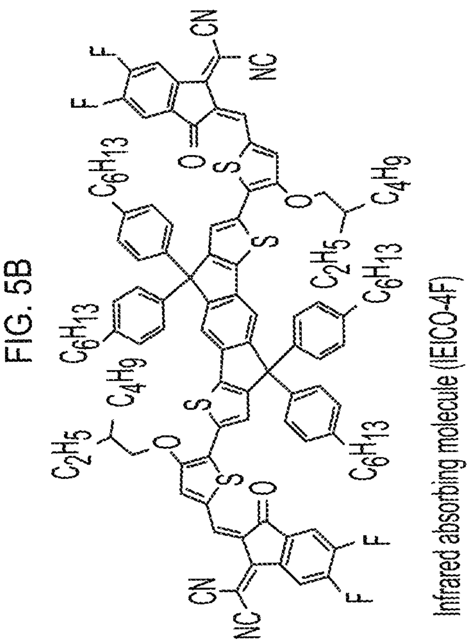
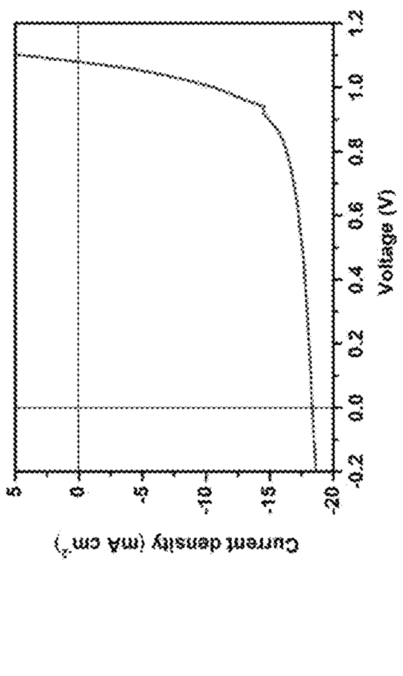
FIG. 5C
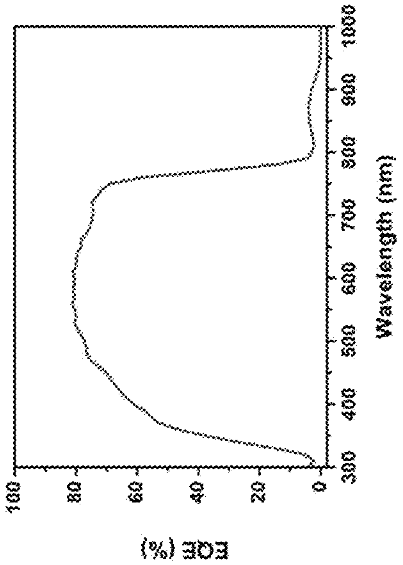
FIG. 5D $PC_{71}BM$

PEROVSKITE SOLAR CELLS WITH NEAR-INFRARED SENSITIVE LAYERS

CROSS-REFERENCE TO RELATED APPLICATIONS

This application is a 35 U.S.C. § 371 national stage of International Application No. PCT/US2020/028853, filed Apr. 17, 2020, which claims priority to and the benefit of U.S. Provisional Application No. 62/835,981 filed Apr. 18, 2019, which are herein incorporated by reference in their entirety for all purposes.

GOVERNMENT INTEREST

This invention was made with government support under Grant No. FA9550-16-1-0299 awarded by The Air Force Office of Scientific Research. The Government has certain rights in the invention.

FIELD OF THE INVENTION

The presently disclosed subject matter relates generally to novel perovskite solar cell device structures comprising at least one near-infrared sensitive semiconductor material that can extend the photoresponse spectra of the device to the near infrared region.

BACKGROUND

Solution processed organic-inorganic halide perovskite (OIHP) solar cells have demonstrated a rapid rise in power conversion efficiencies (PCEs) due to their unique physical properties, such as strong light absorption, long exciton diffusion lengths, and ambipolar transport characteristics. While OIHPs have been shown to exhibit high PCEs in single junction perovskite solar cells, the bandgap associated with these materials is still too large compared to the optimized bandgap to reach the highest efficiency of single junction solar cells. What is needed is a low bandgap perovskite material that can extend its absorption to the near-infrared region, enabling the absorption of more solar photons for enhanced efficiency. The subject matter described herein addresses this problem.

BRIEF SUMMARY

In one aspect, the presently disclosed subject matter is directed to a planar heterojunction perovskite solar cell, comprising:

- a first electrode;
- a first transport layer disposed on the first electrode;
- a perovskite material layer disposed on the first transport layer;
- a second transport layer disposed on the perovskite material layer;
- and a second electrode disposed on the second transport layer,
- wherein one of said first or second transport layers is a hole transport layer and the other one of said first or second transport layers is an electron transport layer, and
- wherein at least one of said hole transport layer or said electron transport layer comprises a single near infrared sensitive semiconductor material.

In another aspect, the presently disclosed subject matter is directed to a single heterojunction perovskite solar cell, comprising:

- a first electrode;
- a first transport layer disposed on the first electrode;
- a perovskite material layer disposed on the first transport layer;
- a second transport layer disposed on the perovskite material layer;
- and a second electrode disposed on the second transport layer,
- wherein one of said first or second transport layers is a hole transport layer and the other one of said first or second transport layers is an electron transport layer;
- wherein at least one of said hole transport layer or said electron transport layer comprises a single near infrared sensitive semiconductor material; and
- wherein at least one of said hole transport layer or said electron transport layer further comprises a mesoporous material.

In another aspect, the presently disclosed subject matter is directed to a stacked bulk heterojunction perovskite solar cell, comprising:

- a first electrode;
- a first bulk heterojunction layer provided on the first electrode;
- a perovskite material layer provided on the first bulk heterojunction layer;
- a second bulk heterojunction layer provided on the perovskite material layer;
- and a second electrode provided on the second bulk heterojunction layer,
- wherein said first bulk heterojunction layer and said second bulk heterojunction layer comprise one of more electron donors and one or more electron acceptors, and
- wherein said one or more electron donors and said one or more electron acceptors is a near infrared sensitive semiconductor material.

These and other aspects are described fully herein.

BRIEF DESCRIPTION OF THE DRAWINGS

FIG. 2A shows a planar heterojunction perovskite solar cell with the device structure, ITO/PTAA/$MAPbI_3$/FOIC/C60/BCP/Cu.

FIG. 2B shows the chemical structure of FOIC.

FIG. 2C shows a typical J-V curve of the solar cell with the ITO/PTAA/$MAPbI_3$/FOIC/C60/BCP/Cu device structure as depicted in FIG. 2A.

FIG. 2D shows the EQE of the solar cell with the ITO/PTAA/$MAPbI_3$/FOIC/C60/BCP/Cu device structure as depicted in FIG. 2A.

FIG. 3A shows a planar heterojunction perovskite solar cell with the device structure, ITO/PTAA/$FA_{0.81}MA_{0.14}Cs_{0.05}PbI_{2.55}Br_{0.45}$/F8IC/C60/BCP/Cu.

FIG. 3B shows the chemical structure of F8IC.

FIG. 3C shows a typical J-V curve of the solar cell with the ITO/PTAA/$FA_{0.81}MA_{0.14}Cs_{0.05}PbI_{2.55}Br_{0.45}$/F8IC/C60/BCP/Cu device structure as depicted in FIG. 3A.

FIG. 3D shows the EQE of the solar cell with the ITO/PTAA/$FA_{0.81}MA_{0.14}Cs_{0.05}PbI_{2.55}Br_{0.45}$/F8IC/C60/BCP/Cu device structure as depicted in FIG. 3A.

FIG. 5A shows a perovskite solar cell having the device structure FTO/c-$TiO_2$/m-$TiO_2$/IEICO-4F/OIHP/Spiro-OMeTAD/Ag.

FIG. 5B shows the chemical structure of IEICO-4F.

FIG. 5C shows a typical J-V curve of the solar cell with the FTO/c-$TiO_2$/m-$TiO_2$/IEICO-4F/$Cs_{0.05}FA_{0.81}MA_{0.14}PbI_{2.55}Br_{0.45}$/Spiro-OMeTAD/Ag device structure as depicted in FIG. 5A.

FIG. 5D shows the EQE of the solar cell with the FTO/c-$TiO_2$/m-$TiO_2$/IEICO-4F/$Cs_{0.05}FA_{0.81}MA_{0.14}PbI_{2.55}Br_{0.45}$/Spiro-OMeTAD/Ag device structure as depicted in FIG. 5A.

DETAILED DESCRIPTION

Figure 1A:
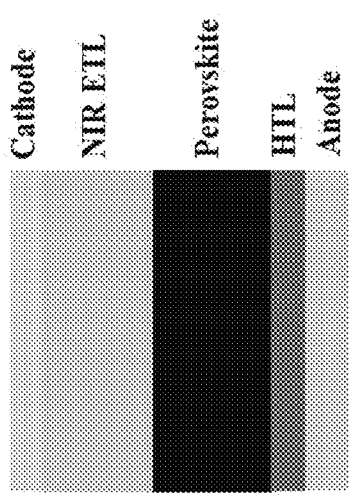
FIG. 1A shows a planar heterojunction perovskite solar cell having the following device structure (from bottom to top): Anode/HTL/Perovskite/NIR ETL/Cathode.

The subject matter described herein relates to novel device structures and compositions comprising at least one near-infrared sensitive semiconductor to extend the photoresponse spectra of perovskite solar cells to the near infrared region.

Organic-inorganic halide perovskite materials with the crystal structure $ABX_3$ (where A is a monovalent cation, B is a divalent metal cation, and X is a halide or mixture of halides) have demonstrated promising results in applications involving solar cell devices.[1] Lead (Pb)-based perovskite solar cells with a band gap of about 1.55 eV have shown the highest power conversion efficiencies of at least 22%. However, the heavy metal Pb is not environmentally friendly and a power conversion efficiency exceeding 22% nears the single-junction Shockley-Queisser (S-Q) limit for medium-bandgap perovskite devices. It is estimated that the maximum theoretical efficiency of a single-junction device could exceed 30% by reducing the perovskite bandgap to roughly 1.2 eV. Therefore, it is highly desirable to develop high performance perovskite materials with low bandgaps and low toxicity.

Significant efforts have been devoted to reduce the bandgap and the toxicity of lead-based OIHP materials by incorporating tin (Sn) to partially replace Pb in the perovskite crystal structure.[2,3] However, these materials suffer from other issues, such as poor material stability in addition to the loss of photocurrent and/or photovoltage.[2,3]

It was discovered that stacking an organic bulk heterojunction (BHJ) layer with near infrared (NIR) light absorption onto an OIHP layer in solar cells can extend the light response spectra of solar cells to the NIR range, while the solar cells still have a similar open circuit voltage ($V_{OC}$) compared to that of perovskite solar cells, regardless of the $V_{OC}$ of the BHJ single junction solar cells.[4,5] In these stacked solar cells, OIHP and BHJ layers are in direct contact with each other. This arrangement is similar to that in a tandem device, but lacks a recombination layer or a tunnel junction in-between. The OIHP/NIR BHJ stacked device is one promising strategy to further enhance the photovoltaic performance of OIHP photovoltaic devices which may break the Shockley-Queisser limit, because it works in a similar way with intermediate band solar cells. The OIHP/NIR BHJ stacked device broadens the light absorption spectrum of a wide bandgap solar cell, but also retains the high $V_{OC}$ of wide bandgap solar cells. Compared to counterpart-tandem solar cells, the OIHP/BHJ stacked solar cell is more economical because it does not contain a charge recombination layer and also avoids current matching. Additionally, simple solution preparation processes minimize the production cost and increase the device yield.

The subject matter disclosed herein is directed to three new perovskite-based solar cell device structures and compositions comprising one or more near infrared sensitive semiconductors. The application of the near infrared sensitive semiconductors (i.e. bandgap≤1.58 eV) can extend the photoresponse spectra of the devices to the near infrared region. The near infrared semiconductor acts as a contact layer that can absorb NIR light and contribute photocurrent, thereby improving the total current and PCE of the perovskite solar cells. This objective can be applied to all perovskite solar cells with a p-i-n or n-i-p structure, planar junction structure, or mesoporous structure. The first device is based on a planar heterojunction structure, comprising one or more NIR-sensitive transport layers (ETL and/or HTL). The second device features NIR-sensitive ETL or HTLs comprising a mesoporous semiconducting material. The third device type is derived from an integrated perovskite/bulk heterojunction structure, which features a blend of NIR sensitive compositions to extend the device's photoresponse spectrum to the NIR range.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, ±5%, ±1%, ±0.5%, or even ±0.1% of the specified amount.

The terms "approximately," "about," "essentially," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic.

As used herein, conditional language used herein, such as, among others, "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

As used herein, "Ar" refers to aryl.

As used herein, "ETL" refers to Electron Transport Layer.

As used herein, "HTL" refers to Hole Transport Layer.

As used herein, "NIR" refers to the "near-infrared region" of the electromagnetic spectrum. This region corresponds with a wavelength of about 780 nm to about 2,500 nm. A near-infrared sensitive semiconductor is a material that can absorb light with a wavelength in the near infrared range. A near-infrared sensitive semiconductor has a bandgap of less than, about, or equal to 1.58 eV. In certain embodiments, the bandgap is less than, about, or equal to 1.50 eV, 1.40 eV, 1.30 eV, or 1.20 eV.

As used herein, "$V_{oc}$" refers to open circuit voltage.

As used herein, "$J_{SC}$" refers to short-circuit current density.

As used herein, "FF" refers to fill factor.

As used herein, "PCE" refers to Power Conversion Efficiency.

As used herein, "EQE" refers to External Quantum Efficiency. EQE is the ratio of the number of charge carriers collected by the solar cell to the number of photons of a given energy shining on the solar cell from outside (incident photons).

As used herein, "IQE" refers to Internal Quantum Efficiency. IQE is the ratio of the number of charge carriers collected by the solar cell to the number of photons of a given energy that shine on the solar cell from outside and are absorbed by the cell.

As used herein, "DPP" refers to the molecule, diketopyrrolopyrrole, having the following structure:

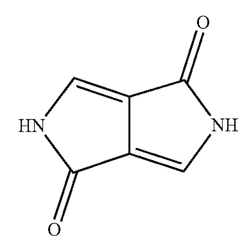

As used herein, DPP-based compounds or polymers contain the diketopyrrolopyrrole fragment in their backbone structure.

As used herein, "IDT" refers to the molecule, indacenodithiophene, having the following structure:

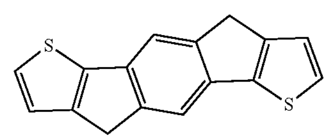

As used herein, IDT-based compounds or polymers contain the indacenodithiophene fragment in their backbone structure.

As used herein, when referring to a hole or electron transport layer that "comprises a single near infrared sensitive semiconductor material," that transport layer, which comprises a transport material, can further comprise a single near infrared sensitive semiconductor material.

As used herein, "smooth" refers to a perovskite material layer that has a uniform surface that is free of perceptible indentations or ridges.

As used herein, "rough" refers to a perovskite material layer that has a non-uniform surface, characterized by structural defects.

As used herein, "electron donor" comprises an electron-donating material, for example a conjugated polymer or any other suitable electron-donating organic molecule. As used herein, "electron acceptor" comprises an electron-accepting material, for example a fullerene (or fullerene derivative) or any other suitable electron-accepting organic molecule. In certain embodiments, such as for diketopyrrole (DPP) near infrared sensitive polymers or compounds, molecules or polymers can act as both electron donors and electron acceptors, depending on the structure of the device and theother components in the solar cell.

II. Device Structures a. Device Structure I—Planar Heterojunction Solar Cell

Figure 1B:
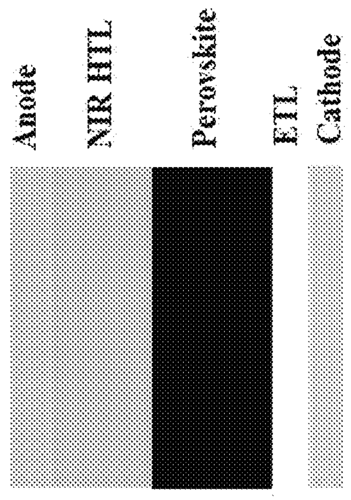
FIG. 1B shows a planar heterojunction perovskite solar cell having the following device structure (from bottom to top): Cathode/ETL/Perovskite/NIR HTL/Anode.
Figure 1C:
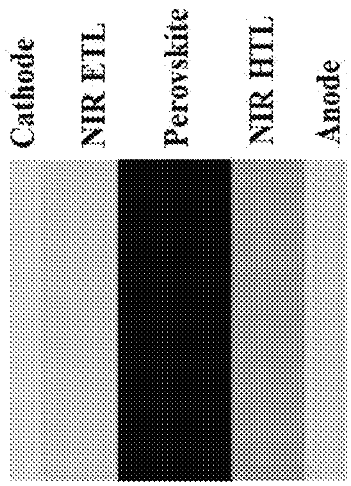
FIG. 1C shows a planar heterojunction perovskite solar cell having the following device structure (from bottom to top): Anode/NIR HTL/Perovskite/NIR ETL/Cathode.

In the first device structure shown in FIG. 1A-FIG. 1C, a single semiconductor material, as opposed to a bulk heterojunction material, is applied to extend the device photoresponse spectrum to the near infrared range.

In certain embodiments, the device has a structure of Anode/HTL/Perovskite/NIR ETL/Cathode (FIG. 1A). In certain embodiments, the device has a structure of Cathode/ETL/Perovskite/NIR HTL/Anode (FIG. 1B). In certain embodiments, the device has a structure of Anode/NIR HTL/Perovskite/NIR ETL/Cathode (FIG. 1C).

Mechanism of Action

In general, the hole (electron) generated from the NIR ETL (HTL) under illumination is transferred to the perovskite layer, and is then collected at the electrodes. The detailed mechanism of this device type is described below:

1) The NIR layer(s) absorbs light with a wavelength over 780 nm, and then generates an exciton (hole-electron pair) and/or free charge carriers;
2) The exciton and/or free charge carriers generated in the NIR layer diffuses to the interface of the perovskite and the NIR layer. Then, the exciton can dissociate to the holes and electrons at the interface due to different energy levels between the perovskite and contact layers;
3) The holes (electrons) generated in the NIR HTL (ETL) are injected into the perovskite layers and are then collected by the perovskite in the perovskite solar cells.

In certain embodiments, the thickness of the cathode layer in device 1 is between about 1 nm and 100 μm. In certain embodiments, the thickness of the cathode layer in device 1 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the anode layer in device 1 is between about 1 nm and 100 μm. In certain embodiments, the thickness of the anode layer in device 1 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the perovskite layer in device 1 is between about 1 nm and 100 μm. In certain embodiments, the thickness of the perovskite layer in device 1 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the HTL layer in device 1 is between about 0.1 nm and 10 μm. In certain embodiments, the thickness of the HTL layer in device 1 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the thickness of the NIR HTL layer in device 1 is between about 0.1 nm and 10 μm. In certain embodiments, the thickness of the NIR HTL layer in device 1 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the thickness of the ETL layer in device 1 is between about 0.1 nm and 10 μm. In certain embodiments, the thickness of the ETL layer in device 1 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the thickness of the NIR ETL layer in device 1 is between about 0.1 nm and 10 μm. In certain embodiments, the thickness of the NIR ETL layer in device 1 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the perovskite layer in device 1 is smooth. In certain embodiments, the perovskite layer in device 1 is flat. In certain embodiments, the perovskite layer in device 1 is rough. It is generally understood that the rough perovskite layer can accommodate more NIR layer with a larger contact area, allowing for more absorption from the NIR and thus more current contribution from the NIR layer.

In certain embodiments, the subject matter described herein is directed to a planar heterojunction perovskite solar cell, comprising:

- a first electrode;
- a first transport layer disposed on the first electrode;
- a perovskite material layer disposed on the first transport layer;
- a second transport layer disposed on the perovskite material layer;
- and a second electrode disposed on the second transport layer,
- wherein one of said first or second transport layers is a hole transport layer and the other one of said first or second transport layers is an electron transport layer, and
- wherein at least one of said hole transport layer or said electron transport layer comprises a single near infrared sensitive semiconductor material.

In certain embodiments, in the planar heterojunction perovskite solar cell, said near infrared sensitive semiconductor material is capable of absorbing light with a wavelength of at least 780 nm. In certain embodiments, said near infrared sensitive semiconductor material is capable of absorbing light with a wavelength greater than 780 nm. In certain embodiments, said near infrared sensitive semiconductor material is capable of absorbing light with a wavelength of at least 790 nm, at least 800 nm, at least 810 nm, at least 820 nm, at least 825, at least 830, or at least 835 nm.

In certain embodiments, in the planar heterojunction perovskite solar cell, the electron transport layer comprises a material selected from the group consisting of C60, BCP, $TiO_2$, $SnO_2$, $PC_{61}BM$, $PC_{71}BM$, ICBA, ZnO, ZrAcac, LiF, Ca, Mg, TPBI, PFN, and a combination thereof. In certain embodiments, the electron transport layer comprises C60. In certain embodiments, the electron transport layer comprises BCP. In certain embodiments, the electron transport layer comprises a mixture of C60 and BCP.

In certain embodiments, in the planar heterojunction perovskite solar cell, the hole transport layer comprises a material selected from the group consisting of PTAA, Spiro- OMeTAD, PEDOT:PSS, NiO, $MoO_3$, $V_2O_5$, Poly-TPD, EH44, and a combination thereof. In certain embodiments, the hole transport layer comprises PTAA.

In certain embodiments, in the planar heterojunction perovskite solar cell, said near infrared sensitive semiconductor material is an inorganic semiconductor selected from the group consisting of PbS, CdTe, Copper Indium Gallium Selenide (CIGS), GaAs, PbS, Si, tin-containing hybrid perovskite $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3$), and $Sb_2Se_3$.

In certain embodiments, in the tin-containing hybrid perovskite, $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3$).

In certain embodiments, in the planar heterojunction perovskite solar cell, said near infrared sensitive semiconductor material is an organic semiconductor comprising IDT or DPP. In certain embodiments, in the planar heterojunction perovskite solar cell, said near infrared sensitive semiconductor material is an organic compound or polymer selected from the group consisting of

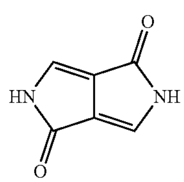

,

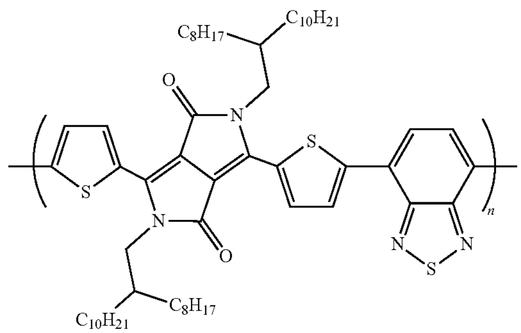

,

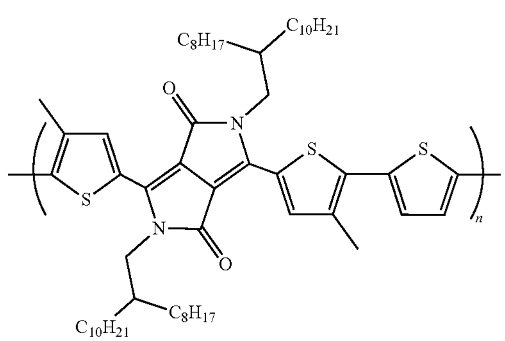

,

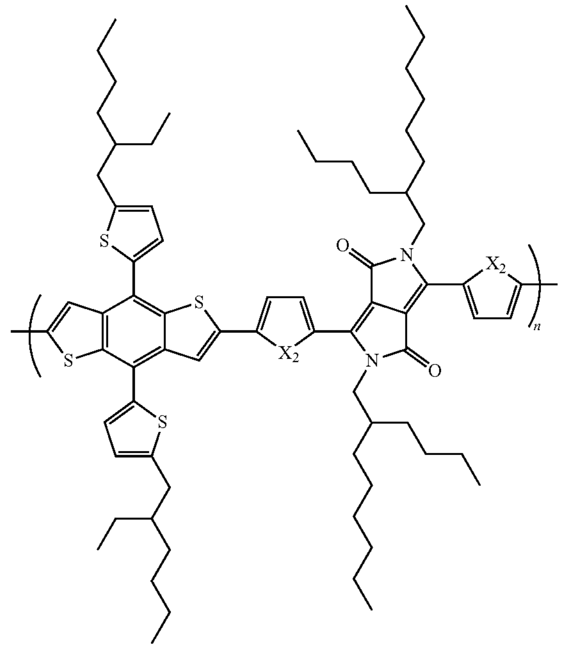

,

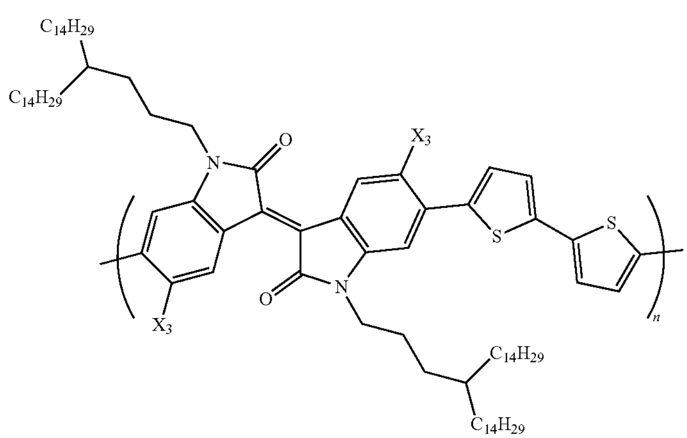

,

-continued
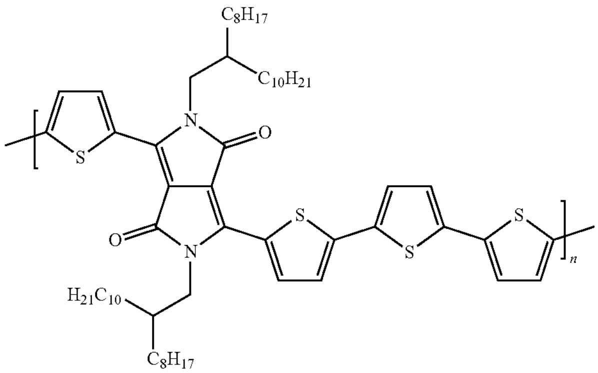
,
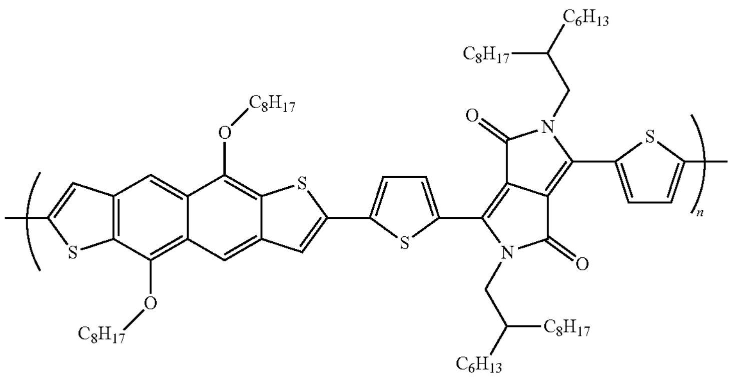
,
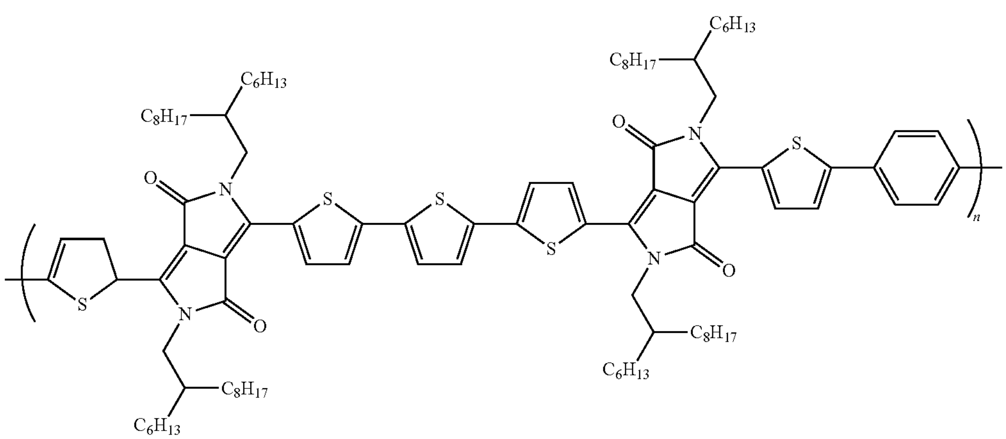
,
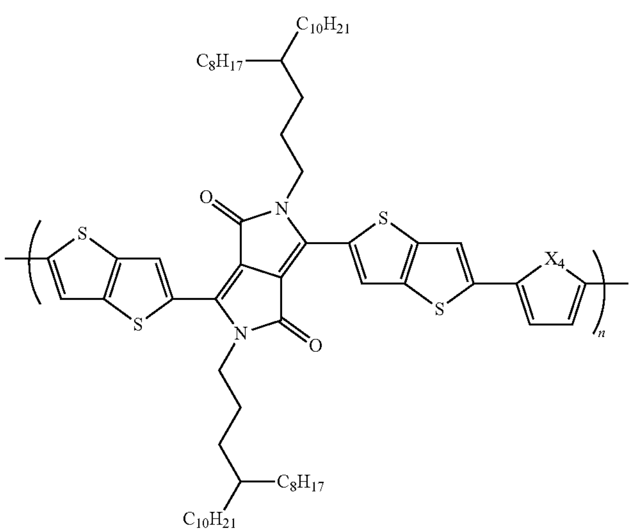
,

-continued
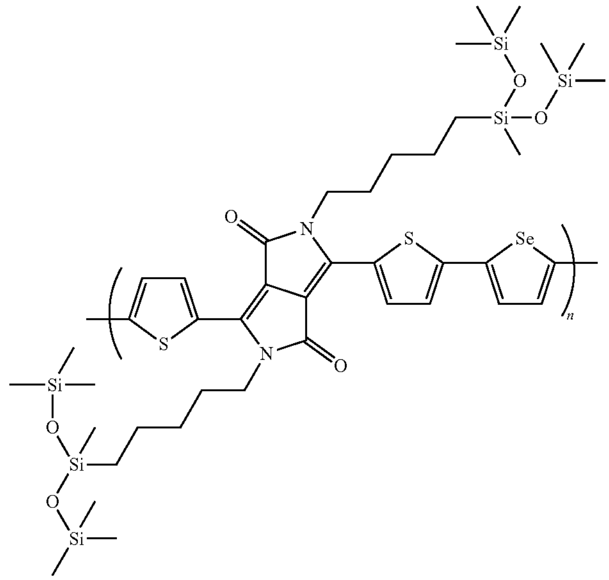
,
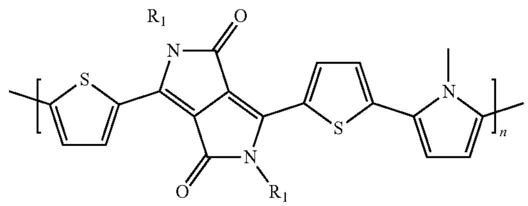
,
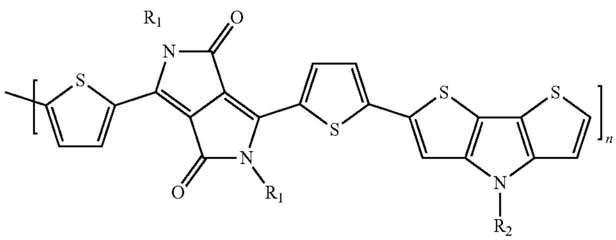
,
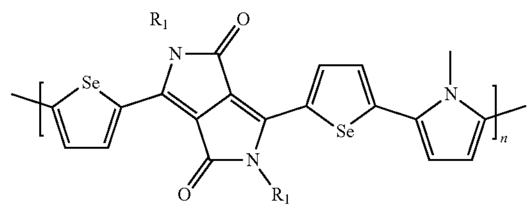
,
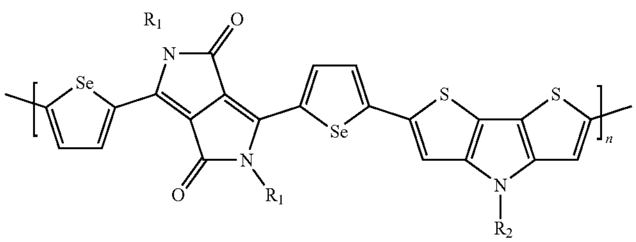
,
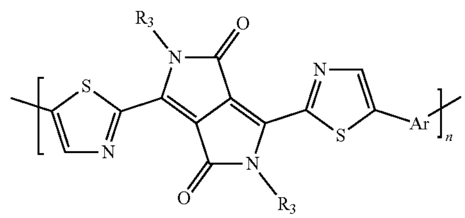
,
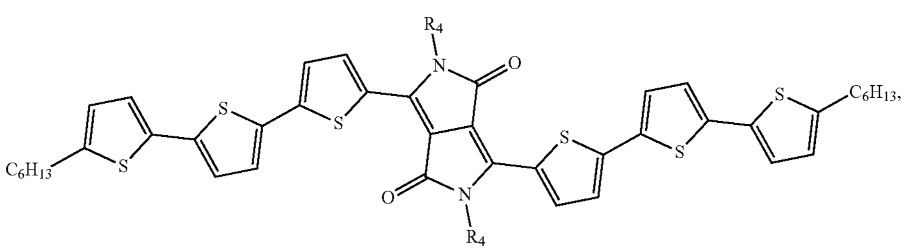
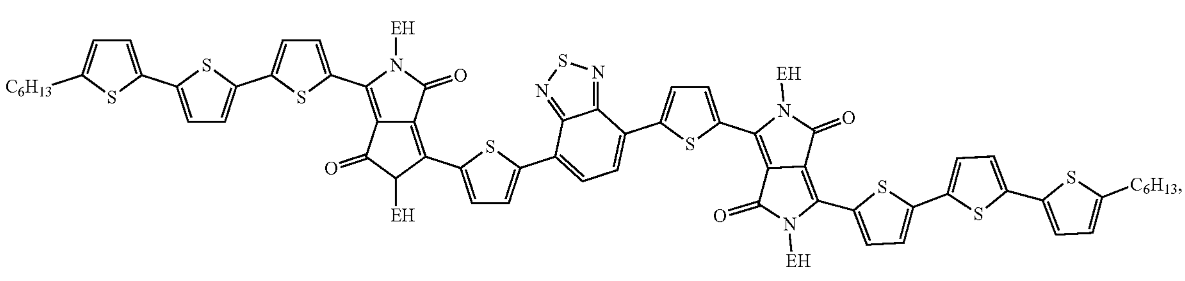

-continued
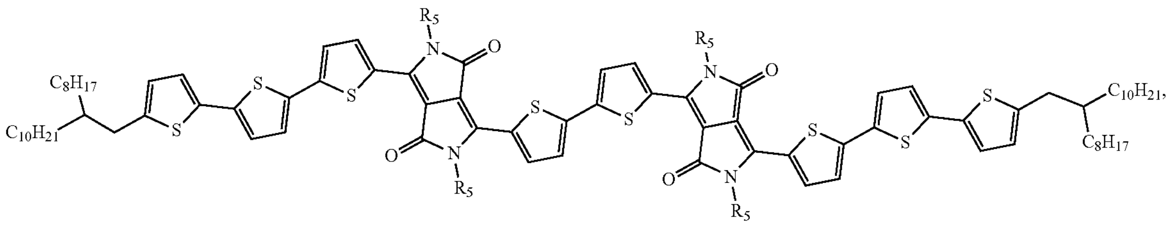
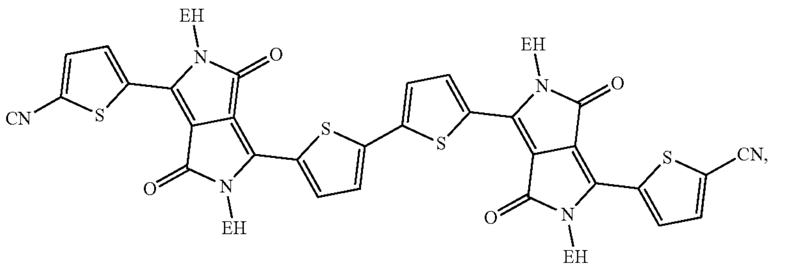
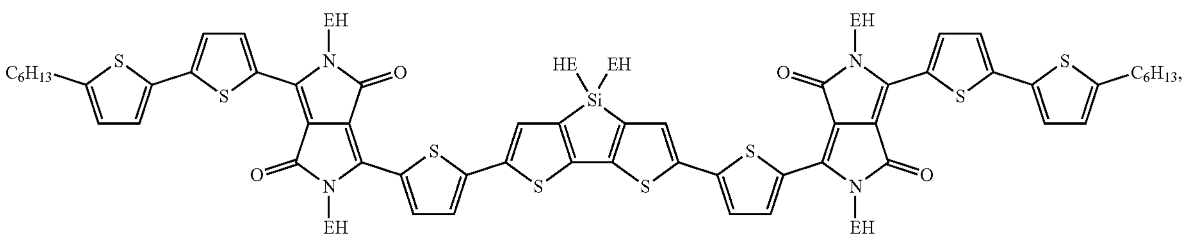
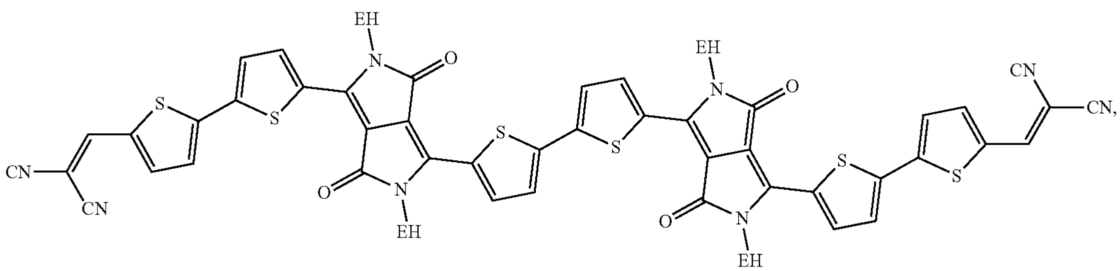
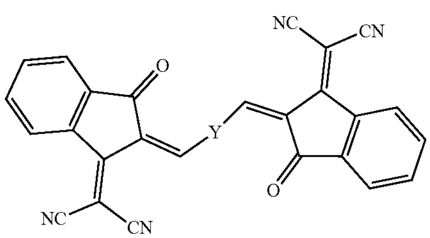
,
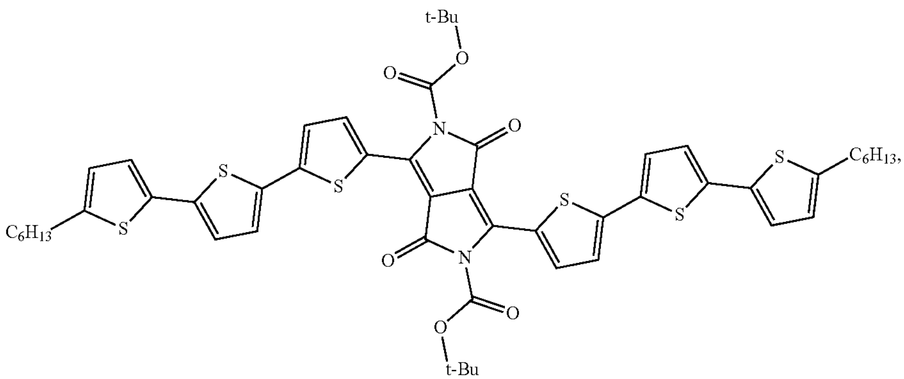

-continued
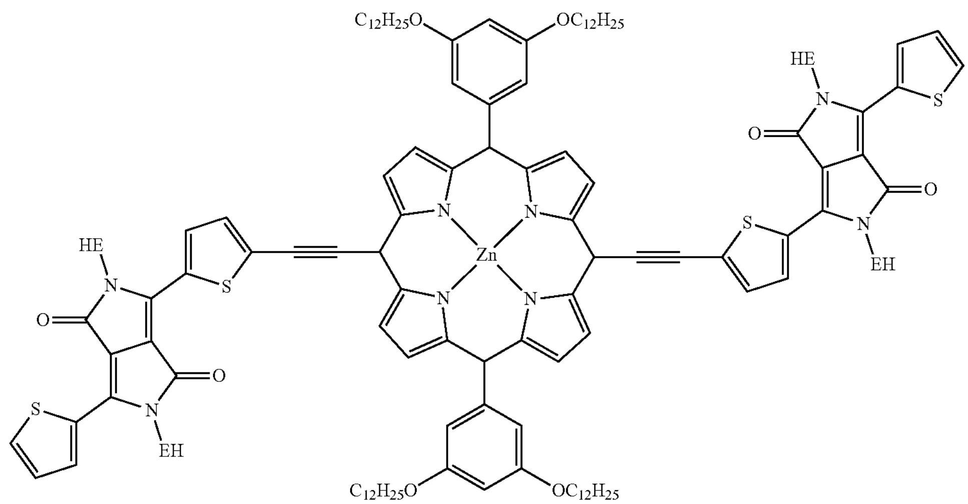
,
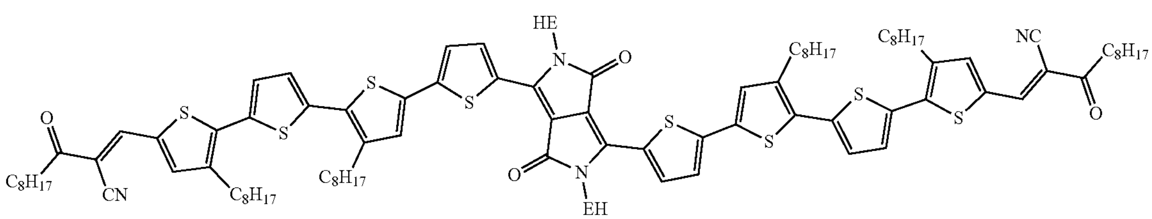
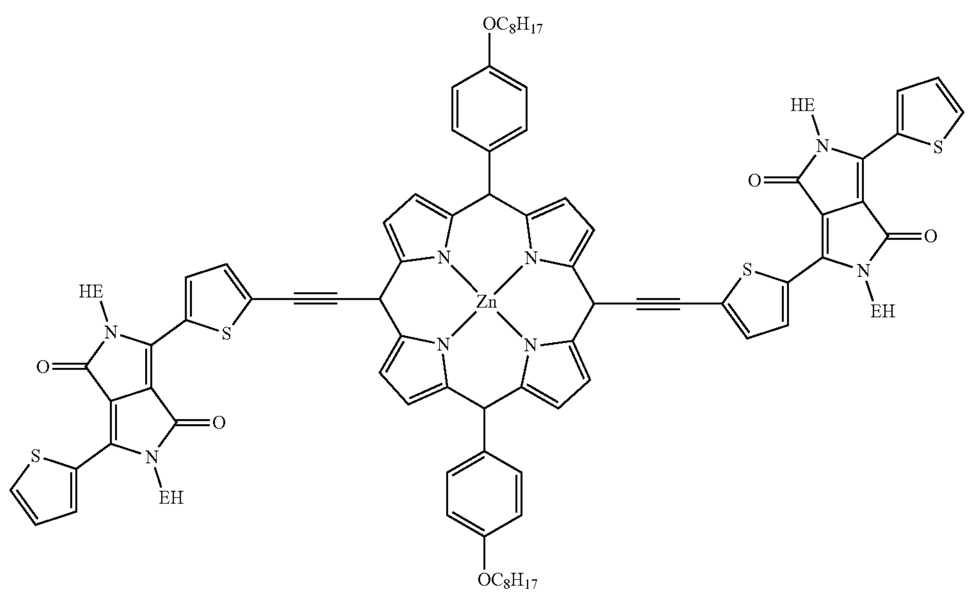
,
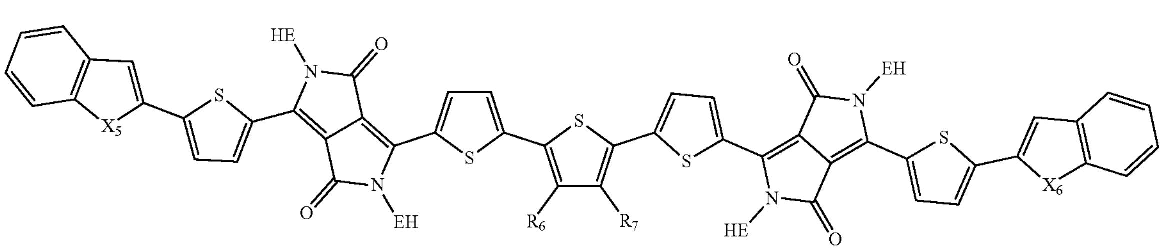
,

-continued
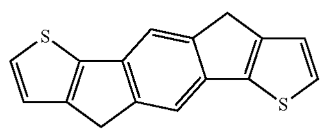
,
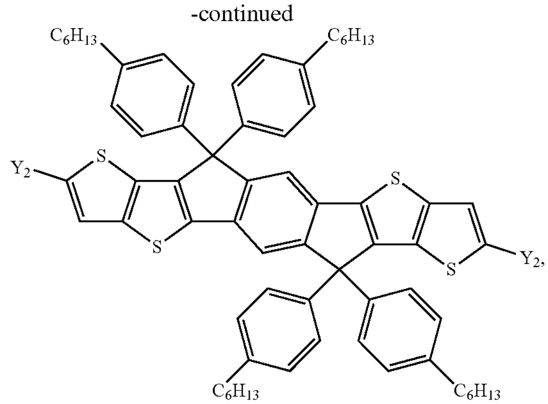
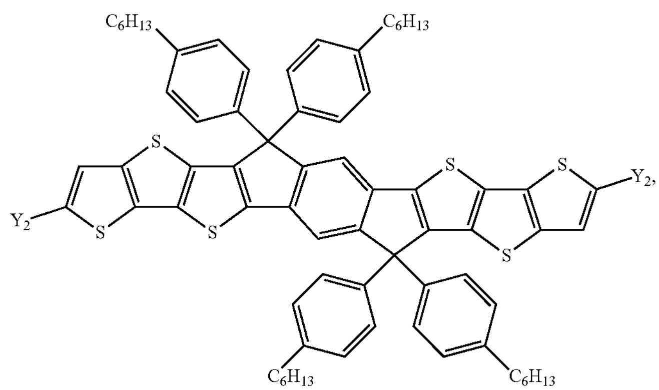
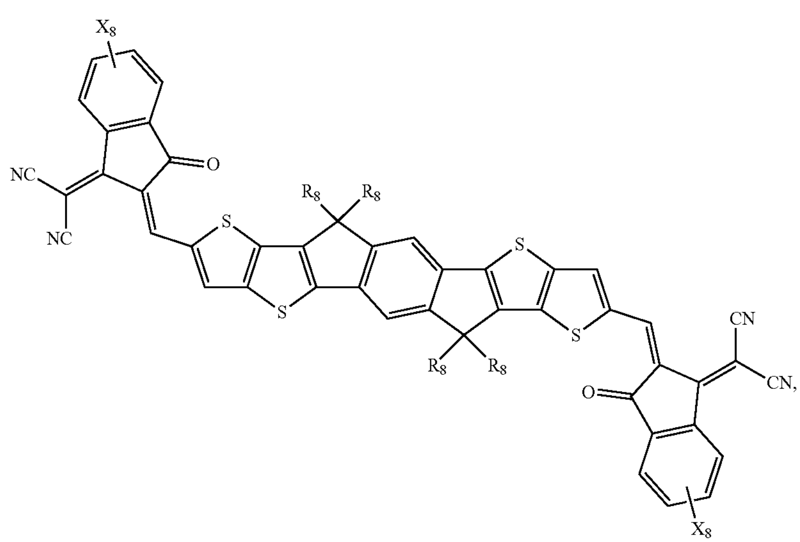

-continued
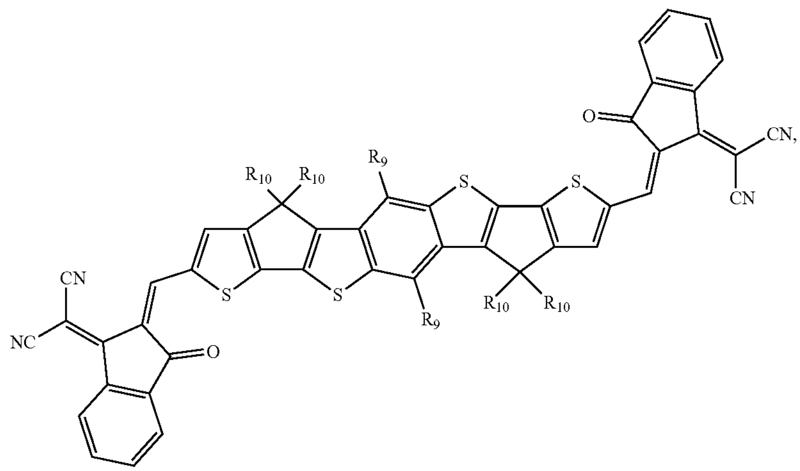
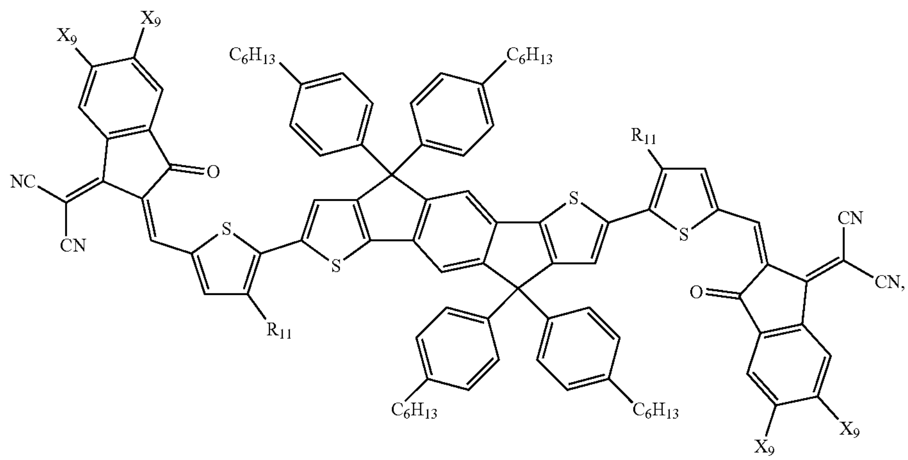
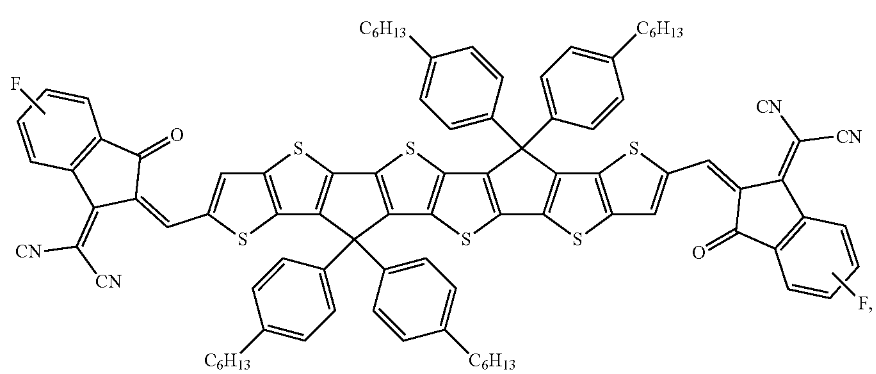

-continued
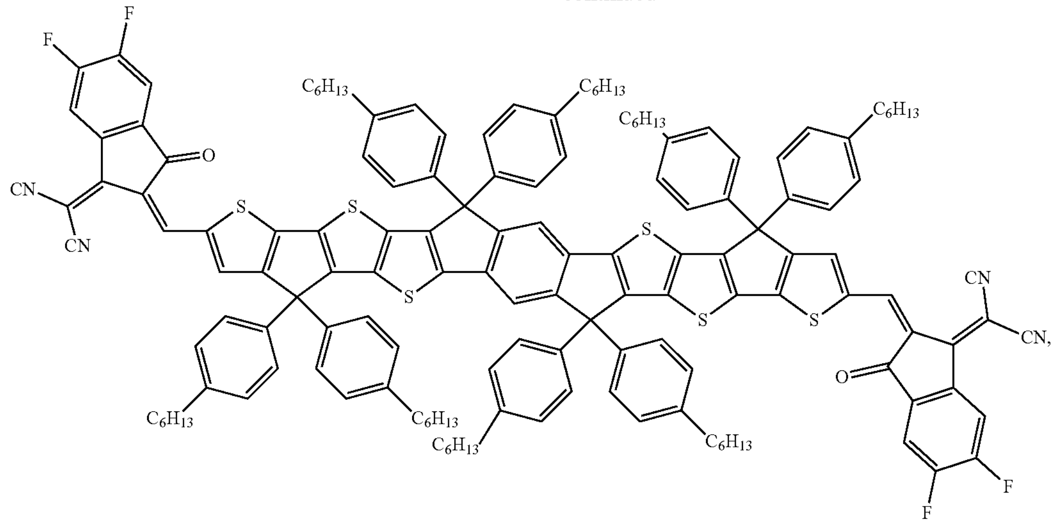
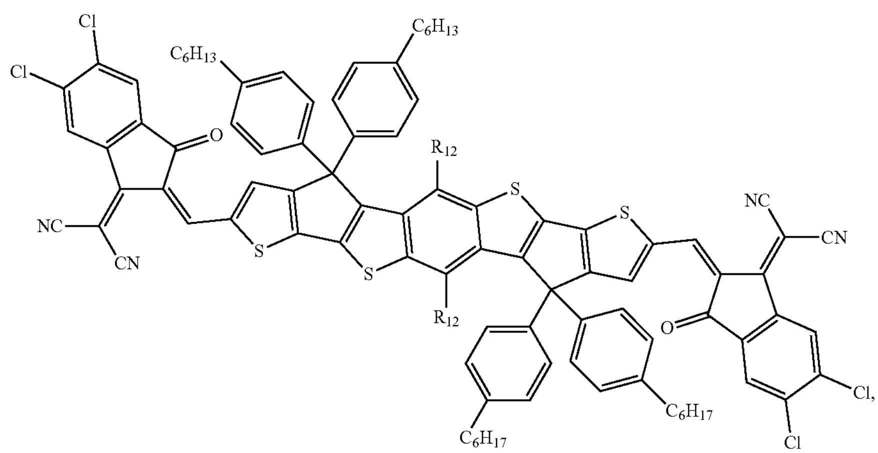
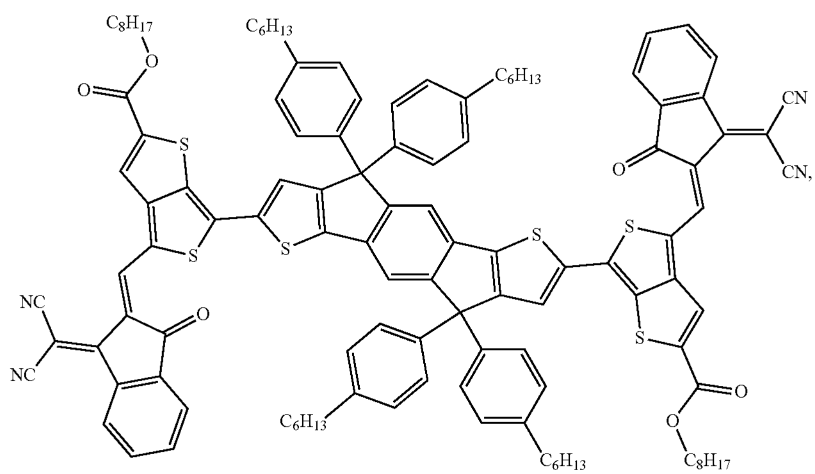

-continued
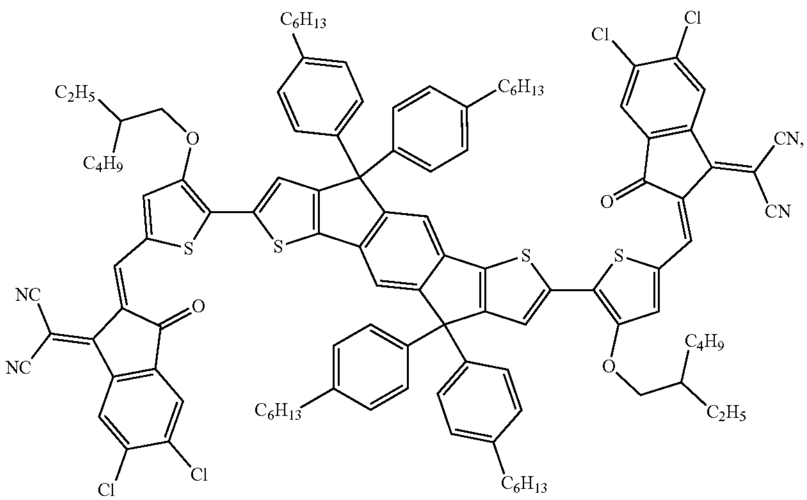
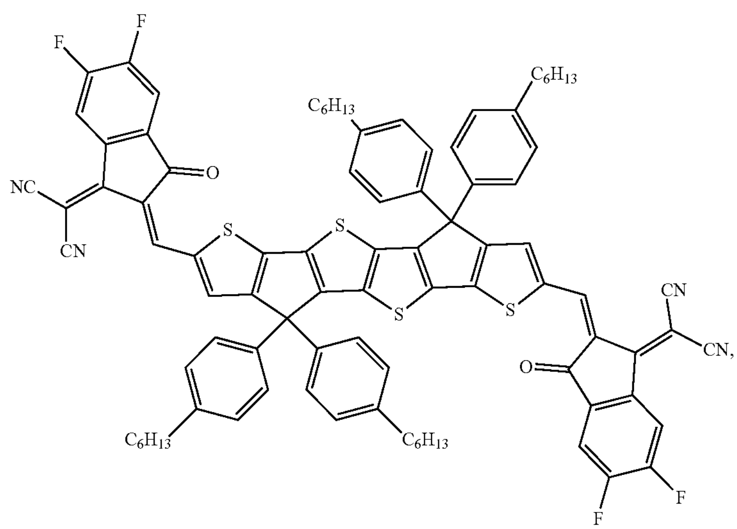
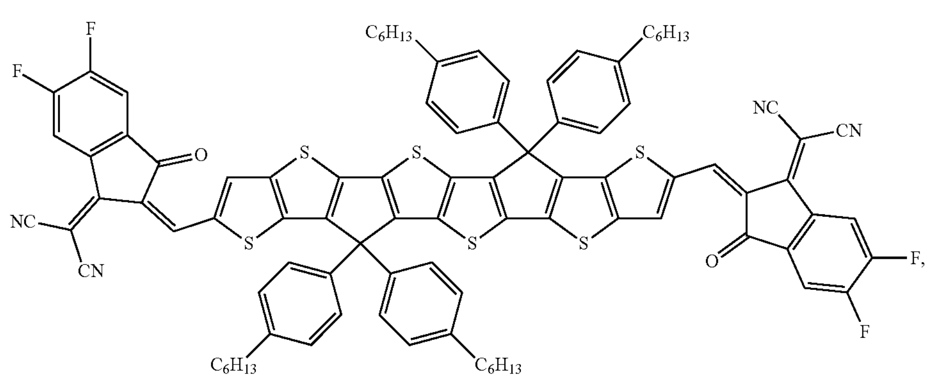

-continued
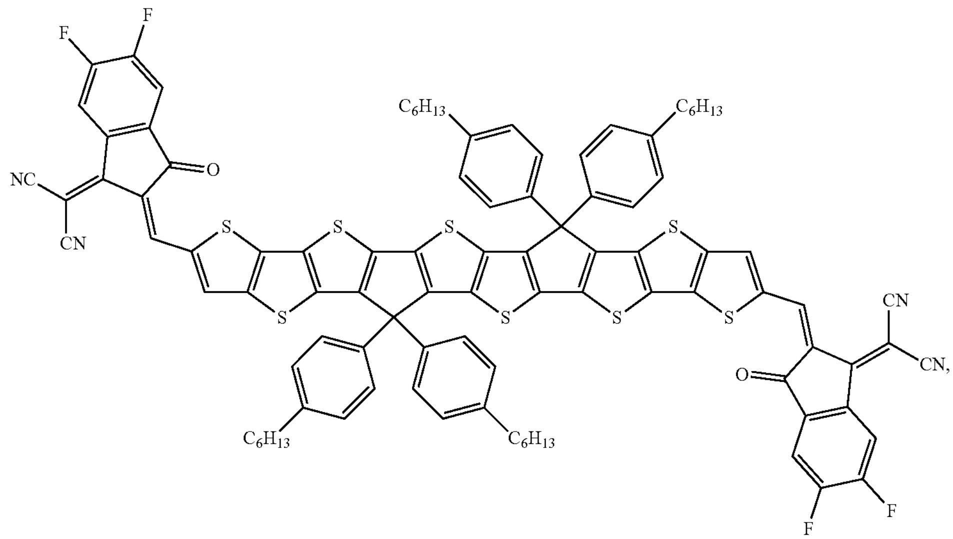
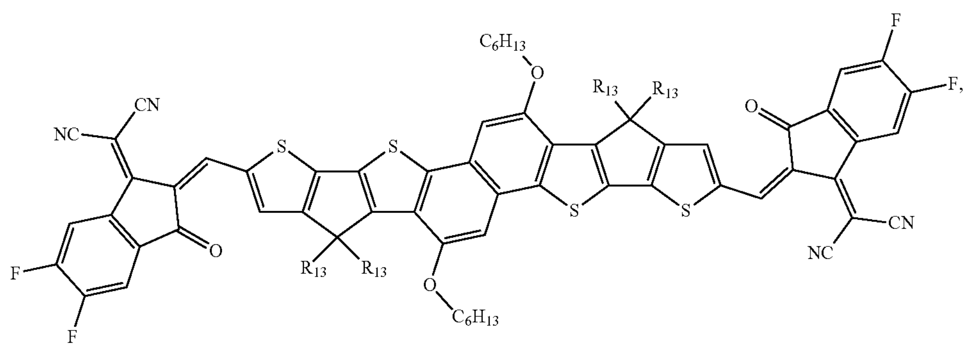
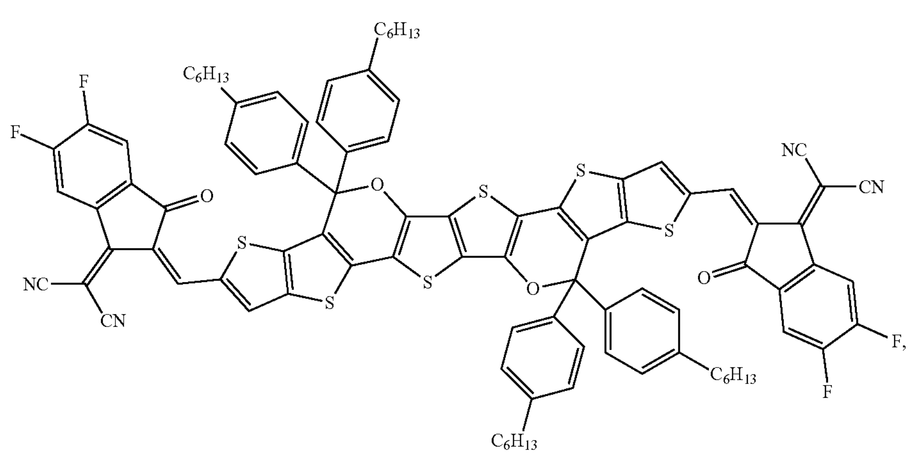

-continued
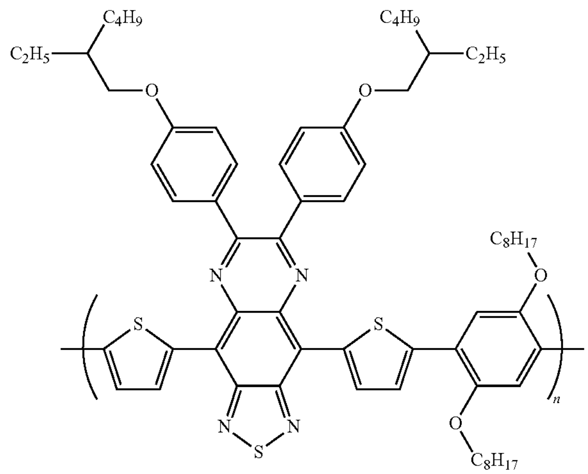
,
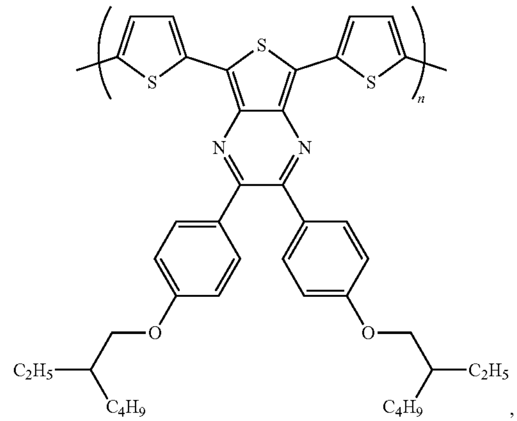
,
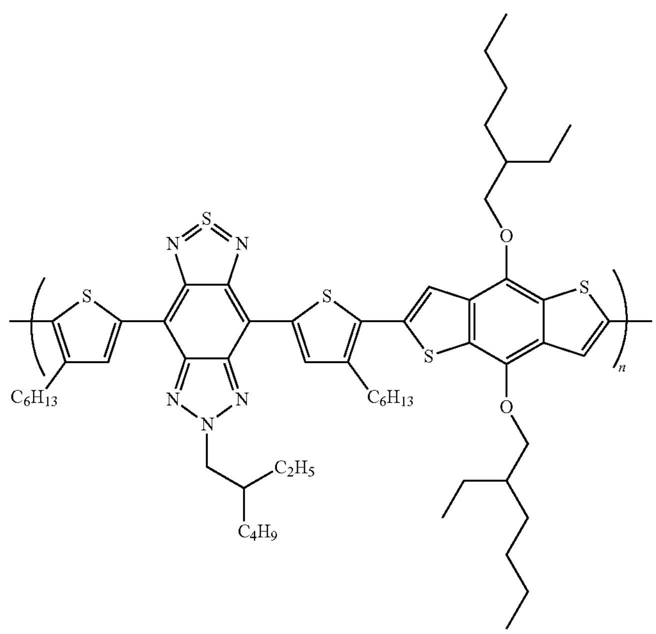
,
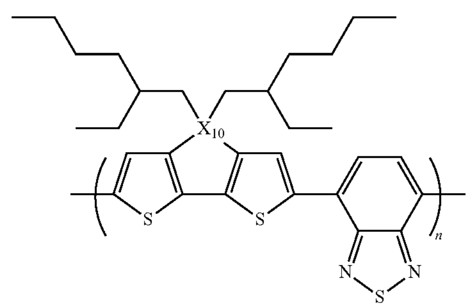
,
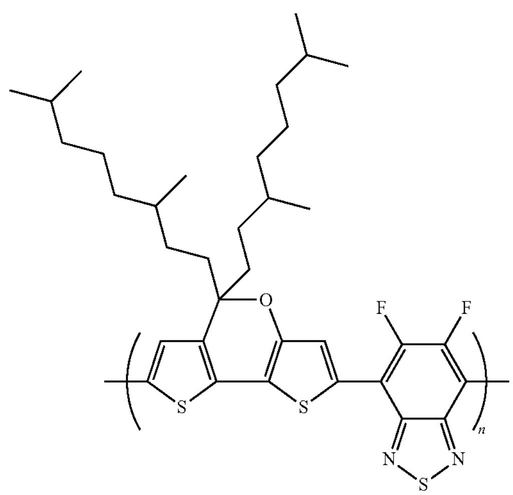
,
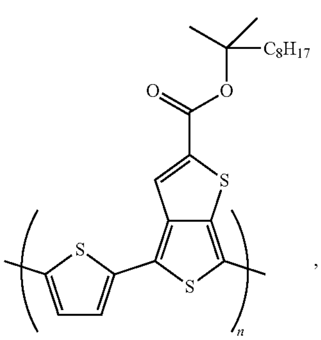
, -continued
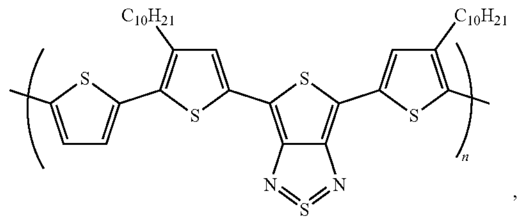
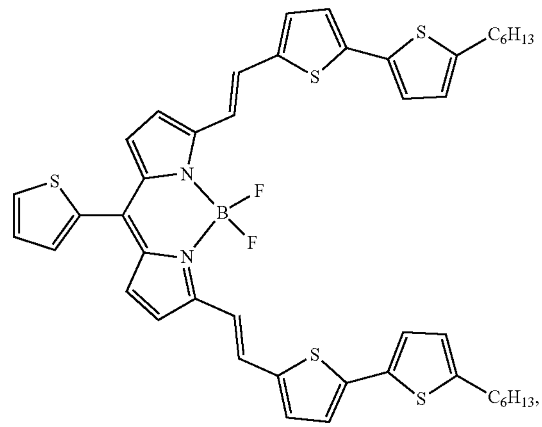
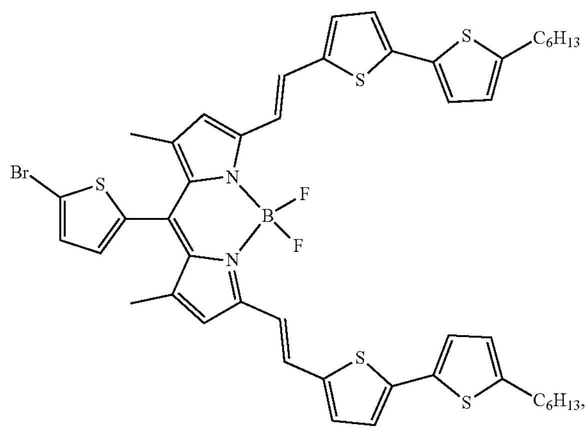
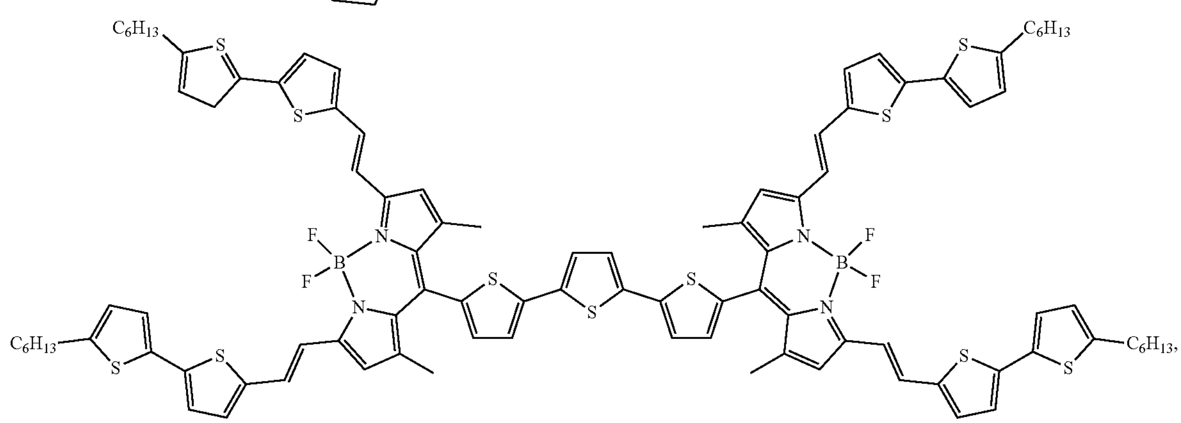
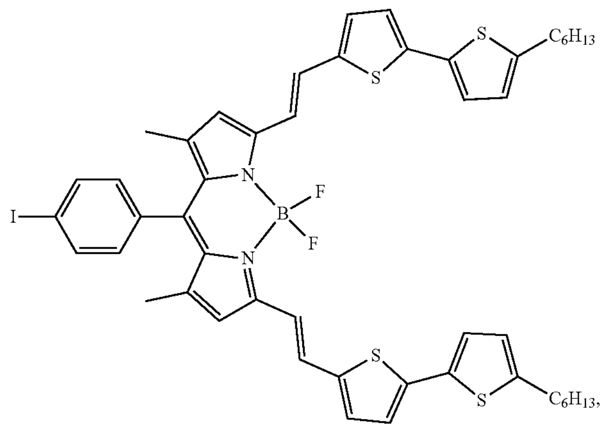

-continued

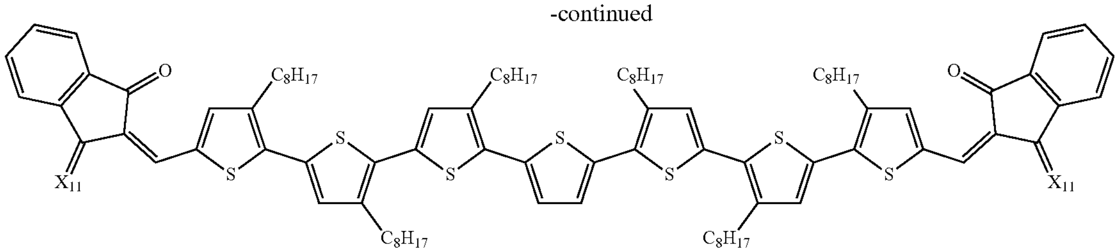,

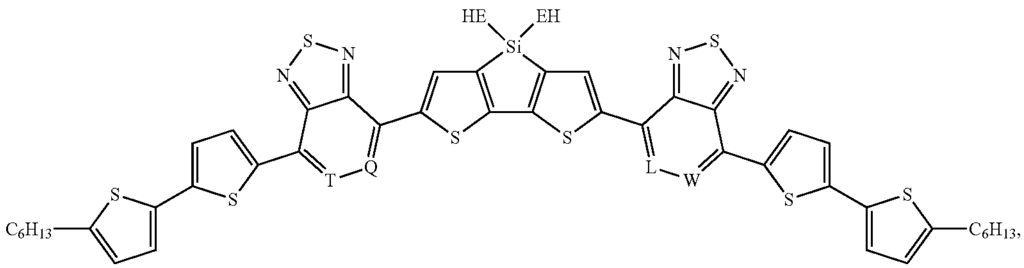

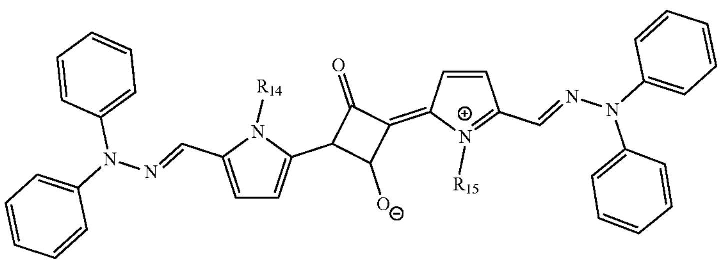,

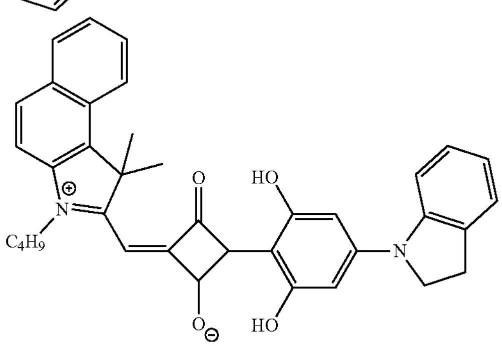, and 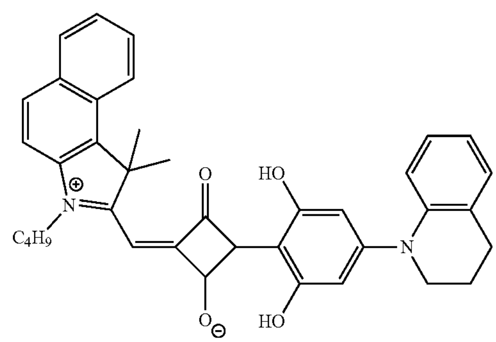, wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Aryl is selected from the group consisting of

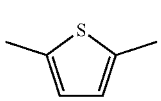, 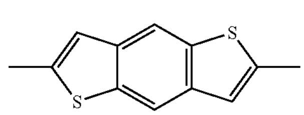,

-continued

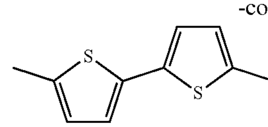, 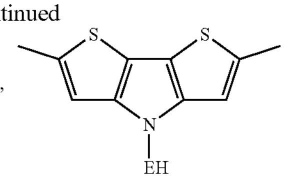

wherein EH is 2-ethylhexyl;

$R_4$ is $C_6H_{13}$ or $C_{12}H_{25}$;

$R_5$ is H or

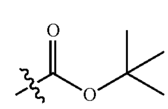

$R_6$ and $R_7$ are each independently H or $CH_3$;

$X_5$ and $X_6$ are each independently O or S;

EH is 2-ethylhexyl;

Y is selected from the group consisting of
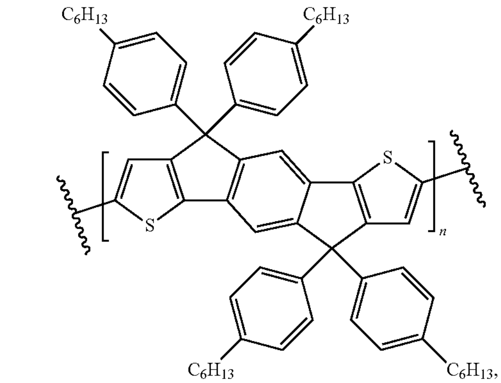
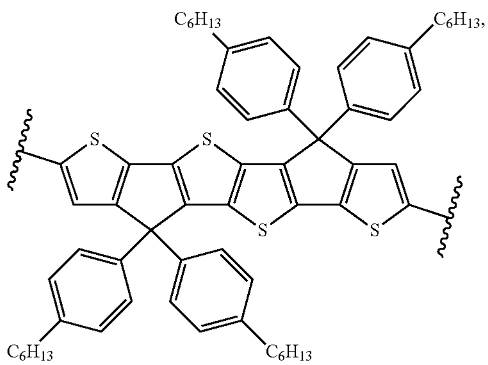
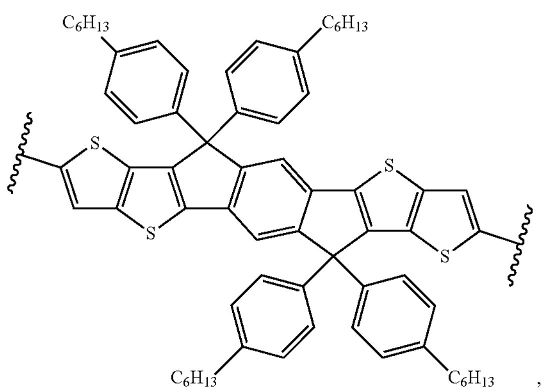
,
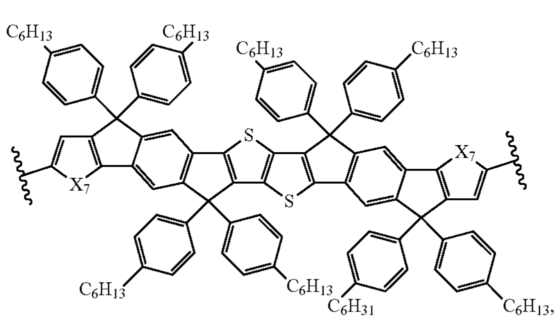
-continued
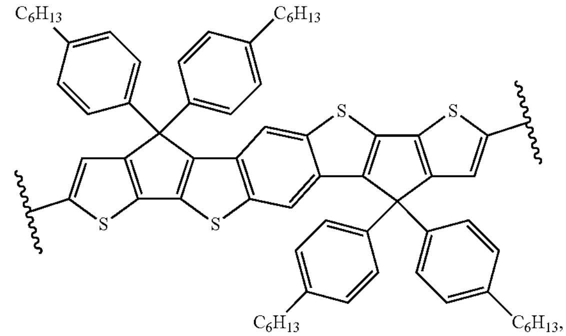
and
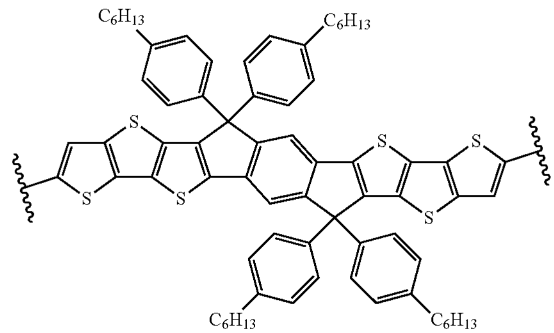
;
$X_7$ is S or Se;
$Y_2$ is selected from the group consisting of
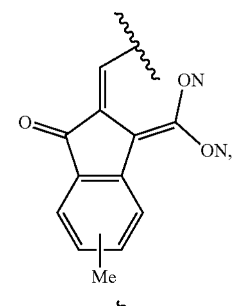
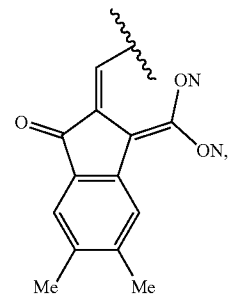
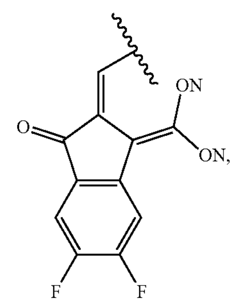
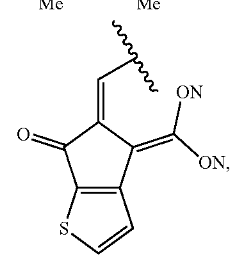
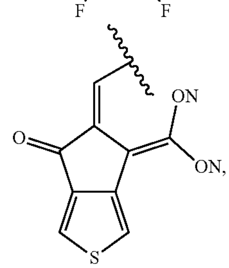
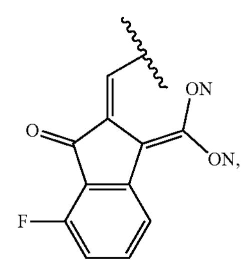

-continued

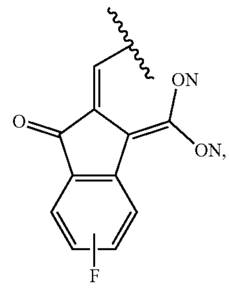

and

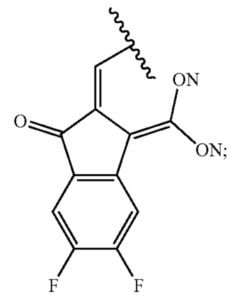

$X_8$ is H or F;

$R_8$ is

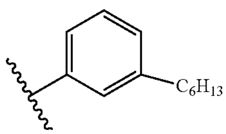

or

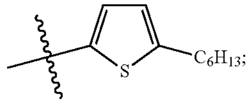

$R_9$ is

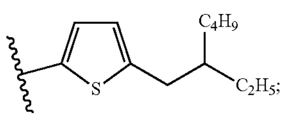

$R_{10}$ is

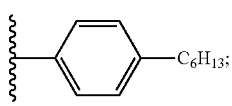

$X_9$ is H or F;

$R_{11}$ is

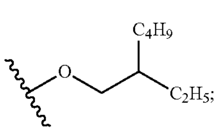

$R_{12}$ is 2-ethylhexyl;

$R_{13}$ is

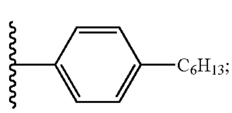

$X_{10}$ is selected from the group consisting of C, Si, and Ge;

$X_{11}$ is O or

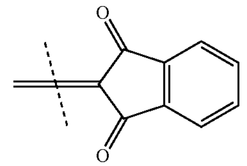

Q, L, T, and W are each independently CH or N;

$R_{14}$ and $R_{15}$ are each independently 2-ethylhexyl or n-dodecyl; and n is an integer between 1 and 10,000.

In certain embodiments, n is an integer between 1 and 5,000, 1 and 2,000, 1 and 1,000, 1 and 500, 1 and 300, 1 and 200, 1 and 100, 1 and 50, 1 and 25, 1 and 10, 1 and 5, or 1 and 3. In certain embodiments, n is 1. In certain embodiments, n is 2. In certain embodiments, n is 3. In certain embodiments, n is 4. As used herein, n can be selected for each polymer type of polymer.

In certain embodiments, in the planar heterojunction perovskite solar cell, the near infrared sensitive semiconducting material is FOIC (FIG. 2B). In certain embodiments, the near infrared sensitive semiconducting material is F8IC (FIG. 3B).

In certain embodiments, in the planar heterojunction perovskite solar cell, the perovskite material layer is smooth. In certain embodiments, in the planar heterojunction perovskite solar cell, said perovskite material layer is rough.

b. Device Structure II—Single Heterojunction Solar Cell with Mesoporous Structure In the second device structure (shown in FIG. 4A-FIG. 4C), a mesoporous material is used in the single heterojunction solar cell. The application of the mesoporous materials is to enhance the absorption of NIR semiconductors or dyes so that the external quantum efficiency of these devices is enhanced in the NIR wavelength range.

Figure 4A:
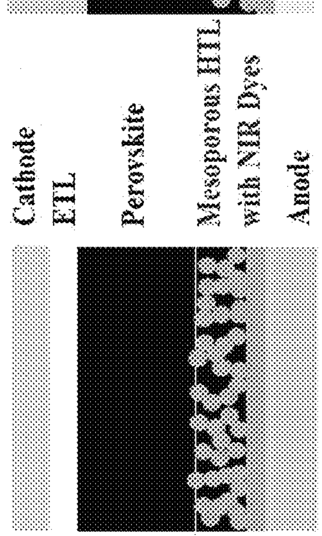
FIG. 4A shows a perovskite solar cell having the following device structure (from bottom to top): Anode/mesoporous HTL with NIR materials/Perovskite/ETL/Cathode.
Figure 4B:
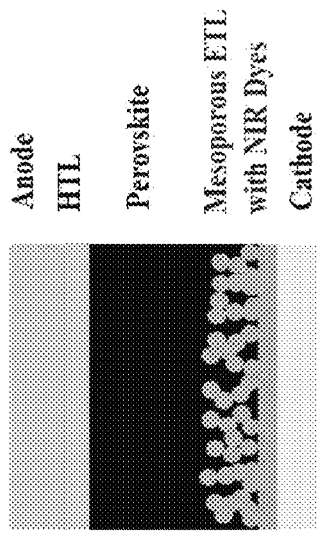
FIG. 4B shows a perovskite solar cell having the following device structure (from bottom to top): Cathode/mesoporous ETL with NIR materials/Perovskite/HTL/Anode.
Figure 4C:
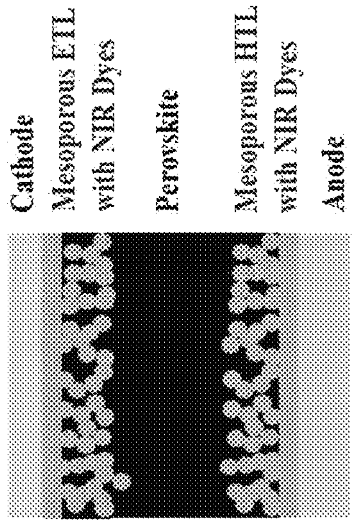
FIG. 4C shows a perovskite solar cell having the following device structure (from bottom to top): Anode/mesoporous HTL with NIR materials/Perovskite/mesoporous ETL with NIR materials/Cathode.

In certain embodiments, the device has a structure of Anode/mesoporous HTL with NIR materials/Perovskite/ETL/Cathode (FIG. 4A). In certain embodiments, the device has a structure of Cathode/mesoporous ETL with NIR materials/Perovskite/HTL/Anode (FIG. 4B). In certain embodiments, the device has a structure of Anode/mesoporous HTL with NIR materials/Perovskite/mesoporous ETL with NIR materials/Cathode (FIG. 4C).

Mechanism of Action

In general, the hole (electron) generated form the NIR materials under illumination is transferred to the perovskite layer, and is then collected at the electrodes.

The detailed mechanism of this device type is described below:

1) The NIR materials in the mesoporous HTL or ETL absorb light with a wavelength over 780 nm and then generate an exciton (hole-electron pair) and/or free charge carriers;
2) The exciton generated in the NIR layer diffuses to the interface between the perovskite and NIR materials, or the interface between the NIR material and the mesoporous HTL (or ETL). The exciton then dissociates to holes and electrons at the interface;
3) The holes and electrons generated in the NIR materials transfer to the perovskite layer and mesoporous HTL, or the mesoporous ETL and perovskite layer, respectively. Then, the charge carriers are collected by electrodes.

In certain embodiments, the thickness of the cathode layer in device 2 is between about 1 nm and 100 μm. In certain embodiments, the thickness of the cathode layer in device 2 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the anode layer in device 2 is between about 1 nm and 100 μm. In certain embodiments, the thickness of the anode layer in device 2 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the perovskite layer in device 2 is between about 1 nm and 100 μm. In certain embodiments, the thickness of the perovskite layer in device 2 is between about 1 nm and about 500 nm, about 50 nm and about 750 nm, about 100 nm and about 1 m, about 20 μm and 1 about 100 μm, or about 50 μm and about 75 μm.

In certain embodiments, the thickness of the HTL layer in device 2 is between about 0.1 nm and 100 μm. In certain embodiments, the thickness of the HTL layer in device 2 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, about 3 μm and about 5 μm, about 10 μm and about 70 μm, about 20 μm and about 100 μm, about 30 μm and about 50 μm, or about 50 μm and about 100 μm.

In certain embodiments, the thickness of the mesoporous HTL layer with NIR dyes in device 2 is between about 0.1 nm and 100 μm. In certain embodiments, the thickness of the mesoporous HTL layer with NIR dyes in device 2 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, about 3 μm and about 5 μm, about 10 μm and about 70 μm, about 20 μm and about 100 μm, about 30 μm and about 50 μm, or about 50 μm and about 100 μm.

In certain embodiments, the thickness of the ETL layer in device 2 is between about 0.1 nm and 100 μm. In certain embodiments, the thickness of the ETL layer in device 2 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, about 3 μm and about 5 μm, about 10 μm and about 70 μm, about 20 μm and about 100 μm, about 30 μm and about 50 μm, or about 50 μm and about 100 μm.

In certain embodiments, the thickness of the mesoporous ETL layer with NIR dyes in device 2 is between about 0.1 nm and 100 μm. In certain embodiments, the thickness of the mesoporous ETL layer with NIR dyes in device 2 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, about 3 μm and about 5 μm, about 10 μm and about 70 μm, about 20 μm and about 100 μm, about 30 μm and about 50 μm, or about 50 μm and about 100 μm.

In certain embodiments, the subject matter described herein is directed to a single heterojunction perovskite solar cell, comprising:

a first electrode;

a first transport layer disposed on the first electrode;

a perovskite material layer disposed on the first transport layer;

a second transport layer disposed on the perovskite material layer;

and a second electrode disposed on the second transport layer, wherein one of said first or second transport layers is a hole transport layer and the other one of said first or second transport layers is an electron transport layer;

wherein at least one of said hole transport layer or said electron transport layer comprises a single near infrared sensitive semiconductor material; and wherein at least one of said hole transport layer or said electron transport layer further comprises a mesoporous material.

In certain embodiments, in the single heterojunction perovskite solar cell, wherein at least one of said hole transport layer or said electron transport layer further comprises a mesoporous material, the near infrared sensitive semiconductor material is capable of absorbing light with a wavelength of at least 780 nm. In certain embodiments, said near infrared sensitive semiconductor material is capable of absorbing light with a wavelength greater than 780 nm. In certain embodiments, said near infrared sensitive semiconductor material is capable of absorbing light with a wavelength of at least 790 nm, at least 800 nm, at least 810 nm, at least 820 nm, at least 825, at least 830, or at least 835 nm.

In certain embodiments, the near infrared sensitive semiconductor material is in the form of a dye.

In certain embodiments, in the single heterojunction perovskite solar cell, wherein at least one of said hole transport layer or said electron transport layer further comprises a mesoporous material, the electron transport layer comprises a material selected from the group consisting of C60, BCP, $TiO_2$, $SnO_2$, $PC_{61}BM$, $PC_{71}BM$, ICBA, ZnO, ZrAcac, LiF, Ca, Mg, TPBI, PFN, and a combination thereof.

In certain embodiments, in the single heterojunction perovskite solar cell, wherein at least one of said hole transport layer or said electron transport layer further comprises a mesoporous material, the hole transport layer comprises a material selected from the group consisting of PTAA, Spiro-OMeTAD, PEDOT:PSS, NiO, $MoO_3$, $V_2O_5$, Poly-TPD, EH44, and a combination thereof. In certain embodiments, the hole transport layer comprises Spiro-OMeTAD.

In certain embodiments, the mesoporous material may comprise any pore-containing material. In some embodiments, the pores may have diameters ranging from about 1 to about 100 nm; in other embodiments, pore diameter may range from about 2 to about 50 nm. Suitable mesoporous material includes any one or more of: aluminum (Al); bismuth (Bi); indium (In); molybdenum (Mo); niobium (Nb); nickel (Ni); silicon (Si); titanium (Ti); vanadium (V); zinc (Zn); zirconium (Zr); an oxide of any one or more of the foregoing metals (e.g., alumina, ceria, titania, zinc oxide, zircona, etc.); a sulfide of any one or more of the foregoing metals; a nitride of any one or more of the foregoing metals; and combinations thereof. In certain embodiments, the electron transport layer of device 2 further comprises a mesoporous material selected from the group consisting of mesoporous $TiO_2$, mesoporous $SnO_2$, and mesoporous $ZrO_2$. In certain embodiments, the hole transport layer of device 2 further comprises a mesoporous material selected from the group consisting of mesoporous NiO, mesoporous $MoO_3$, and mesoporous $V_2O_5$. In certain embodiments, the electron transport layer comprises mesoporous $TiO_2$ (m-$TiO_2$) and compact $TiO_2$ (c-$TiO_2$).

In certain embodiments, in the single heterojunction perovskite solar cell, said near infrared sensitive semiconductor material is an inorganic semiconductor selected from the group consisting of PbS, CdTe, Copper Indium Gallium Selenide (CIGS), GaAs, PbS, Si, tin-containing hybrid perovskite $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3)$, and $Sb_2Se_3$.

In certain embodiments, in the tin-containing hybrid perovskite, $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3)$.

In certain embodiments, in the single heterojunction perovskite solar cell, wherein at least one of said hole transport layer or said electron transport layer further comprises a mesoporous material, said near infrared sensitive semiconductor material is an organic semiconductor comprising IDT or DPP. In certain embodiments, in the single heterojunction perovskite solar cell, wherein at least one of said hole transport layer or said electron transport layer further comprises a mesoporous material, said near infrared sensitive semiconductor material is an organic semiconductor selected from the group consisting of

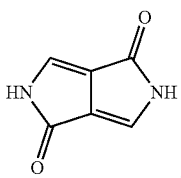

,

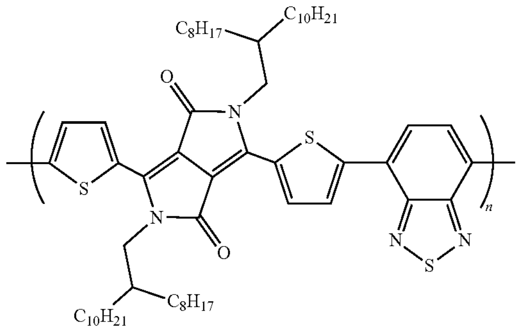

,

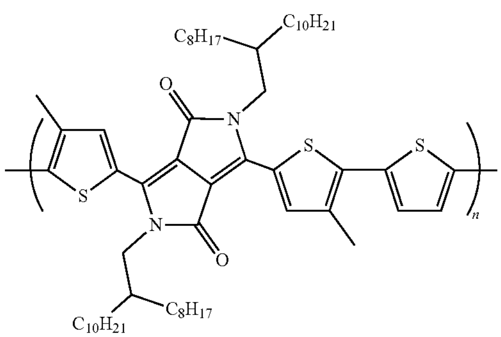

,

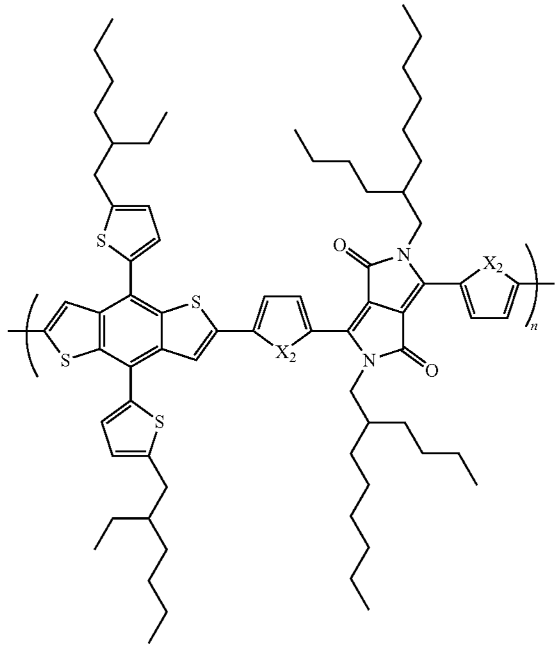

,

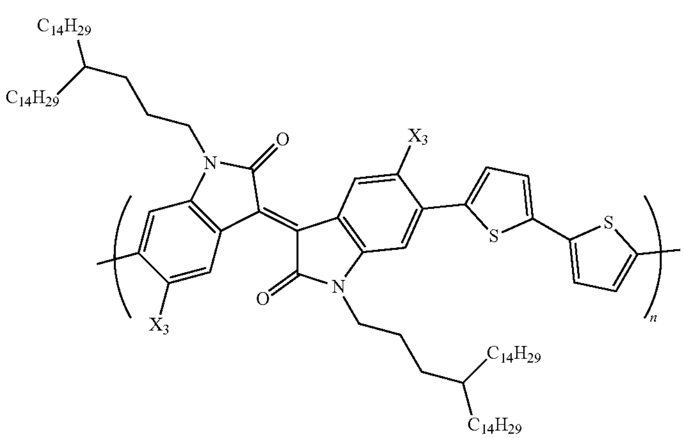

,

-continued
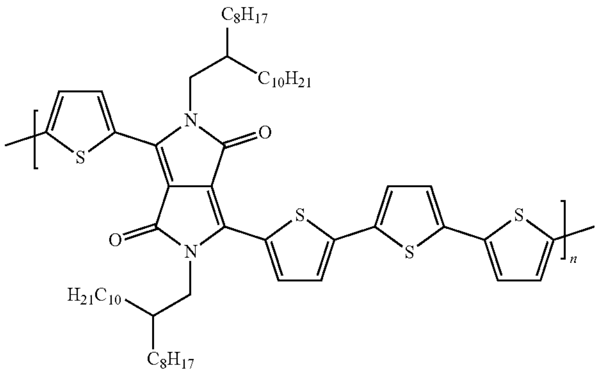
,
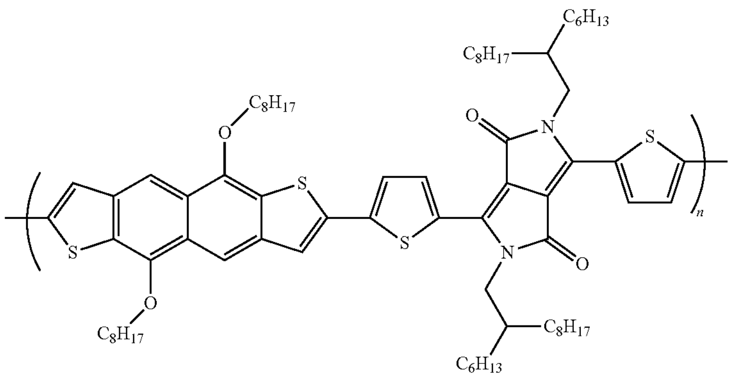
,
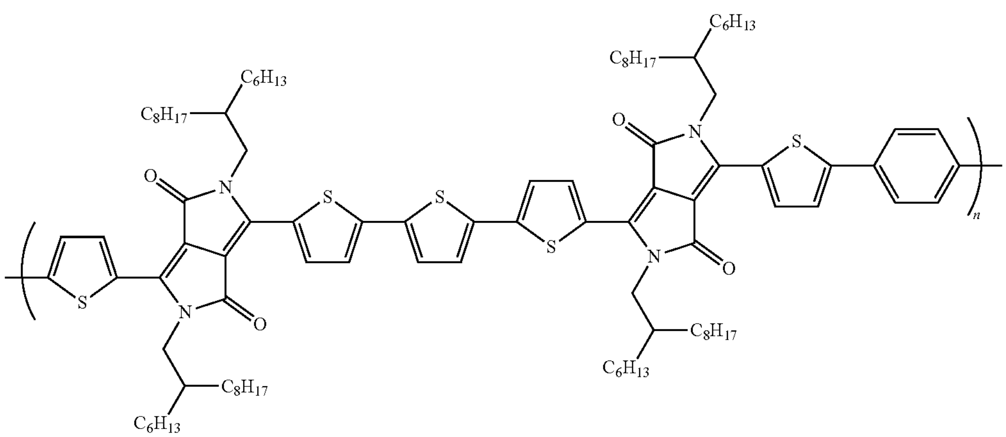
,
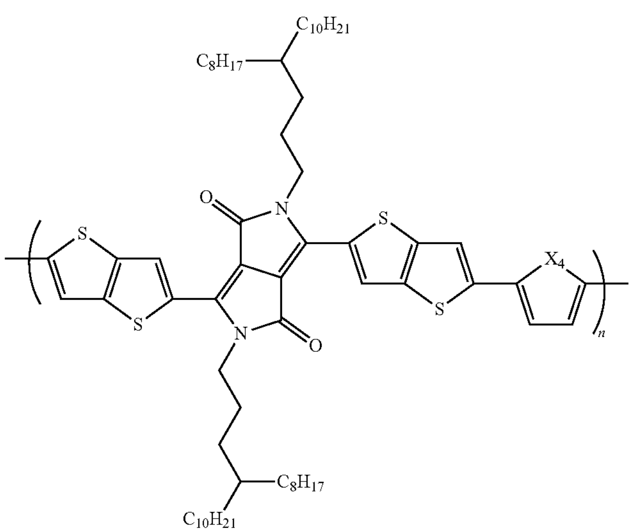
,

-continued
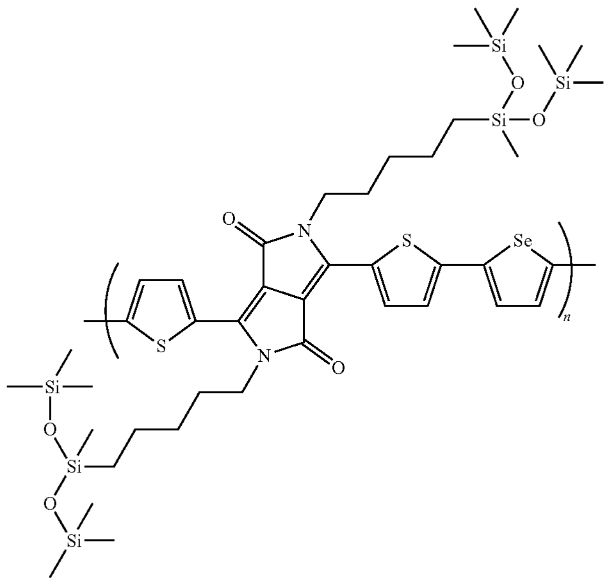
,
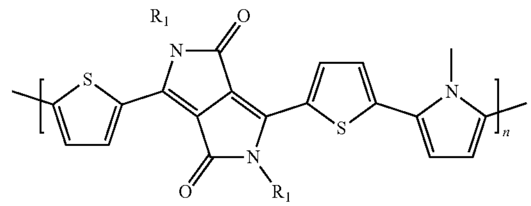
,
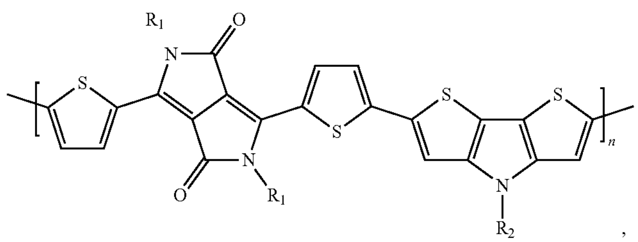
,
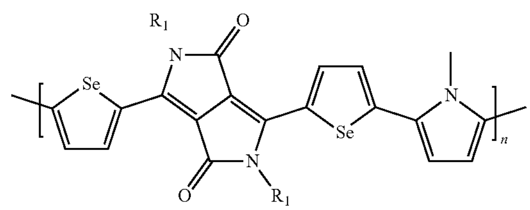
,
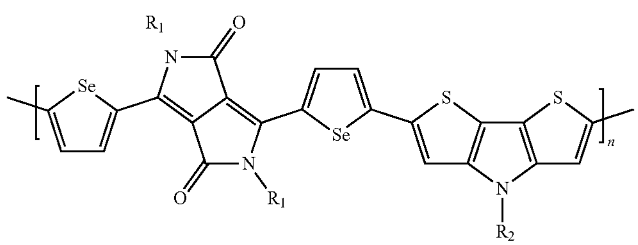
,
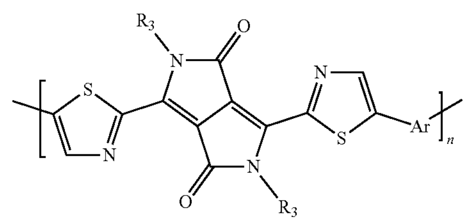
,
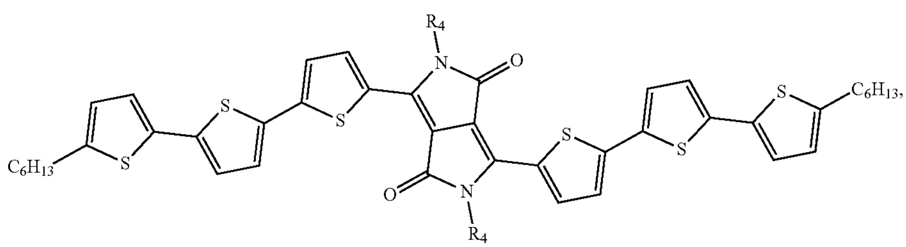
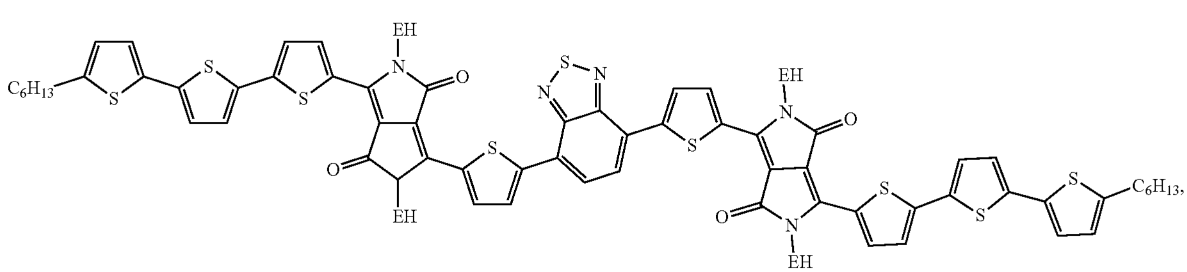

-continued
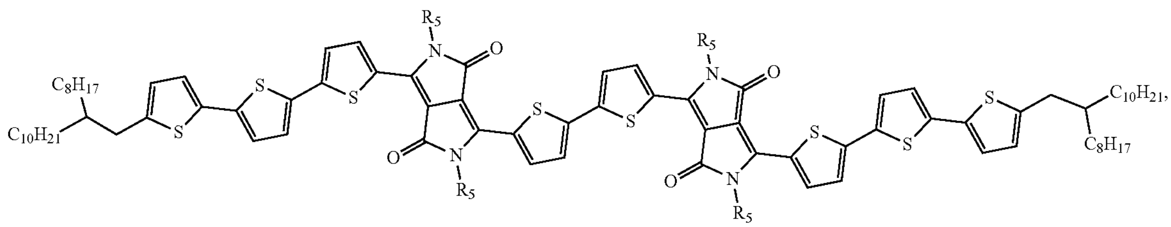
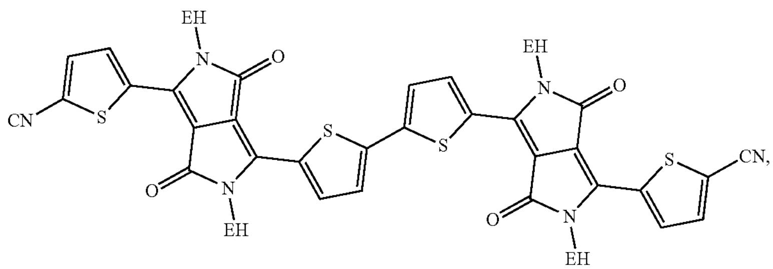
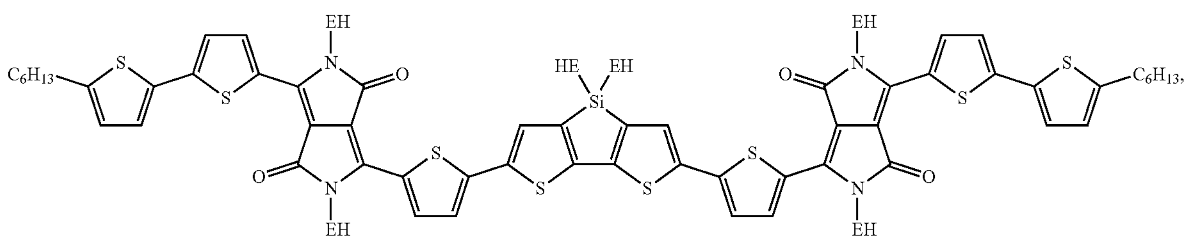
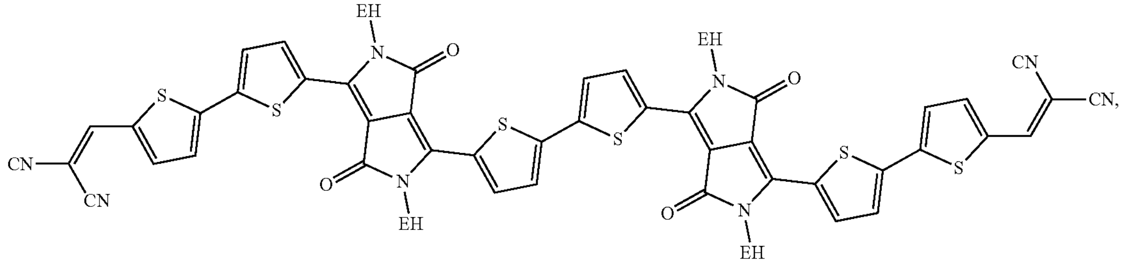
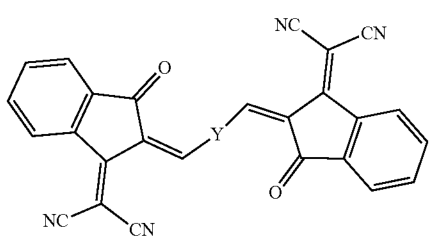
,
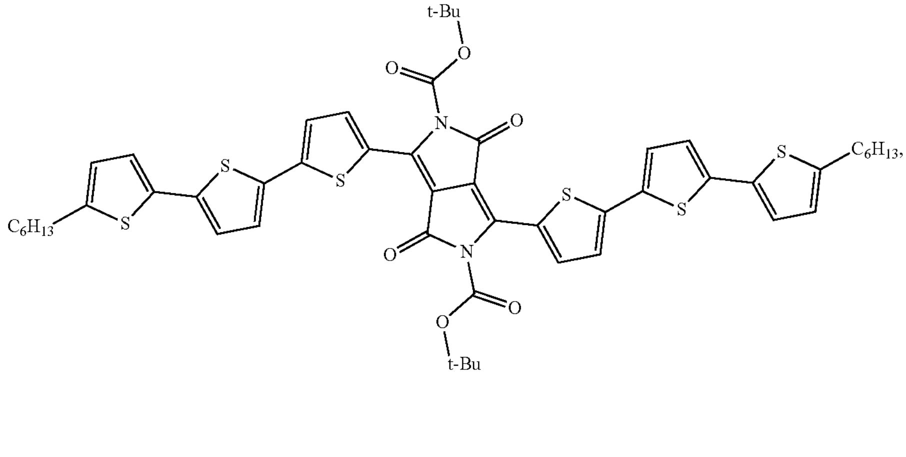

-continued
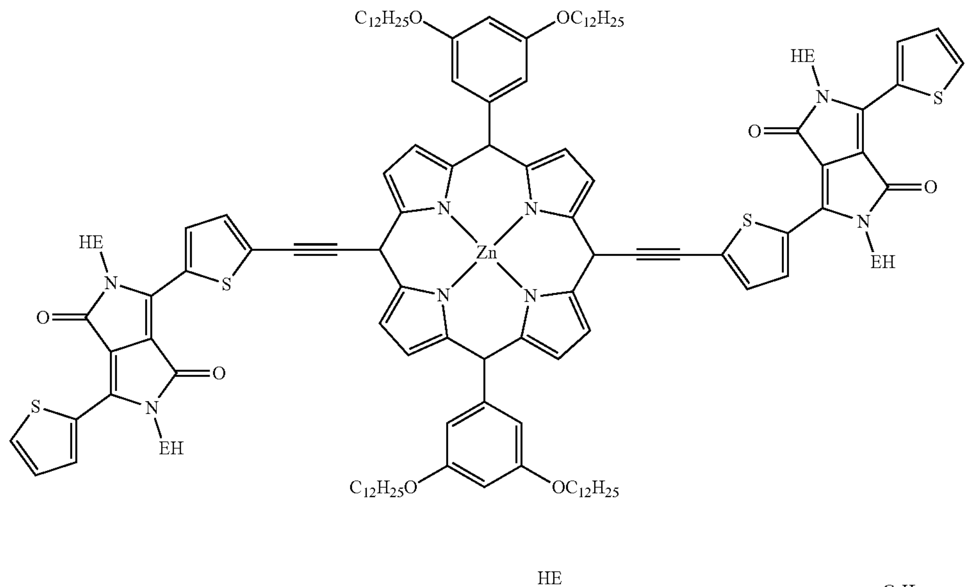
,
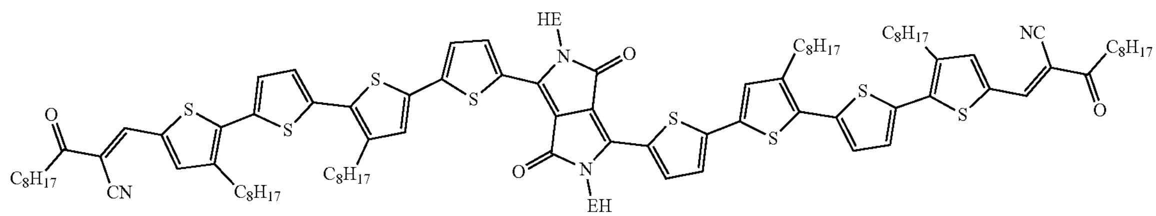
,,
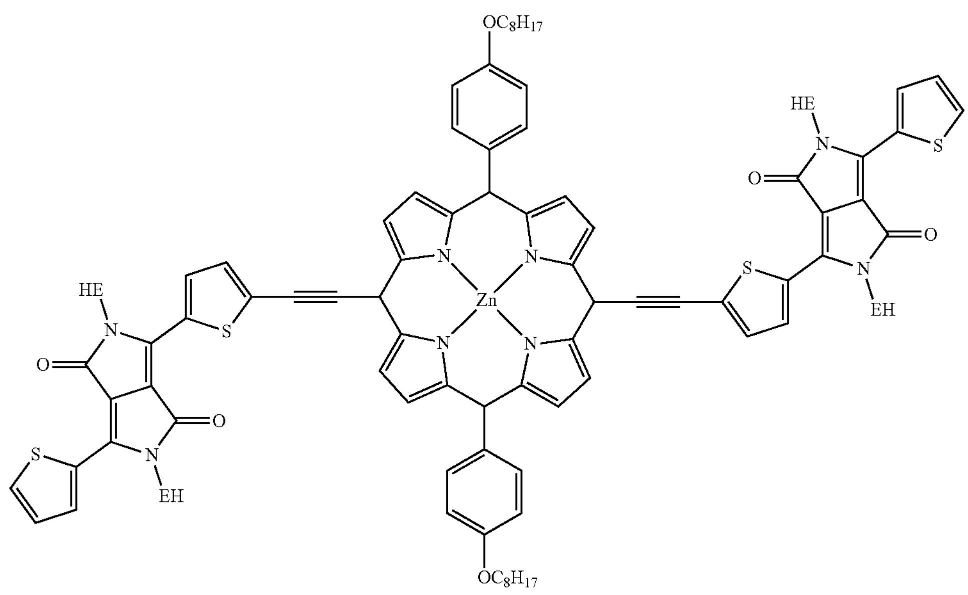
,
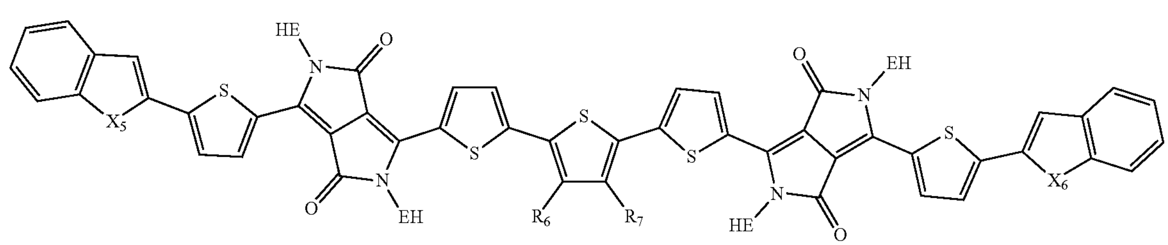
,

-continued
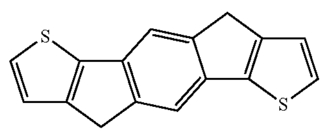
,
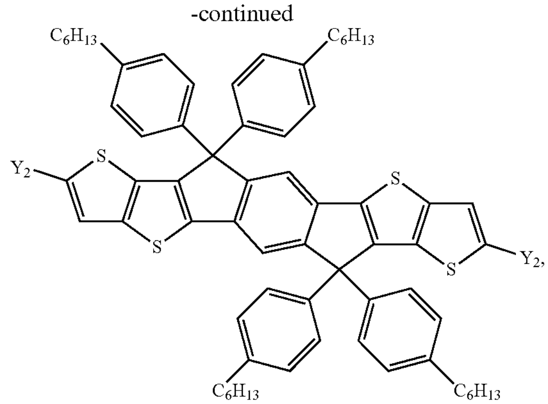
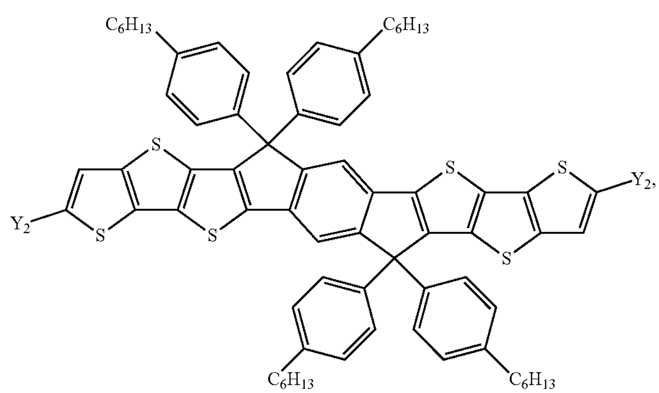
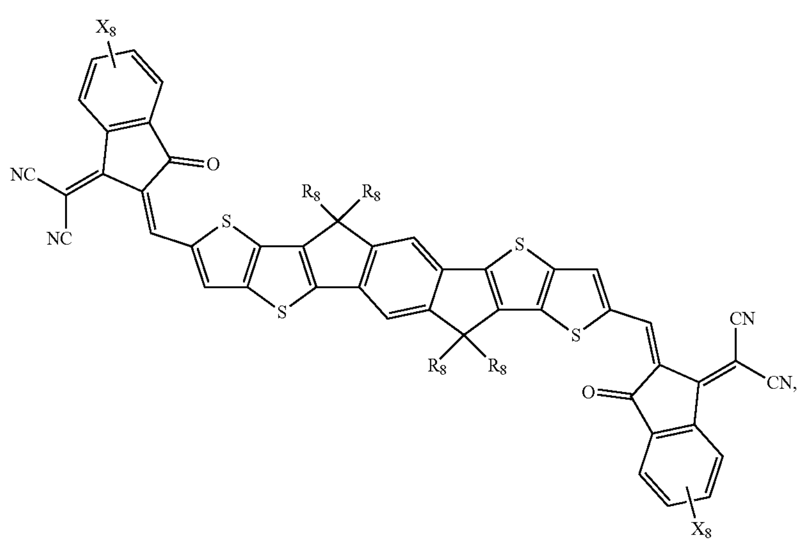

-continued
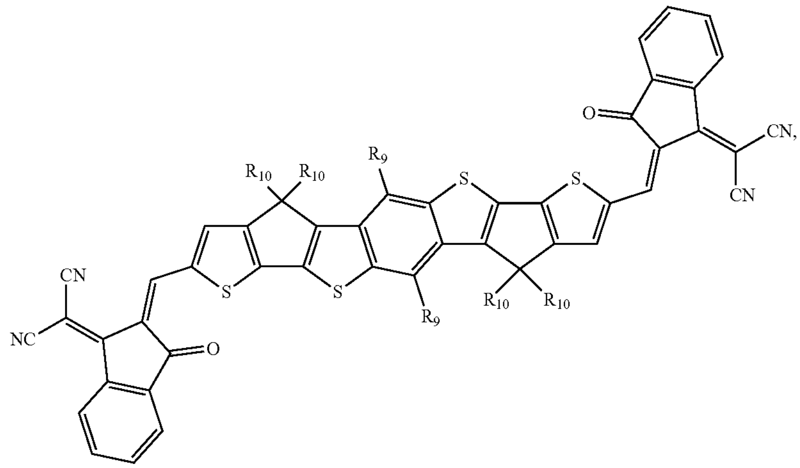
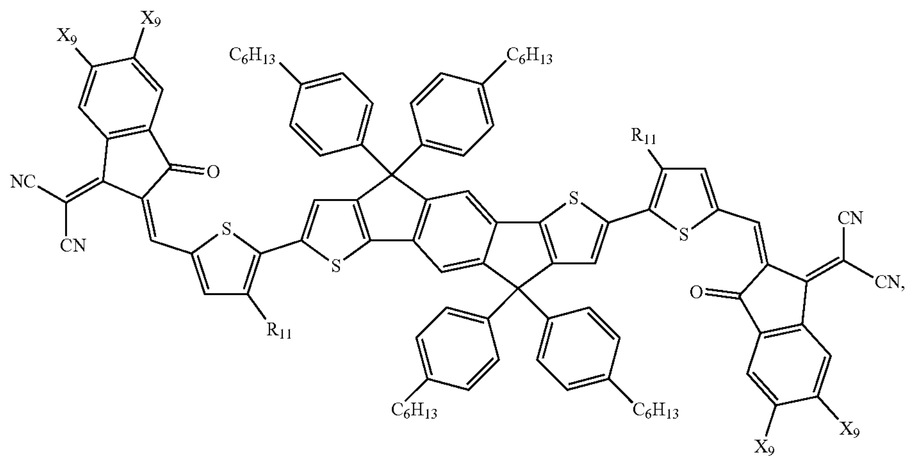
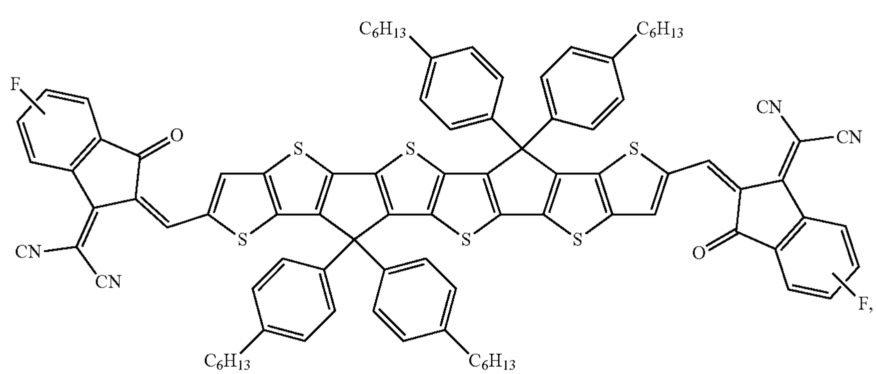

-continued
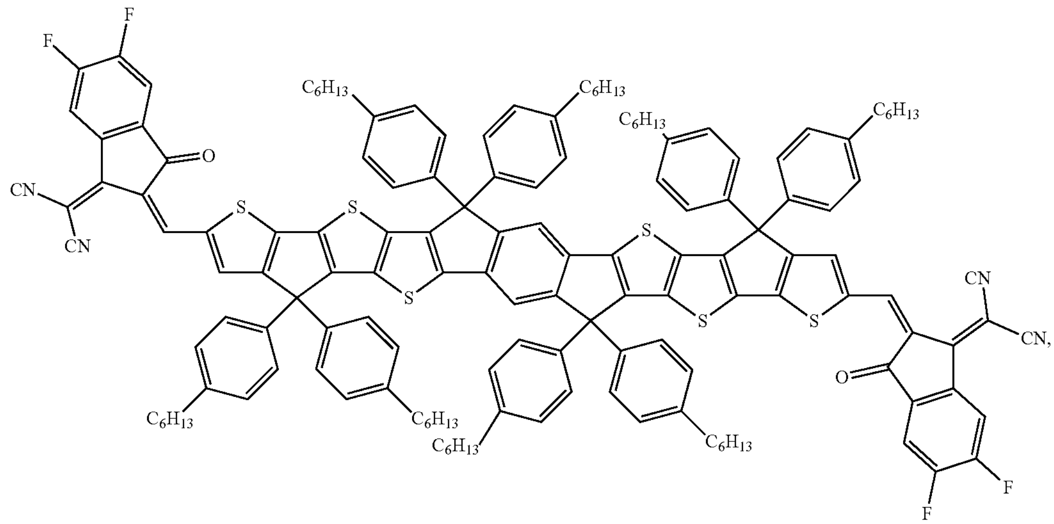
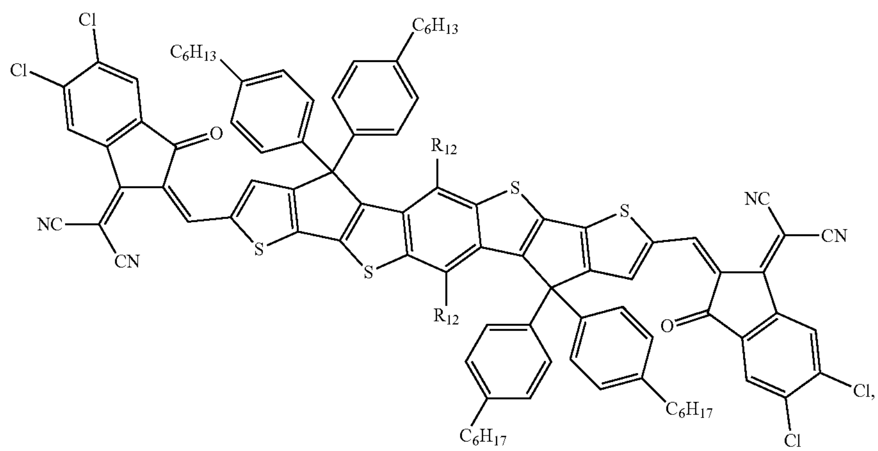
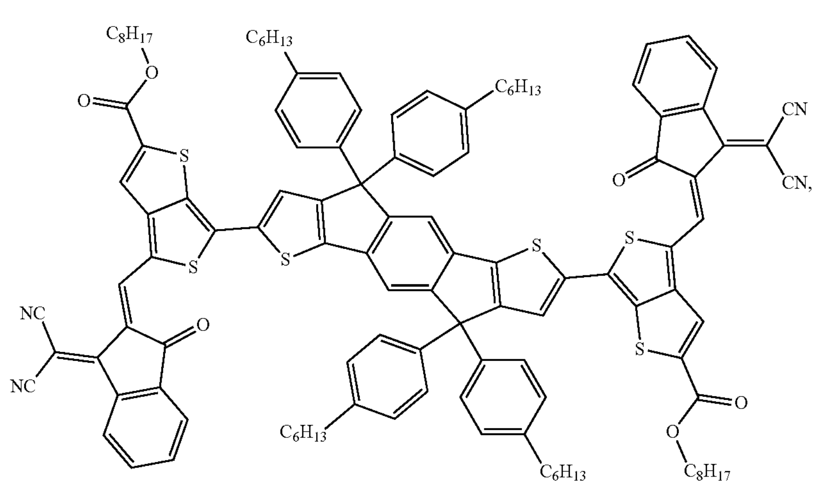

-continued
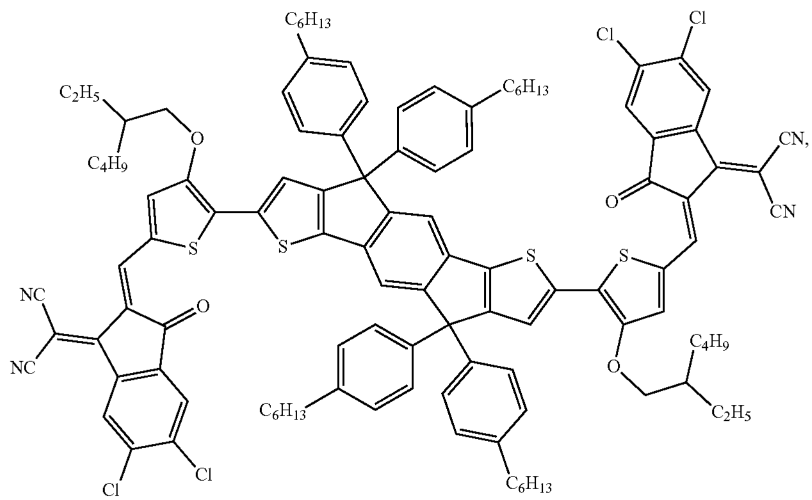
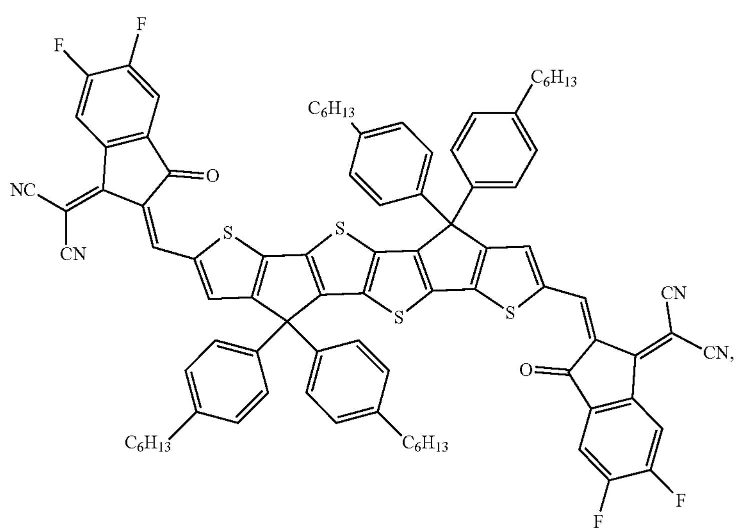
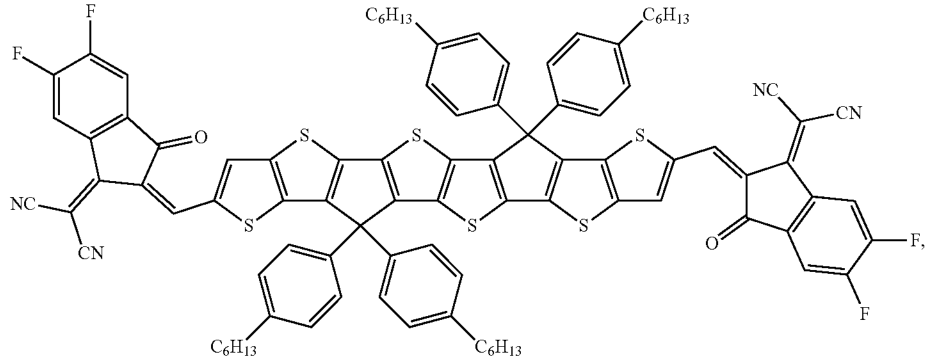

-continued
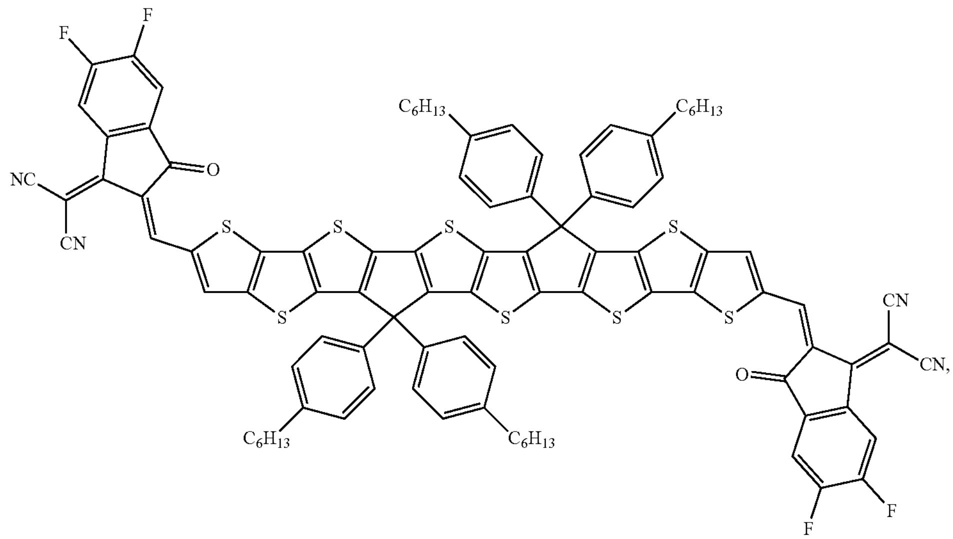
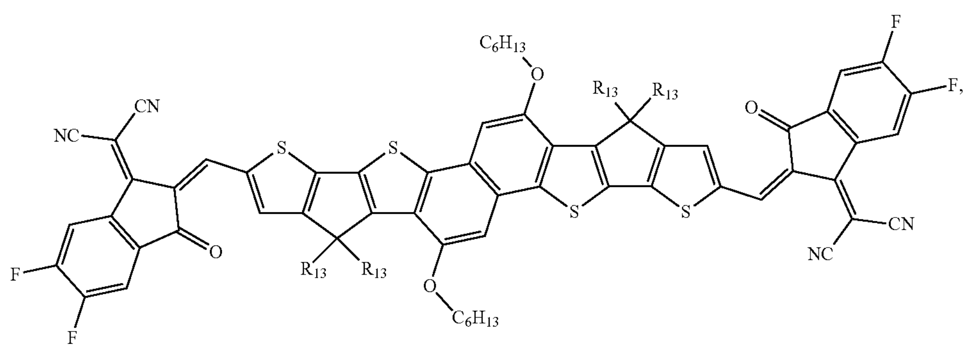
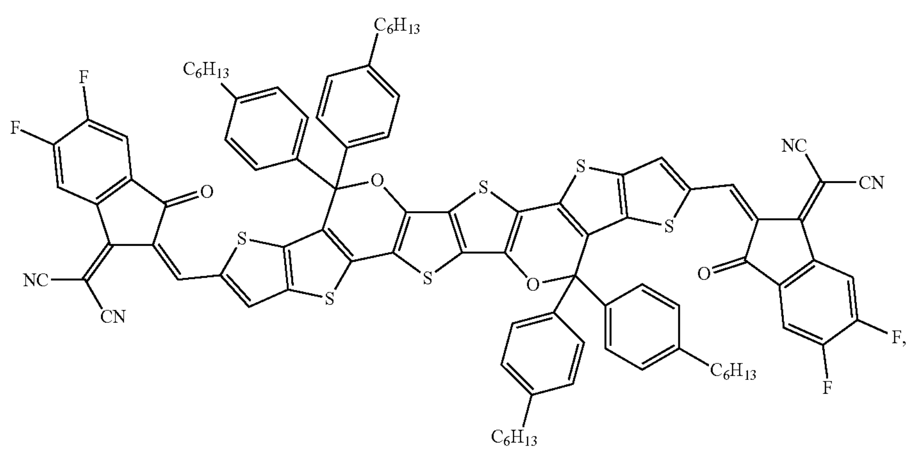

-continued
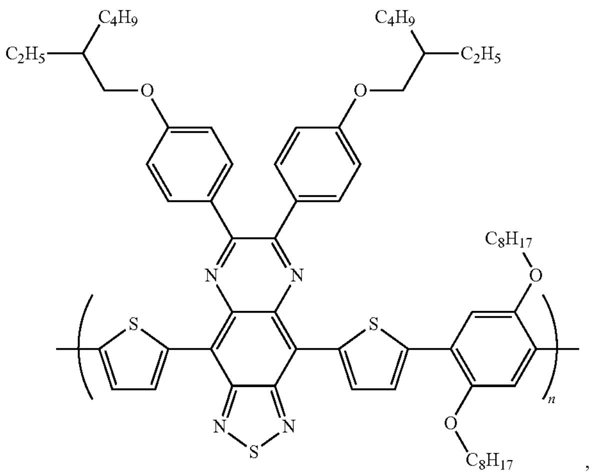
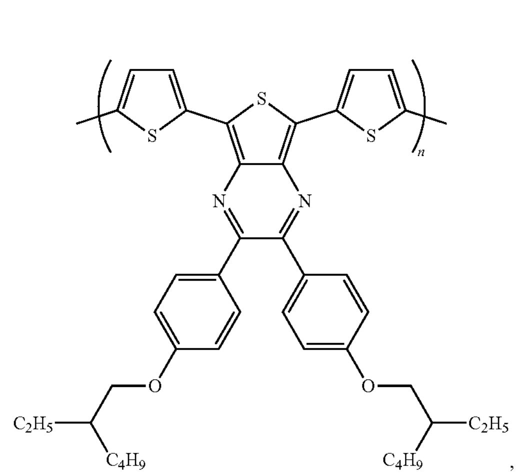
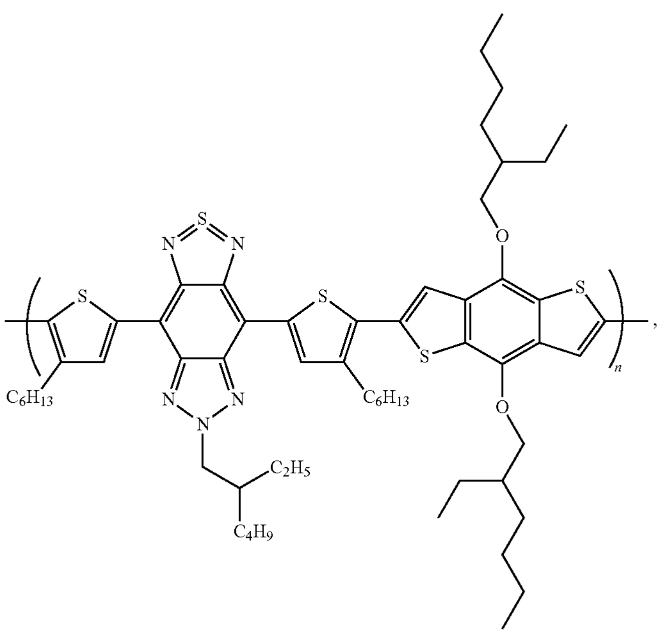
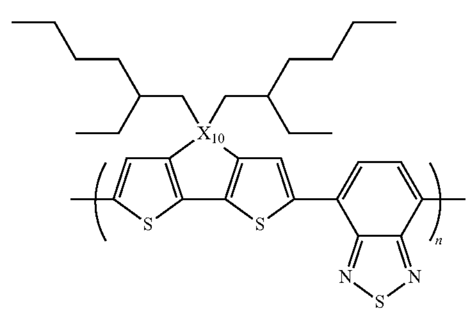
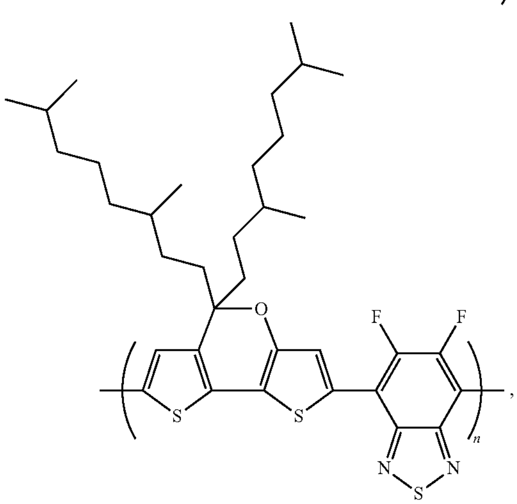
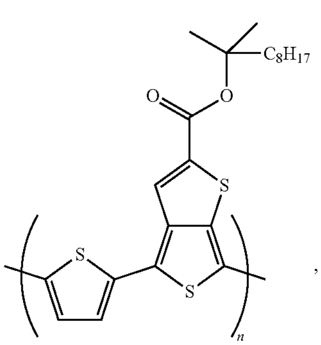

-continued
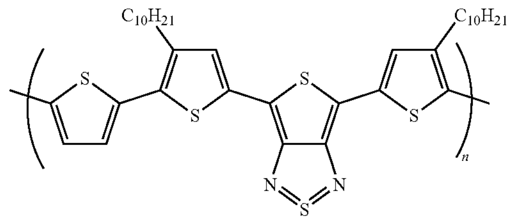
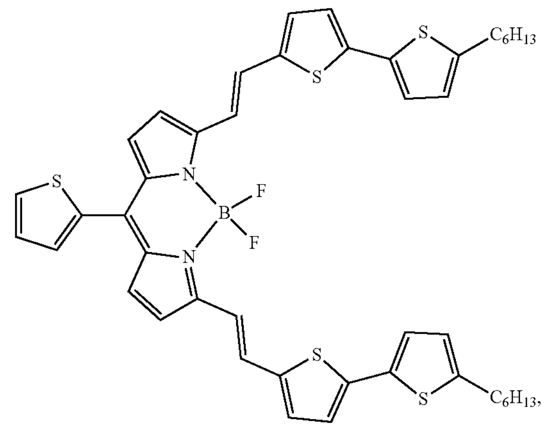
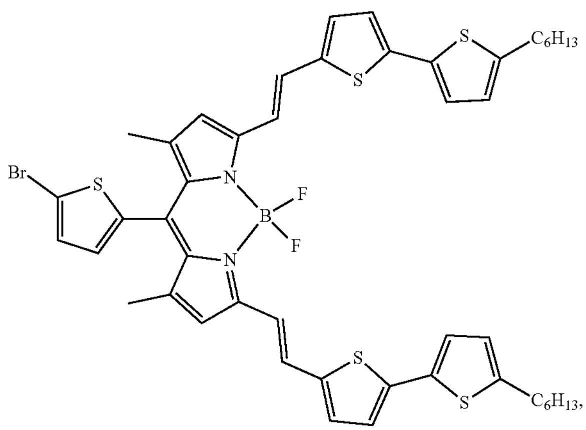
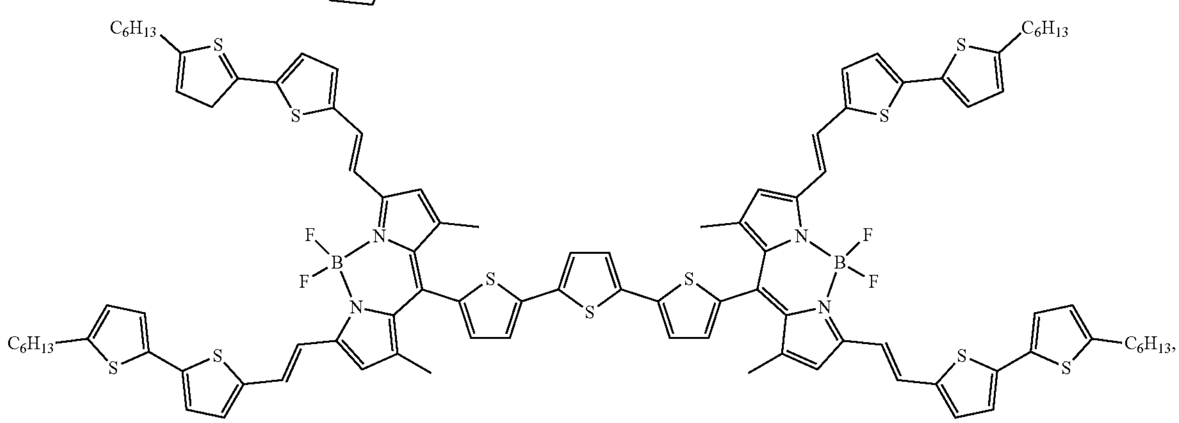
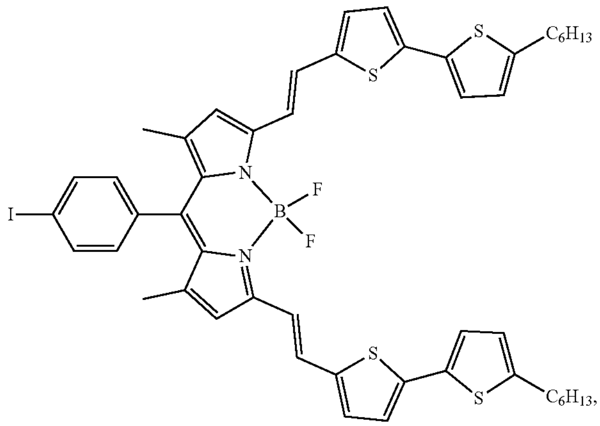

-continued

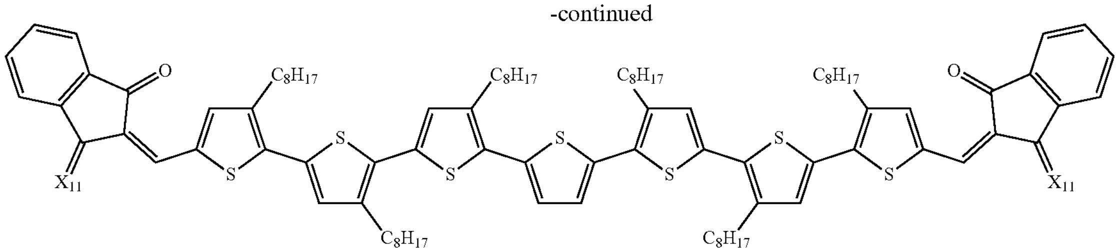

,

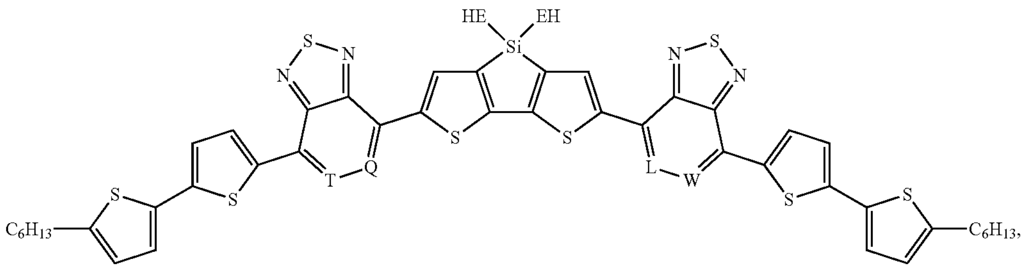

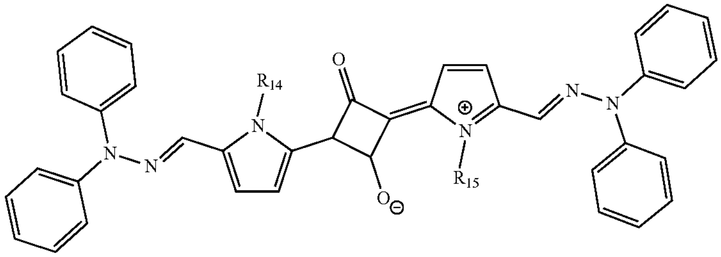

,

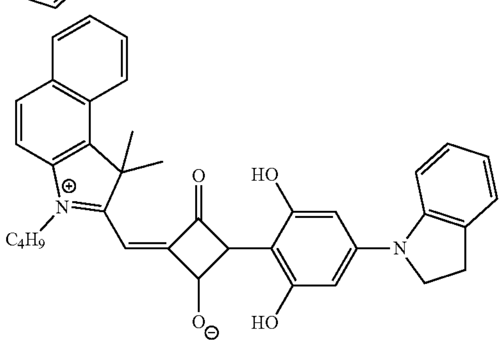

, and

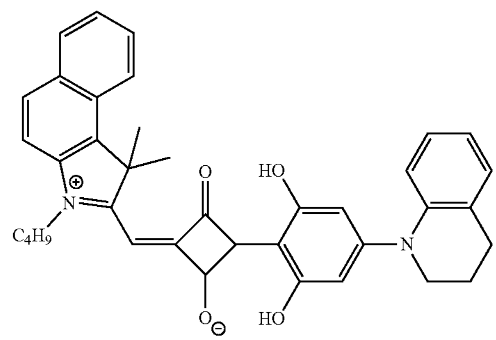

, wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

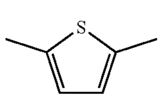

,

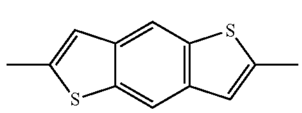

,

-continued

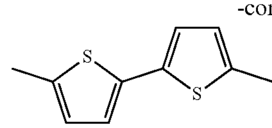

,

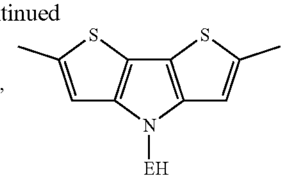

wherein EH is 2-ethylhexyl;

$R_4$ is $C_6H_{13}$ or $C_{12}H_{25}$;

$R_5$ is H or

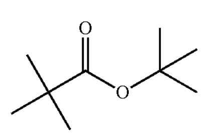

$R_6$ and $R_7$ are each independently H or $CH_3$;

$X_5$ and $X_6$ are each independently O or S;

EH is 2-ethylhexyl;

Y is selected from the group consisting of
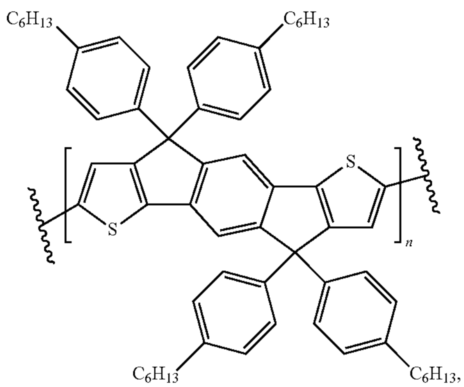
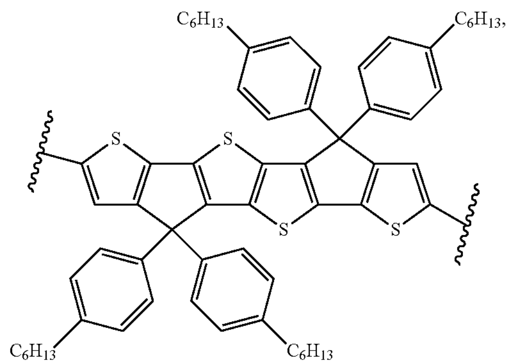
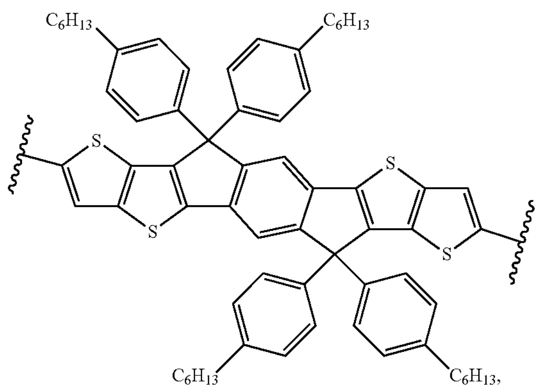
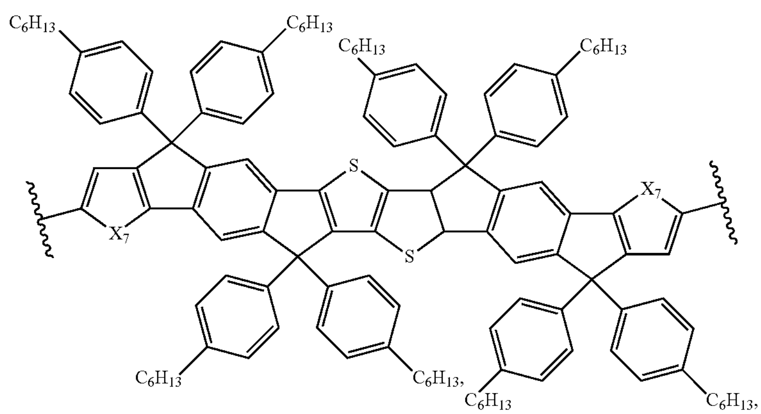
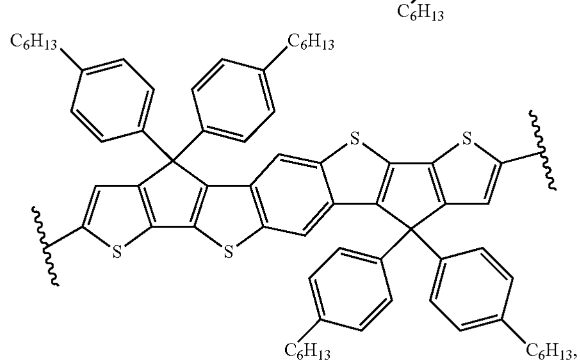
and -continued
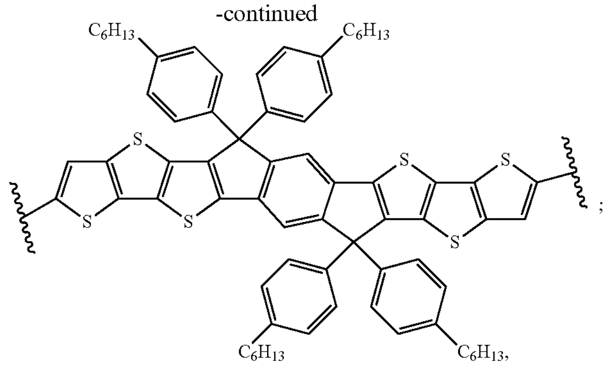
$X_7$ is S or Se;
$Y_2$ is selected from the group consisting of
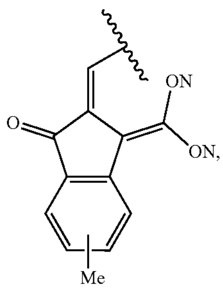
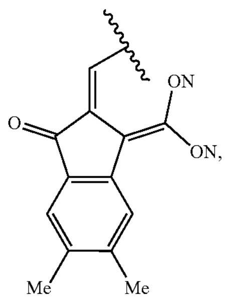
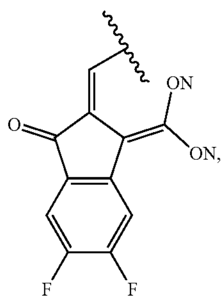
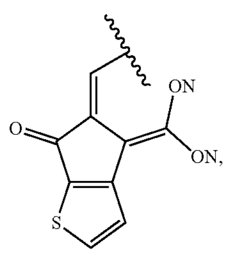
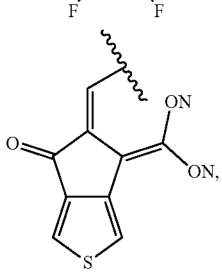
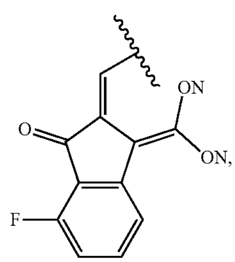
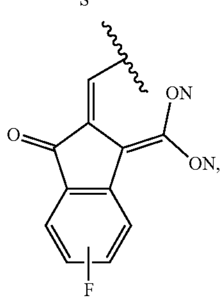
and
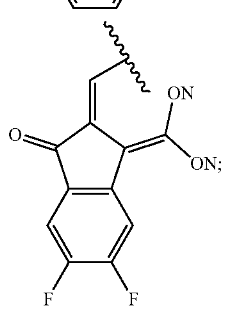
$X_8$ is H or F;
$R_8$ is
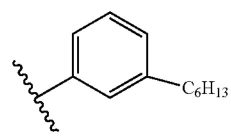
or
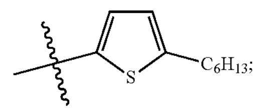
$R_9$ is
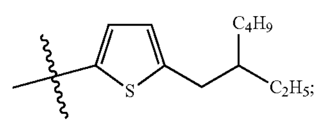
$R_{10}$ is
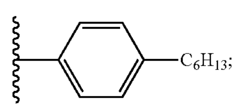
$X_9$ is H or F;
$R_{11}$ is
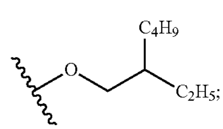
$R_{12}$ is 2-ethylhexyl;
$R_{13}$ is
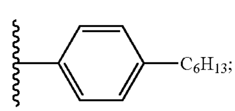

$X_{10}$ is selected from the group consisting of C, Si, and Ge;
$X_1$ is O or

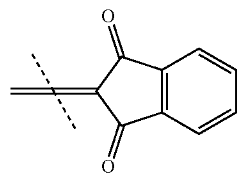

;

Q, L, T, and W are each independently CH or N;

$R_{14}$ and $R_{15}$ are each independently 2-ethylhexyl or n-dodecyl; and n is an integer between 1 and 10,000.

In certain embodiments, n is an integer between 1 and 5,000, 1 and 2,000, 1 and 1,000, 1 and 500, 1 and 300, 1 and 200, 1 and 100, 1 and 50, 1 and 25, 1 and 10, 1 and 5, or 1 and 3. In certain embodiments, n is 1. In certain embodiments, n is 2. In certain embodiments, n is 3. In certain embodiments, n is 4. As used herein, n can be selected for each polymer type of polymer.

In certain embodiments, in the single heterojunction perovskite solar cell, wherein at least one of said hole transport layer or said electron transport layer further comprises a mesoporous material, said near infrared sensitive semiconducting material is IEICO-4F (FIG. 5B).

In certain embodiments, in the single heterojunction perovskite solar cell, wherein at least one of said hole transport layer or said electron transport layer further comprises a mesoporous material, the perovskite material layer is smooth. In certain embodiments, in the single heterojunction perovskite solar cell, wherein at least one of said hole transport layer or said electron transport layer further comprises a mesoporous material, the perovskite material layer is rough.

c. Device Structure III—Stacked Perovskite/NIR Bulk Heterojunction

The third device structure (FIG. 6A-FIG. 6C) is directed to stacked perovskite/NIR bulk heterojunction (BHJ) perovskite solar cells.

Figure 6A:
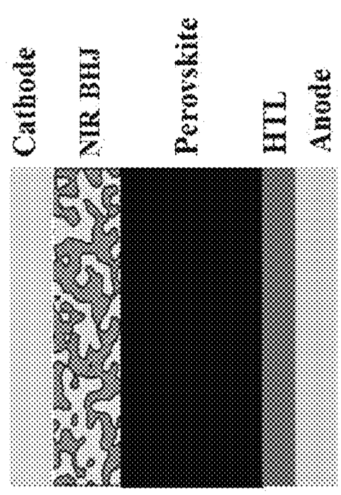
FIG. 6A shows a solar cell based on a stacked perovskite/NIR bulk heterojunction (BHJ) having the following device structure (from bottom to top): Anode/HTL/Perovskite/NIR BHJ/Cathode.
Figure 6B:
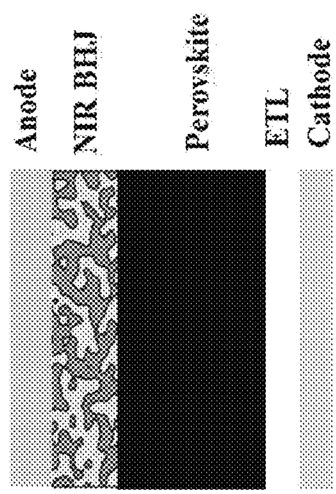
FIG. 6B shows a solar cell based on a stacked perovskite/NIR bulk heterojunction (BHJ) having the following device structure (from bottom to top): Cathode/ETL/Perovskite/NIR BHJ/Anode.
Figure 6C:
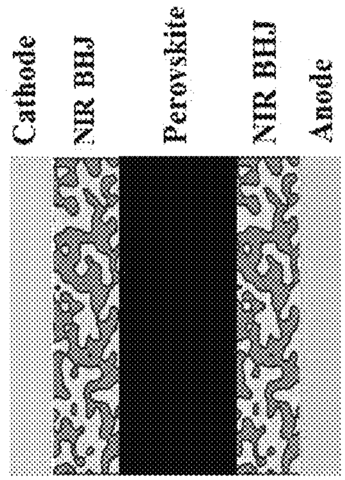
FIG. 6C shows a solar cell based on a stacked perovskite/NIR bulk heterojunction (BHJ) having the following device structure (from bottom to top): Anode/NIR BHJ/Perovskite/NIR BHJ/Cathode.

In certain embodiments, the device has a structure of Anode/HTL/Perovskite/NIR BHJ/Cathode (FIG. 6A). In certain embodiments, the device has a structure of Cathode/ETL/Perovskite/NIR BHJ/Anode (FIG. 6B). In certain embodiments, the device has a structure of Anode/NIR BHJ/Perovskite/NIR BHJ/Cathode (FIG. 6C).

Mechanism of Action

In general, the NIR BHJ layers contain one or more electron donors and one or more electron acceptors, at least one of which can absorb NIR light. The hole (electron) generated from the NIR materials under illumination are transferred to the perovskite layer, and are then collected at the electrodes. The detailed mechanism of this device type is described below:

1) The NIR contact layers absorb light with a wavelength greater than 780 nm, and then generate exciton (hole-electron pair) and/or free charge carriers;
2) The exciton and/or free charge carriers generated in the NIR layer diffuse to the interface between the perovskite and the NIR BHJ contact layer, or to the interface between the electron donor and electron acceptor within the BHJ layer. Then, the exciton dissociates to holes and electrons at the interface due to the difference in energy levels between the perovskite and NIR contact layers, or between the electron donor and electron acceptor;
3) The holes (electrons) generated in the NIR BHJ layers transfer to the perovskite layers and then are collected at the electrodes.

In certain embodiments, the thickness of the cathode layer in device 3 is between about 1 nm and 100 μm. In certain embodiments, the thickness of the cathode layer in device 3 is between about 1 nm and about 500 nm, about 50 nm and about 750 nm, about 100 nm and about 1 μm, about 20 μm and 1 about 100 μm, or about 50 μm and about 75 μm.

In certain embodiments, the thickness of the anode layer in device 3 is between about 1 nm and 100 μm. In certain embodiments, the thickness of the anode layer in device 3 is between about 1 nm and about 500 nm, about 50 nm and about 750 nm, about 100 nm and about 1 μm, about 20 μm and 1 about 100 m, or about 50 μm and about 75 m.

In certain embodiments, the thickness of the perovskite layer in device 3 is between about 1 nm and 100 μm. In certain embodiments, the thickness of the perovskite layer in device 3 is between about 1 nm and about 500 nm, about 50 nm and about 750 nm, about 100 nm and about 1 μm, about 20 m and 1 about 100 μm, or about 50 m and about 75 μm.

In certain embodiments, the thickness of the HTL layer in device 3 is between about 0.1 nm and 10 μm. In certain embodiments, the thickness of the HTL layer in device 3 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the thickness of the ETL layer in device 3 is between about 0.1 nm and 10 μm. In certain embodiments, the thickness of the ETL layer in device 3 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the thickness of the NIR BHJ layer in device 3 is between about 0.1 nm and 10 μm. In certain embodiments, the thickness of the NIR BHJ layer in device 3 is between about 0.1 nm and about 1 nm, about 10 nm and 100 nm, about 75 nm and 500 nm, about 50 nm and about 750 nm, about 100 nm and about 1 μm, about 1 μm and 10 μm, about 2 μm and about 8 μm, or about 3 μm and about 5 μm.

In certain embodiments, the subject matter described herein is directed to a stacked bulk heterojunction perovskite solar cell, comprising:

a first electrode;

a transport layer disposed on the first electrode;

a perovskite material layer disposed on the transport layer;

a bulk heterojunction layer disposed on the perovskite material layer; and a second electrode disposed on the bulk heterojunction layer, wherein said bulk heterojunction layer comprises one of more electron donors and one or more electron acceptors, and wherein at least one of said electron donors and at least one of said electron acceptors is a diketopyrrole (DPP) near infrared sensitive polymer or compound selected from the group consisting of

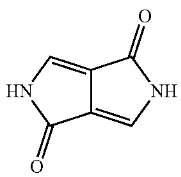
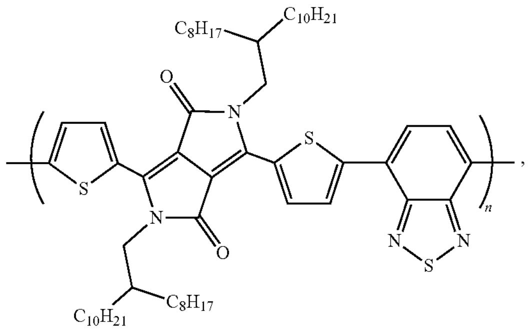
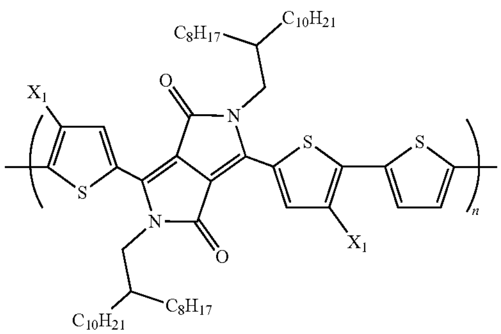
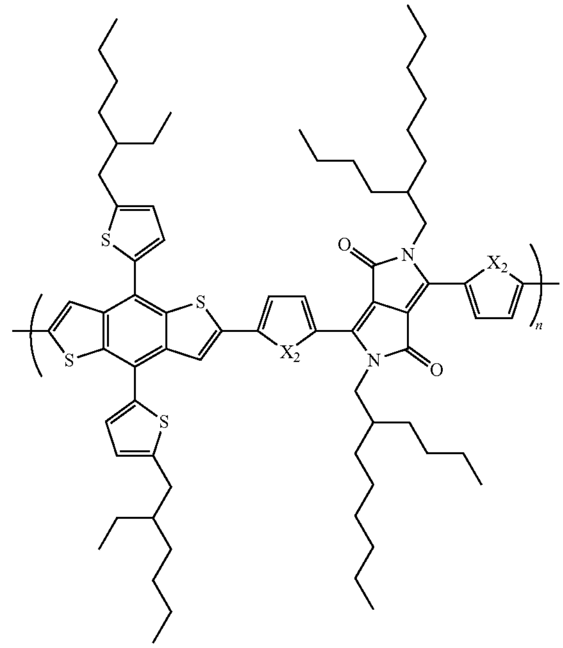
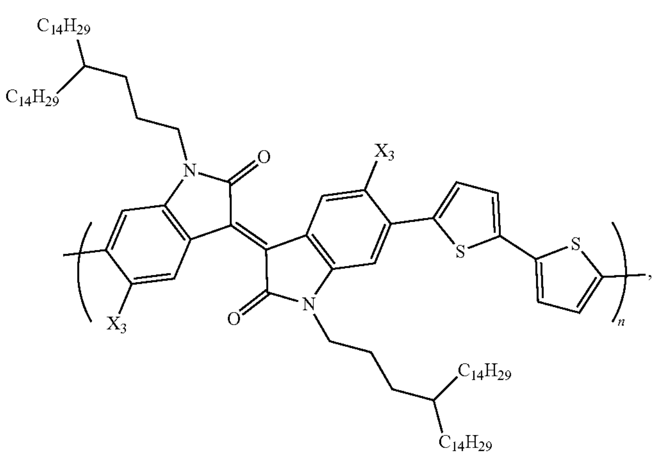

-continued
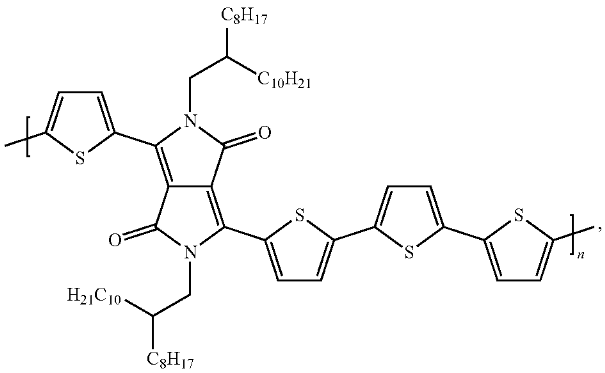
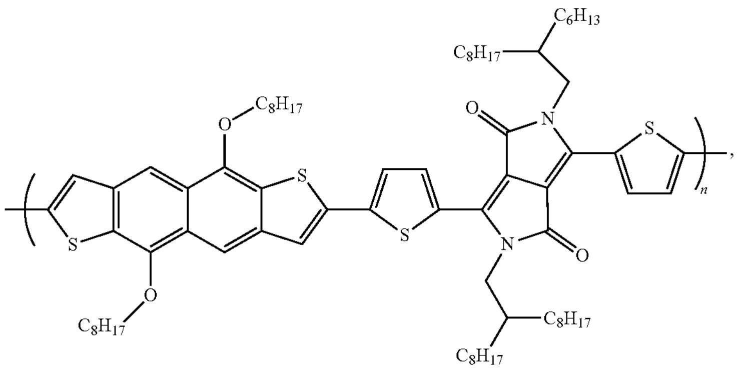
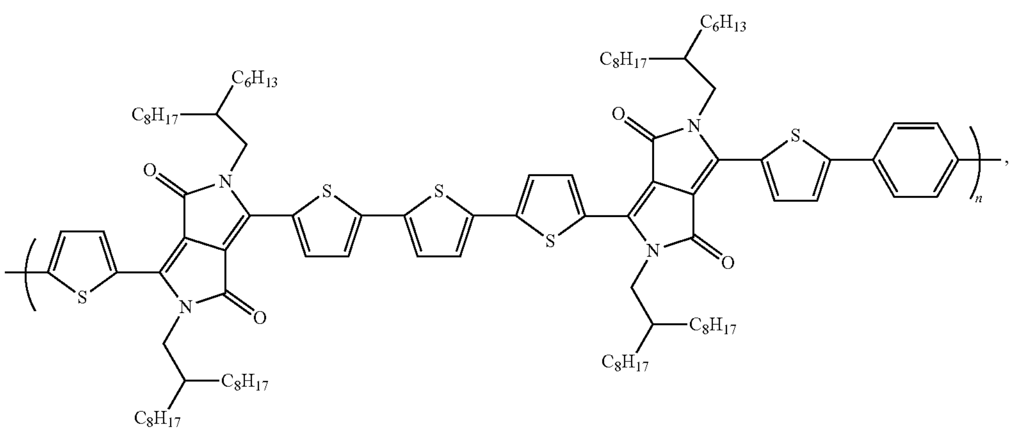
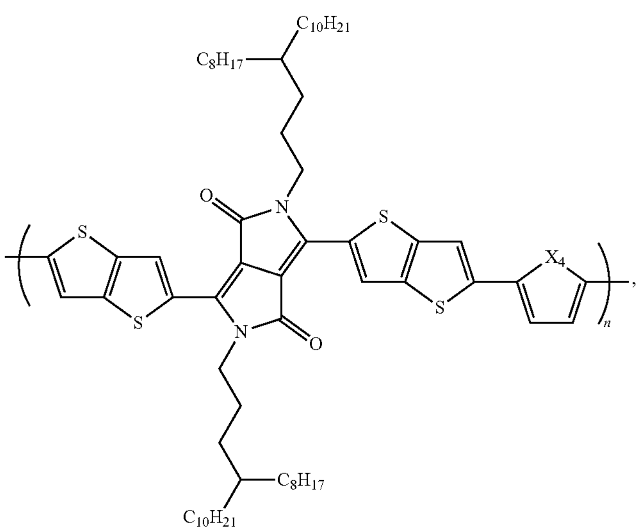

-continued
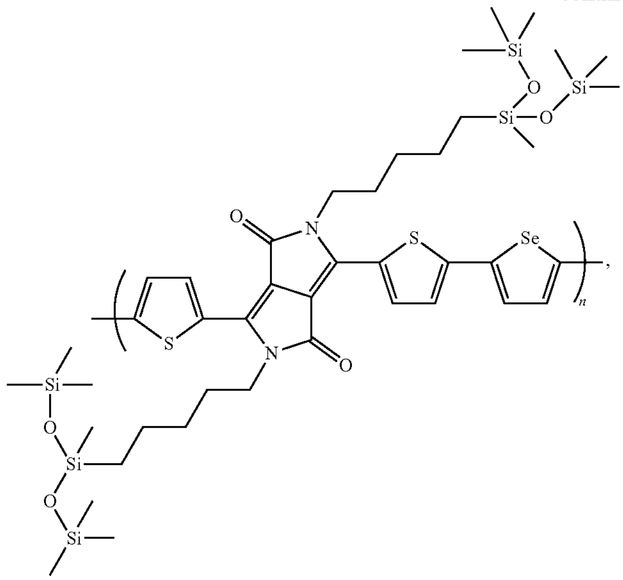
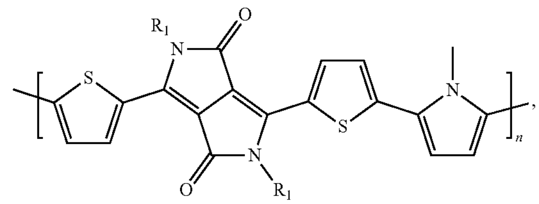
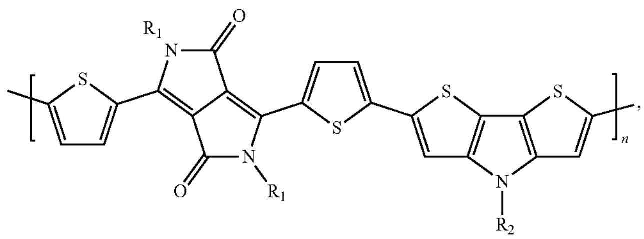
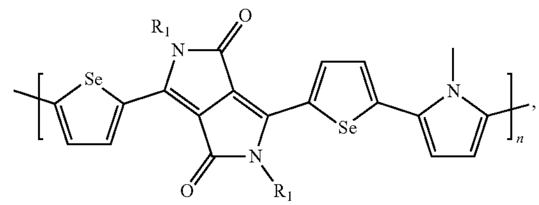
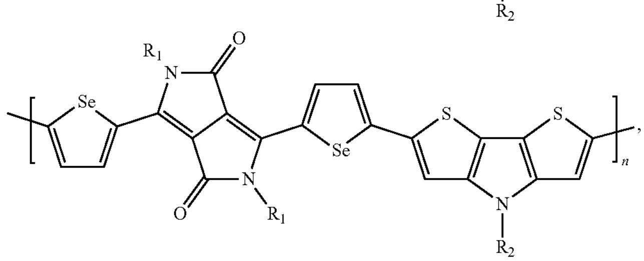
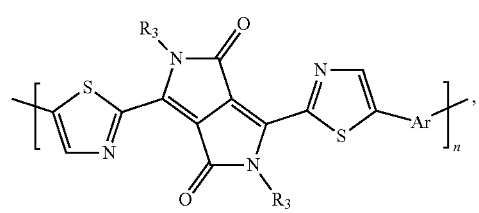
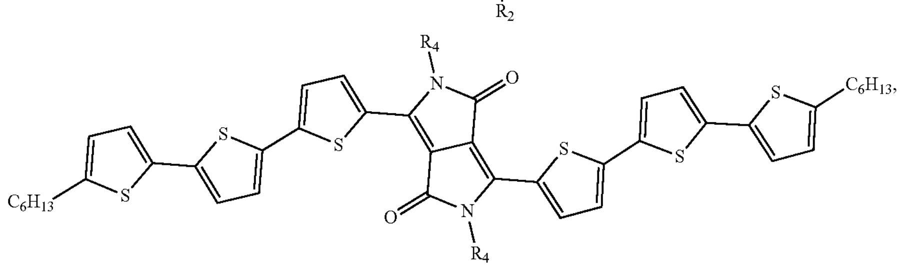
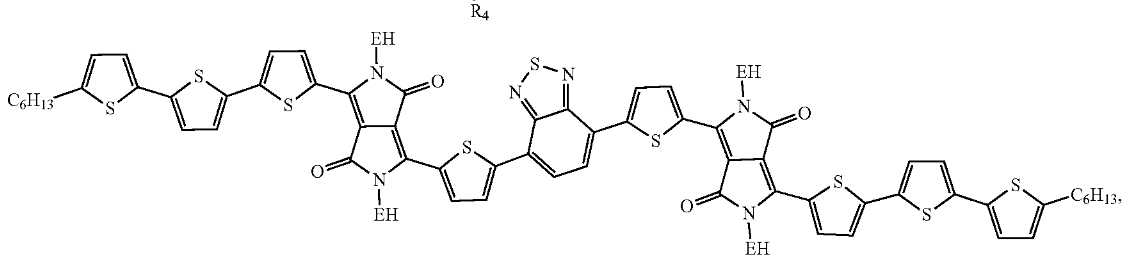
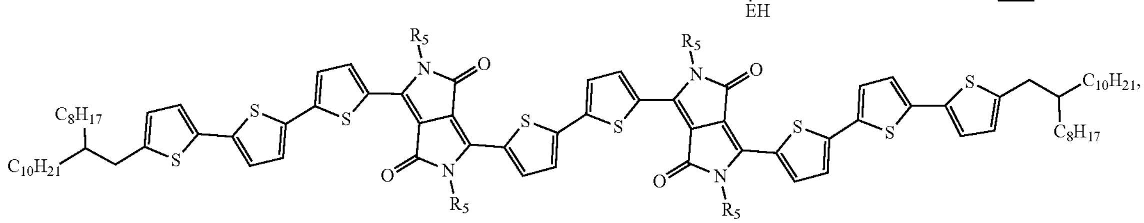

-continued
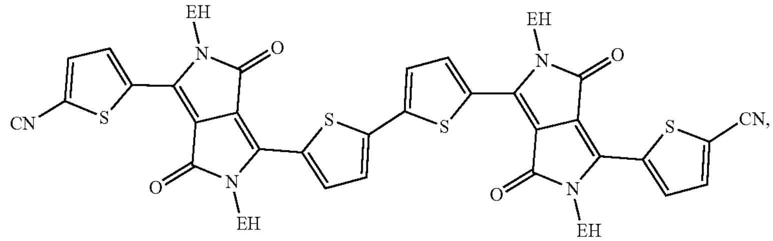
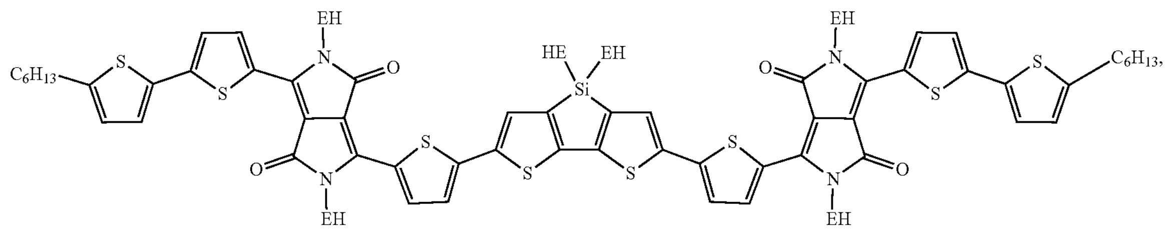
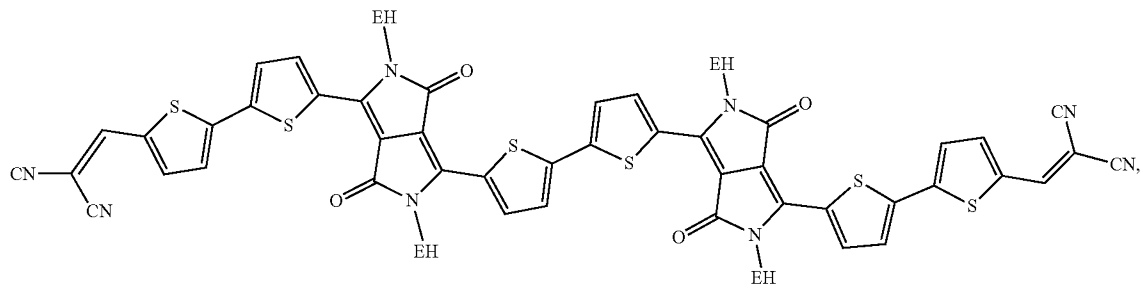
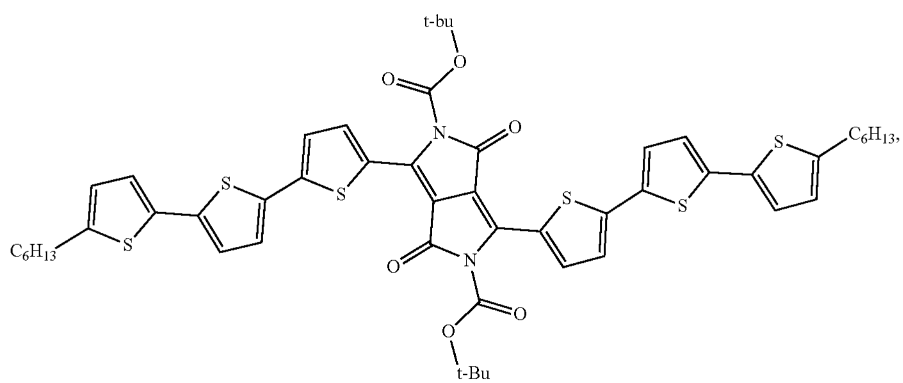
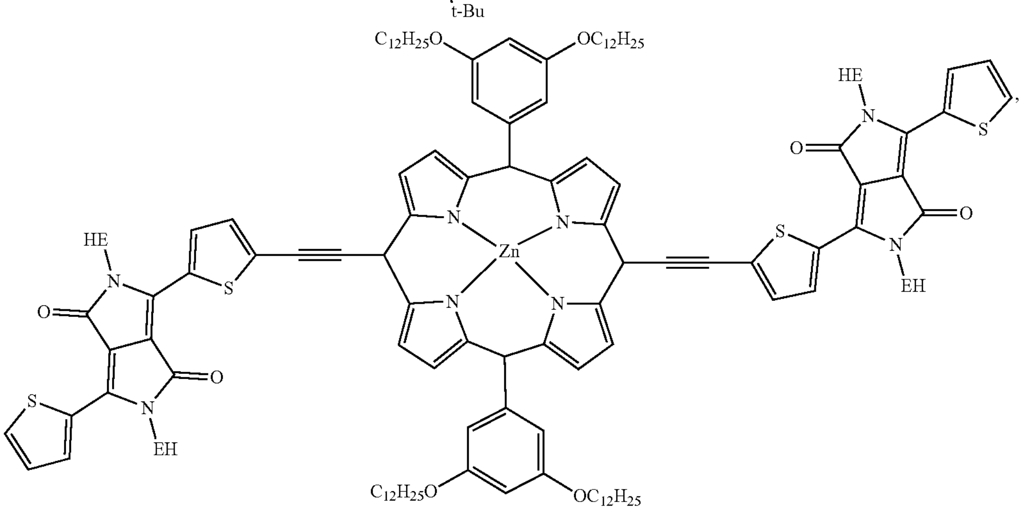

-continued

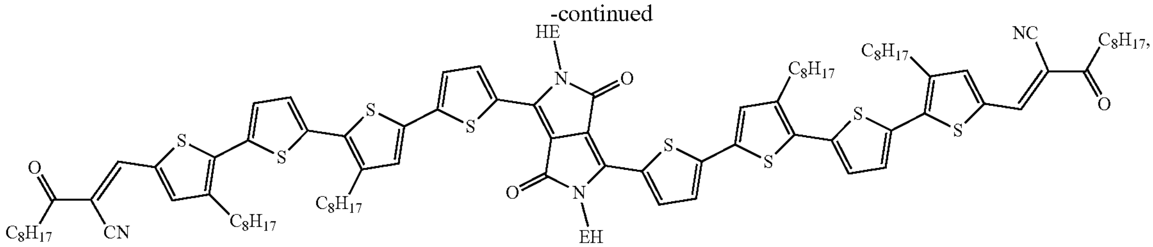

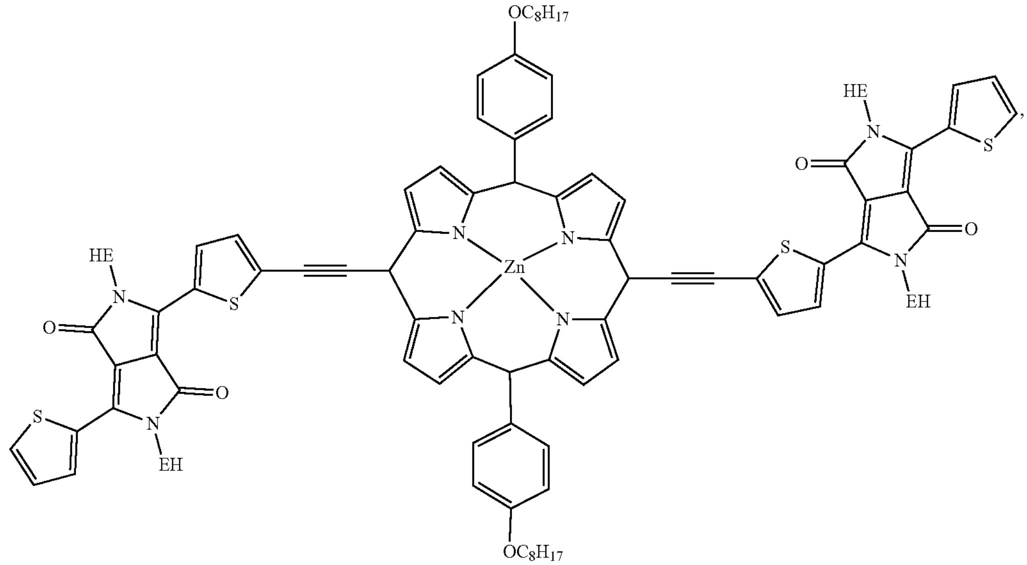

and

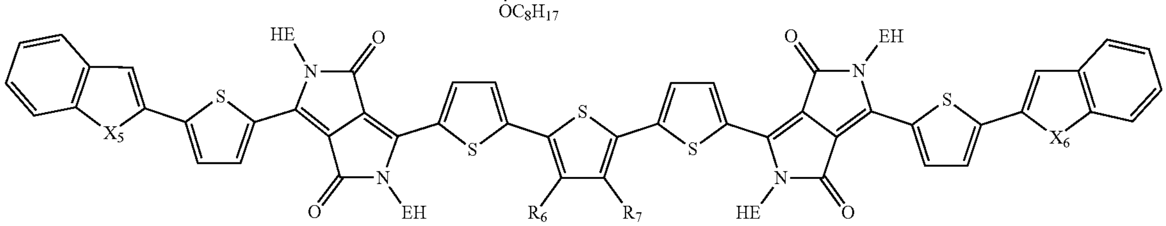

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

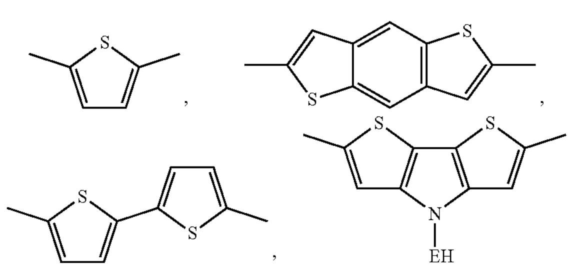

wherein EH is 2-ethylhexyl;

$R_4$ is $C_6H_{13}$ or $C_{12}H_{25}$;

$R_5$ is H or

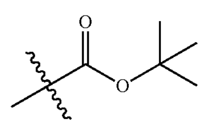 [SMILES: *C(=O)OC(C)(C)C]

$R_6$ and $R_7$ are each independently H or $CH_3$;

$X_5$ and $X_6$ are each independently O or S;

EH is 2-ethylhexyl; and n is an integer between 1 and 10,000.

In certain embodiments, n is an integer between 1 and 5,000, 1 and 2,000, 1 and 1,000, 1 and 500, 1 and 300, 1 and 200, 1 and 100, 1 and 50, 1 and 25, 1 and 10, 1 and 5, or 1 and 3. In certain embodiments, n is 1. In certain embodiments, n is 1. In certain embodiments, n is 2. In certain embodiments, n is 3. In certain embodiments, n is 4. As used herein, n can be selected for each polymer type of polymer.

In certain embodiments, in the above stacked bulk heterojunction perovskite solar cell, the near infrared sensitive polymer or compound is capable of absorbing light with a wavelength of at least 780 nm. In certain embodiments, said near infrared sensitive polymer or compound is capable of absorbing light with a wavelength greater than 780 nm. In certain embodiments, said near infrared sensitive polymer or compound is capable of absorbing light with a wavelength of at least 790 nm, at least 800 nm, at least 810 nm, at least 820 nm, at least 825, at least 830, or at least 835 nm.

In certain embodiments, the subject matter described herein is directed to a stacked bulk heterojunction perovskite solar cell, comprising:

a first electrode;

a transport layer disposed on the first electrode;

a perovskite material layer disposed on the transport layer;

a bulk heterojunction layer disposed on the perovskite material layer; and a second electrode disposed on the bulk heterojunction layer, wherein said bulk heterojunction layer comprises one of more electron donors and one or more electron acceptors, and wherein said one or more electron donors and said one or more electron acceptors is a near infrared sensitive inorganic semiconductor material selected from the group consisting of PbS, CdTe, CIGS, GaAs, PbS, Si, a tin-containing hybrid perovskite $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3)$, and $Sb_2Se_3$.

In certain embodiments, in the tin-containing hybrid perovskite, $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3)$.

In certain embodiments, in the above stacked bulk heterojunction perovskite solar cell, the near infrared sensitive inorganic semiconductor material is capable of absorbing light with a wavelength of at least 780 nm. In certain embodiments, the near infrared sensitive inorganic semiconductor material is capable of absorbing light with a wavelength greater than 780 nm. In certain embodiments, the near infrared sensitive inorganic semiconductor material is capable of absorbing light with a wavelength of at least 790 nm, at least 800 nm, at least 810 nm, at least 820 nm, at least 825, at least 830, or at least 835 nm.

In certain embodiments, in the above stacked bulk heterojunction perovskite solar cell, the transport layer is an electron transport layer, comprising a material selected from the group consisting of C60, BCP, $TiO_2$, $SnO_2$, $PC_{61}BM$, $PC_{71}BM$, ICBA, ZnO, ZrAcac, LiF, Ca, Mg, TPBI, PFN, and a combination thereof. In certain embodiments, the transport layer is an electron transport layer, comprising $SnO_2$.

In certain embodiments, in the above stacked bulk heterojunction perovskite solar cell, the transport layer is hole transport layer, comprising a material selected from the group consisting of PTAA, Spiro-OMeTAD, PEDOT:PSS, NiO, $MoO_3$, $V_2O_5$, Poly-TPD, EH44, and a combination thereof. In certain embodiments, the transport layer is a hole transport layer, comprising PTAA.

In certain embodiments, the subject matter described herein is directed to a stacked bulk heterojunction solar cell, comprising:

a first electrode;

a transport layer disposed on the first electrode;

a perovskite material layer disposed on the transport layer;

a bulk heterojunction layer disposed on the perovskite material layer;

and a second electrode disposed on the bulk heterojunction layer, wherein said bulk heterojunction layer comprises one of more electron donors and one or more electron acceptors, and wherein at least one of said electron donors and at least one of said electron acceptors is a near infrared sensitive organic compound selected from the group consisting of,

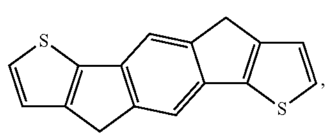

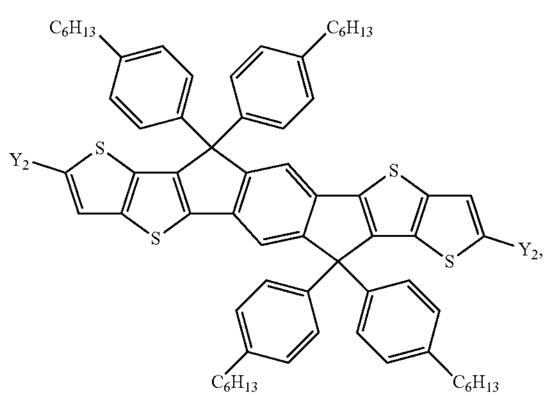

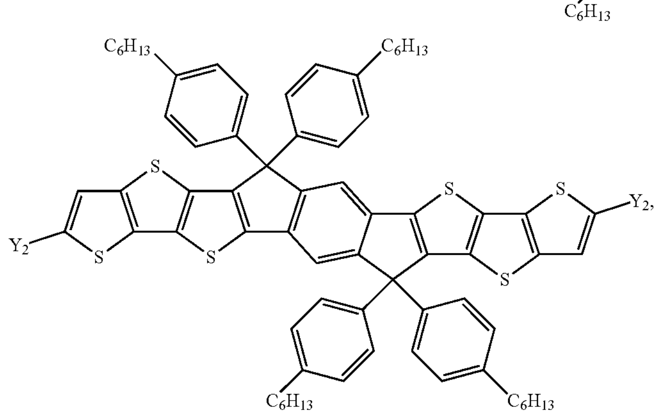

-continued
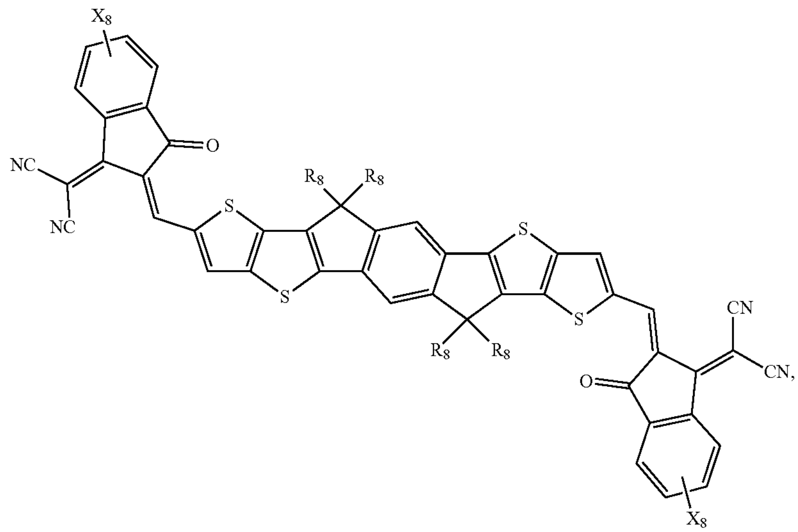
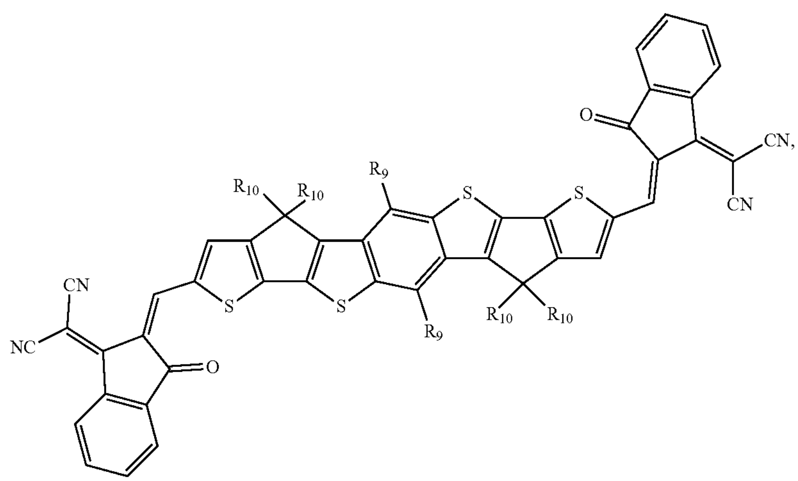
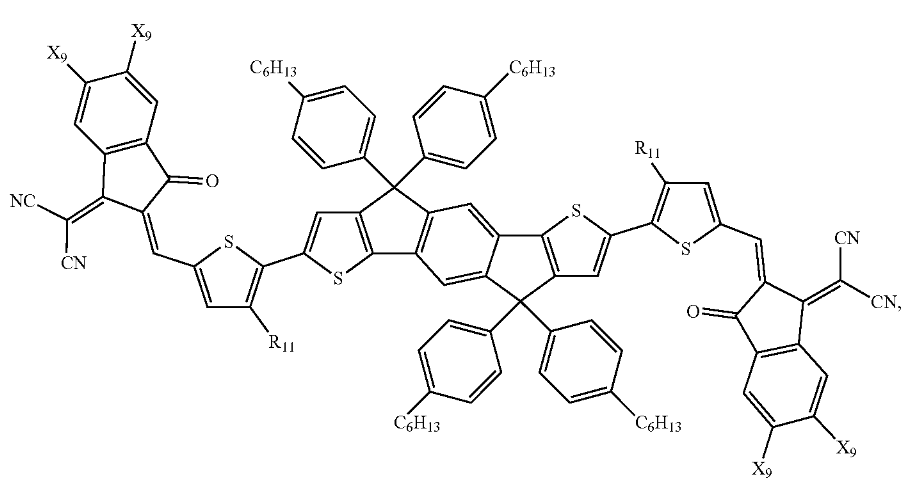

-continued
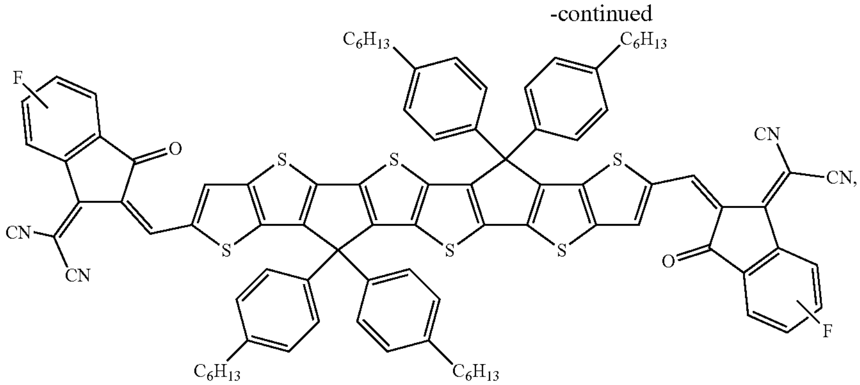
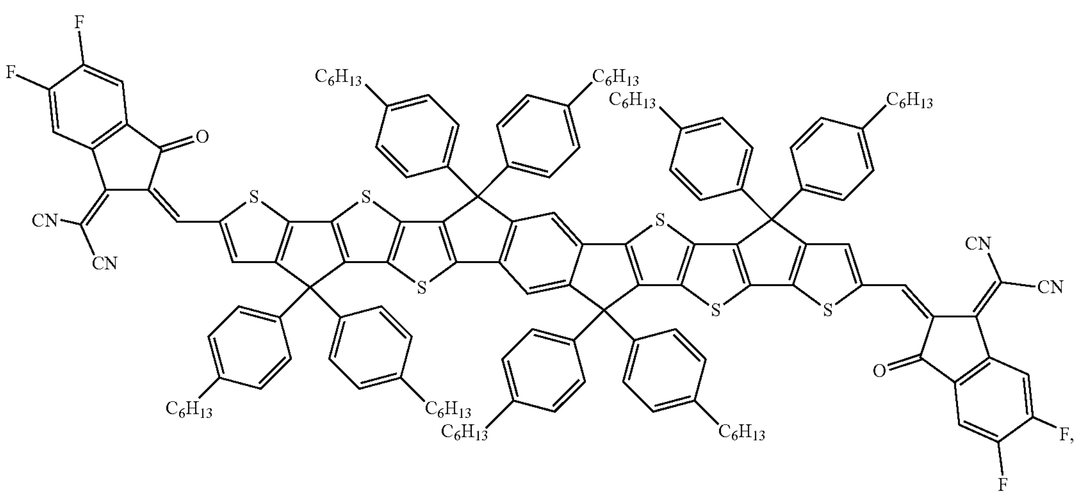
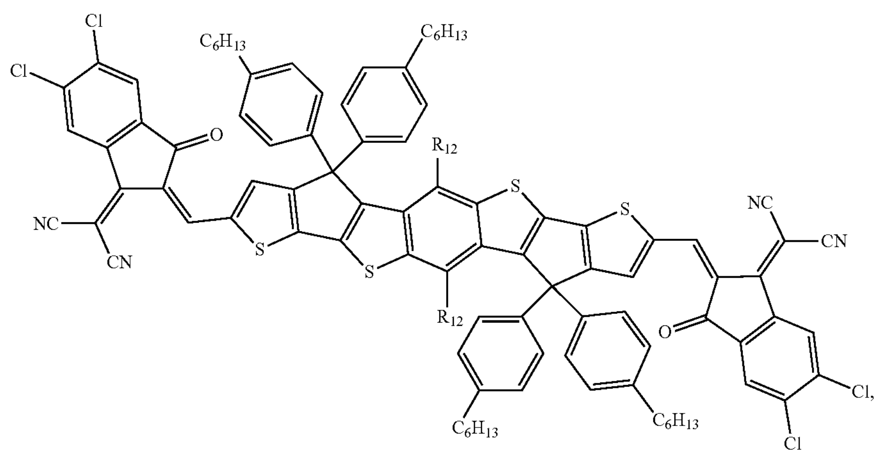

-continued
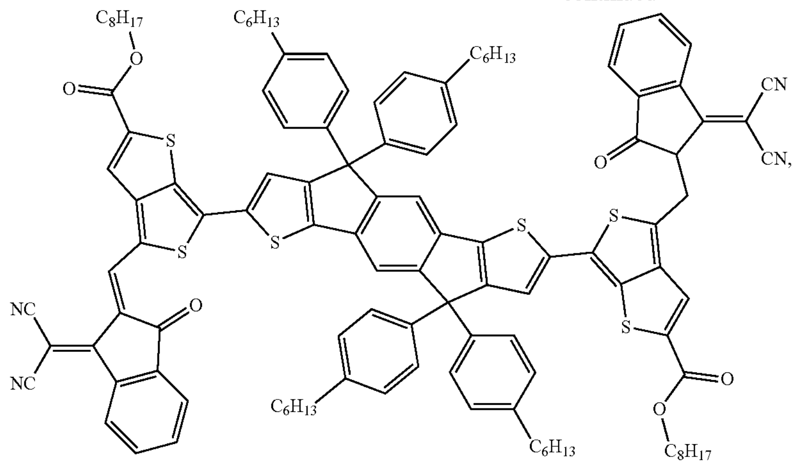
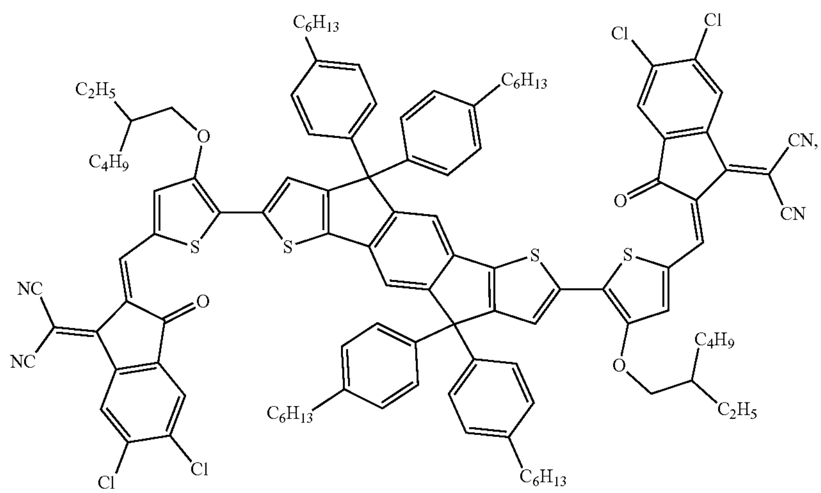
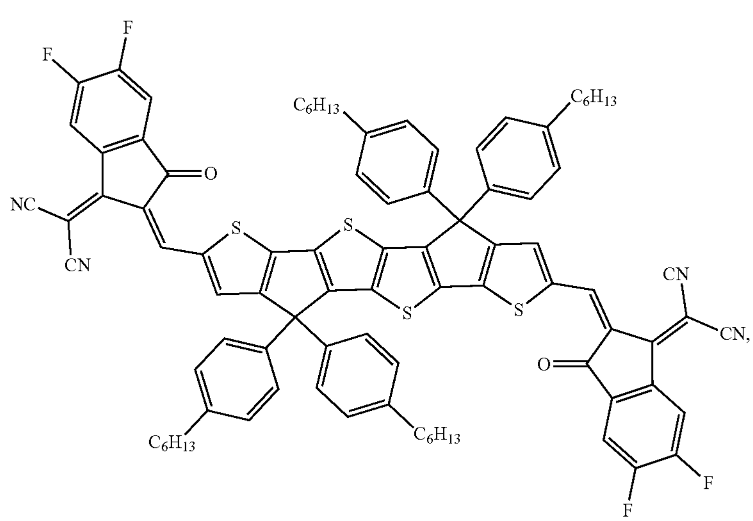

-continued
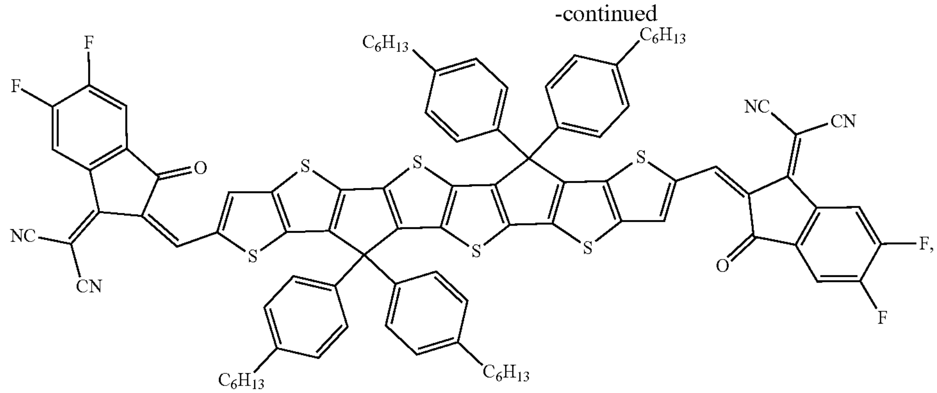
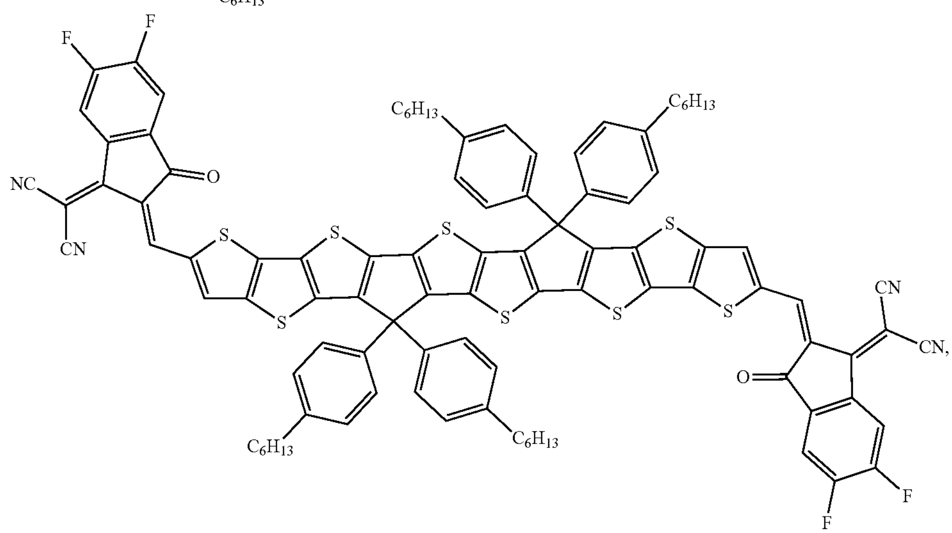
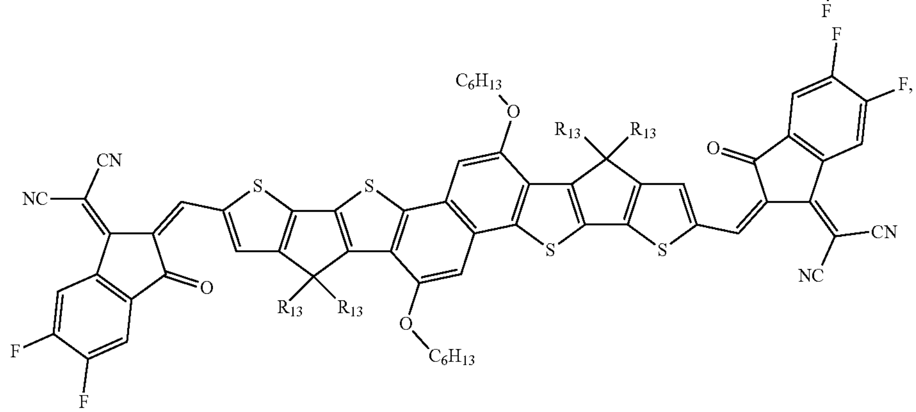
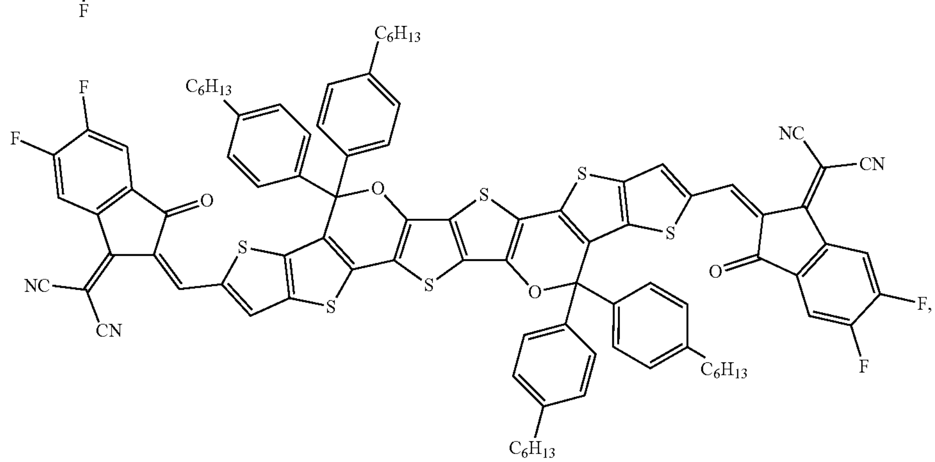

-continued
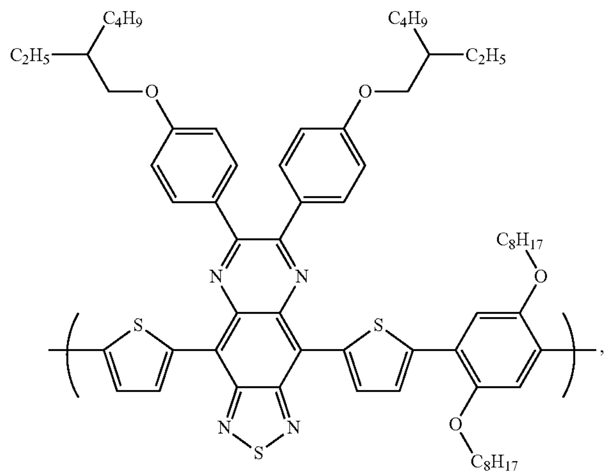
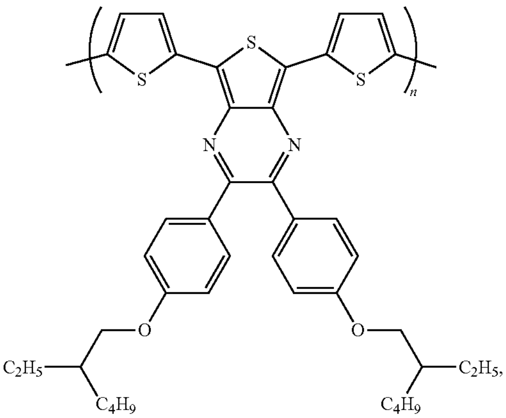
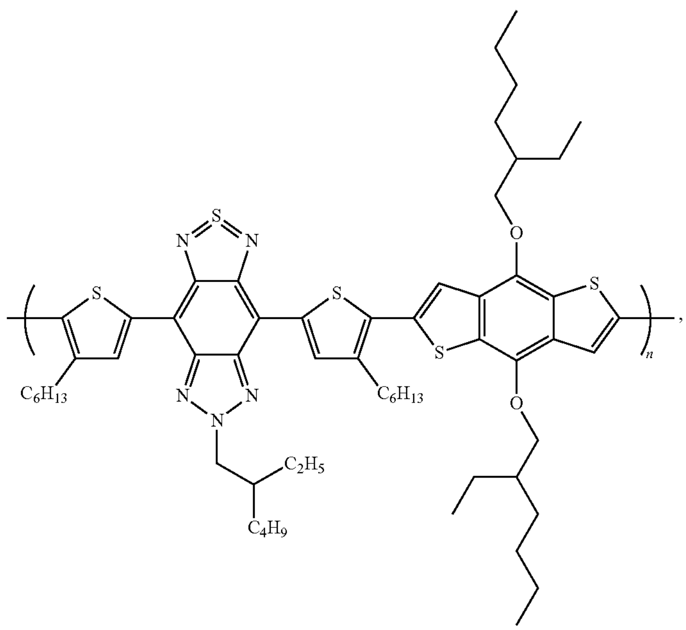
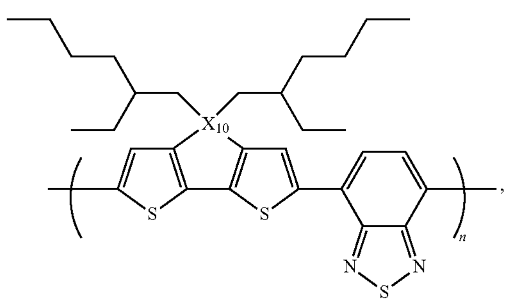
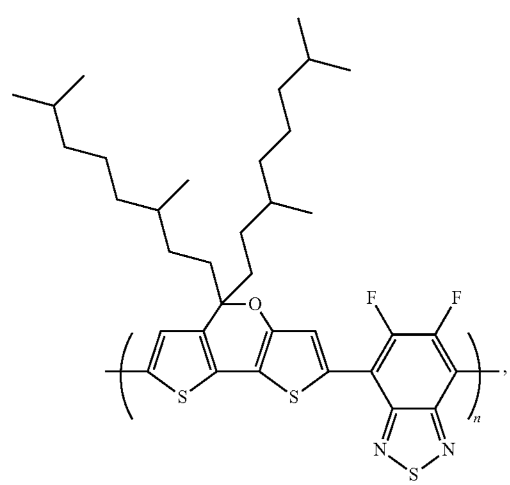

-continued
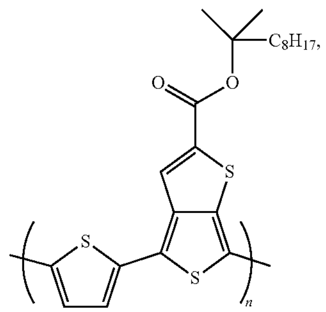
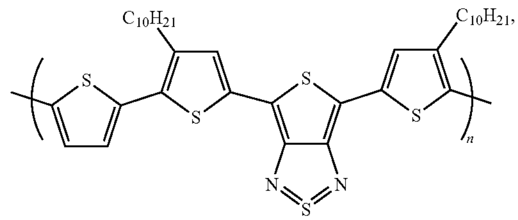
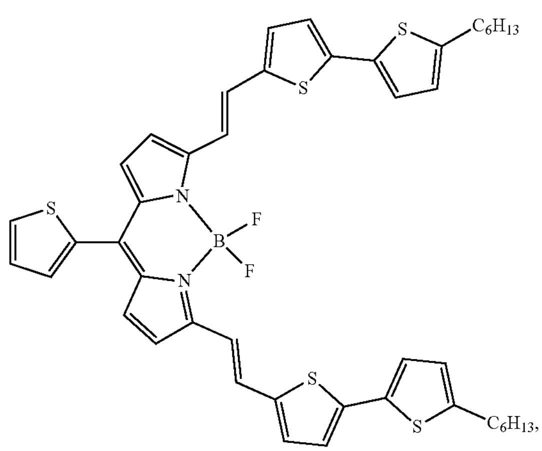
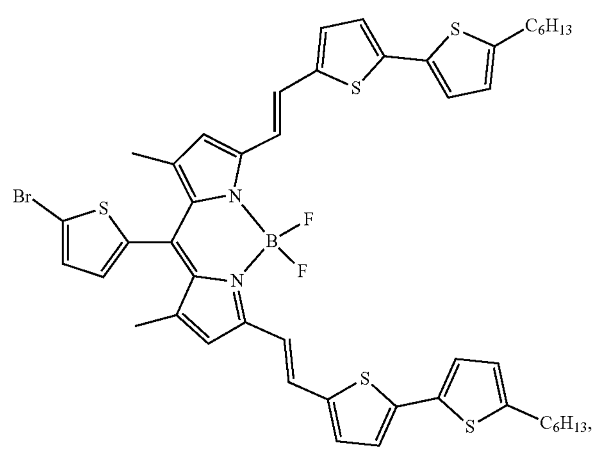
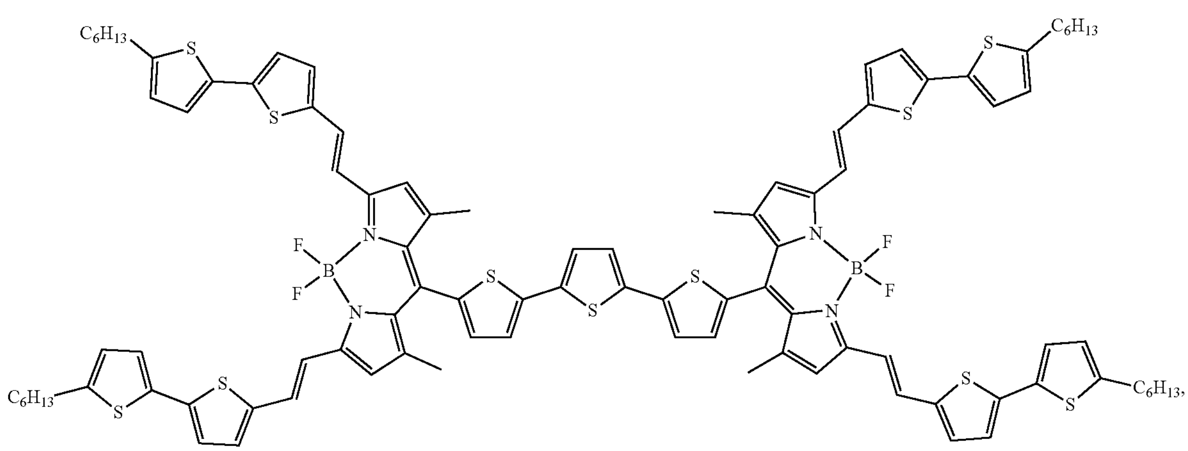
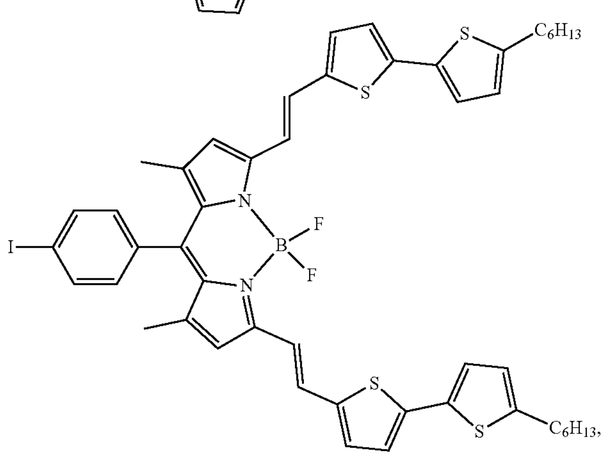

-continued
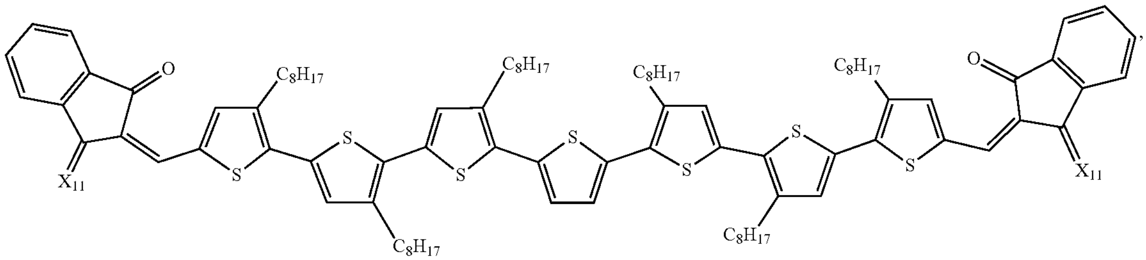
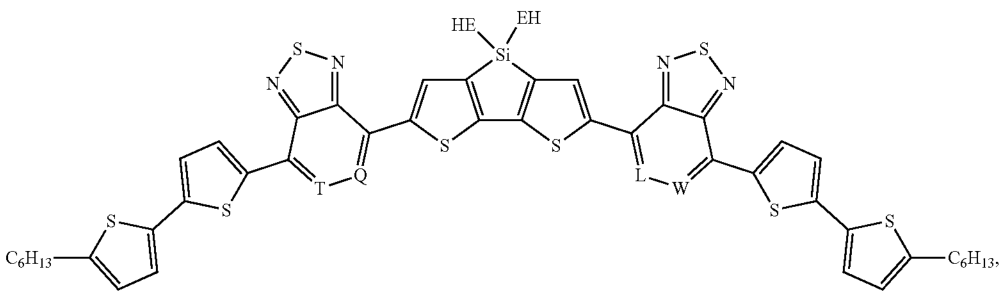
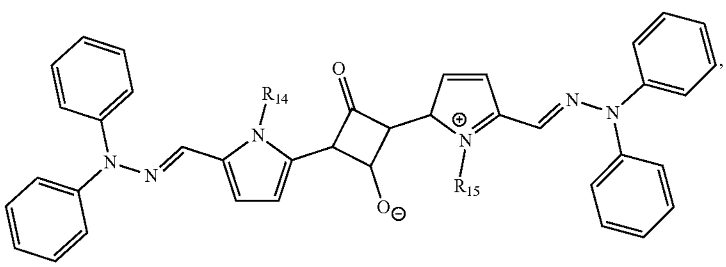
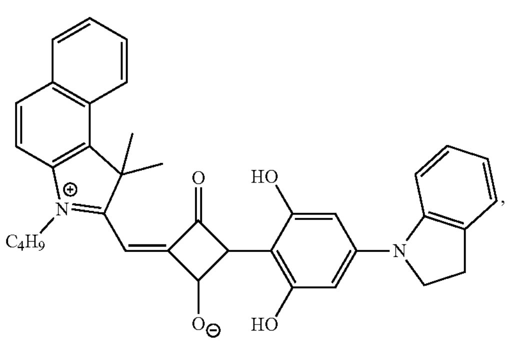
and
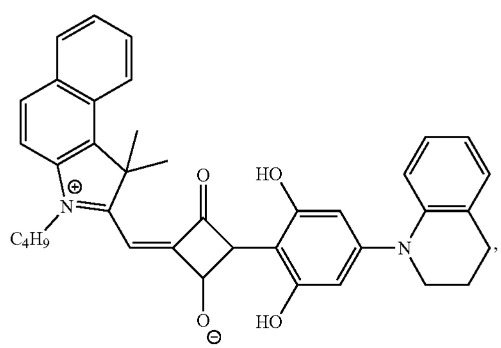

wherein:
Y is selected from the group consisting of
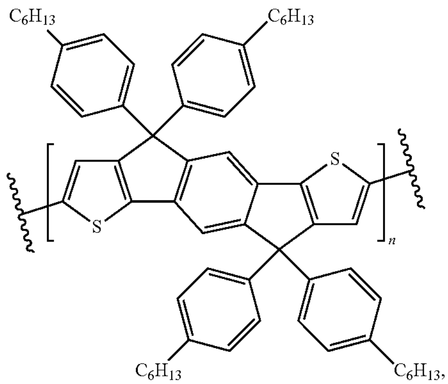
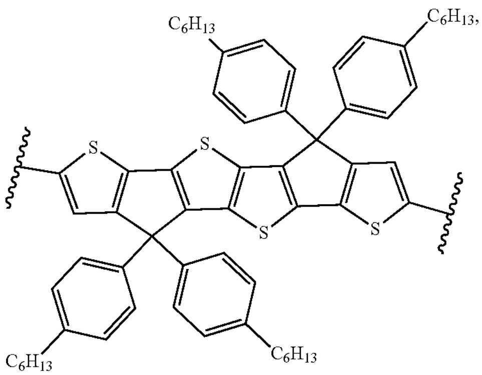
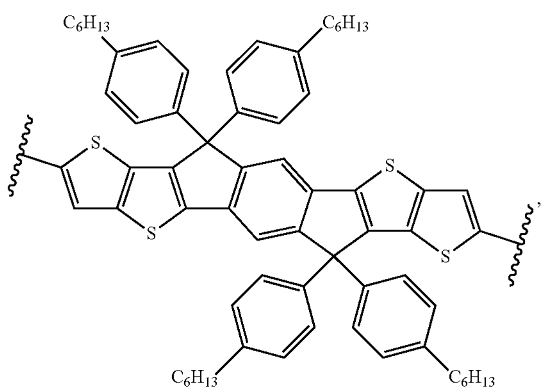
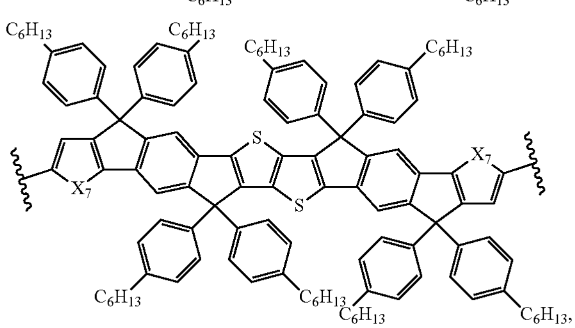
-continued
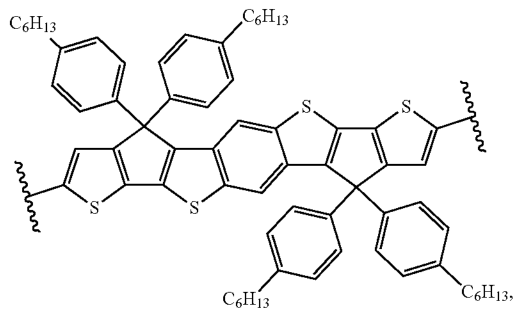
and
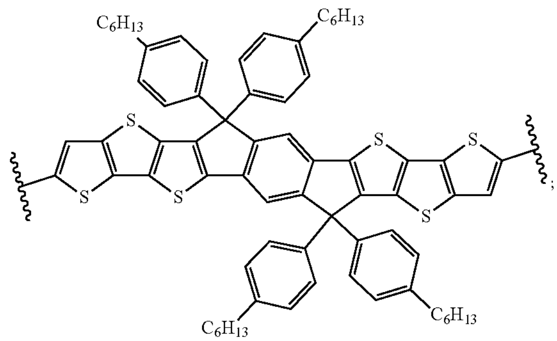
;
$X_7$ is S or Se;
$Y_2$ is selected from the group consisting of
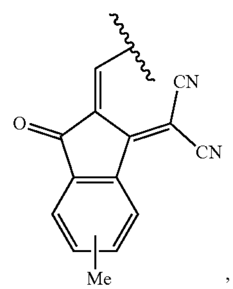
,
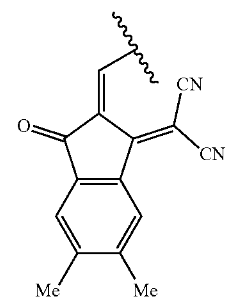
,
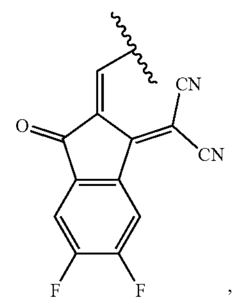
,
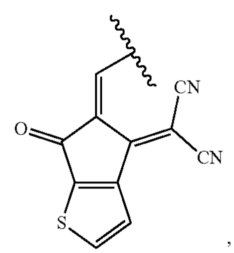
,
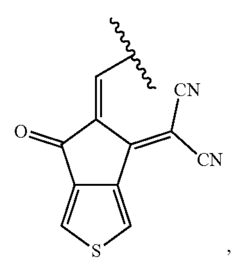
,
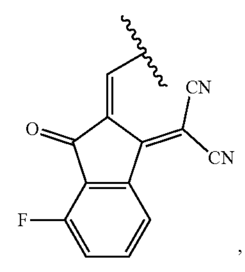
, -continued

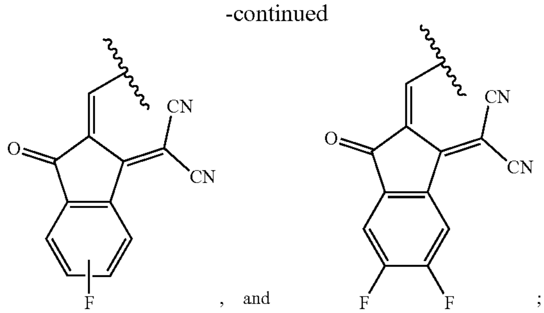

$X_8$ is H or F;

$R_8$ is

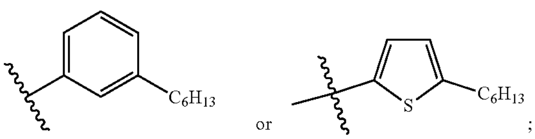

$R_9$ is

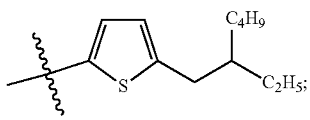

$R_{10}$ is

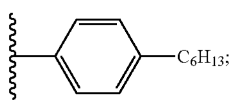

$X_9$ is H or F;

$R_{11}$ is

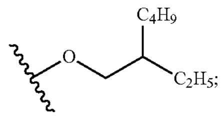

$R_{12}$ is 2-ethylhexyl;

$R_{13}$ is

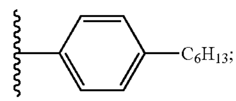

$X_{10}$ is selected from the group consisting of C, Si, and Ge;

$X_{11}$ is O or

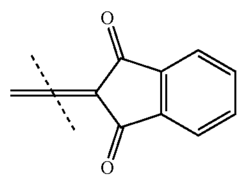

Q, L, T, and W are each independently CH or N;

$R_{14}$ and $R_{15}$ are each independently 2-ethylhexyl or n-dodecyl; and n is an integer between 1 and 10,000.

provided that said bulk heterojunction layer does not contain the following two combinations:

PTB7-Th

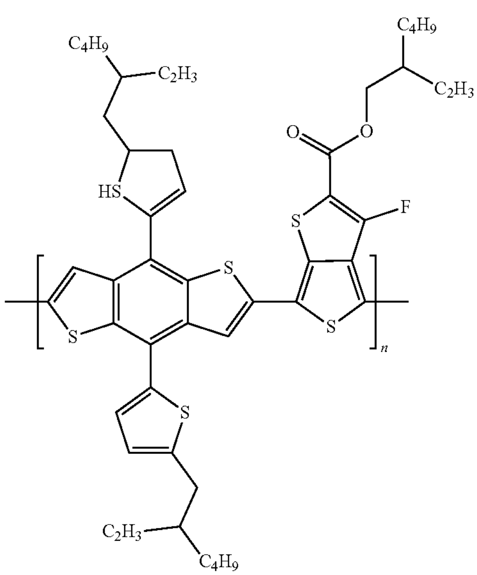

-continued
IEICO-4F
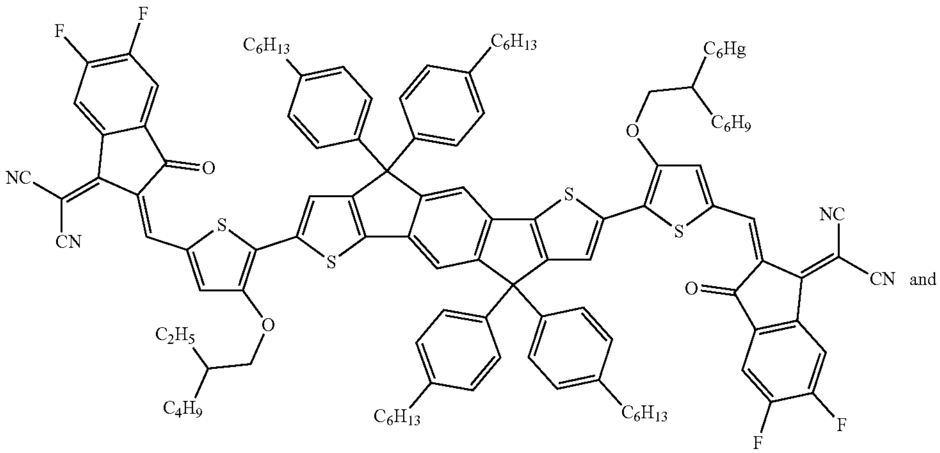
and
PBDB-T
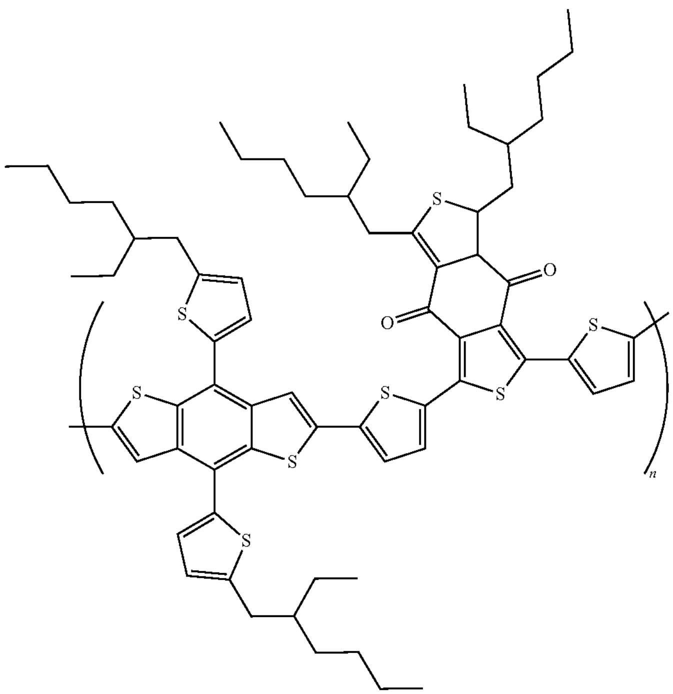

-continued

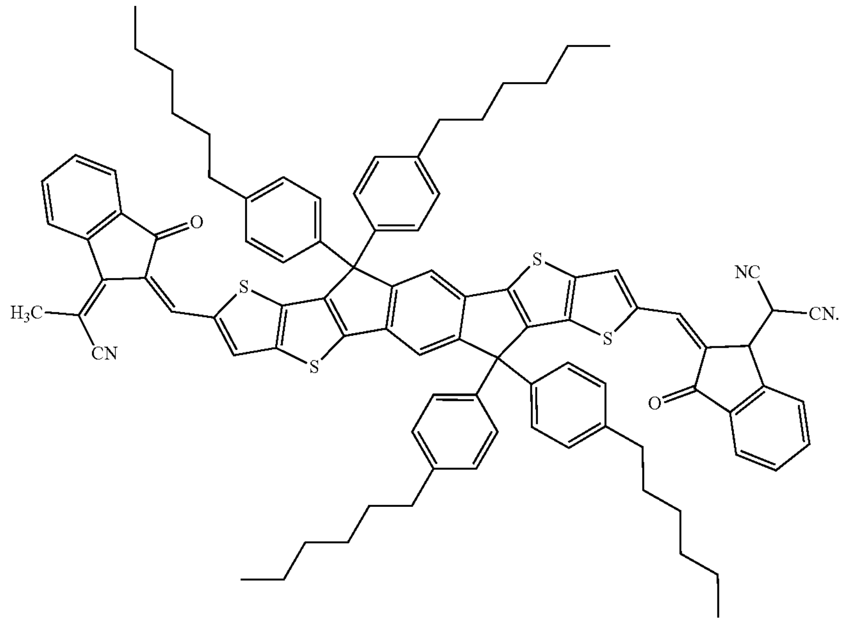

ITIC

In certain embodiments, in the above stacked bulk heterojunction perovskite solar cell, the near infrared sensitive organic compound is capable of absorbing light with a wavelength of at least 780 nm. In certain embodiments, the near infrared sensitive organic compound is capable of absorbing light with a wavelength greater than 780 nm. In certain embodiments, the near infrared sensitive organic compound is capable of absorbing light with a wavelength of at least 790 nm, at least 800 nm, at least 810 nm, at least 820 nm, at least 825, at least 830, or at least 835 nm.

In certain embodiments, in the above stacked bulk heterojunction perovskite solar cell, the transport layer is an electron transport layer, comprising a material selected from the group consisting of C60, BCP, $TiO_2$, $SnO_2$, $PC_{61}BM$, $PC_{71}BM$, ICBA, ZnO, ZrAcac, LiF, Ca, Mg, TPBI, PFN, and a combination thereof. In certain embodiments, the transport layer is an electron transport layer, comprising $SnO_2$.

In certain embodiments, in the above stacked bulk heterojunction perovskite solar cell, the transport layer is hole transport layer, comprising a material selected from the group consisting of PTAA, Spiro-OMeTAD, PEDOT:PSS, NiO, $MoO_3$, $V_2O_5$, Poly-TPD, EH44, and a combination thereof. In certain embodiments, the transport layer is a hole transport layer, comprising PTAA.

In certain embodiments, the subject matter described herein is directed to a stacked bulk heterojunction perovskite solar cell, comprising:

a first electrode;

a first bulk heterojunction layer provided on the first electrode;

a perovskite material layer provided on the first bulk heterojunction layer;

a second bulk heterojunction layer provided on the perovskite material layer;

and a second electrode provided on the second bulk heterojunction layer, wherein said first bulk heterojunction layer and said second bulk heterojunction layer comprise one of more electron donors and one or more electron acceptors, and wherein said one or more electron donors and said one or more electron acceptors is a near infrared sensitive semiconductor material.

In certain embodiments, in the above stacked bulk heterojunction perovskite solar cell, the near infrared sensitive semiconductor material is capable of absorbing light with a wavelength of at least 780 nm. In certain embodiments, the near infrared sensitive semiconductor material is capable of absorbing light with a wavelength greater than 780 nm. In certain embodiments, the near infrared sensitive semiconductor material is capable of absorbing light with a wavelength of at least 790 nm, at least 800 nm, at least 810 nm, at least 820 nm, at least 825, at least 830, or at least 835 nm.

In certain embodiments, in the above stacked bulk heterojunction perovskite solar cell, the near infrared sensitive semiconductor material is an inorganic semiconductor selected from the group consisting of PbS, CdTe, CIGS, GaAs, PbS, Si, a tin-containing hybrid perovskite ($FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3$), and $Sb_2Se_3$.

In certain embodiments, in the tin-containing hybrid perovskite, ($FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, $FA=HC(NH_2)_2$, $MA=CH_3NH_3$).

In certain embodiments, in the above stacked bulk heterojunction perovskite solar cell, the near infrared sensitive semiconductor material is an organic semiconductor selected from the group consisting of

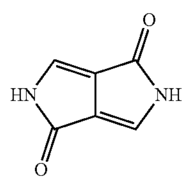
,
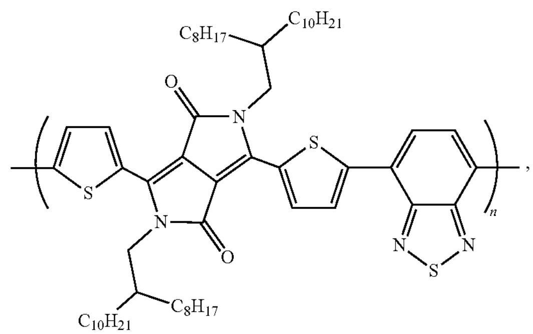
,
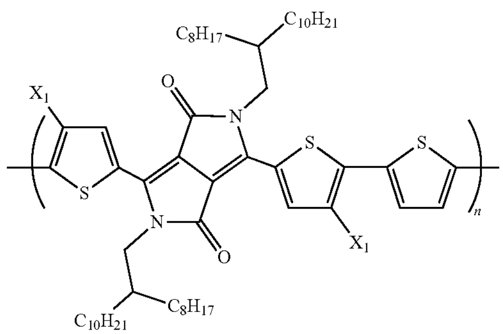
,
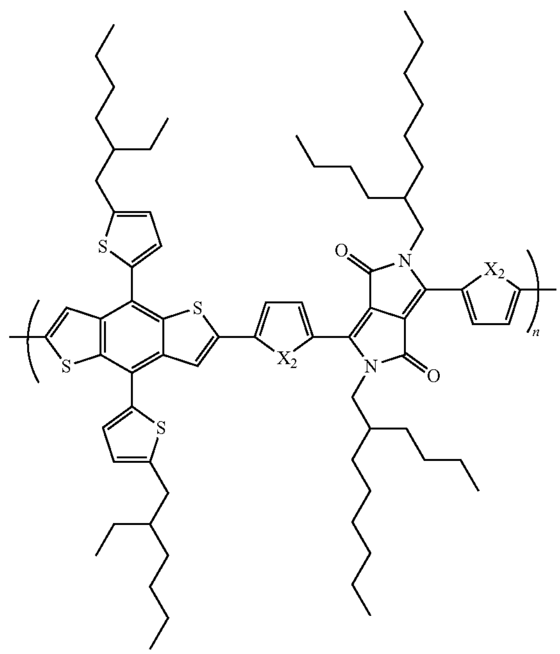
,
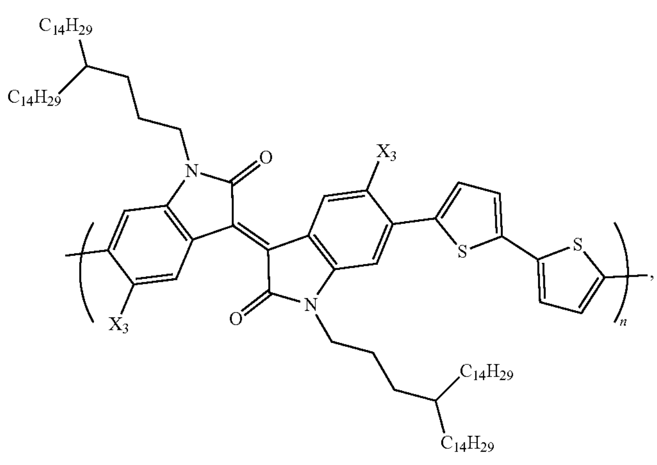
,

-continued
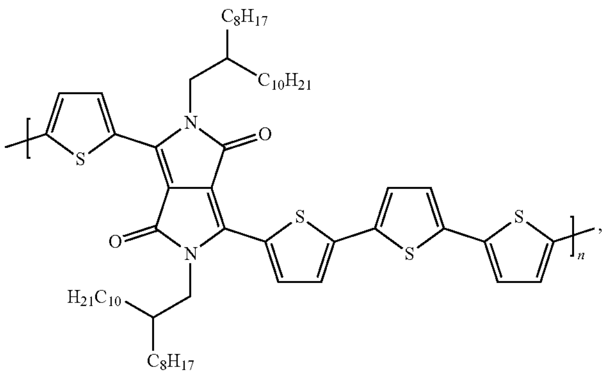
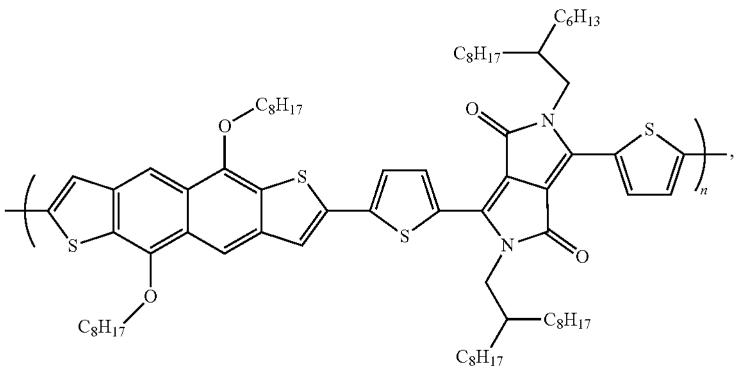
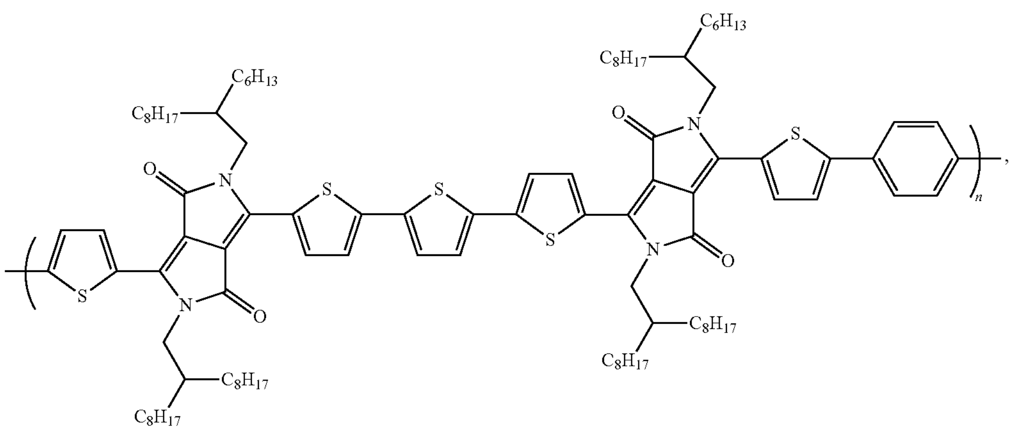
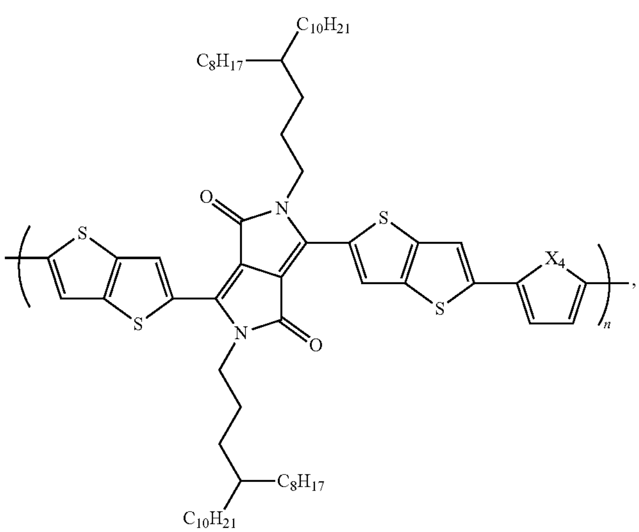

-continued
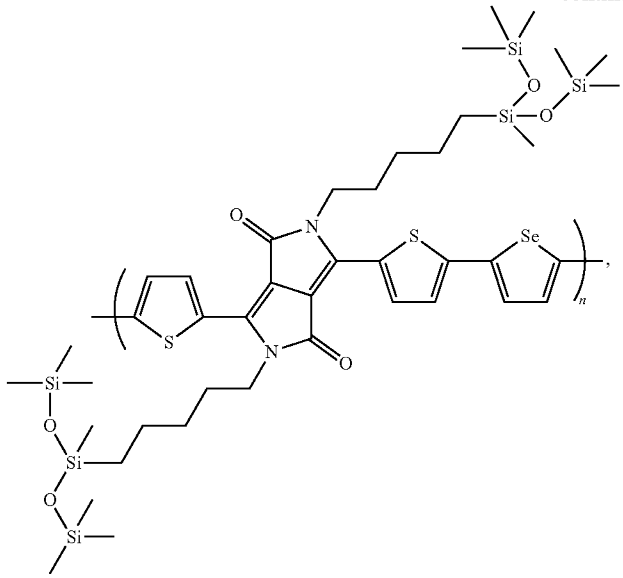
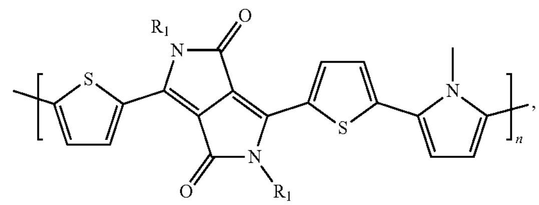
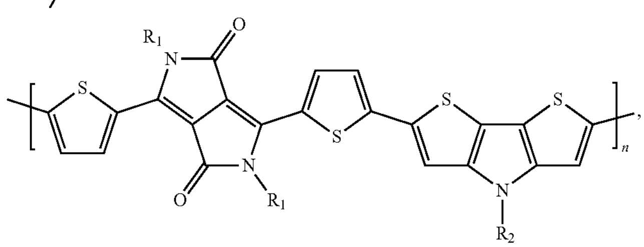
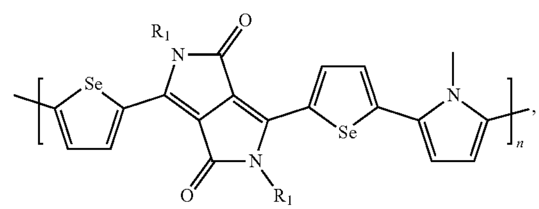
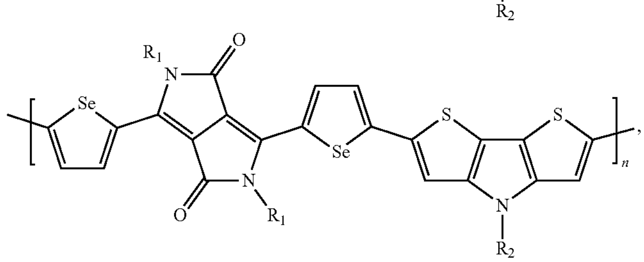
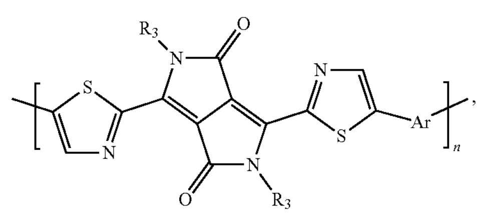
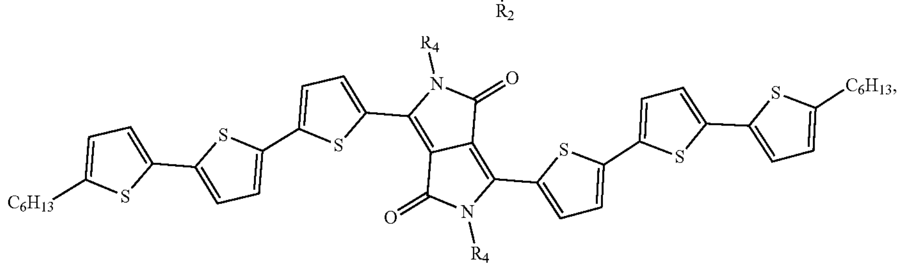
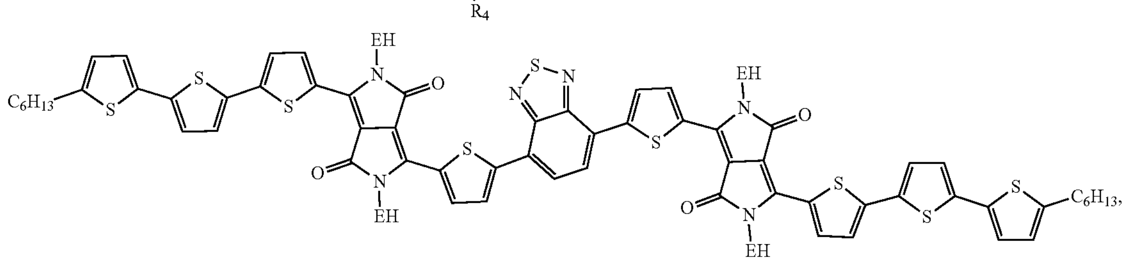
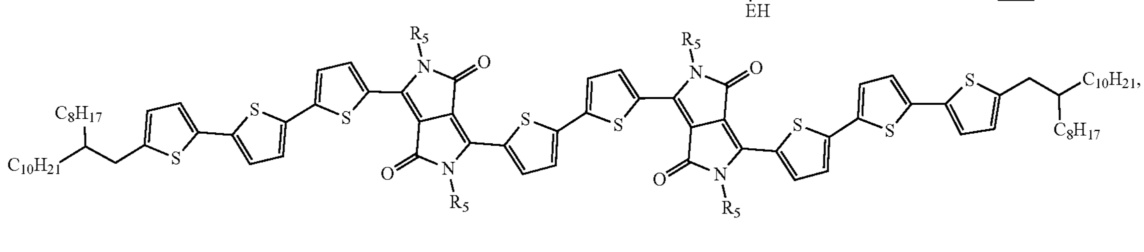

-continued
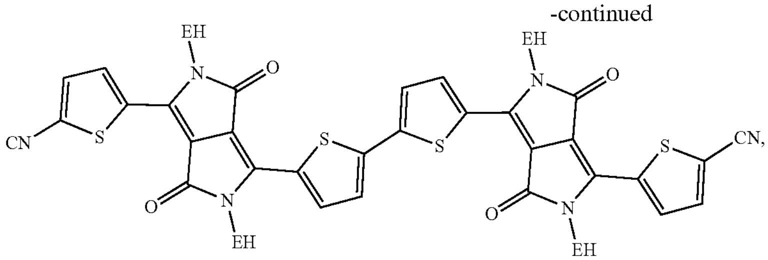
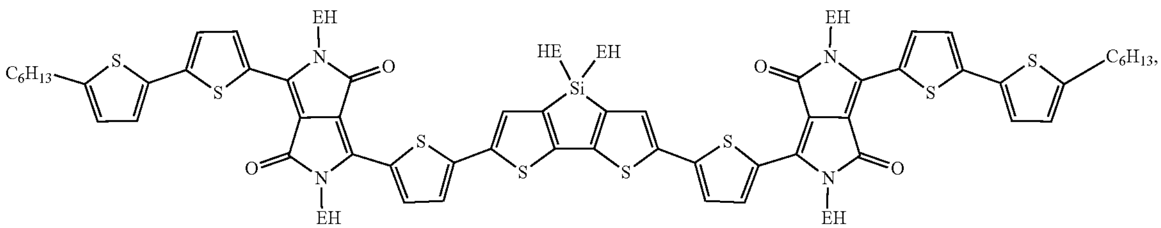
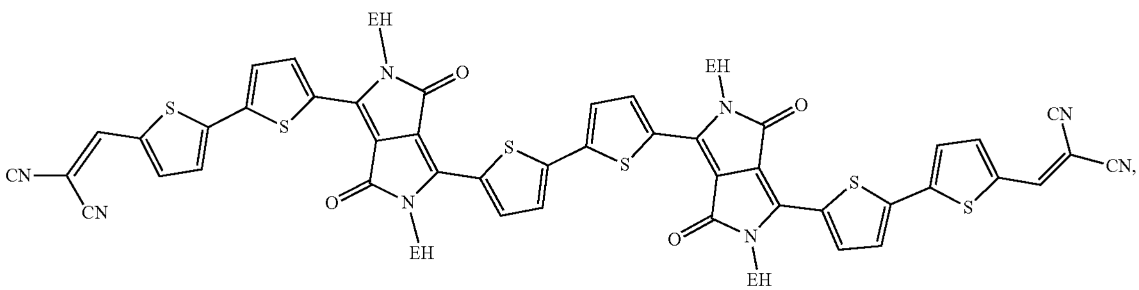
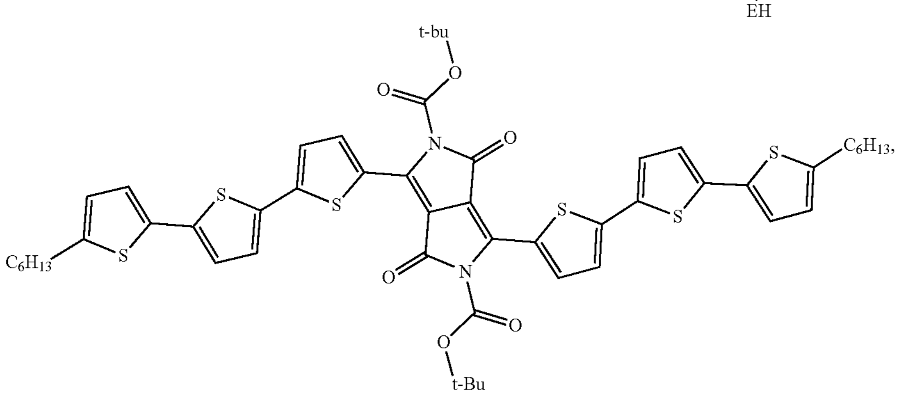
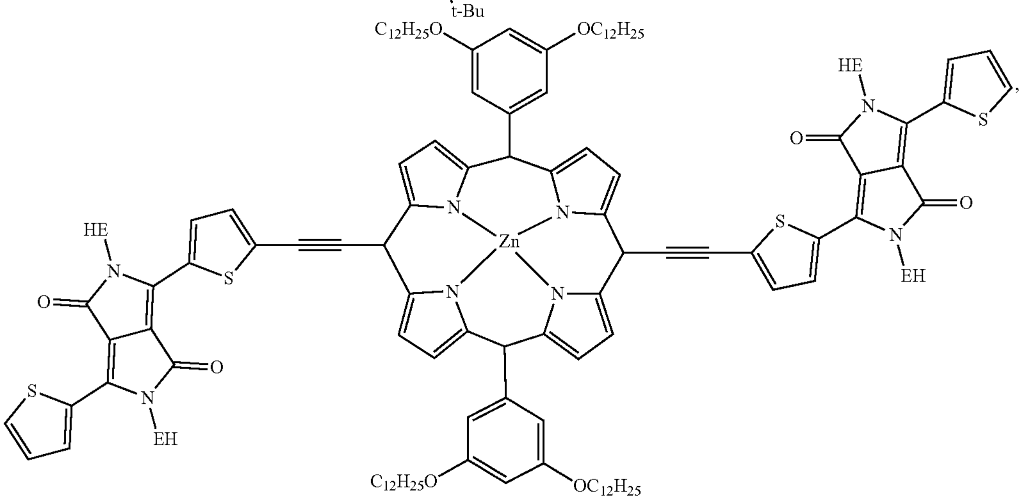

-continued
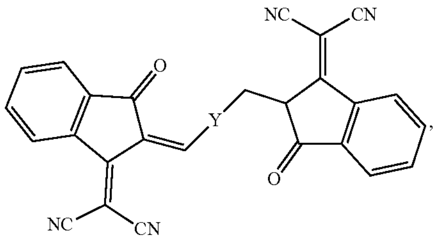
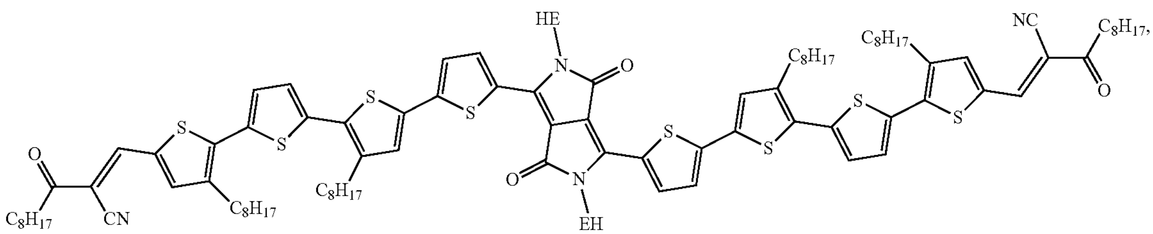
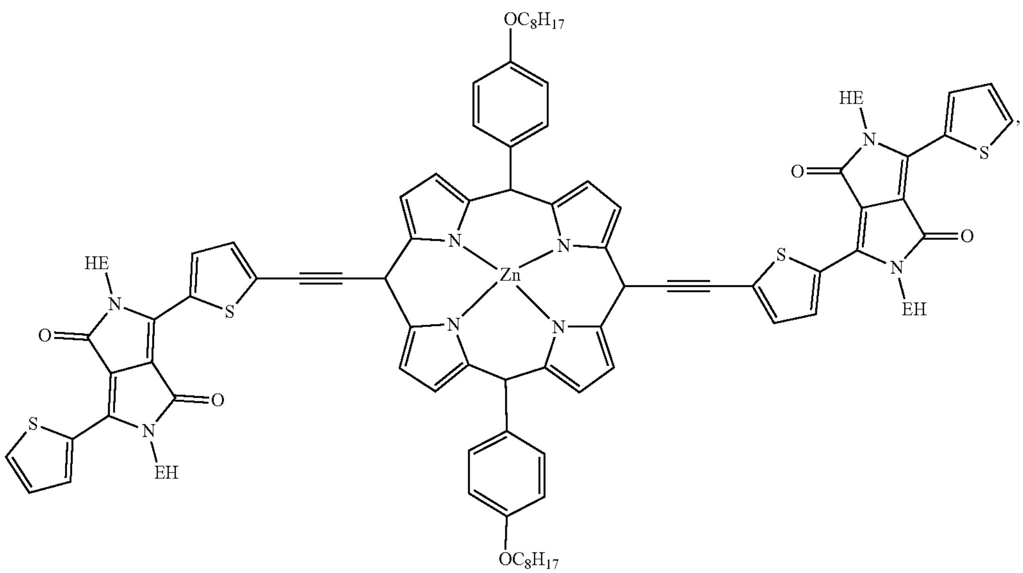
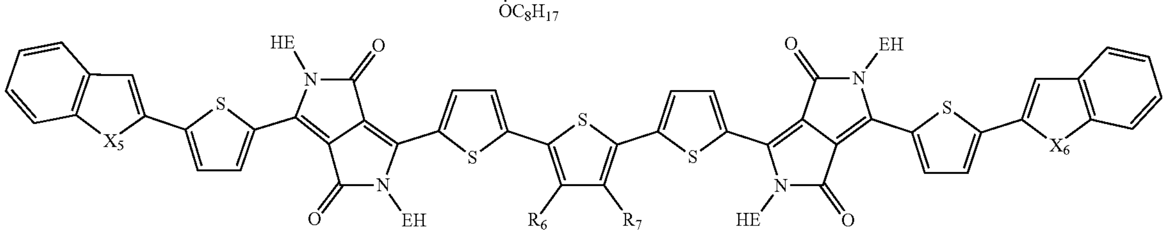
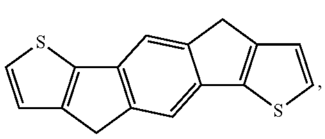
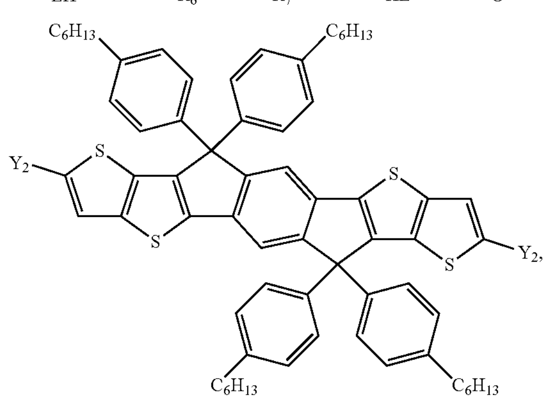

-continued
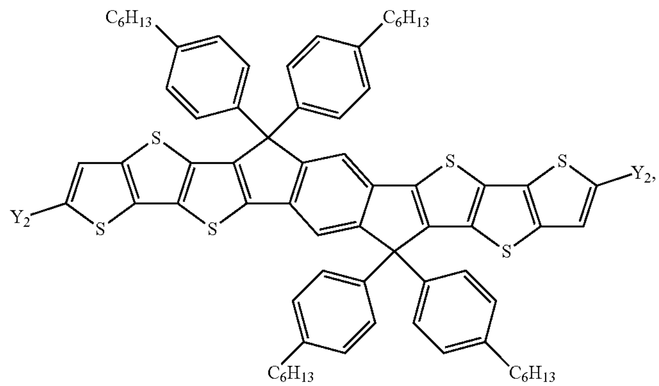
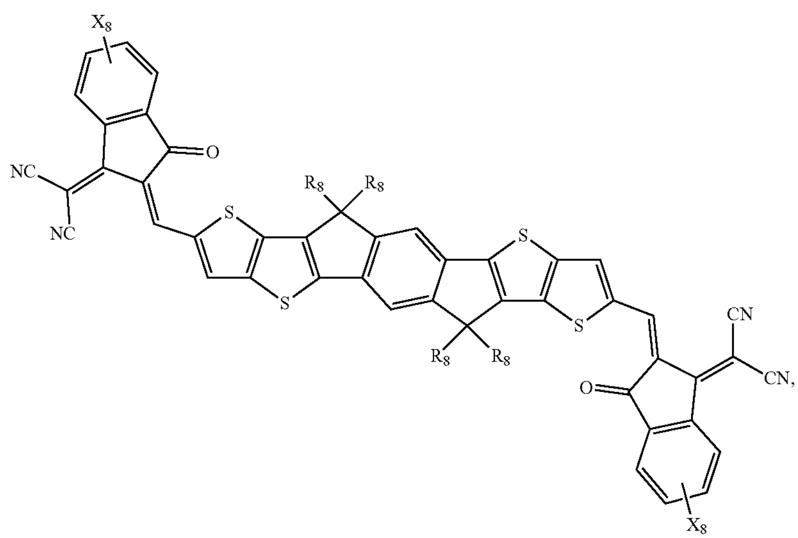
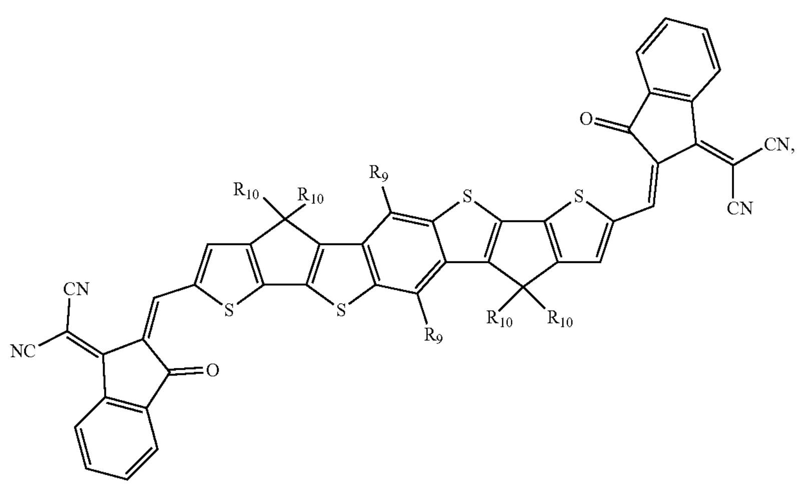

-continued
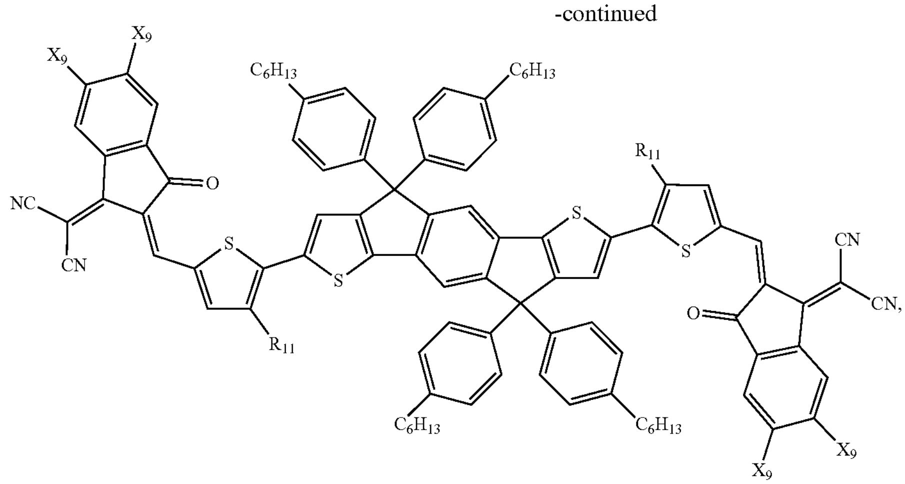
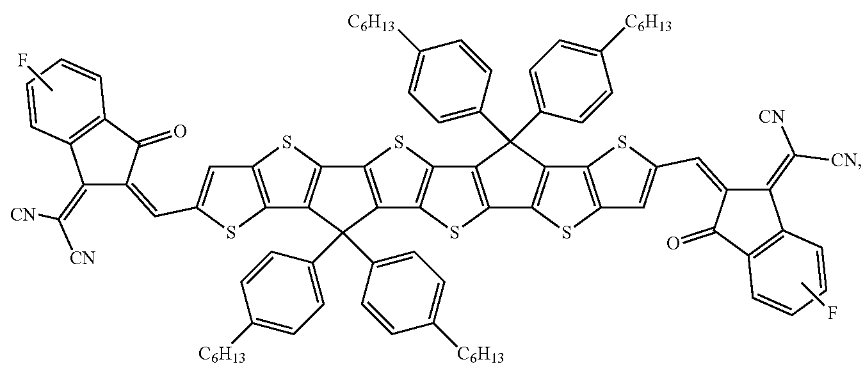
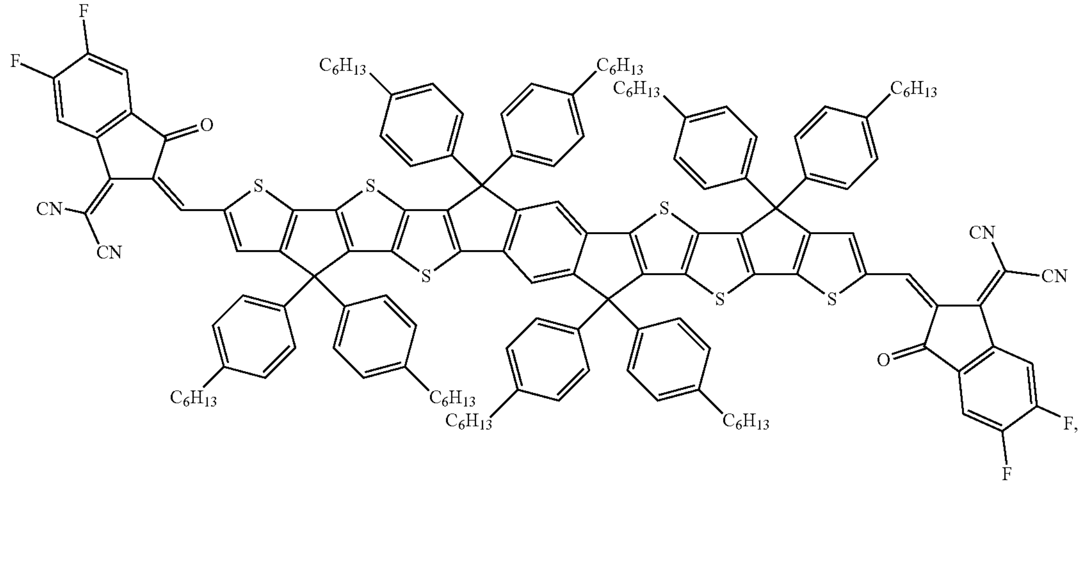

-continued
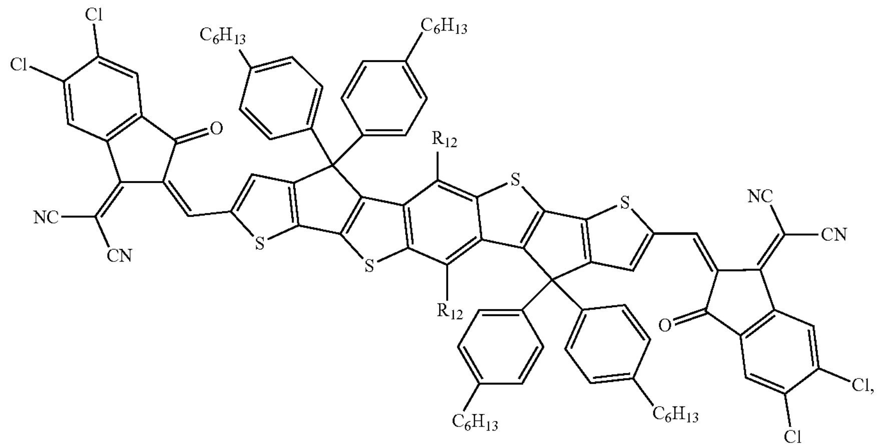
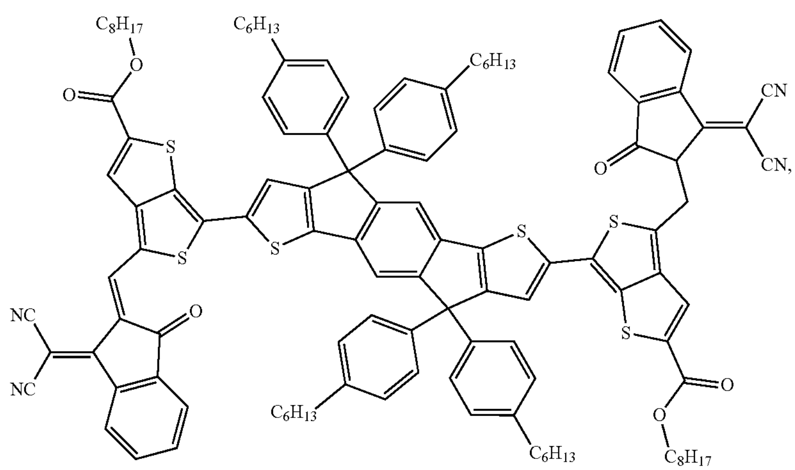
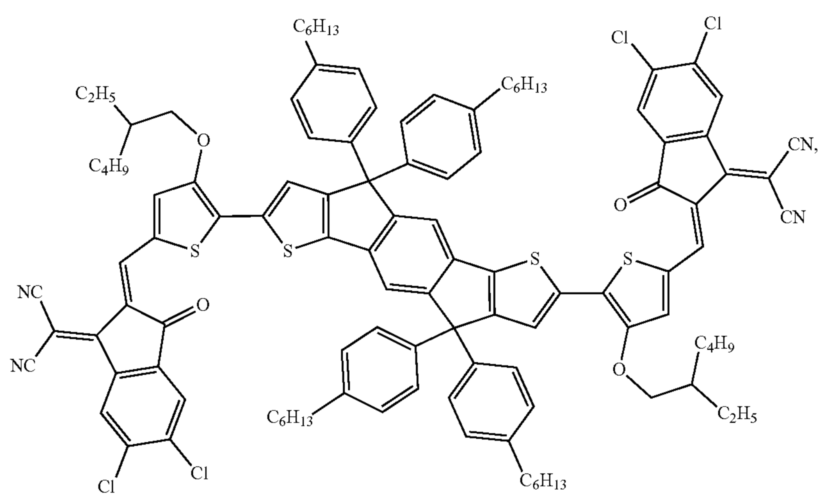

-continued
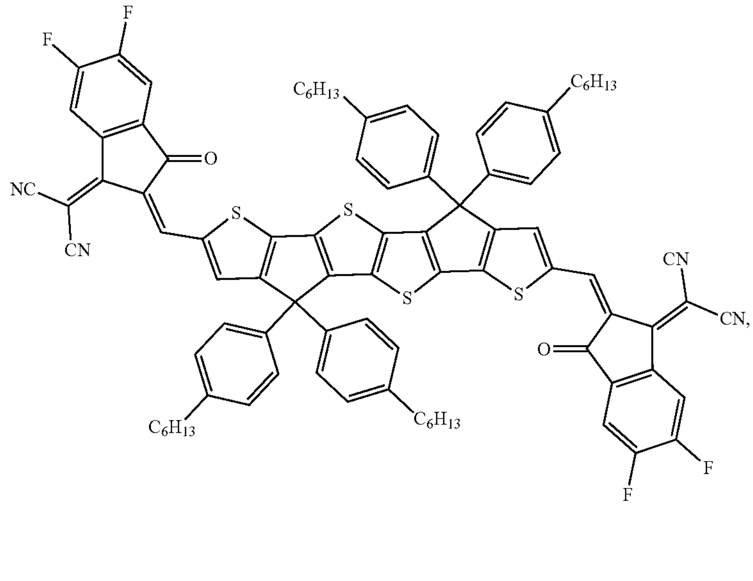
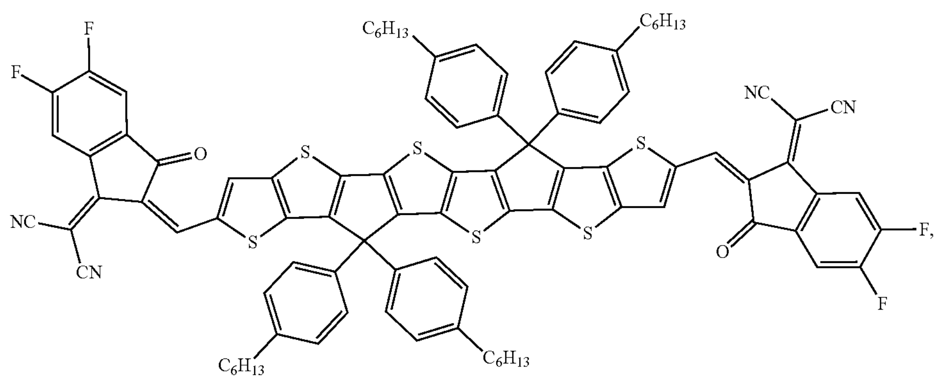
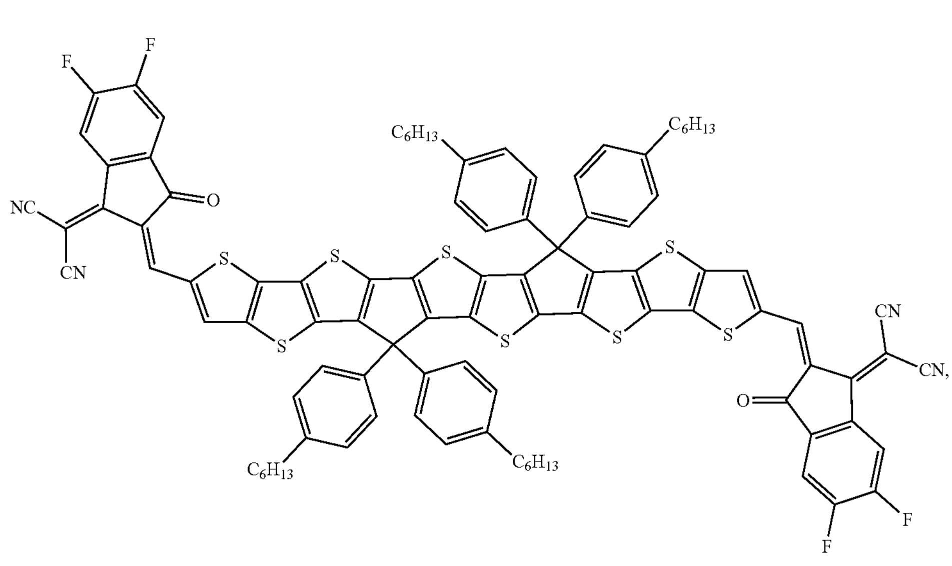

-continued
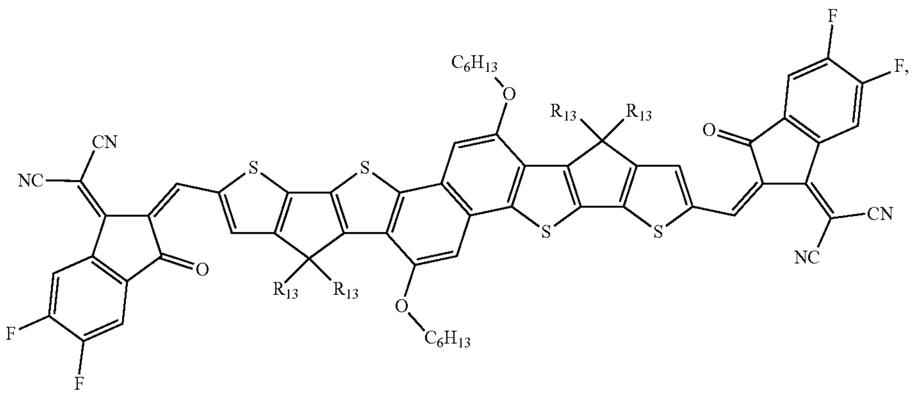
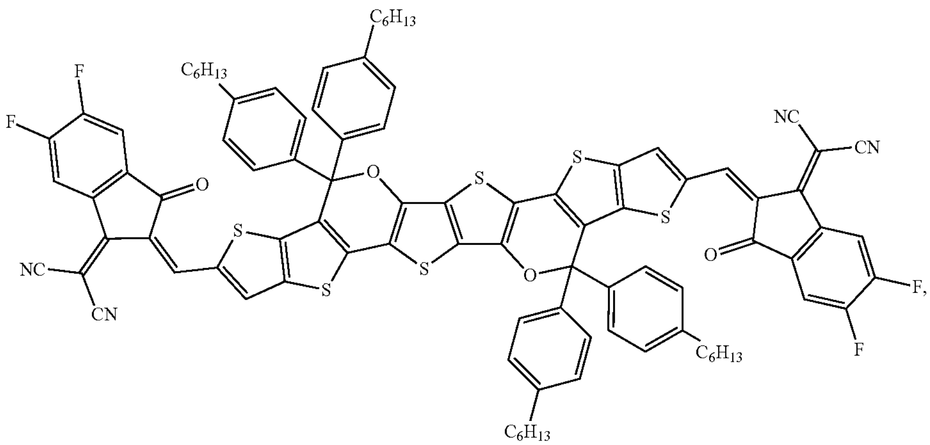
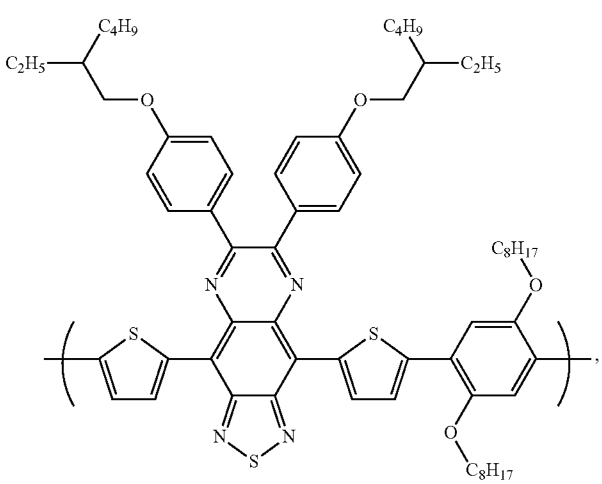
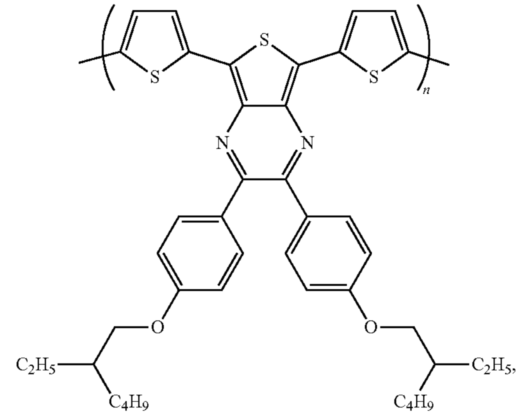

-continued
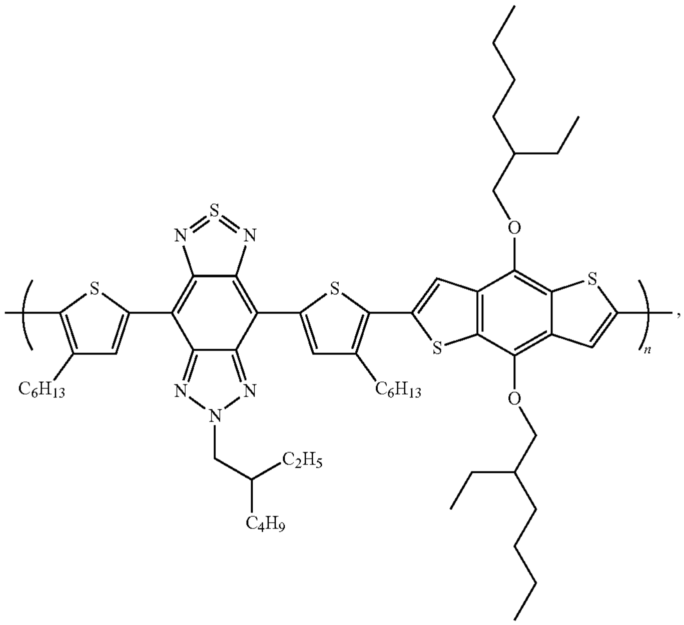
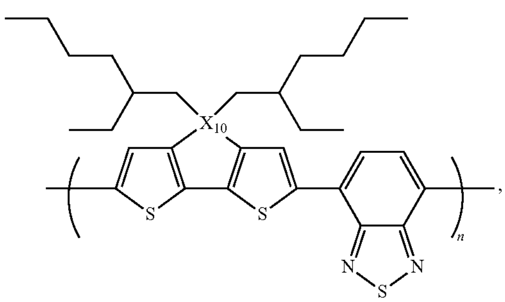
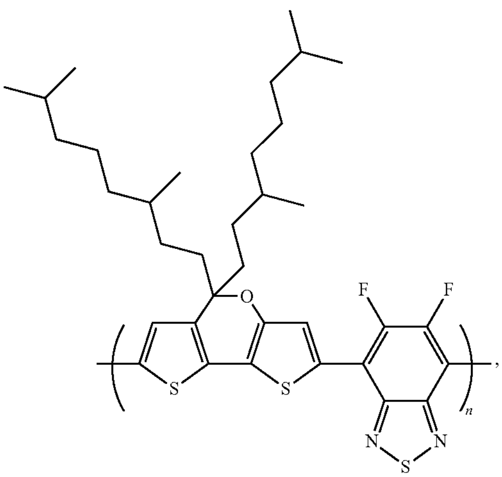
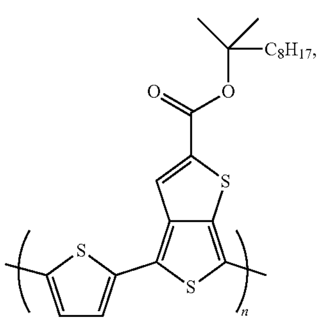
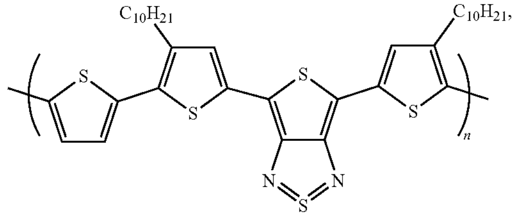

-continued
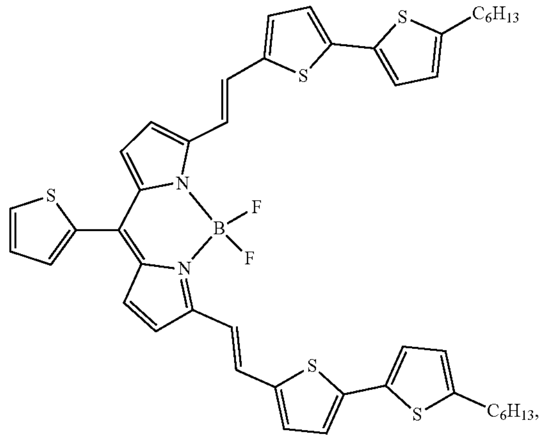
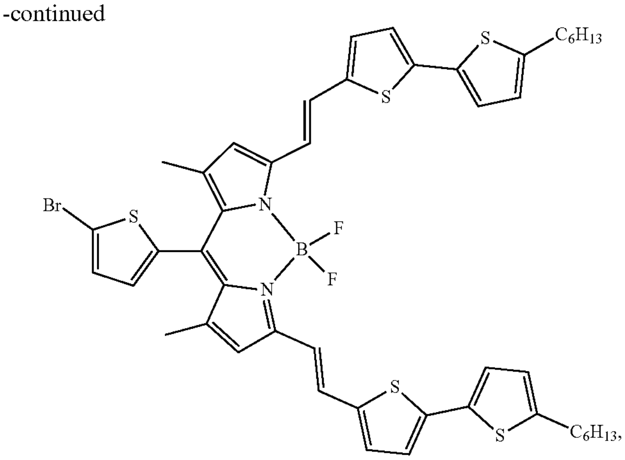
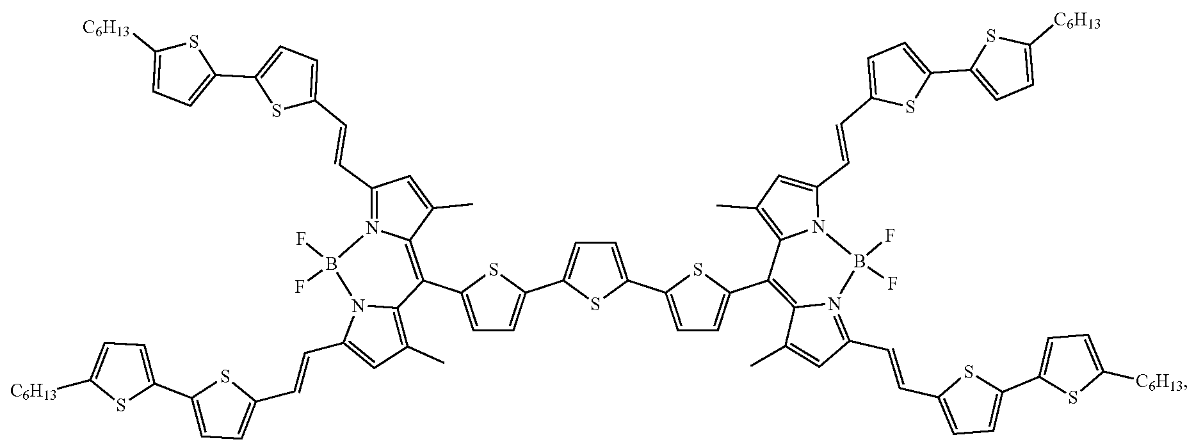
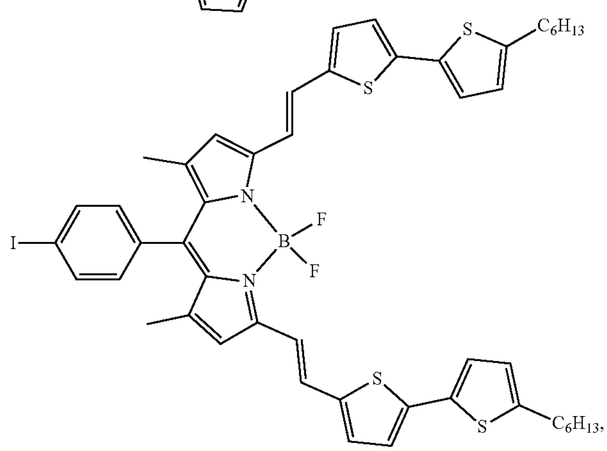
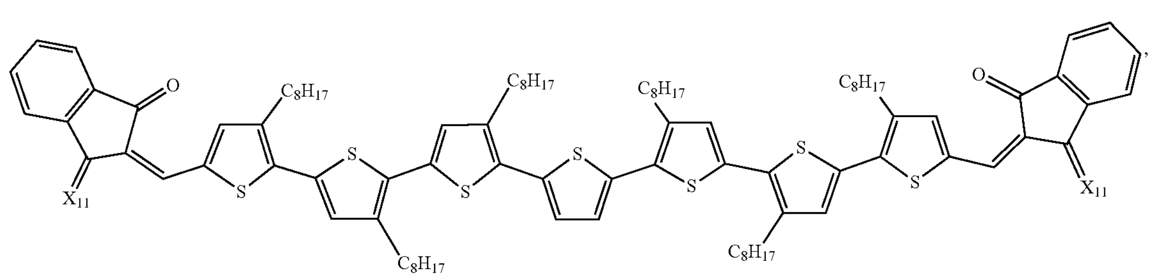

-continued

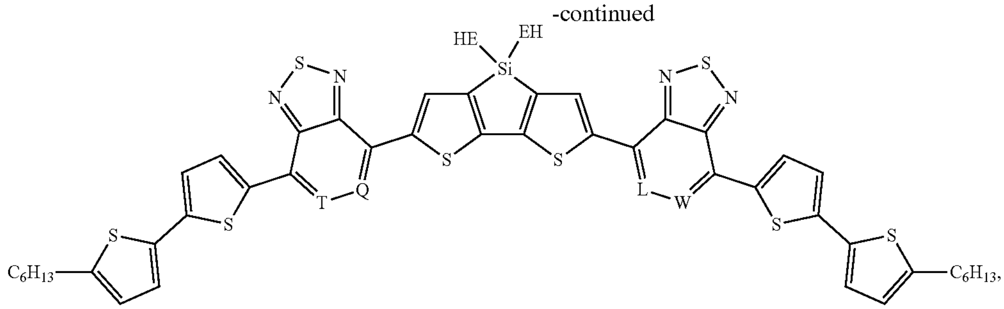

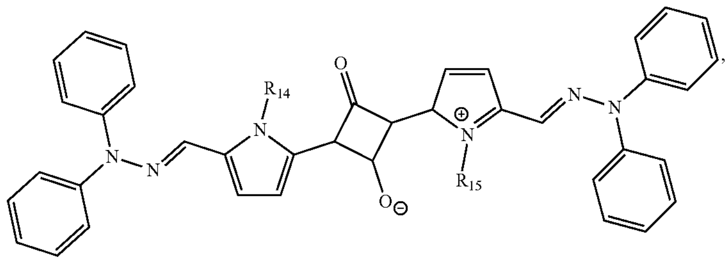

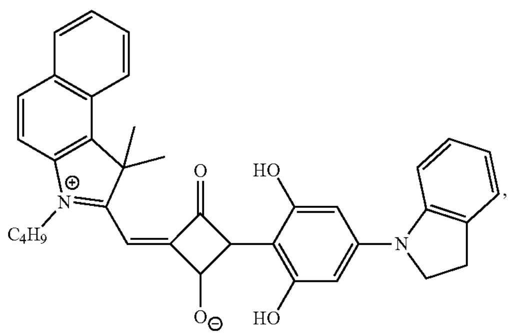

and

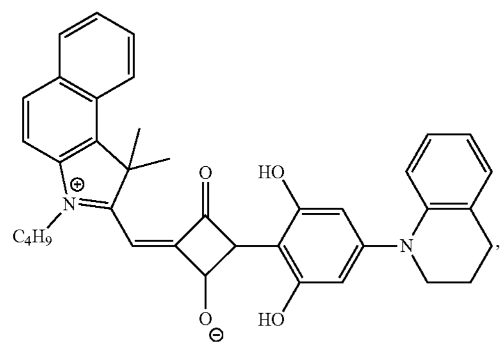

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

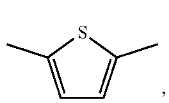

,

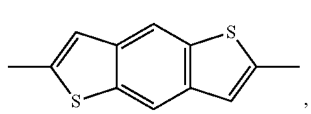

,

-continued

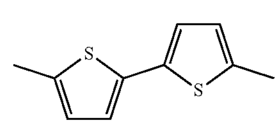

,

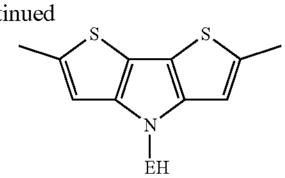

wherein EH is 2-ethylhexyl;

$R_4$ is $C_6H_{13}$ or $C_{12}H_{25}$;

$R_5$ is H or

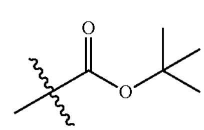 [SMILES: *C(=O)OC(C)(C)C]

$R_6$ and $R_7$ are each independently H or $CH_3$;

$X_5$ and $X_6$ are each independently O or S;

EH is 2-ethylhexyl;

Y is selected from the group consisting of
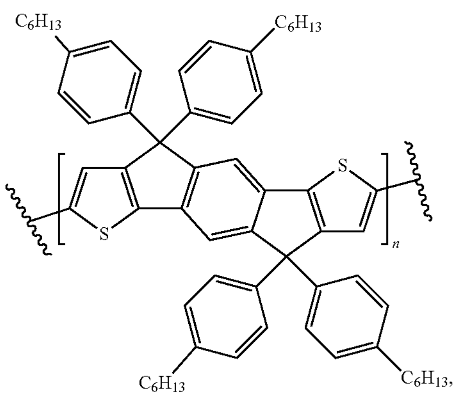
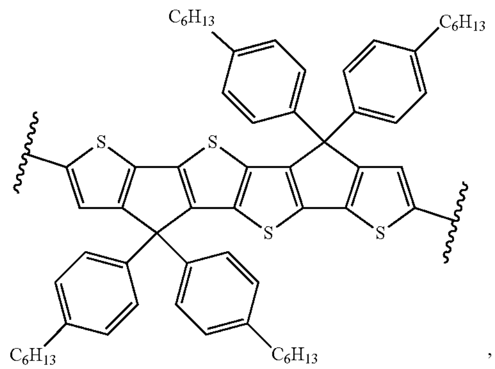
,
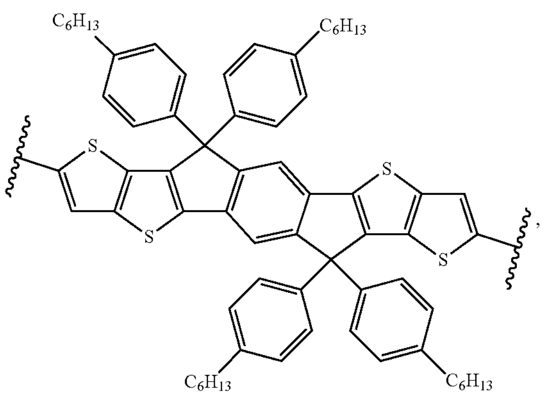
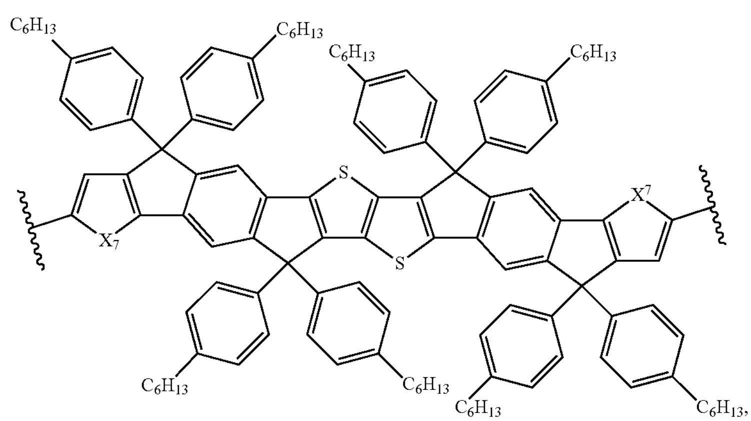
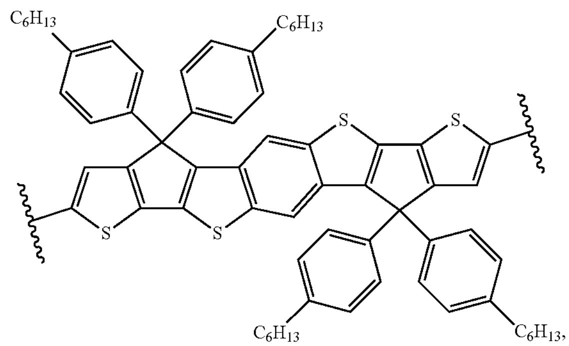
and -continued
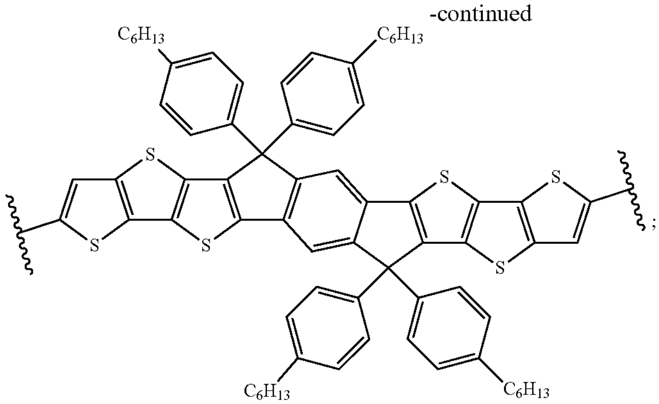
$X_7$ is S or Se;
$Y_2$ is selected from the group consisting of
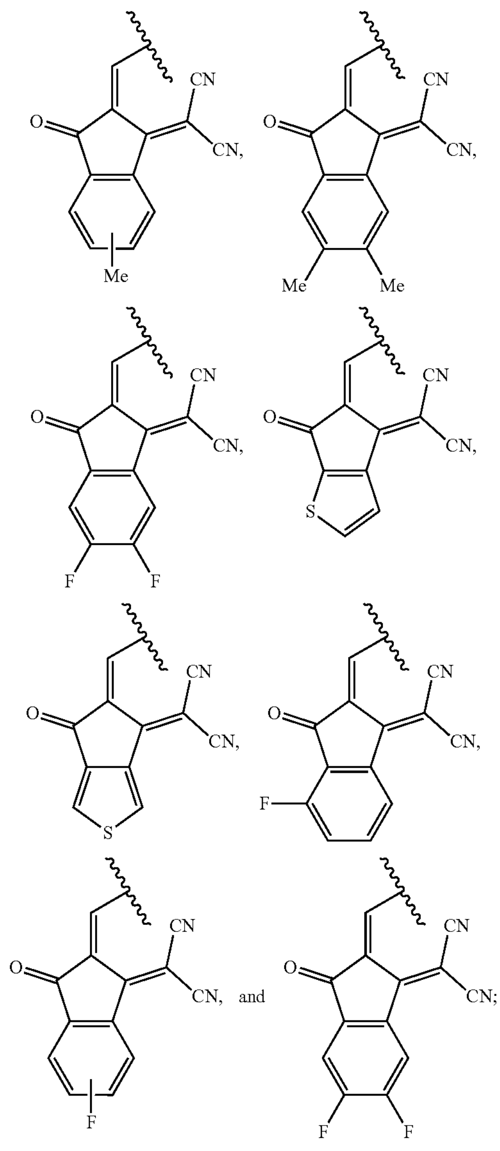
$X_8$ is H or F;
$R_8$ is
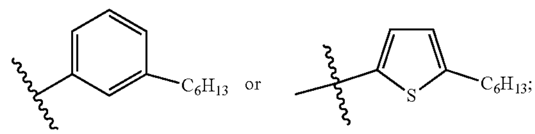
$R_9$ is
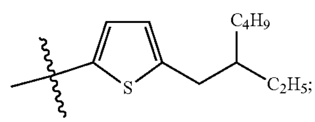
$R_{10}$ is
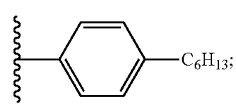
$X_9$ is H or F;
$R_{11}$ is
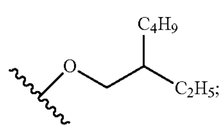
$R_{12}$ is 2-ethylhexyl;
$R_{13}$ is
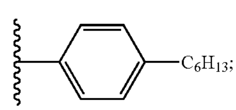

$X_{10}$ is selected from the group consisting of C, Si, and Ge;

$X_{11}$ is O or

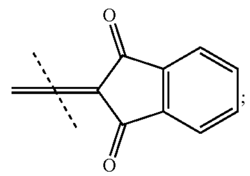

Q, L, T, and W are each independently CH or N;

$R_{14}$ and $R_{15}$ are each independently 2-ethylhexyl or n-dodecyl; and n is an integer between 1 and 10,000.

In certain embodiments, in the Stacked Perovskite/NIR Bulk Heterojunction of device type 3, the bulk heterojunction layer comprises one electron donor and one electron acceptor. In certain embodiments the weight ratio of electron donor to electron acceptor is about 1:1, about 1:1.25, about 1:1.5, about 1:1.75, about 1:2, about 2:1, about 1.75:1, about 1.5:1, or about 1.25:1. In certain embodiments, in the Stacked Perovskite/NIR Bulk Heterojunction of device type 3, the bulk heterojunction layer comprises two electron acceptors and one electron donor. In certain embodiments, in the Stacked Perovskite/NIR Bulk Heterojunction of device type 3, the bulk heterojunction layer comprises two electron donors and one electron acceptor.

In certain embodiments the bulk heterojunction layer contains PTB7-Th and IEICO-4F in a 1:1.5 weight ratio. In certain embodiments, the bulk heterojunction layer contains PDPPTDTPT, PDPP4T, and $PC_{71}BM$ in a 1:2:4 weight ratio.

III. Perovskite Compositions

In any of the above three device structures, the perovskite material or perovskite material layer is a perovskite having a structure of $ABX_3$, wherein A comprises at least one monovalent cation, B comprises at least one divalent metal, and X is one or more halides.

In certain embodiments, in the $ABX_3$ perovskite crystal structure, A comprises at least one cation selected from the group consisting of methylammonium (MA), tetramethylammonium, formamidinium (FA), cesium, rubidium, potassium, sodium, butylammonium, phenethylammonium, phenylammonium, and guanidinium.

In certain embodiments, A may comprise an ammonium, an organic cation of the general formula $[NR_4]^+$ where the R groups can be the same or different groups. Suitable R groups include, but are not limited to: methyl, ethyl, propyl, butyl, pentyl group or isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —$OC_xH_y$, where x=0-20, y=1-42.

In certain embodiments, A may comprise a formamidinium, an organic cation of the general formula $[R_2NCHNR_2]^+$ where the R groups can be the same or different groups. Suitable R groups include, but are not limited to: hydrogen, methyl, ethyl, propyl, butyl, pentyl or an isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —$OC_xH_y$, where x=0-20, y=1-42.

In certain embodiments, A may comprise a guanidinium, an organic cation of the general formula $[(R_2N)_2C{=}NR_2]^+$ where the R groups can be the same or different groups. Suitable R groups include, but are not limited to: hydrogen, methyl, ethyl, propyl, butyl, pentyl group or isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —$OC_xH_y$, where x=0-20, y=1-42.

In certain embodiments, A may comprise an alkali metal cation, such as $Li^+$, $Na^+$, $K^+$, $Rb^+$, or $Cs^+$.

In certain embodiments, the perovskite crystal structure composition may be doped (e.g., by partial substitution of the cation A and/or the metal B) with a doping element, which may be, for example, an alkali metal (e.g., $Li^+$, $Na^+$, $K^+$, $Rb^+$, or $Cs^+$), an alkaline earth metal (e.g., $Mg^{+2}$, $Ca^{+2}$, $Sr^{+2}$, $Ba^{+2}$) or other divalent metal, such as provided below for B, but different from B (e.g., $Sn^{+2}$, $Pb^{2+}$, $Zn^{+2}$, $Cd^{+2}$, $Ge^{+2}$, $Ni^{+2}$, $Pt^{+2}$, $Pd^{+2}$, $Hg^{+2}$, $Si^{+2}$, $Ti^{+2}$), or a Group 15 element, such as Sb, Bi, As, or P, or other metals, such as silver, copper, gallium, indium, thallium, molybdenum, or gold, typically in an amount of up to or less than about 1, 5, 10, 20, 25, 30, 35, 40, 45, 50, 55, 60, 65, 70, 75, 80, 85, 90, 95, 99, or 100 mol % of A or B. A may comprise a mixture of cations. B may comprise a mixture of cations.

The variable B comprises at least one divalent ($B^{+2}$) metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium).

The variable X is independently selected from one or a combination of halide atoms, wherein the halide atom (X) may be, for example, fluoride ($F^-$), chloride ($Cl^-$), bromide ($Br^-$), and/or iodide ($I^-$).

In certain embodiments, in the planar heterojunction perovskite solar cell of device 1, the perovskite material is characterized by an $ABX_3$ crystal structure, wherein A is selected from the group consisting of formamidinium (FA), methylammonium (MA), Cs, Rb, and a combination thereof; B is selected from the group consisting of Pb, Sn, Ge, and a combination thereof; and X is selected from the group consisting of I, Br, Cl, and a combination thereof.

In certain embodiments, in the single heterojunction device of type 2 comprising a mesoporous material, the perovskite material is characterized by an $ABX_3$ crystal structure, wherein A is selected from the group consisting of formamidinium (FA), methylammonium (MA), Cs, Rb, and a combination thereof; B is selected from the group consisting of Pb, Sn, Ge, and a combination thereof; and X is selected from the group consisting of I, Br, Cl, and a combination thereof.

In certain embodiments, in the Stacked Perovskite/NIR Bulk Heterojunction of device type 3, the perovskite material is characterized by an $ABX_3$ crystal structure, wherein A is selected from the group consisting of formamidinium (FA), methylammonium (MA), Cs, Rb, and a combination thereof; B is selected from the group consisting of Pb, Sn, Ge, and a combination thereof; and X is selected from the group consisting of I, Br, Cl, and a combination thereof.

In certain embodiments, the perovskite composition is $MAPbI_3$. In certain embodiments, the perovskite composition is $FA_{0.81}MA_{0.14}Cs_{0.05}PbI_{2.55}Br_{0.45}$. In certain embodiments, the perovskite composition is $(FA_{0.85}MA_{0.15})_{0.95}Cs_{0.05}Pb(I_{0.85}Br_{0.15})_3$.

IV. General Device Components

In any of the three above device structures, an electrode may be either an anode or a cathode. In certain embodiments, one electrode may function as a cathode, and the other may function as an anode. An electrode may constitute any conductive material. Suitable electrode materials may include any one or more of: indium tin oxide or tin-doped indium oxide (ITO); fluorine-doped tin oxide (FTO); cadmium oxide (CdO); zinc indium tin oxide (ZITO); aluminum zinc oxide (AZO); aluminum (Al); gold (Au); copper (Cu); chromium (Cr); calcium (Ca); magnesium (Mg); silver (Ag); titanium (Ti); steel; carbon (and allotropes thereof); and combinations thereof. In certain embodiments, any of the three above devices comprises an electrode consisting of copper (Cu). In certain embodiments, any of the three above devices comprises an electrode consisting of ITO. In certain embodiments, any of the three above devices comprises an electrode consisting of silver (Ag).

As used herein, "transport layer" may include solid-state charge transport material (i.e., a colloquially labeled solid-state electrolyte), or it may include a liquid electrolyte and/or ionic liquid. Any of the liquid electrolyte, ionic liquid, and solid-state charge transport material may be referred to as a charge transport material. As used herein, "charge transport material" refers to any material, solid, liquid, or otherwise, capable of collecting charge carriers and/or transporting charge carriers. For instance, in PV devices according to certain embodiments, a charge transport material may be capable of transporting charge carriers to an electrode. Charge carriers may include holes (the transport of which could make the charge transport material just as properly labeled "hole transport material," which comprises a "hole transport layer") and electrons. Holes may be transported toward an anode, and electrons toward a cathode (thereby making it an "electron transport layer"), depending upon placement of the charge transport layer in relation to either a cathode or anode in a PV or other device. Suitable examples of charge transport material according to some embodiments may include any one or more of: perovskite material; $I^-/I_3^-$; Co complexes; polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT); poly(triaryl amine) compounds and derivatives thereof (e.g., PTAA); Spiro-OMeTAD; fullerenes and/or fullerene derivatives (e.g., C60, PCBM); and combinations thereof. In certain embodiments, charge transport layer comprising a charge transport material may include any material, solid or liquid, capable of collecting charge carriers (electrons or holes), and/or capable of transporting charge carriers. Charge transport material of certain embodiments therefore may be n- or p-type active and/or semi-conducting material. In certain embodiments, in any of the three devices above, the electron transport layer comprises a material selected from the group consisting of C60, BCP, $TiO_2$, $SnO_2$, $PC_{61}BM$, $PC_{71}BM$, ICBA, ZnO, ZrAcac, LiF, Ca, Mg, TPBI, PFN, and a combination thereof. In certain embodiments, in any of the three devices above, the hole transport layer comprises a material selected from the group consisting of PTAA, Spiro-OMeTAD, PEDOT:PSS, NiO, $MoO_3$, $V_2O_5$, Poly-TPD, EH44, and a combination thereof. Charge transport material may be disposed proximate to one of the electrodes of a device. It may in certain embodiments be disposed adjacent to an electrode, although in certain other embodiments an interfacial layer may be disposed between the charge transport material and an electrode. In certain embodiments, the type of charge transport material may be selected based upon the electrode to which it is proximate. For example, if the charge transport layer collects and/or transports holes, it may be proximate to an anode so as to transport holes to the anode. However, the charge transport layer may instead be placed proximate to a cathode, and be selected or constructed so as to transport electrons to the cathode.

In certain embodiments, any one of the three above device structures may optionally include an interfacial layer between any two other layers and/or materials, although devices according to certain embodiments need not contain any interfacial layers. Thus, for example, a device may contain zero, one, two, three, four, five, or more interfacial layers. An interfacial layer may include a thin-coat interfacial layer (e.g., comprising alumina and/or other metal-oxide particles, and/or a titania/metal-oxide bilayer, and/or other compounds in accordance with thin-coat interfacial layers). An interfacial layer according to certain embodiments may include any suitable material for enhancing charge transport and/or collection between two layers or materials; it may also help prevent or reduce the likelihood of charge recombination once a charge has been transported away from one of the materials adjacent to the interfacial layer. Suitable interfacial materials may include any one or more of: Al; Bi;

In; Mo; Ni; platinum (Pt); Si; Ti; V; Nb; Zn; Zr, oxides of any of the foregoing metals (e.g., alumina, silica, titania); a sulfide of any of the foregoing metals; a nitride of any of the foregoing metals; functionalized or non-functionalized alkyl silyl groups; graphite; graphene; fullerenes; carbon nanotubes; and combinations thereof (including, in some embodiments, bilayers of combined materials). In certain embodiments, in any of the bulk heterojunction device type structures described above, the device additionally comprises an interfacial layer consisting of a buffer layer. In certain embodiments, the buffer layer is situated between the bulk heterojunction layer and the electrode. In certain embodiments, the buffer layer comprises LiF. In certain embodiments, the buffer layer comprises $MoO_3$. In certain embodiments, some or all of the active layer components (i.e. charge transport layer, mesoporous layer, perovskite layer) may be in whole or in part arranged in sub-layers. For example, the active layer may comprise any one or more of: an interfacial layer including interfacial material; a mesoporous layer including mesoporous material; and a charge transport layer including charge transport material. Further, an interfacial layer may be included between any two or more other layers of an active layer. Reference to layers herein may include either a final arrangement (e.g., substantially discrete portions of each material separately definable within the device), and/or reference to a layer may mean arrangement during construction of a device, notwithstanding the possibility of subsequent intermixing of material(s) in each layer. Layers may in certain embodiments be discrete and comprise substantially contiguous material. In certain other embodiments, layers may be substantially intermixed (as in the case of, e.g., BHJ). In certain embodiments, a device may comprise a mixture of these two kinds of layers. In any case, any two or more layers of whatever kind may in certain embodiments be disposed adjacent to each other (and/or intermixedly with each other) in such a way as to achieve a high contact surface area. In certain embodiments, a layer comprising a perovskite material layer may be disposed adjacent to one or more other layers so as to achieve high contact surface area (e.g., where a perovskite material exhibits low charge mobility). In other embodiments, high contact surface area may not be necessary (e.g., where a perovskite material exhibits high charge mobility).

In certain embodiments, any of the three above devices may optionally include one or more substrates. In certain embodiments, either or both of the first and second electrode may be coated or otherwise disposed upon a substrate, such that the electrode is disposed substantially between a substrate and an active layer. The materials of composition of devices (e.g., substrate, electrode, active layer and/or active layer components) may in whole or in part be either rigid or flexible in various embodiments. In certain embodiments, an electrode may act as a substrate, thereby negating the need for a separate substrate. In certain embodiments, the components are flexible.

The choice of functional substrate is dependent on the end-use application. In certain embodiments, the substrate is inorganic, such as, for example, silicon (Si), a metal (e.g., Al, Co, Ni, Cu, Ti, Zn, Pt, Au, Ru, Mo, W, Ta, or Rh, stainless steel, a metal alloy, or combination thereof), a metal oxide (e.g., glass or a ceramic material, such as F-doped indium tin oxide), a metal nitride (e.g., TaN), a metal carbide, a metal silicide, or a metal boride. In certain embodiments, the substrate is organic, such as a rigid or flexible heat-resistant plastic or polymer film, or a combination thereof, or multilayer composite thereof. Some of these substrates, such as molybdenum-coated glass and flexible plastic or polymeric film, are particularly suitable for use in photovoltaic applications. The photovoltaic substrate can be, for example, an absorber layer, emitter layer, or transmitter layer useful in a photovoltaic device.

In certain embodiments, the perovskite solar cells disclosed herein have a power conversion efficiency of about 13%, 14%, 15%, 16%, 17%, 18%, 19%, 19.1, 19.2, 19.3, 19.4 19.5%, 19.7%, 19.8%, 19.9%, 20%, 20.1%, 20.2%, 20.3%, 20.4%, 20.5%, 20.6%, 20.7%, 20.8%, 20.9%, 21%, 21.2%, 21.3%, 21.4%, 21.5%, 21.6%, 21.7%, 21.8%, 21.9%, 22%, 23%, or 24%.

In certain embodiments, the perovskite solar cells disclosed herein exhibit a near infrared External Quantum Efficiency extended to about 915 nm, 920 nm, 925 nm, 930 nm, 935 nm, 940 nm, 945 nm, 950 nm, 955 nm, 960 nm, or 965 nm.

The subject matter described herein is directed to the following embodiments:

1. A planar heterojunction perovskite solar cell, comprising:
   - a first electrode;
   - a first transport layer disposed on said first electrode;
   - a perovskite material layer disposed on said first transport layer;
   - a second transport layer disposed on said perovskite material layer;
   - and a second electrode disposed on said second transport layer,
   - wherein one of said first or second transport layers is a hole transport layer and the other one of said first or second transport layers is an electron transport layer, and
   - wherein at least one of said hole transport layer or said electron transport layer comprises a single near infrared sensitive semiconductor material.
2. The planar heterojunction perovskite solar cell of embodiment 1, wherein said near infrared sensitive semiconductor material is capable of absorbing light with a wavelength of at least 780 nm.
3. The planar heterojunction perovskite solar cell of embodiment 1 or 2, wherein said electron transport layer comprises a material selected from the group consisting of C60, BCP, $TiO_2$, $SnO_2$, $PC_{61}BM$, $PC_{71}BM$, ICBA, ZnO, ZrAcac ($Zr(C_5H_7O_2)_4$), LiF, Ca, Mg, TPBI, PFN, and a combination thereof.
4. The planar heterojunction perovskite solar cell of any one of embodiments 1-3, wherein said electron transport layer comprises a mixture of C60 and BCP.
5. The planar heterojunction perovskite solar cell of any one of embodiments 1-4, wherein said hole transport layer comprises a material selected from the group consisting of PTAA, Spiro-OMeTAD, PEDOT:PSS, NiO, $MoO_3$, $V_2O_5$, Poly-TPD, EH44, and a combination thereof.
6. The planar heterojunction perovskite solar cell of any one of embodiments 1-5, wherein said hole transport layer comprises PTAA.
7. The planar heterojunction perovskite solar cell of embodiment 1, wherein said near infrared sensitive semiconductor material is an inorganic semiconductor selected from the group consisting of PbS, CdTe, Copper Indium Gallium Selenide (CIGS), GaAs, PbS, Si, $(FA_aMA_bCs_{(1-a-b)}Pb_cSn_{(1-c)}I_dBr_{3-d}$, in which $0 \le a \le 1$, $0 \le b \le 1$, $0 \le a+b \le 1$, $0 \le c \le 1$, and $0 \le d \le 3$, FA=HC$(NH_2)_2$, MA=$CH_3NH_3$), and $Sb_2Se_3$.
8. The planar heterojunction perovskite solar cell of any one of embodiments 1-6, wherein said near infrared sensitive semiconductor material is an organic semiconductor selected from the group consisting of
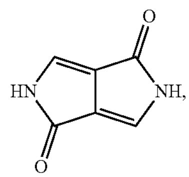
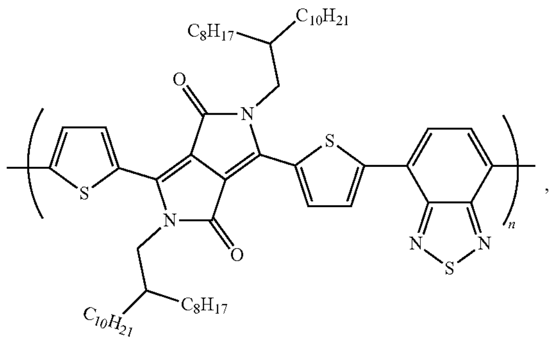
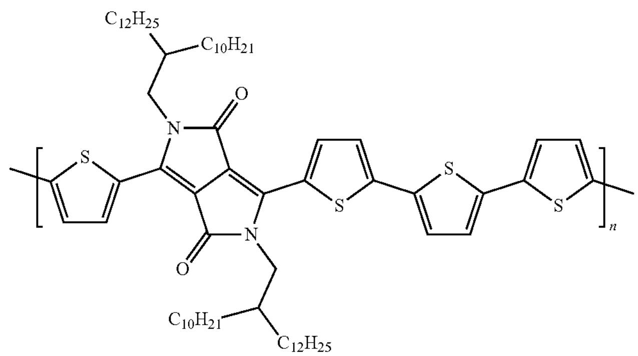
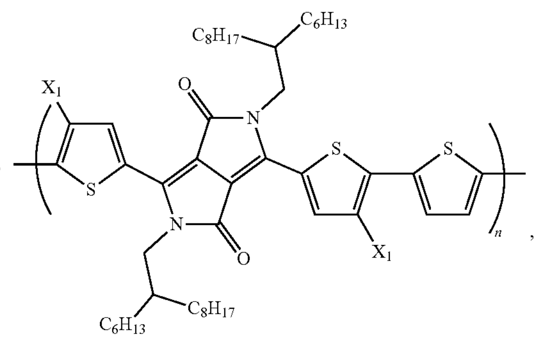
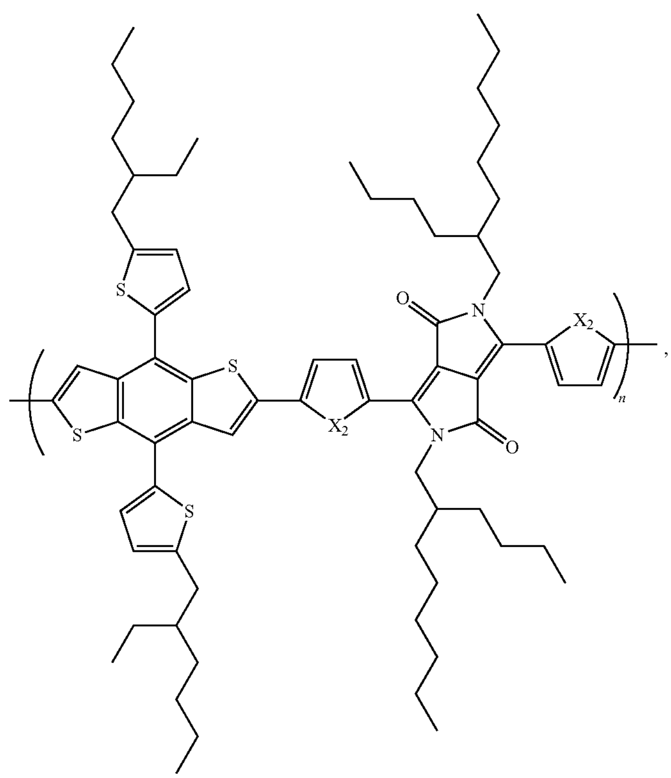

-continued
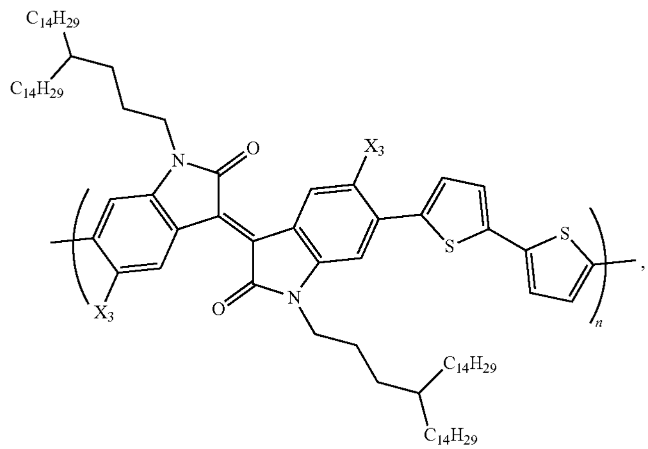
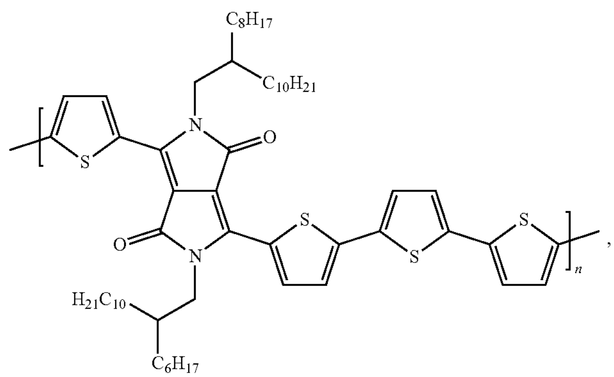
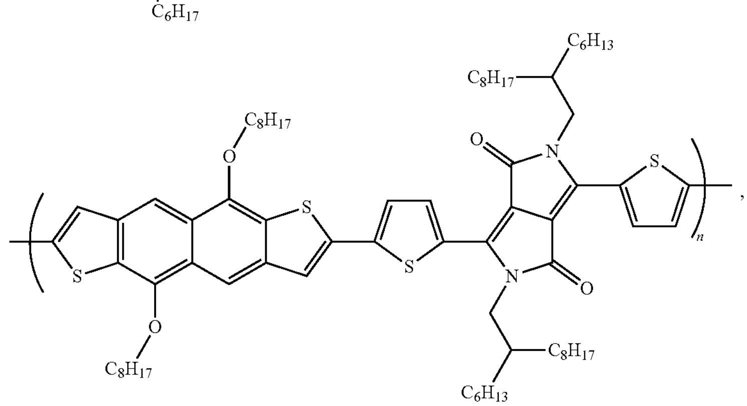
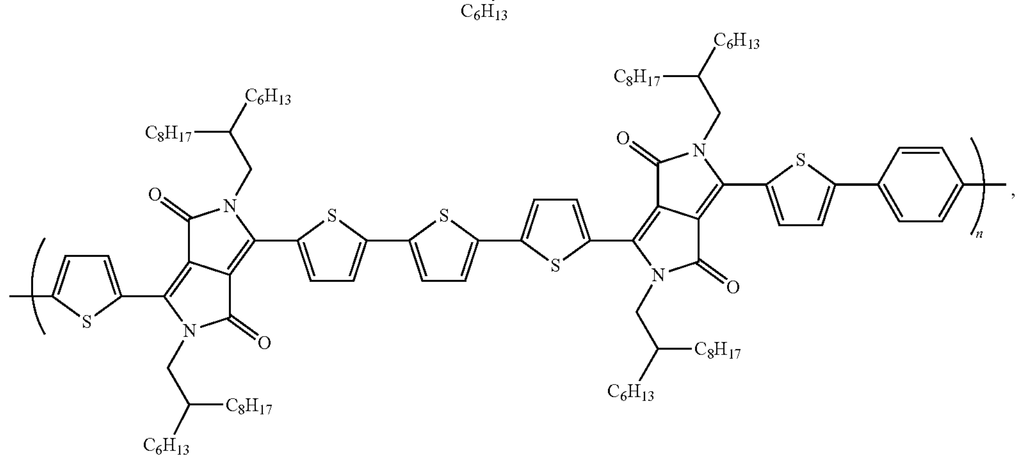

-continued
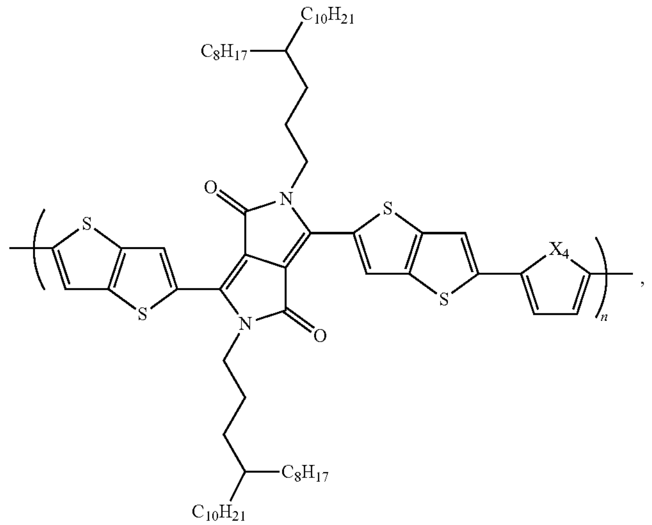
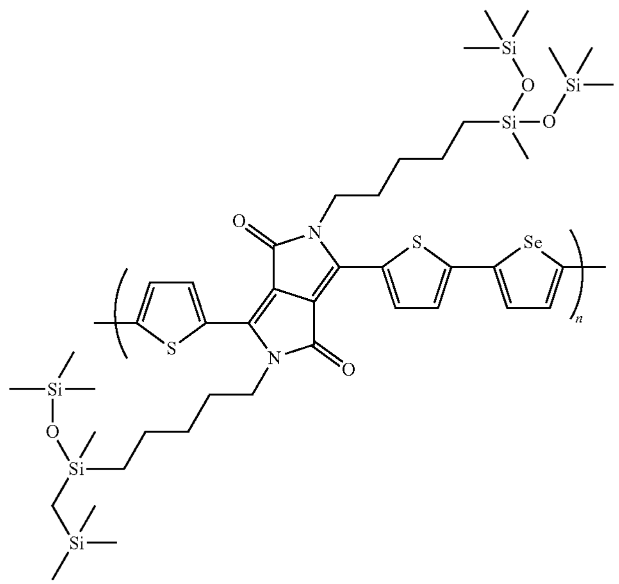
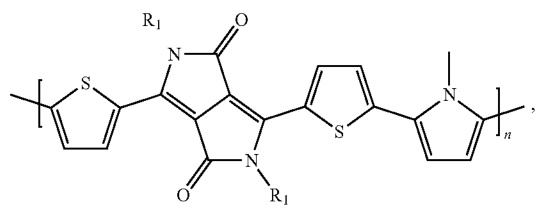
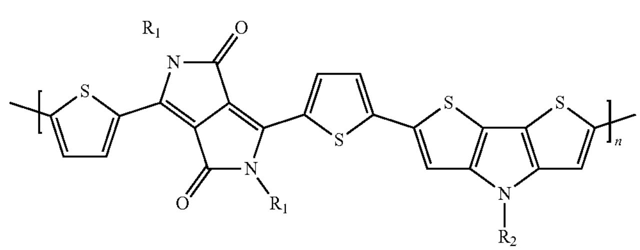
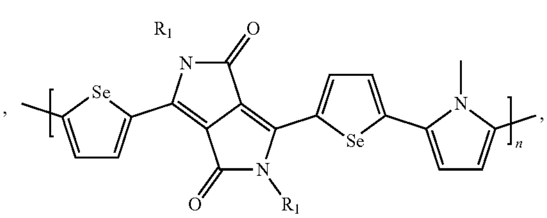
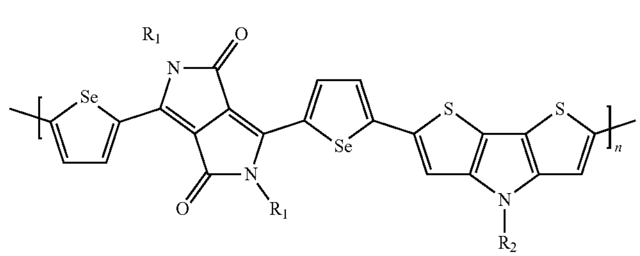
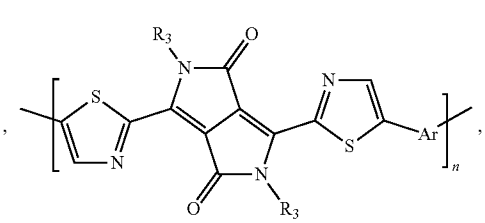

-continued
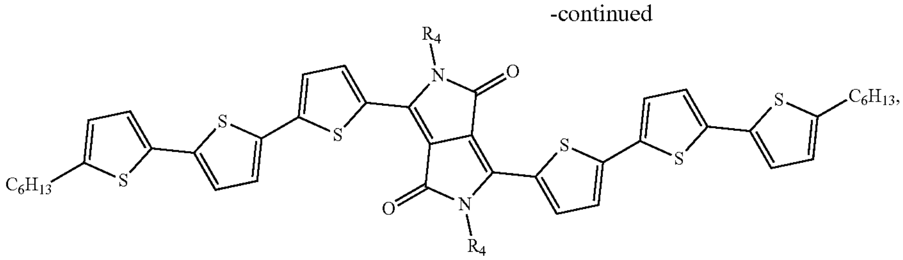
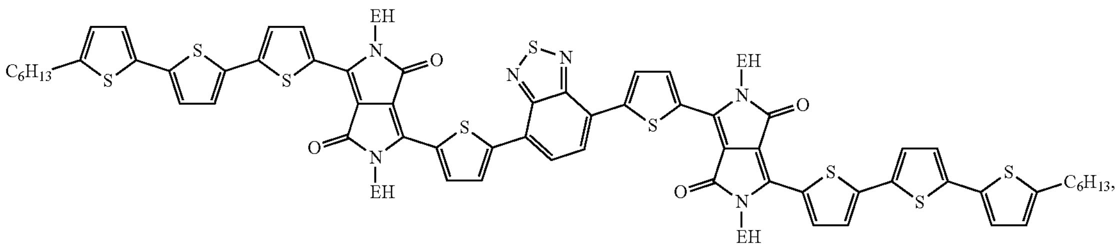
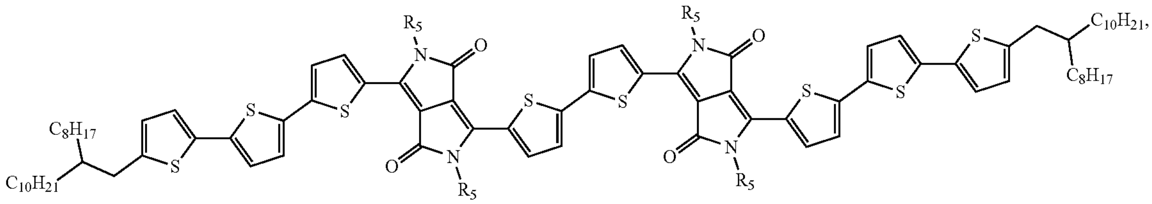
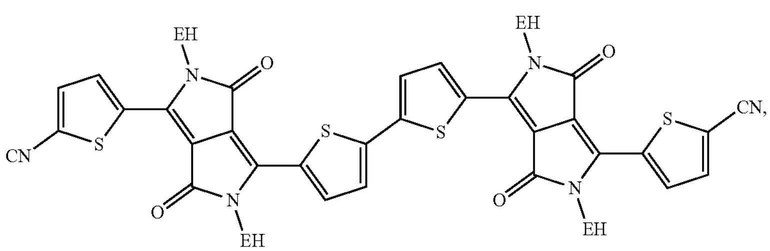
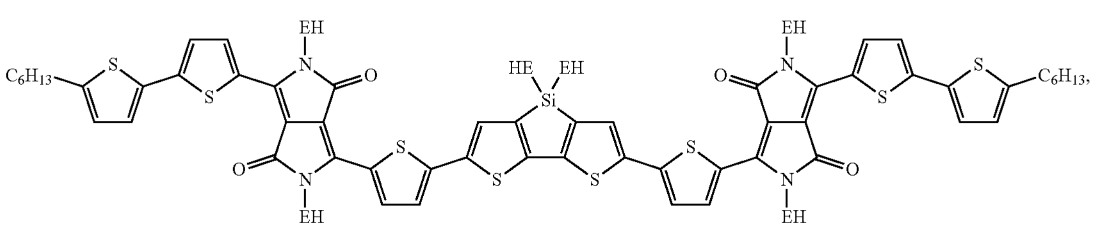
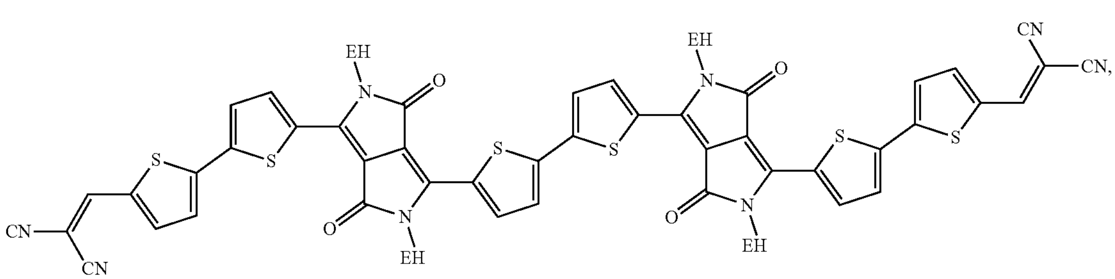

-continued
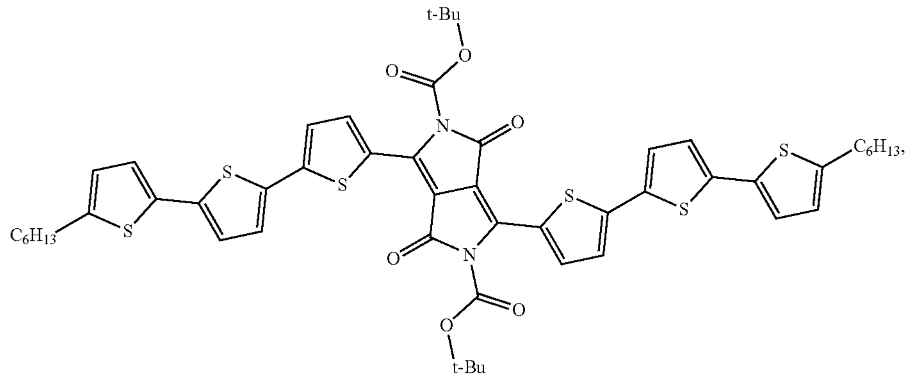
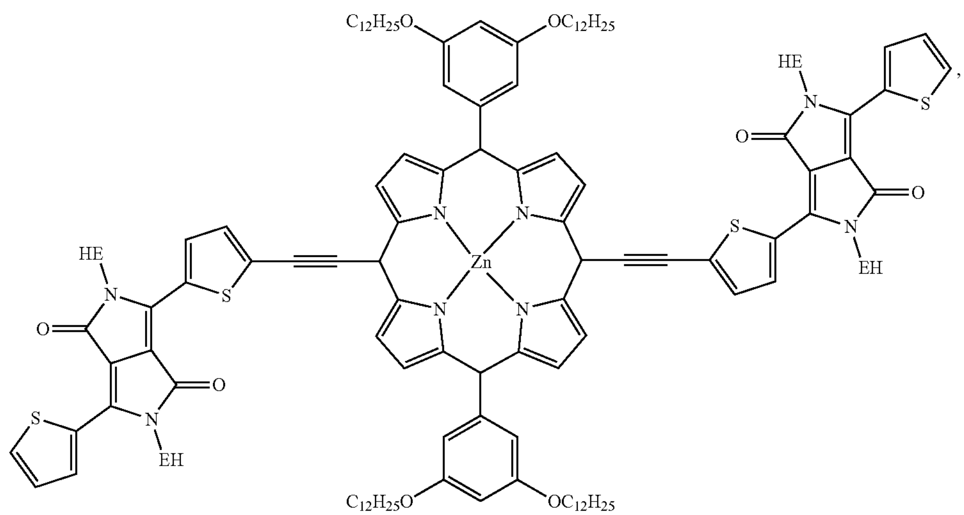
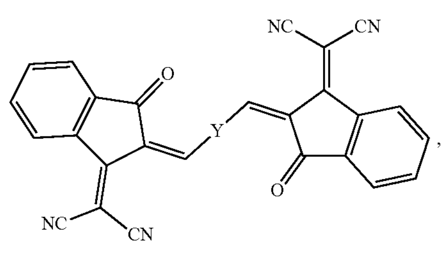
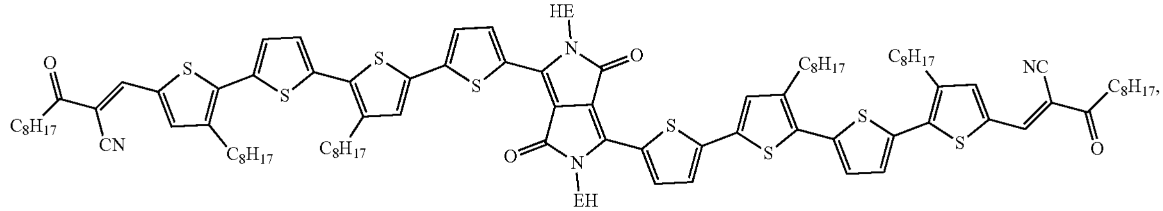

-continued
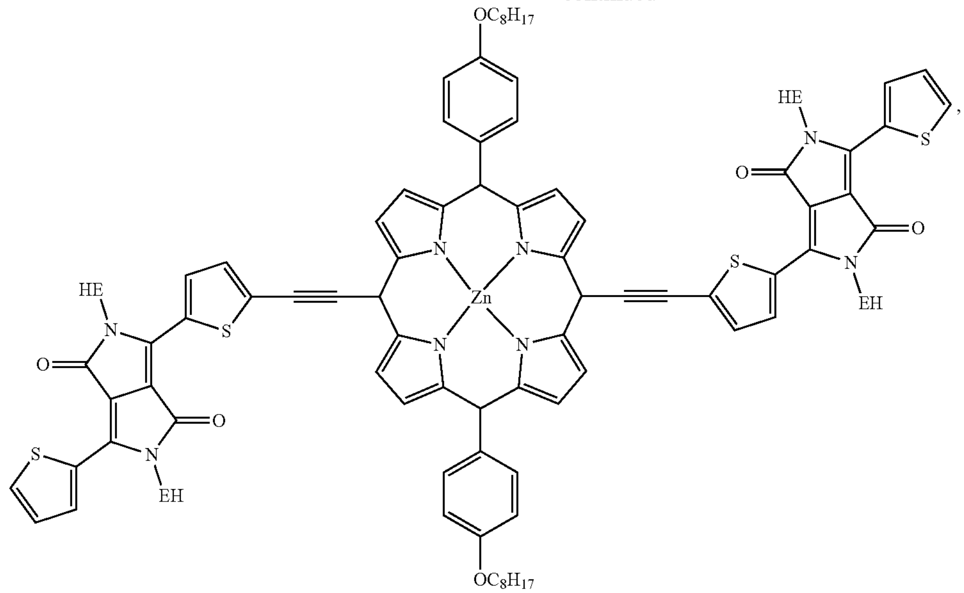
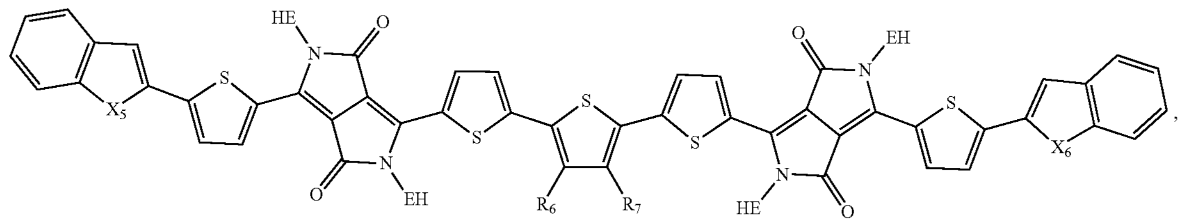
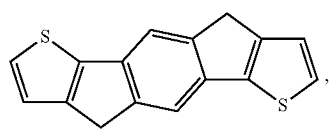
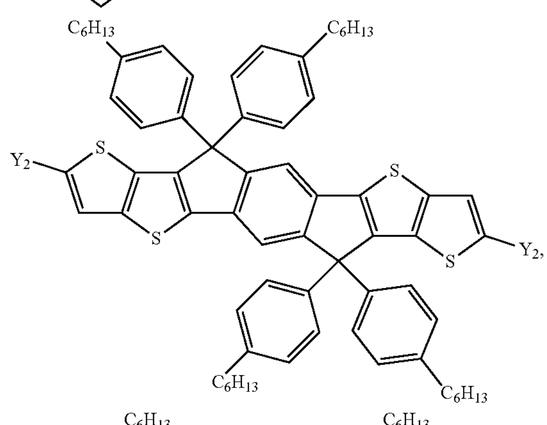
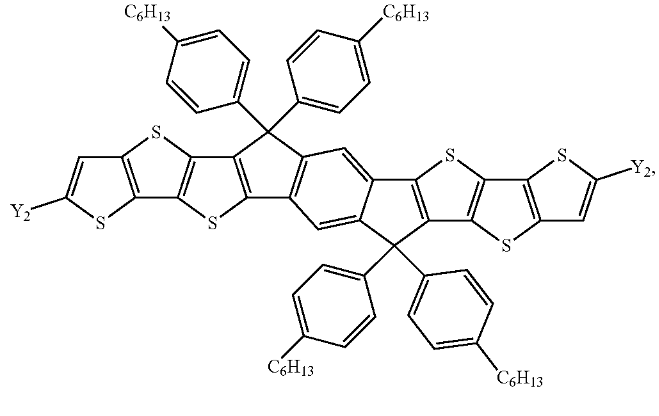

-continued
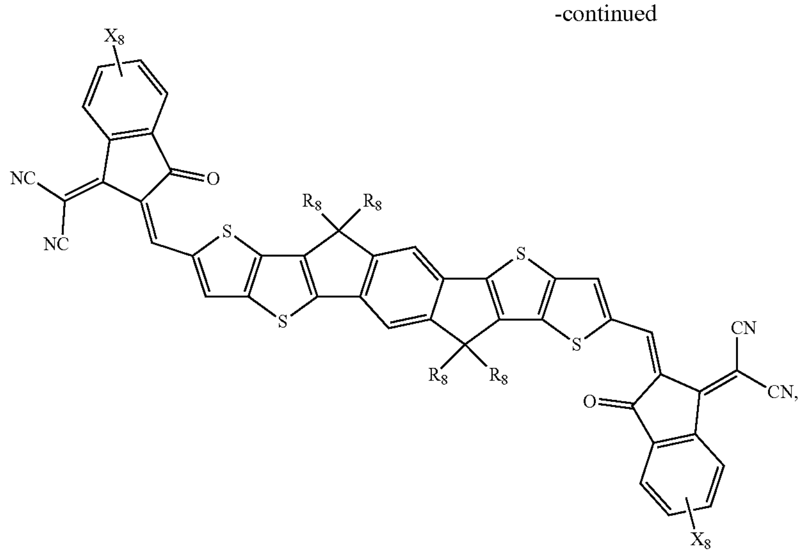
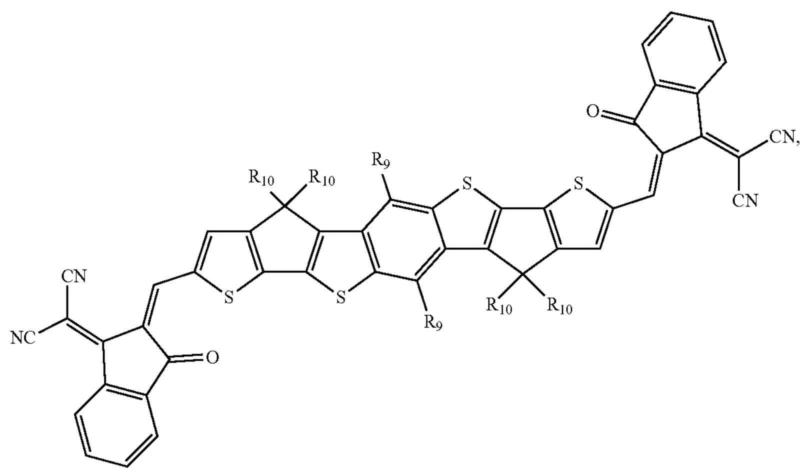
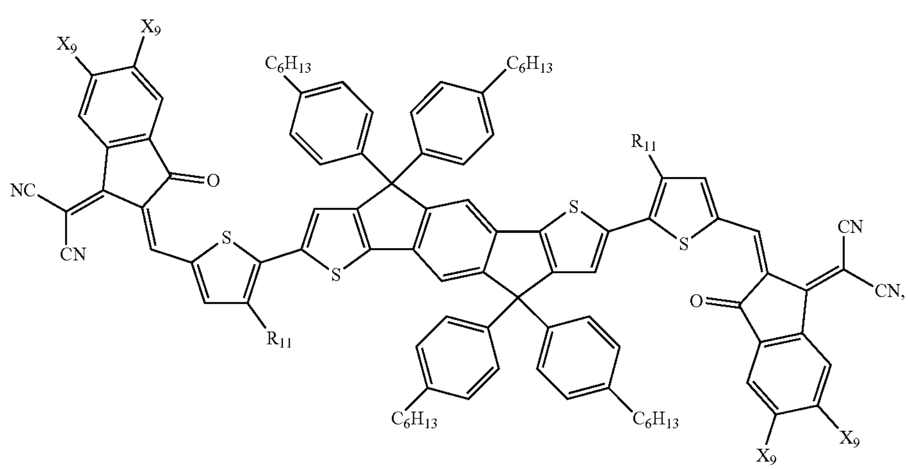

-continued
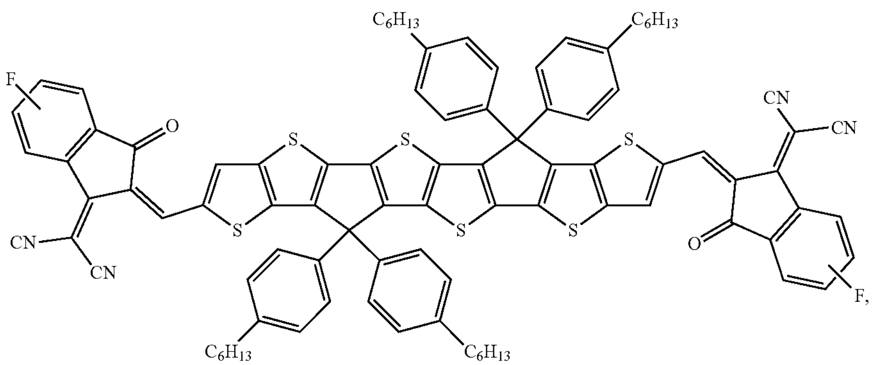
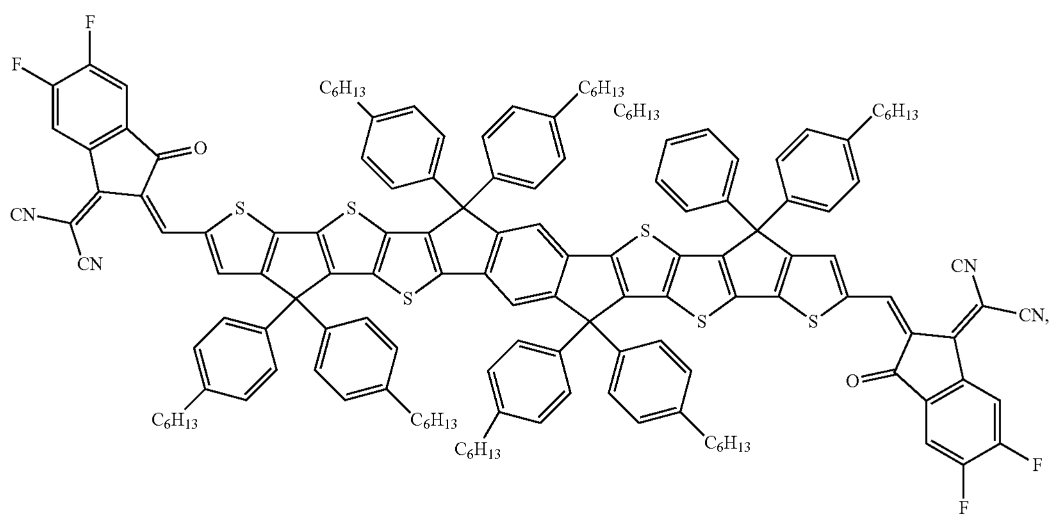
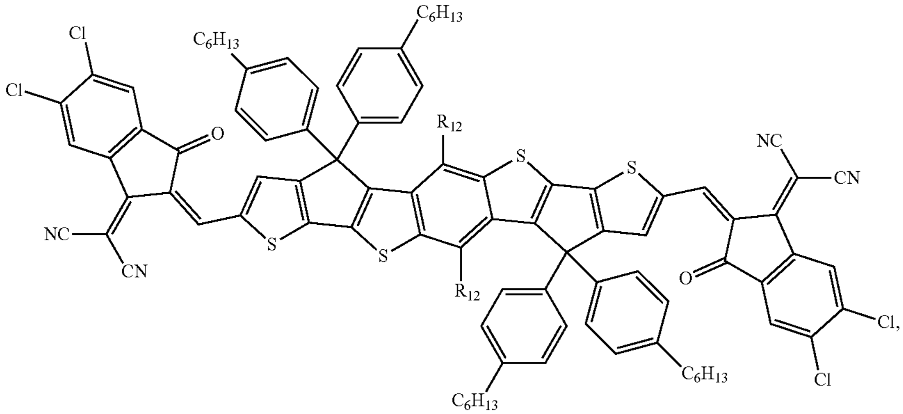

-continued
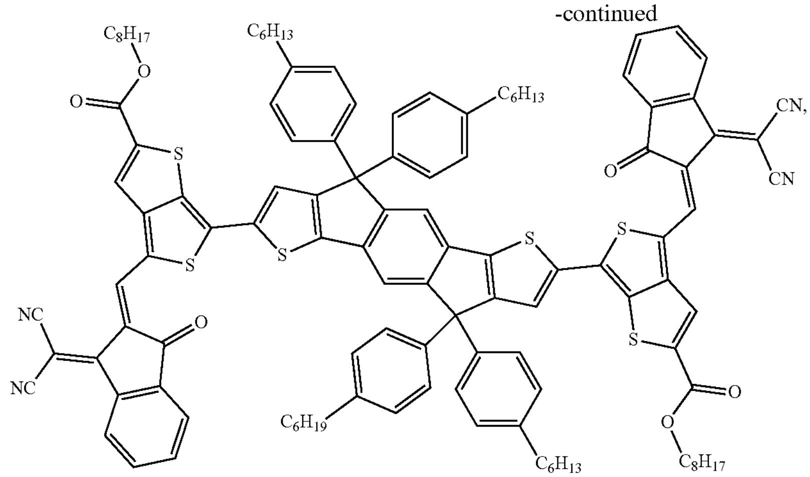
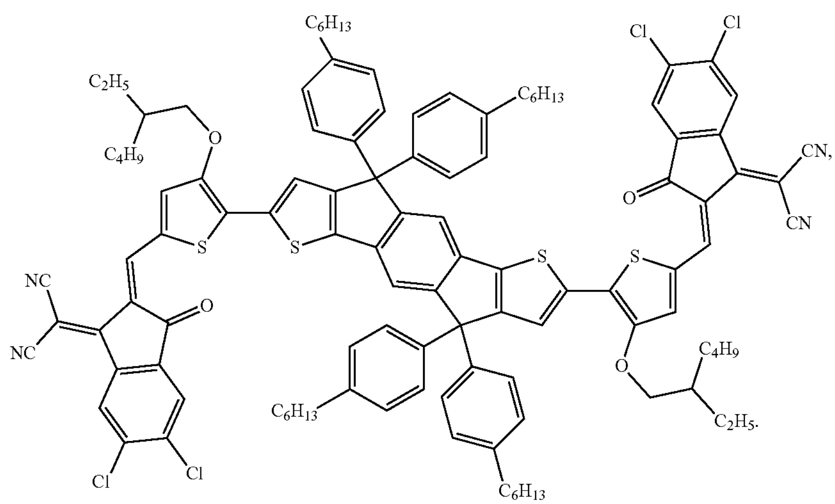
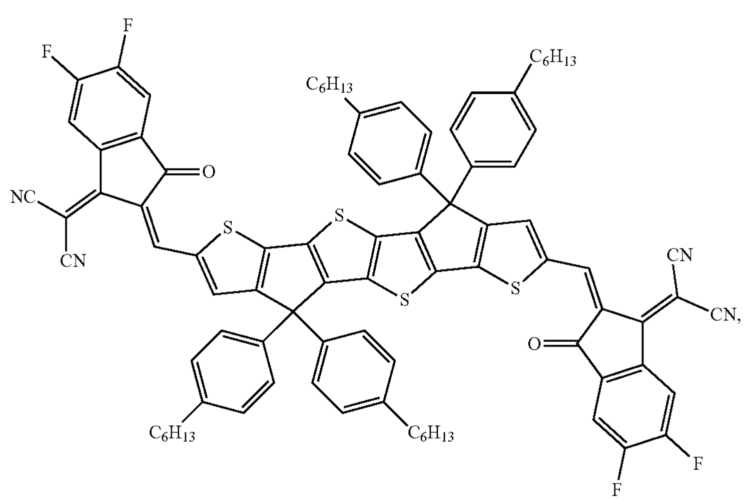

-continued
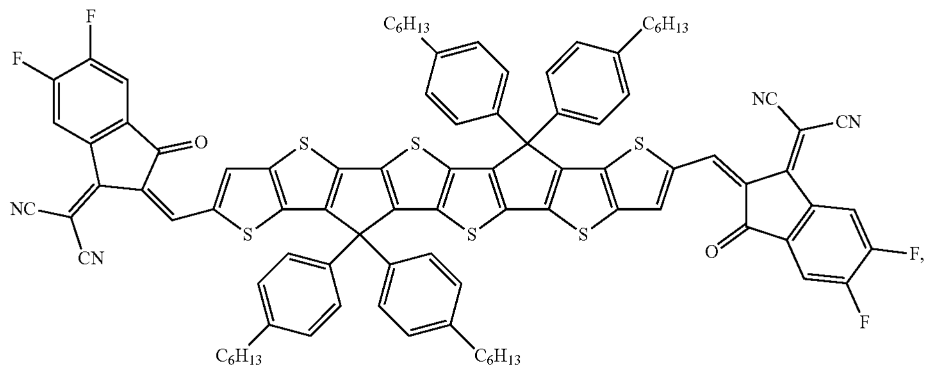
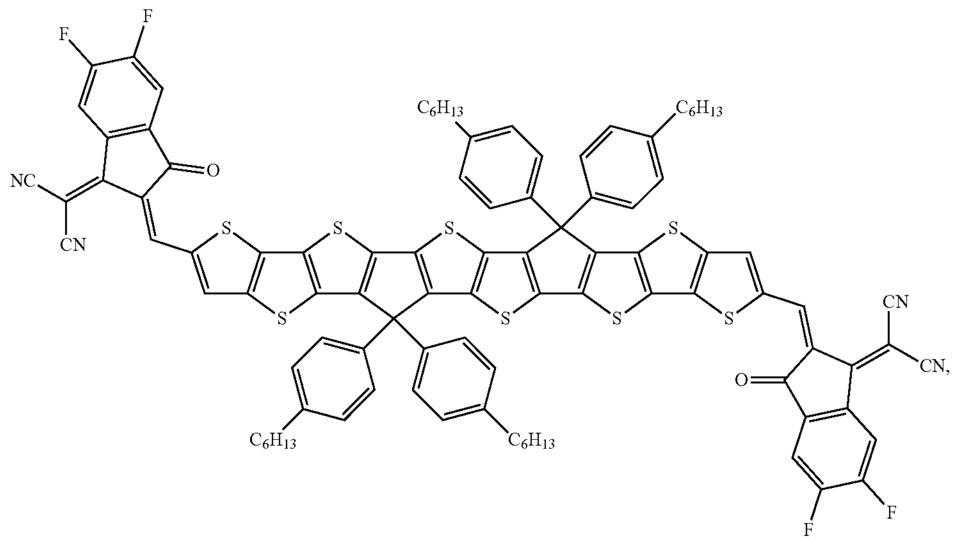
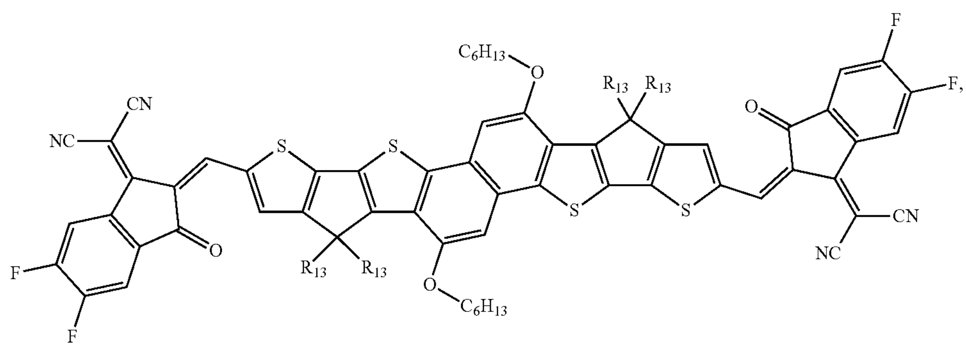
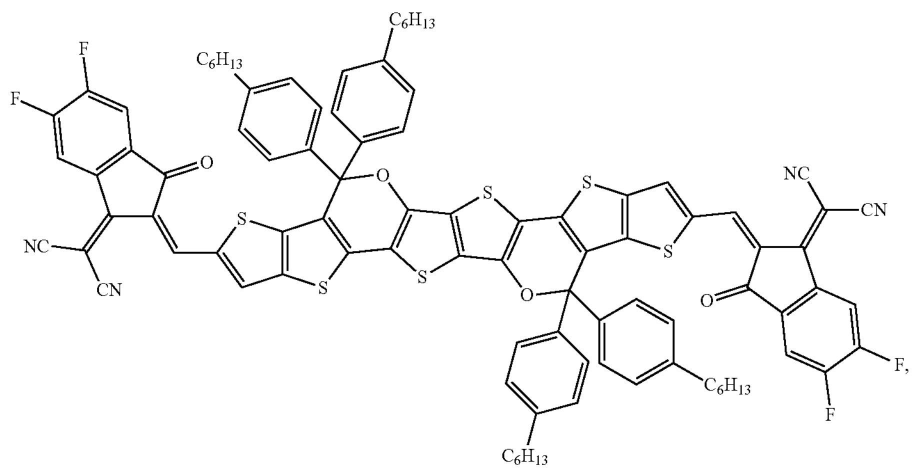

-continued
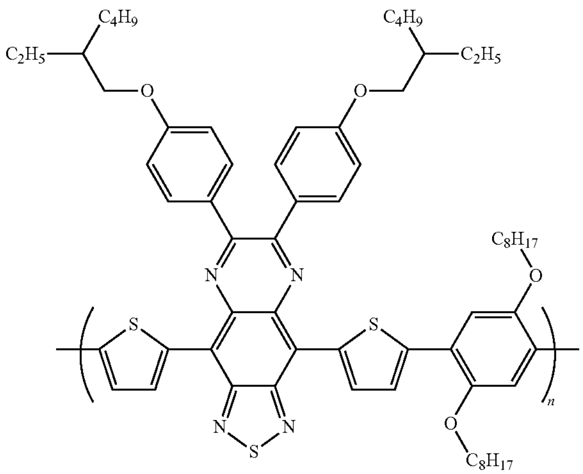
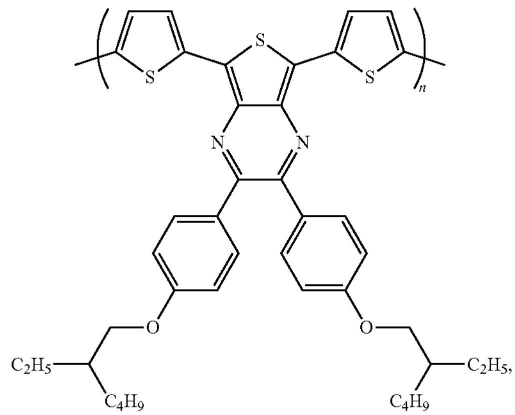
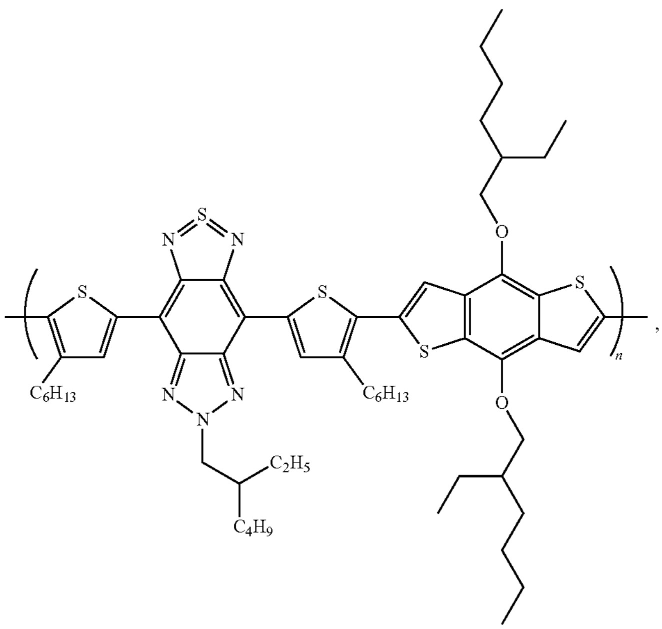
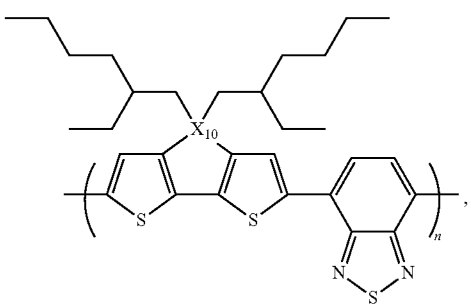
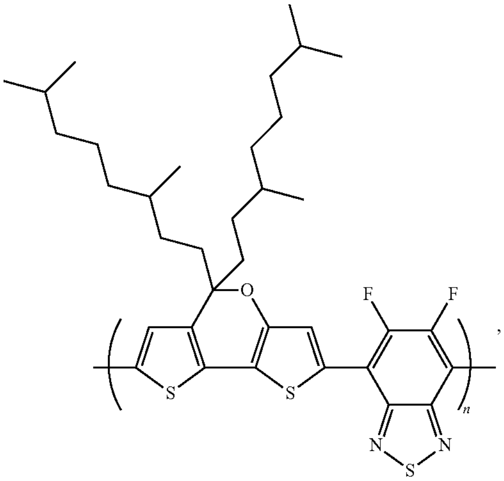

-continued
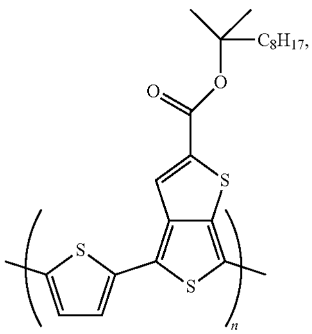
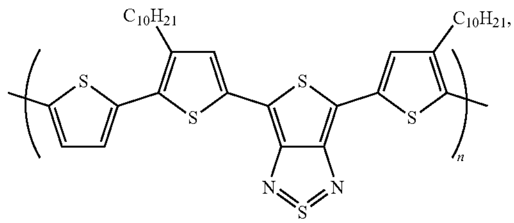
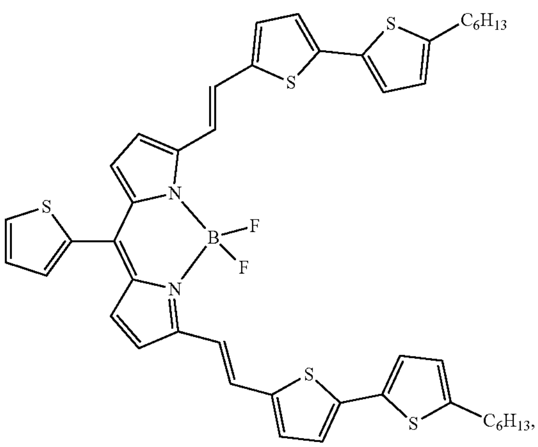
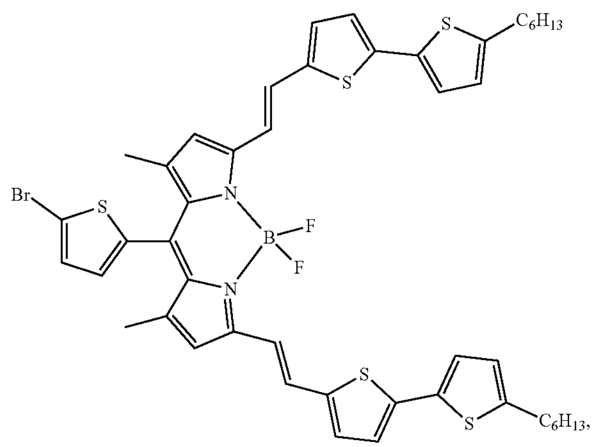
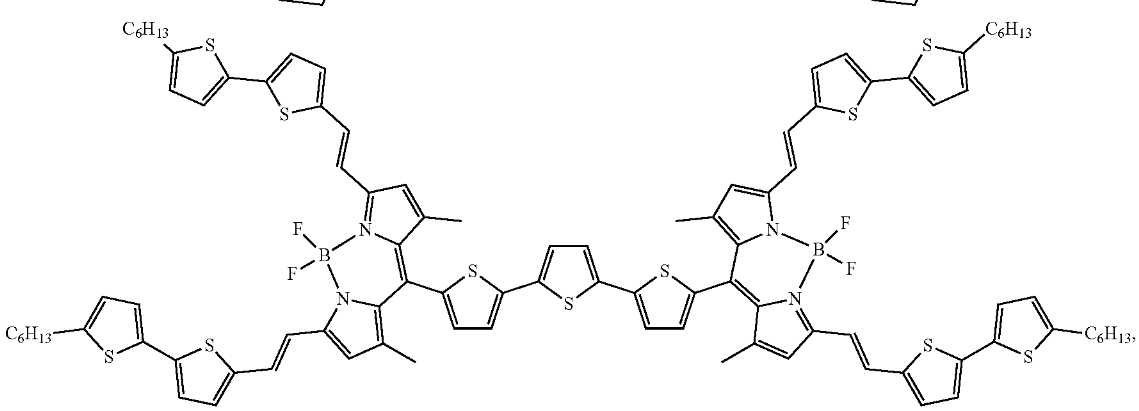
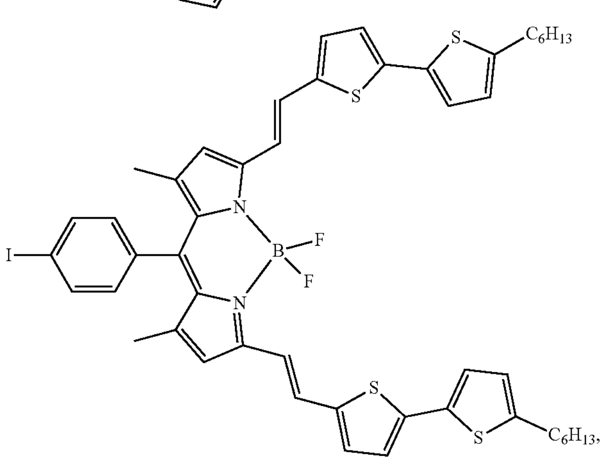

-continued

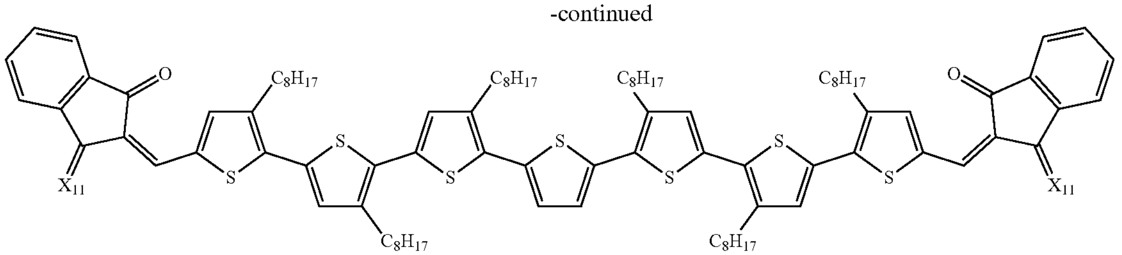

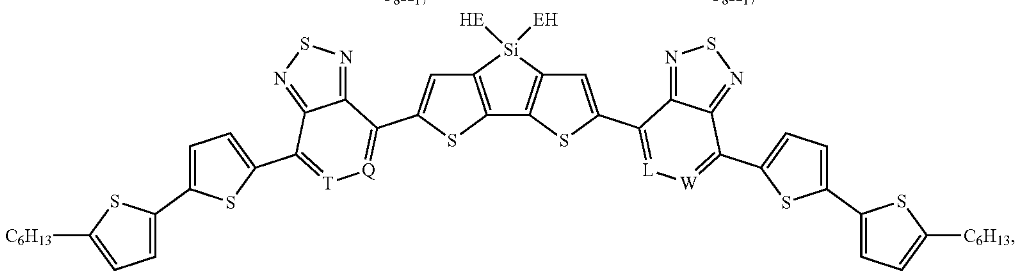

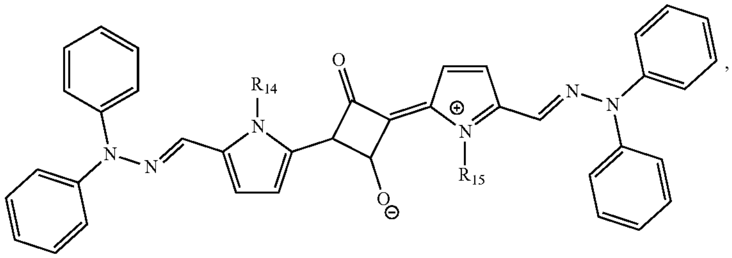

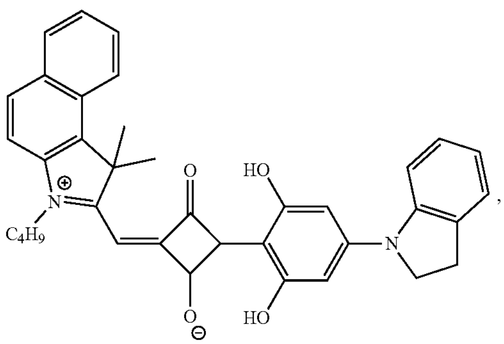
, and
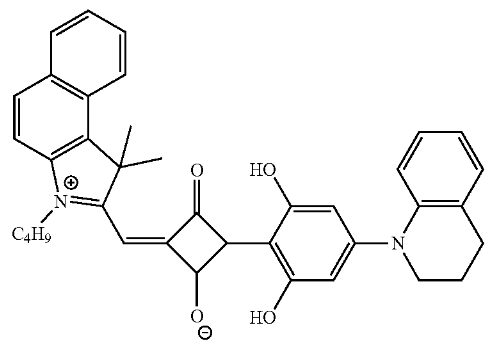
;

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

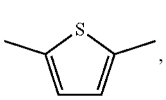
,
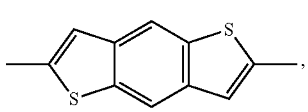
,

-continued

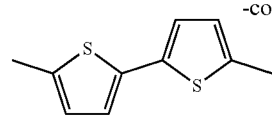
,
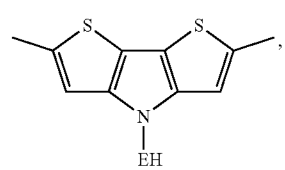
, wherein EH is 2-ethylhexyl;

$R_4$ is $C_6H_{13}$ or $C_{12}H_{25}$;

$R_5$ is H or

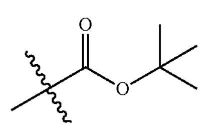 [SMILES: *C(=O)OC(C)(C)C]

$R_6$ and $R_7$ are each independently H or $CH_3$;

$X_5$ and $X_6$ are each independently O or S;

EH is 2-ethylhexyl;
Y is selected from the group consisting of
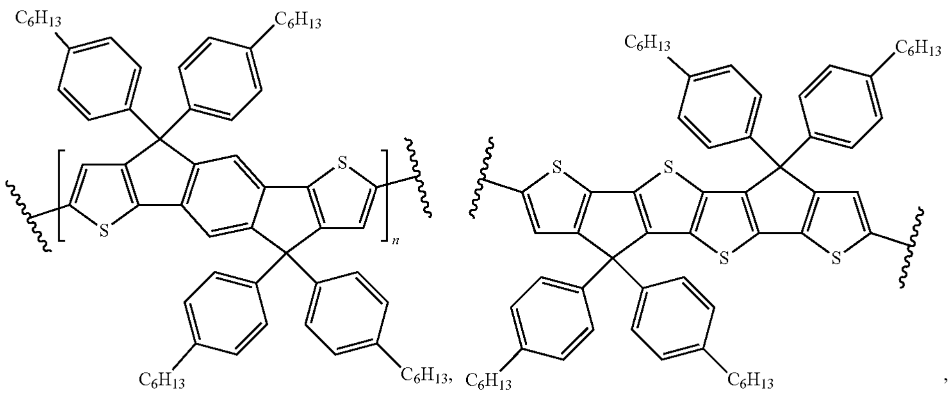
,
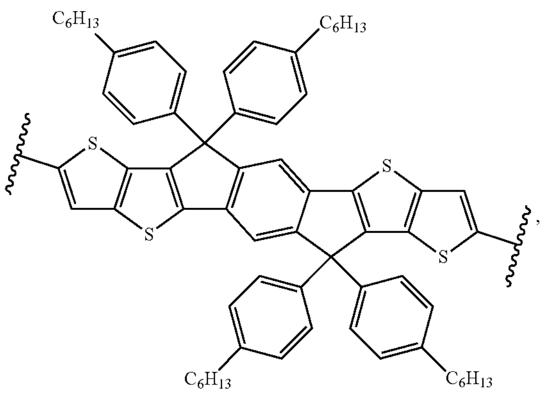
,
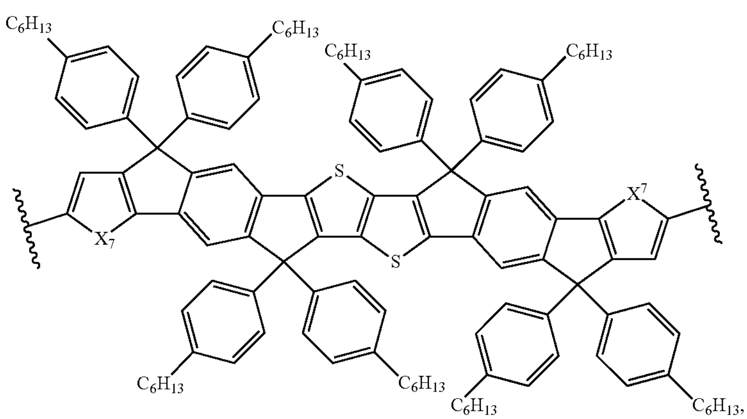
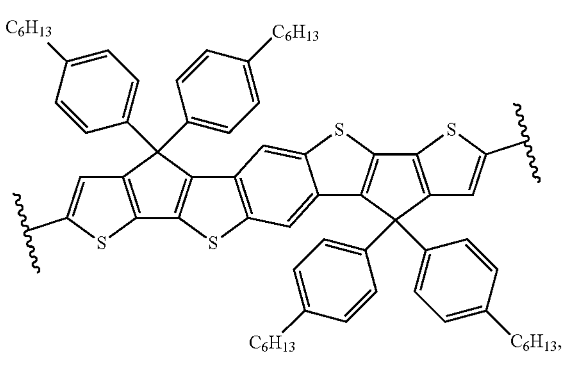
and -continued
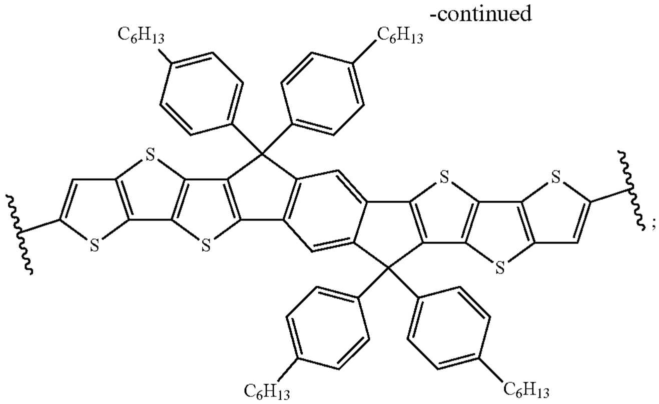
where $X_7$ is S or Se;
$Y_2$ is selected from the group consisting of
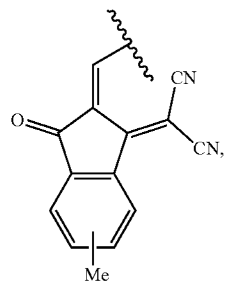
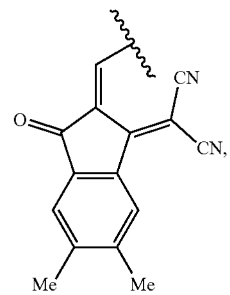
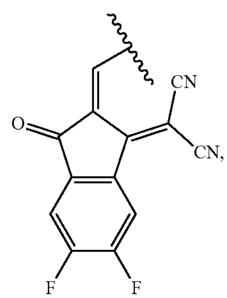
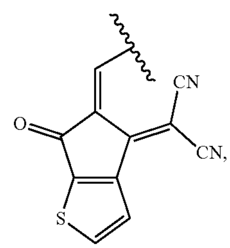
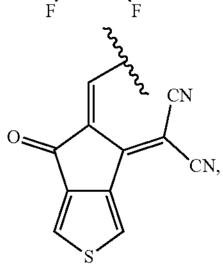
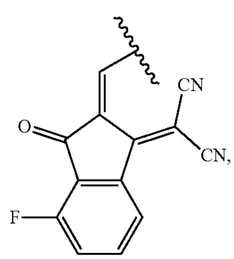
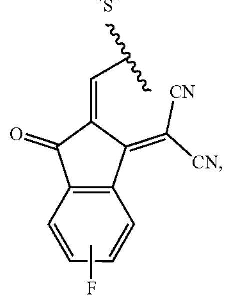
and
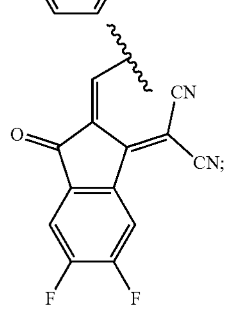
$X_8$ is H or F;
$R_8$ is
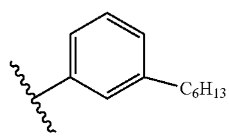
or
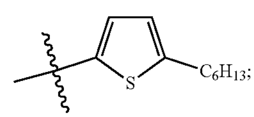
$R_9$ is
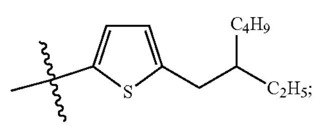
$R_{10}$ is
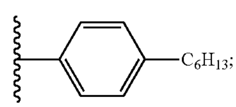
$X_9$ is H or F;
$R_{11}$ is
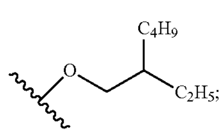
$R_{12}$ is 2-ethylhexyl;
$R_{13}$ is
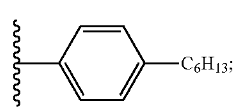

$X_{10}$ is selected from the group consisting of C, Si, and Ge;
$X_{11}$ is O or
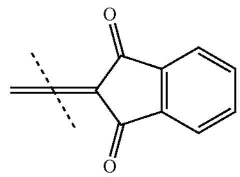
;
Q, L, T, and W are each independently CH or N;
$R_{14}$ and $R_{15}$ are each independently 2-ethylhexyl or n-dodecyl; and
n is an integer between 1 and 10,000.
9. The planar heterojunction perovskite solar cell of any one of embodiments 1-6 or 8, wherein said single near infrared sensitive semiconductor material is
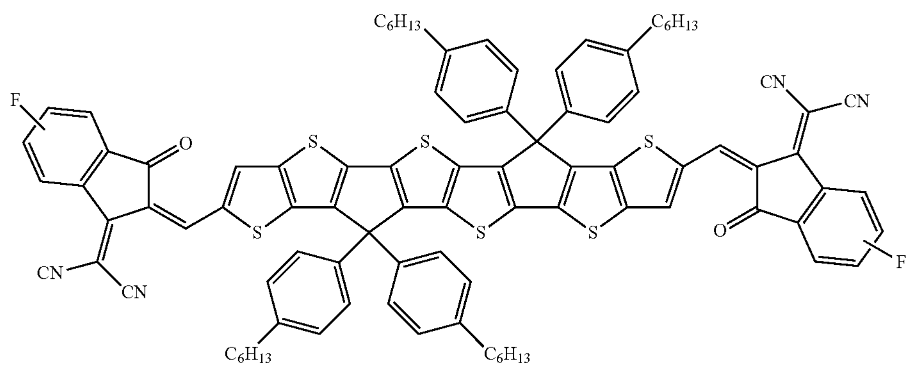
or
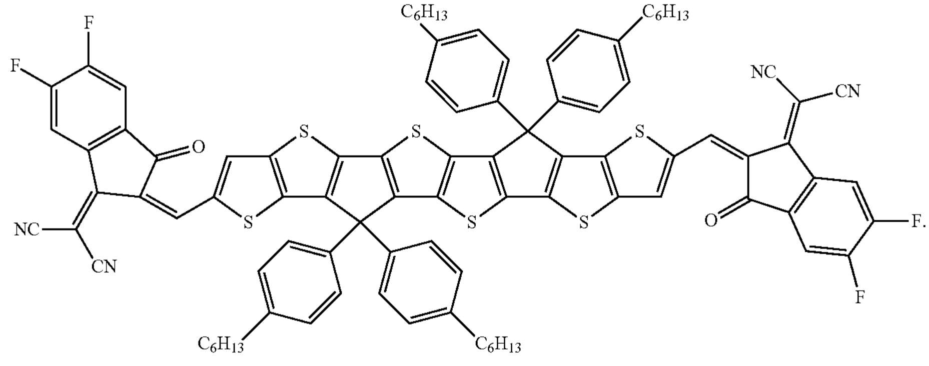
.

10. The planar heterojunction perovskite solar cell of any one of embodiments 1-6 or 8, wherein said near infrared sensitive semiconductor material is selected from the group consisting of
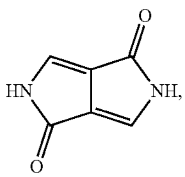
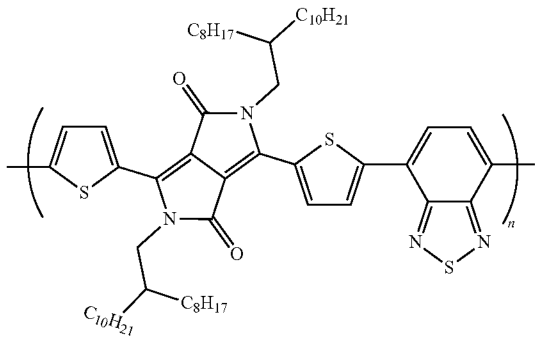
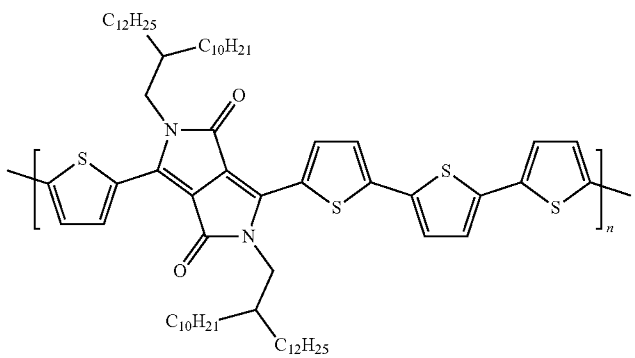
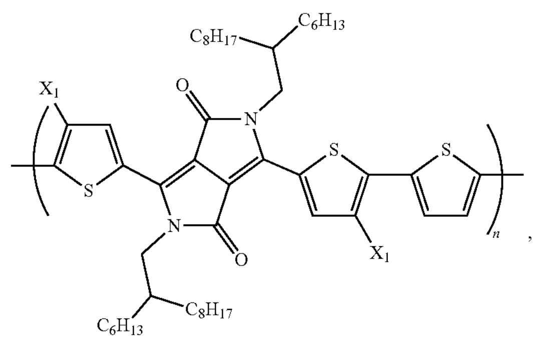
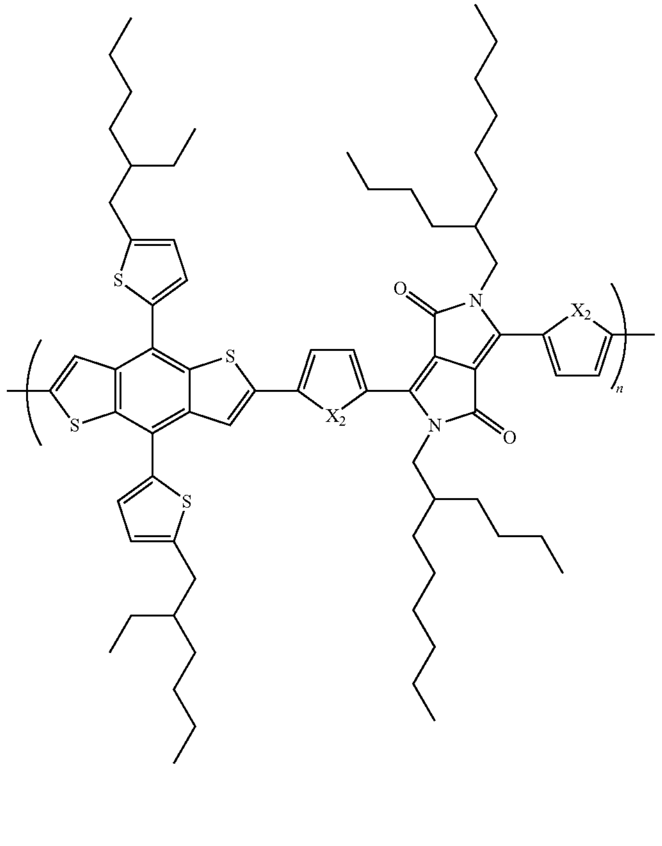

-continued
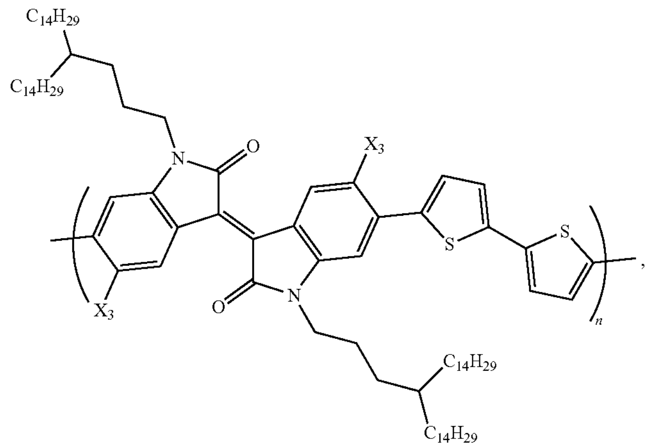
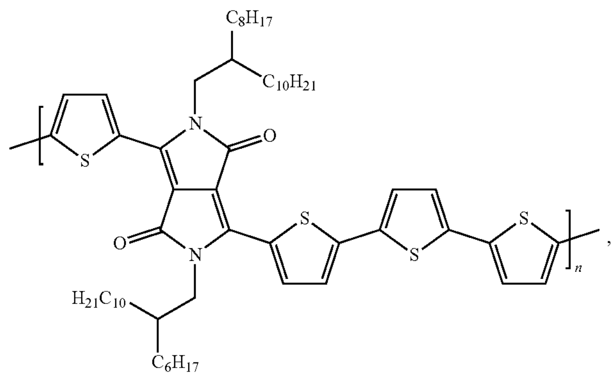
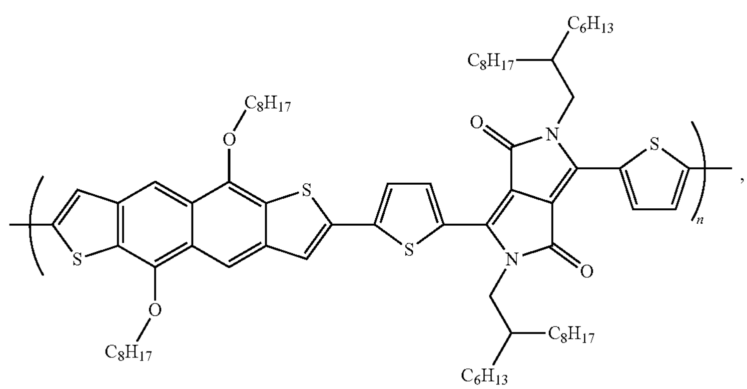
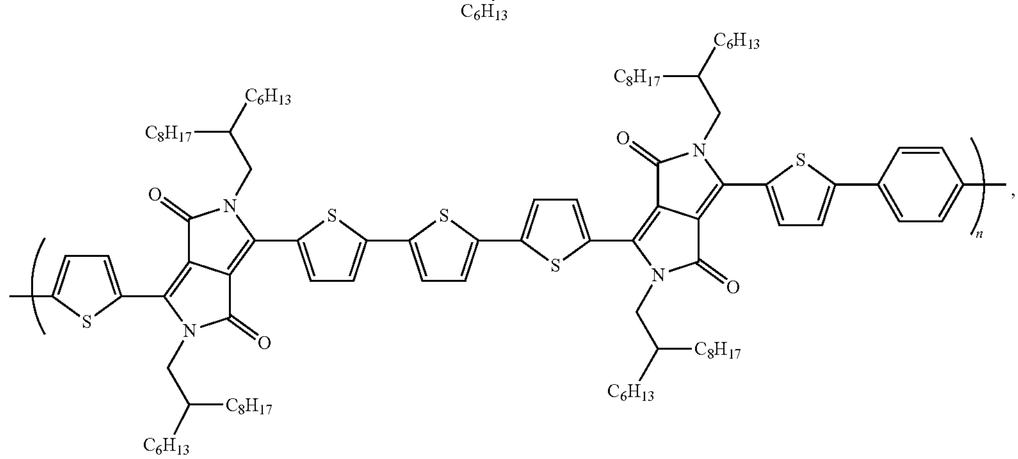

-continued
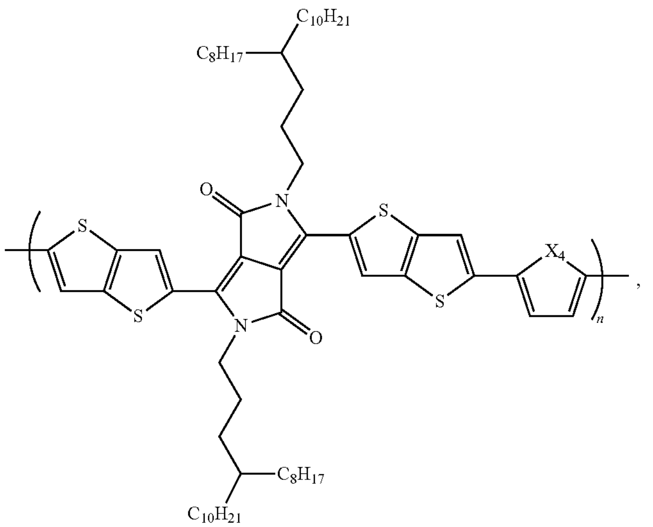
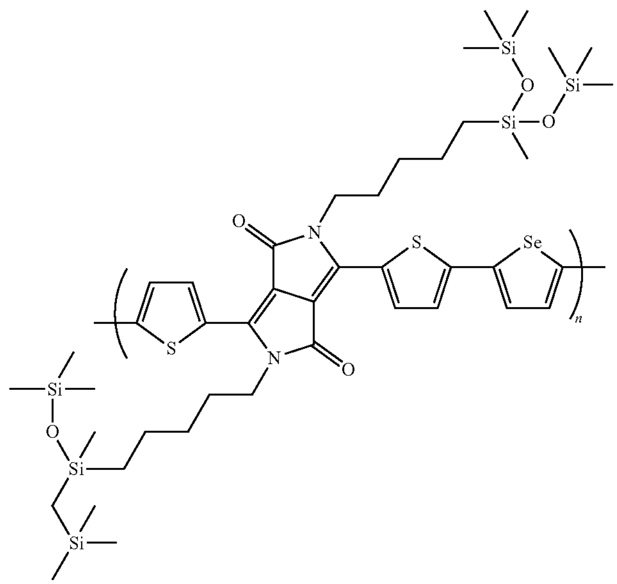
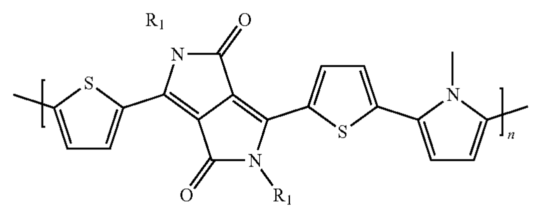
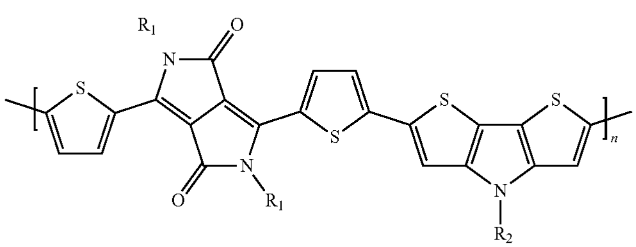
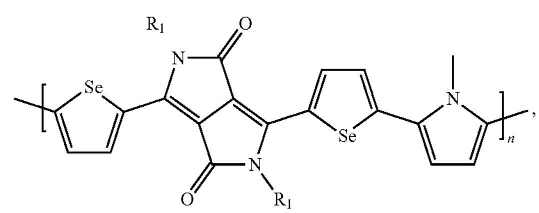
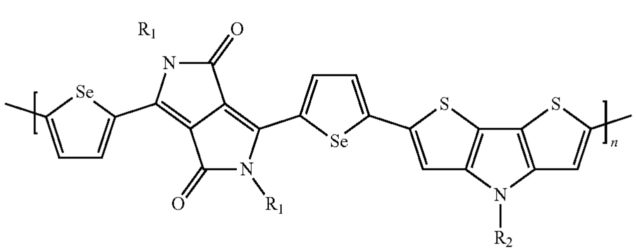
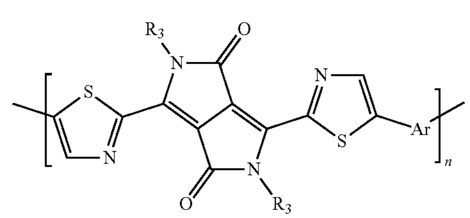

-continued
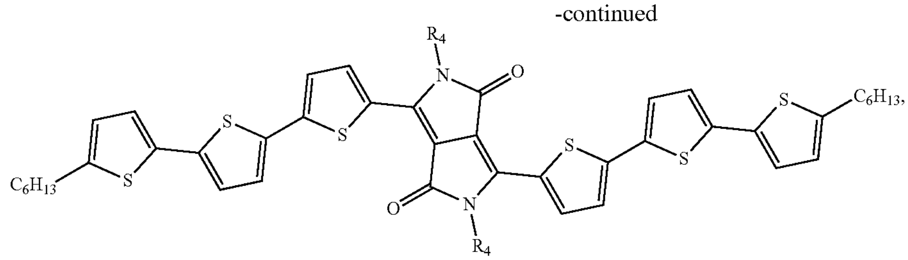
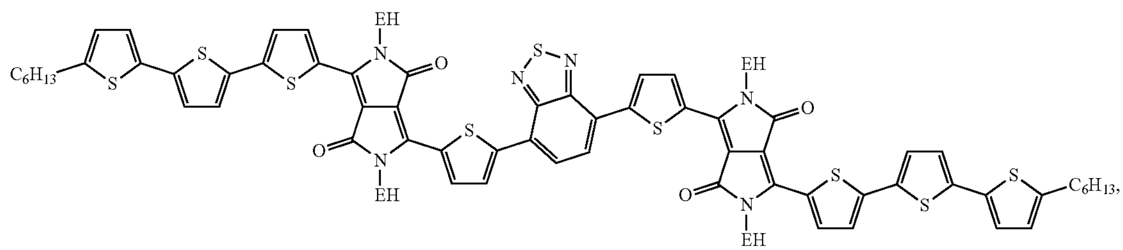
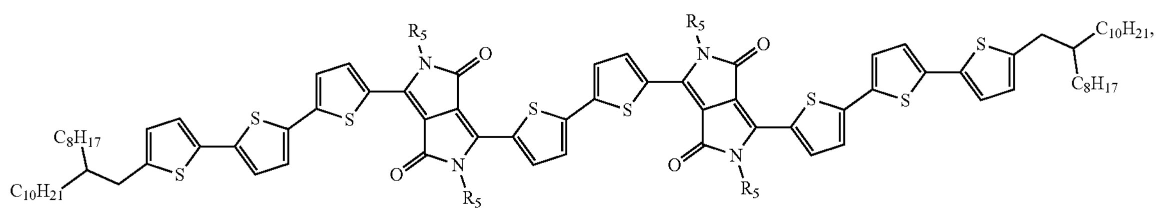
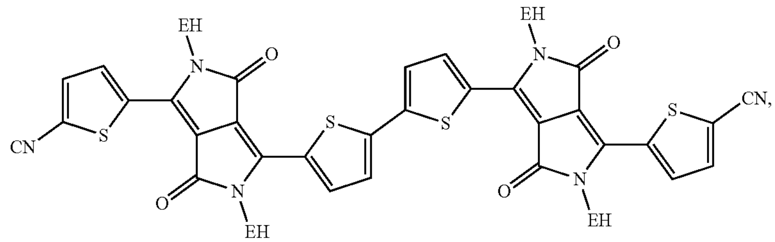
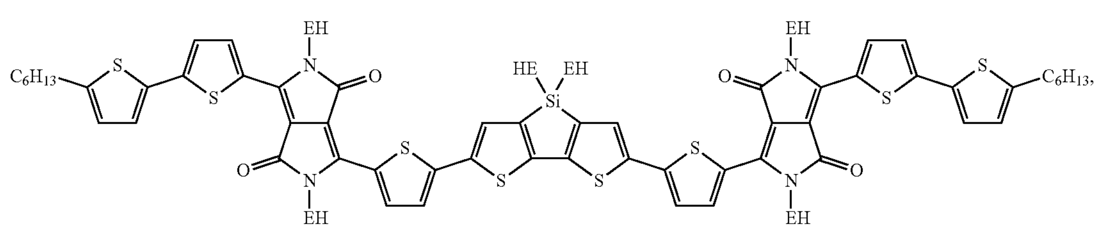
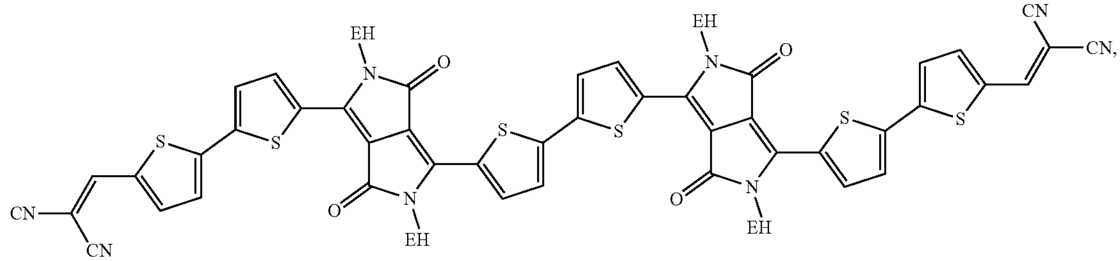

-continued
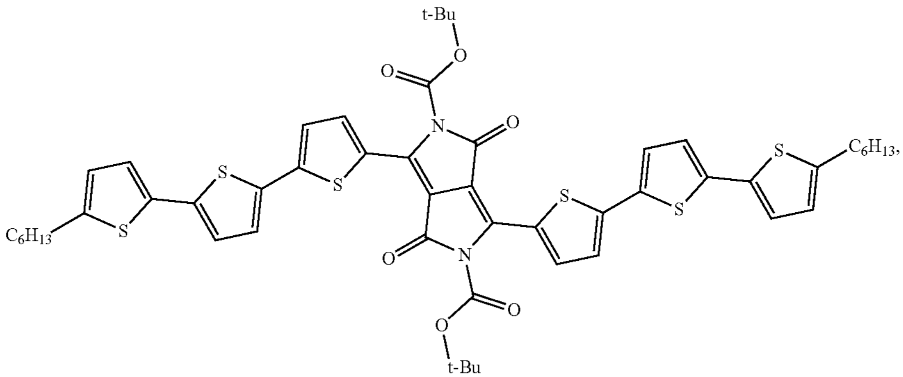
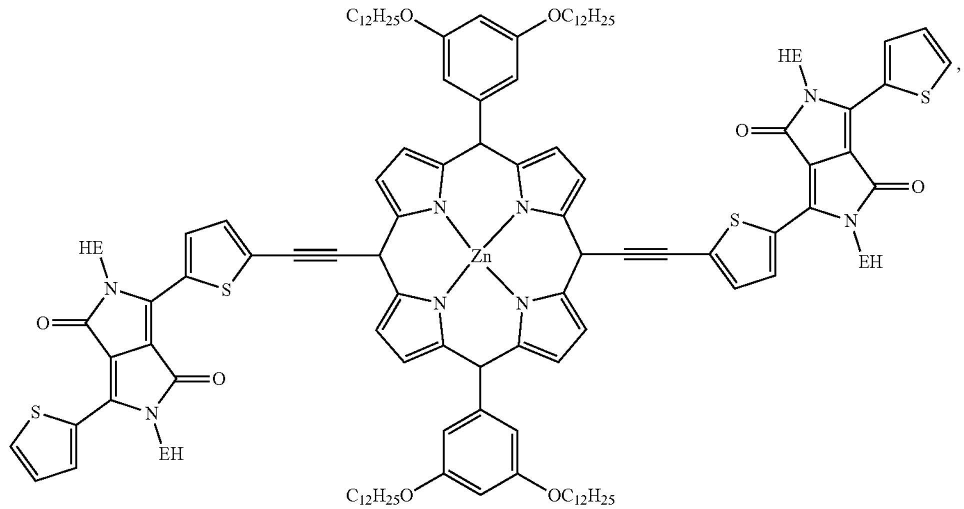
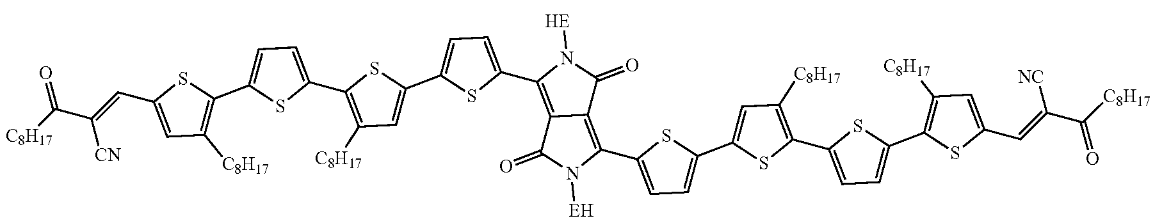
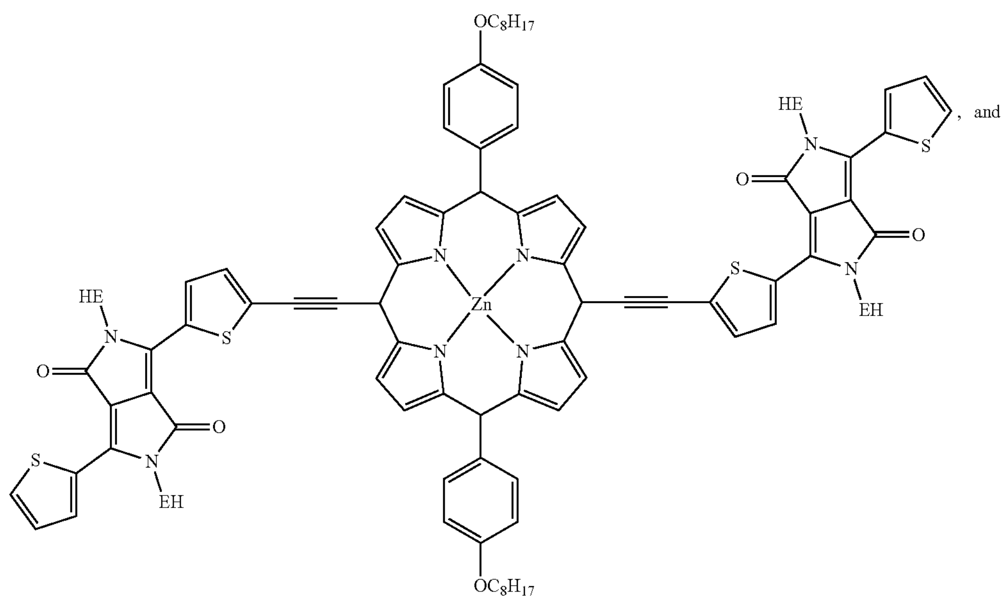

-continued

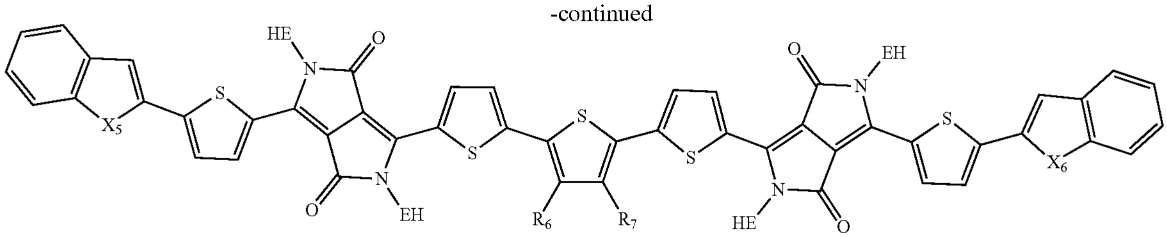

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

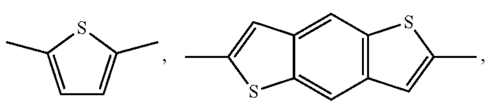

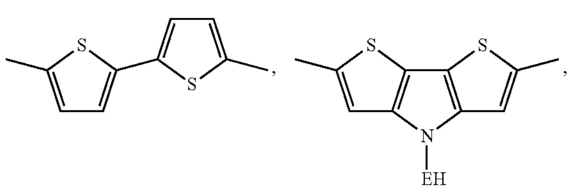

wherein EH is 2-ethylhexyl;

$R_4$ is $C_6H_{13}$ or $C_{12}H_{25}$;

$R_5$ is H or

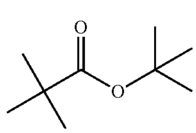

$R_6$ and $R_7$ are each independently H or $CH_3$;

$X_5$ and $X_6$ are each independently O or S;

EH is 2-ethylhexyl; and n is an integer between 1 and 10,000.

11. The planar heterojunction perovskite solar cell of any one of embodiments 1-10, wherein said perovskite material layer is smooth.

12. The planar heterojunction perovskite solar cell of any one of embodiments 1-10, wherein said perovskite material layer is rough.

13. The planar heterojunction perovskite solar cell of any one of embodiments 1-12, wherein said first and said second electrodes are each independently selected from the group consisting of ITO, FTO, CdO, ZITO, AZO, Al, Au, Cu, Cr, Ca, Mg, Ag, and Ti.

14. The planar heterojunction perovskite solar cell of any one of embodiments 1-13, wherein said first transport layer is said hole transport layer and said second transport layer is said electron transport layer.

15. The planar heterojunction perovskite solar cell of any one of embodiments 1-14, wherein said electron transport layer comprises said single near infrared sensitive semiconductor material.

16. The planar heterojunction perovskite solar cell of any one of embodiments 1-15, wherein said first electrode is ITO.

17. The planar heterojunction perovskite solar cell of any one of embodiments 1-16, wherein said second electrode is Cu.

18. The planar heterojunction perovskite solar cell of any one of embodiments 1-17, wherein said perovskite material is a perovskite having a structure of $ABX_3$, wherein A comprises a cation selected from the group consisting of FA, MA, Cs, Rb, and a combination thereof; B comprises a divalent metal selected from the group consisting of Pb, Sn, Ge, and a combination thereof; and X is one or more halides selected from the group consisting of I, Br, and Cl.

19. The planar heterojunction perovskite solar cell of any one of embodiments 1-18, wherein said perovskite material is a perovskite having a structure of $MAPbI_3$ or $FA_{0.81}MA_{0.14}Cs_{0.05}PbI_{2.55}Br_{0.45}$.

20. The planar heterojunction perovskite solar cell of any one of embodiments 1-19, wherein said first electrode is ITO; said first transport layer is said hole transport layer; said perovskite material layer is $MAPbI_3$; said second transport layer is said electron transport layer; said second electrode is Cu; wherein said hole transport layer comprises PTAA, said electron transport layer comprises a combination of C60 and BCP; and said electron transport layer comprises a single near infrared sensitive semiconductor material, wherein said single near infrared sensitive semiconductor material is

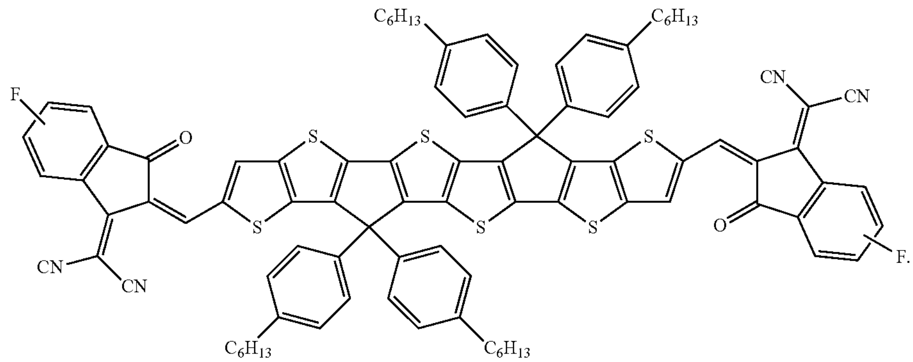

21. The planar heterojunction perovskite solar cell of embodiment 20, having a Power Conversion Efficiency of about 21.5%.
22. The planar heterojunction perovskite solar cell of embodiment 20, exhibiting a near infrared External Quantum Efficiency extended to about 925 nm.
23. The planar heterojunction perovskite solar cell of any one of embodiments 1-19, wherein said first electrode is ITO; said first transport layer is said hole transport layer; said perovskite material is $FA_{0.81}MA_{0.14}Cs_{0.05}PbI_{2.55}Br_{0.45}$; said second transport layer is said electron transport layer; said second electrode is Cu; wherein said hole transport layer comprises PTAA; said electron transport layer comprises a combination of C60 and BCP; and said electron transport layer comprises a single near infrared sensitive semiconductor material, wherein said single near infrared sensitive semiconductor material is

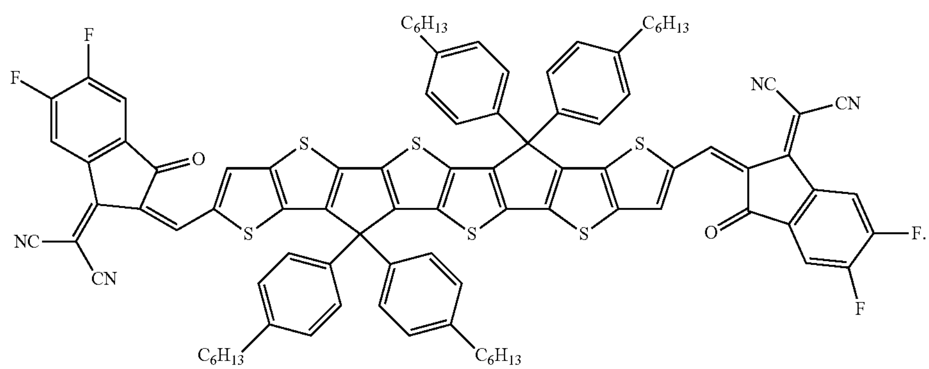

24. The planar heterojunction perovskite solar cell of embodiment 23, having a Power Conversion Efficiency of about 21.5%.
25. The planar heterojunction perovskite solar cell of embodiment 23, exhibiting a near infrared External Quantum Efficiency extended to about 960 nm.
26. A single heterojunction perovskite solar cell, comprising:
   a first electrode;
   a first transport layer disposed on the first electrode;
   a perovskite material layer disposed on the first transport layer;
   a second transport layer disposed on the perovskite material layer;
   and a second electrode disposed on the second transport layer,
   wherein one of said first or second transport layers is a hole transport layer and the other one of said first or second transport layers is an electron transport layer;
   wherein at least one of said hole transport layer or said electron transport layer comprises a single near infrared sensitive semiconductor material; and
   wherein at least one of said hole transport layer or said electron transport layer further comprises a mesoporous material.
27. The single heterojunction perovskite solar cell of embodiment 26, wherein said near infrared sensitive semiconductor material is capable of absorbing light with a wavelength of at least 780 nm.
28. The single heterojunction perovskite solar cell of embodiment 26 or 27, wherein said near infrared sensitive semiconductor material is in the form of a dye.
29. The single heterojunction perovskite solar cell of any one of embodiments 26-28, wherein said electron transport layer comprises a material selected from the group consisting of C60, BCP, $TiO_2$, $SnO_2$, $PC_{61}BM$, $PC_{71}BM$, ICBA, ZnO, ZrAcac ($Zr(C_5H_7O_2)_4$), LiF, Ca, Mg, TPBI, PFN, and a combination thereof.
30. The single heterojunction perovskite solar cell of any one of embodiments 26-29, wherein said electron transport layer comprises $TiO_2$.
31. The single heterojunction perovskite solar cell of any one of embodiments 26-30, wherein said hole transport layer comprises a material selected from the group consisting of PTAA, Spiro-OMeTAD, PEDOT:PSS, NiO, $MoO_3$, $V_2O_5$, Poly-TPD, EH44, and a combination thereof.

32. The single heterojunction perovskite solar cell of any one of embodiments 26-31, wherein said hole transport layer comprises Spiro-OMeTAD.

33. The single heterojunction perovskite solar cell of any one of embodiments 26-32, wherein said electron transport layer further comprises a mesoporous material selected from the group consisting of mesoporous $TiO_2$, mesoporous $SnO_2$, and mesoporous $ZrO_2$.

34. The single heterojunction perovskite solar cell of any one of embodiments 26-33, wherein said hole transport layer further comprises a mesoporous material selected from the group consisting of mesoporous NiO, mesoporous $MoO_3$, and mesoporous $V_2O_5$.

35. The single heterojunction perovskite solar cell of any one of embodiments 26-34, wherein said near infrared sensitive semiconductor material is an inorganic semiconductor selected from the group consisting of PbS, CdTe, Copper Indium Gallium Selenide (CIGS), GaAs, PbS, Si, $(FA_aMA_bCs_{(1-a-b)}Pb_cSn_{(1-c)}I_dBr_{3-d}$, in which $0 \leq a \leq 1$, $0 \leq b \leq 1$, $0 \leq a+b \leq 1$, $0 \leq c \leq 1$, and $0 \leq d \leq 3$, $FA=HC(NH_2)_2$, $MA=CH_3NH_3$), and $Sb_2Se_3$.

36. The single heterojunction perovskite solar cell of any one of embodiments 26-34, wherein said near infrared sensitive semiconductor material is an organic semiconductor selected from the group consisting of

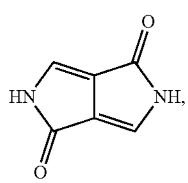

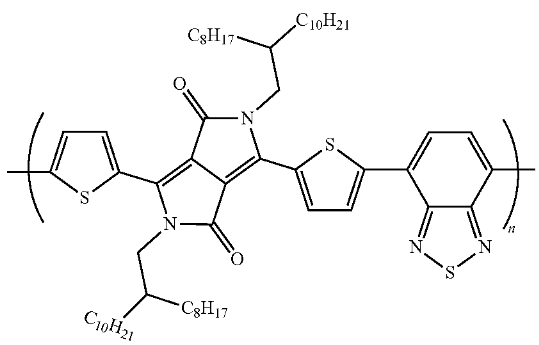
,

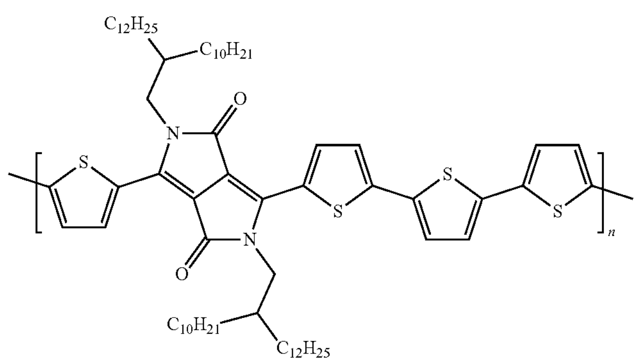
,

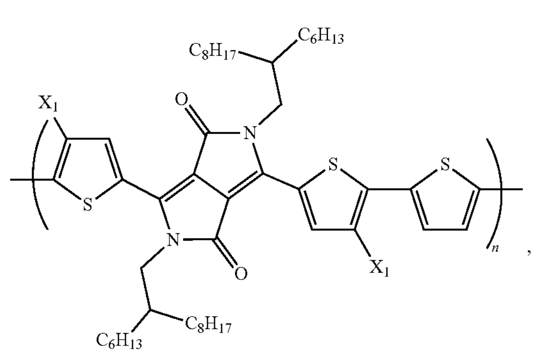
,

-continued
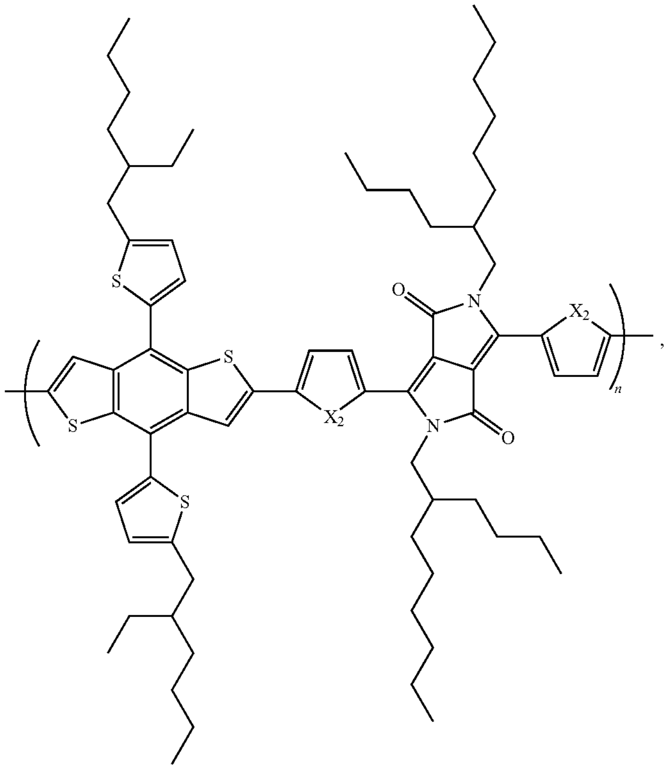
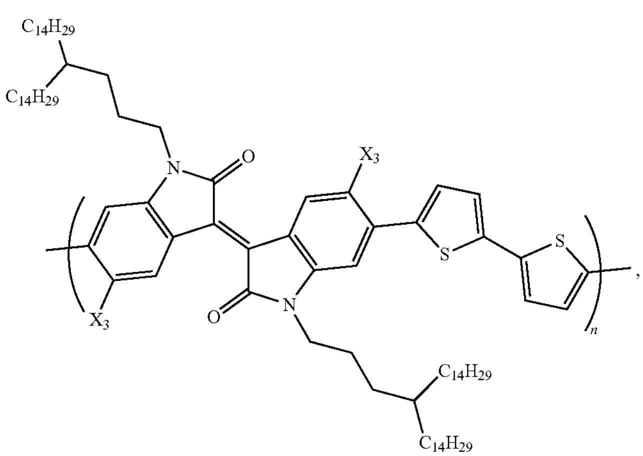
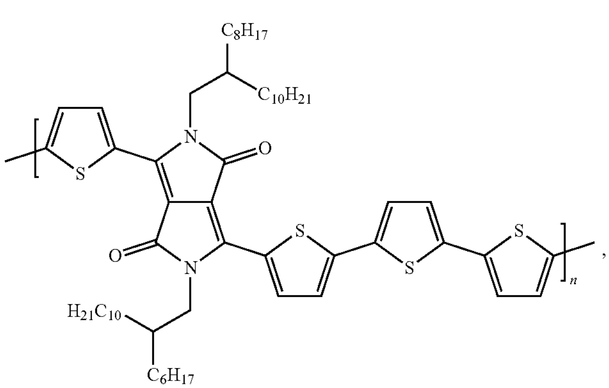

-continued
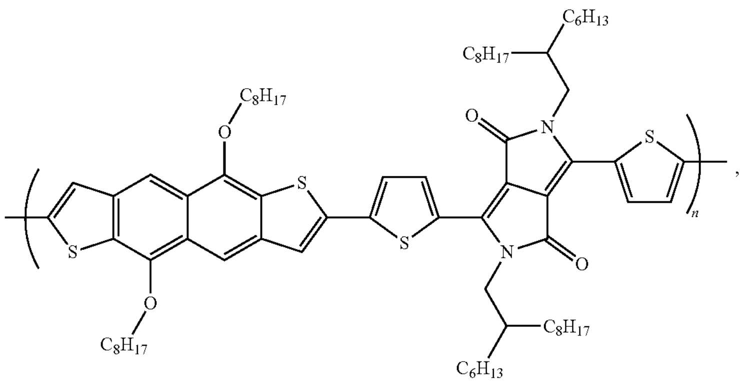
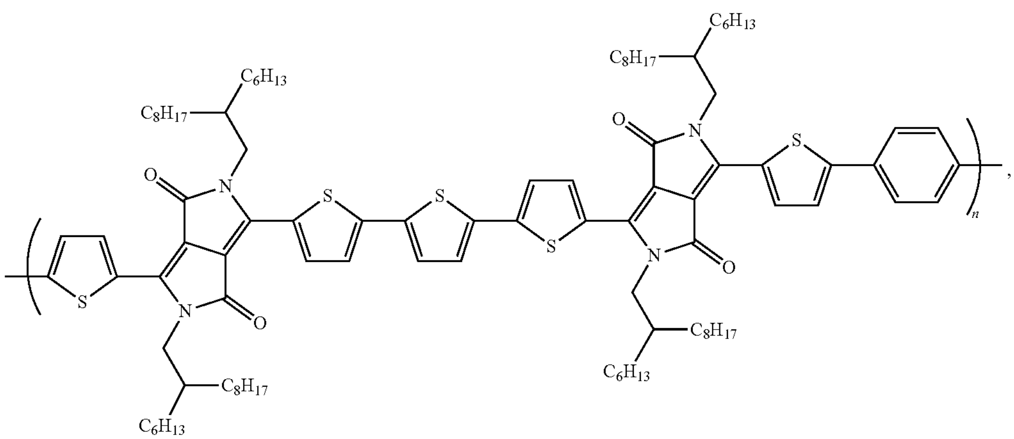
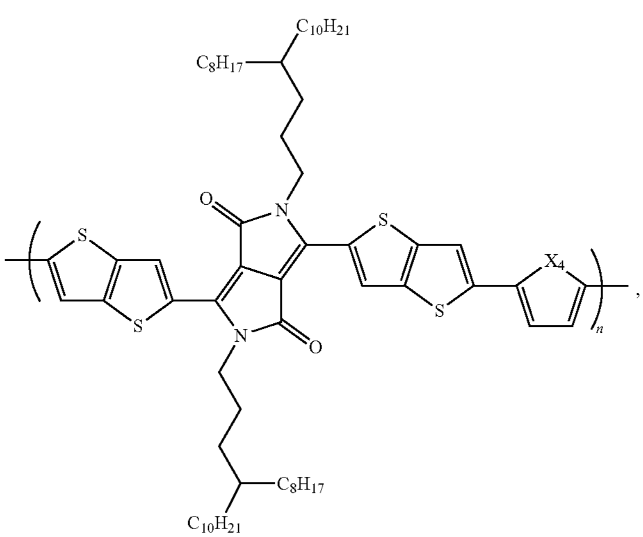

-continued
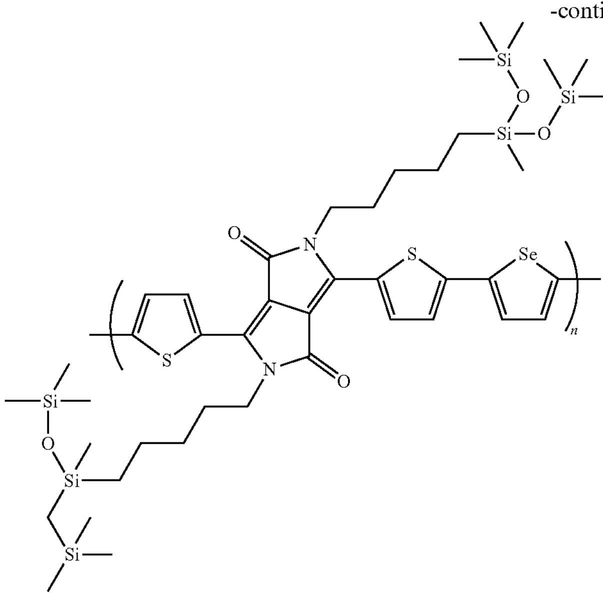
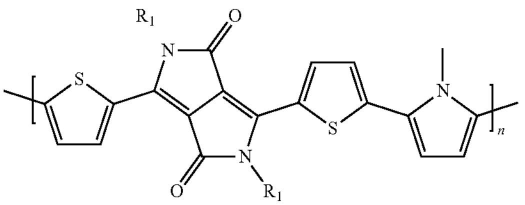
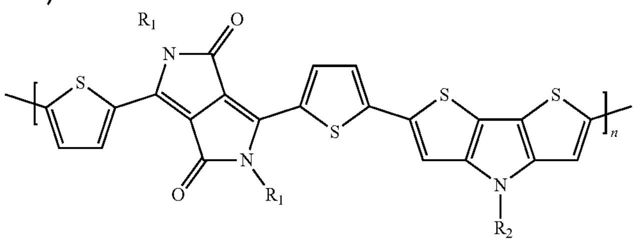
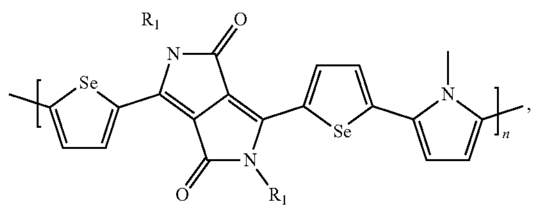
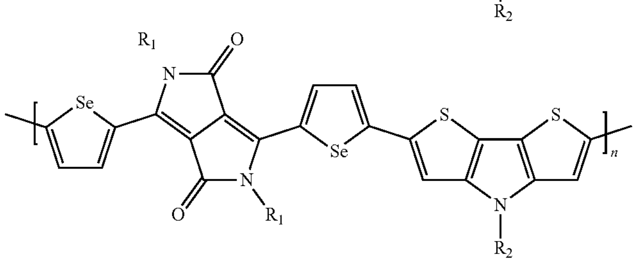
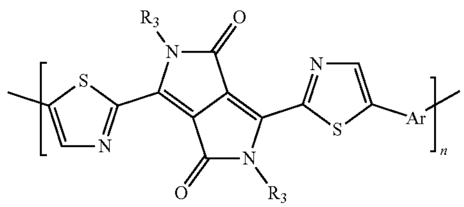
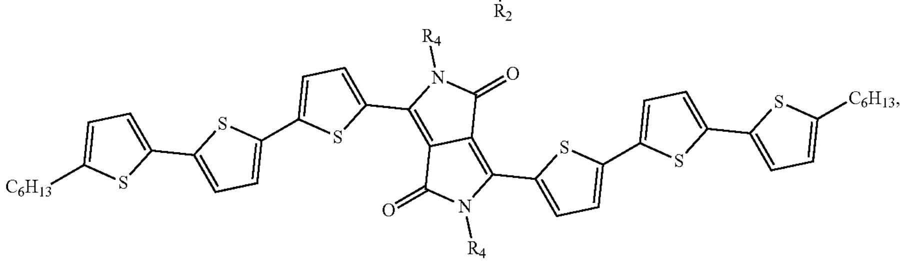
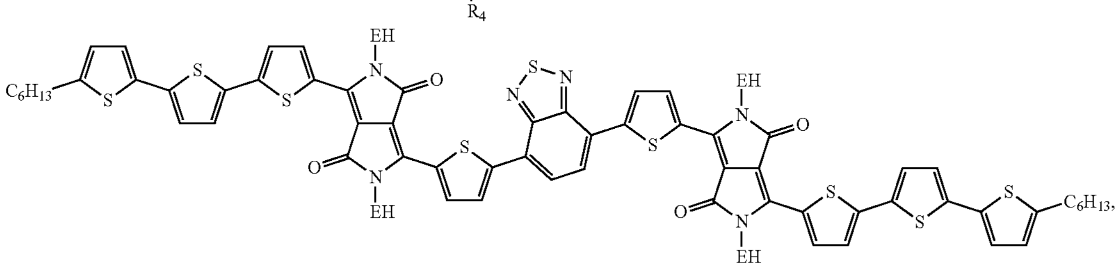
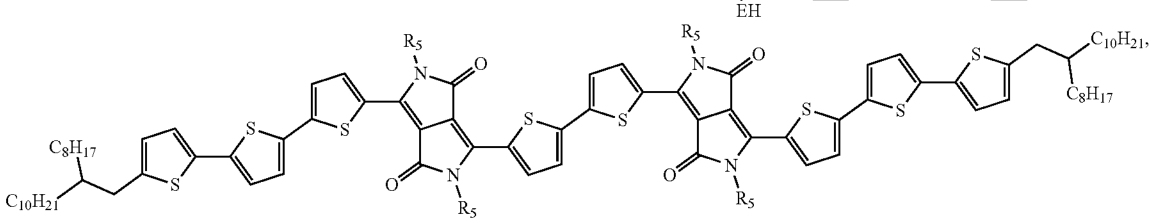

-continued
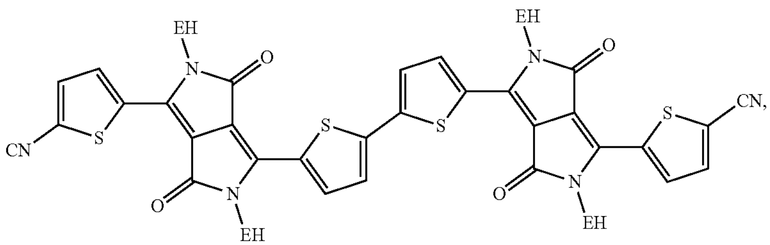
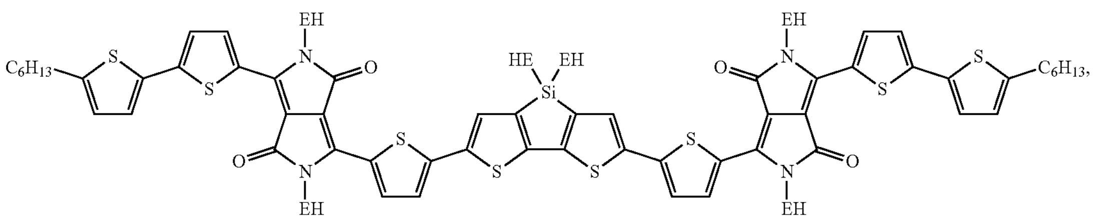
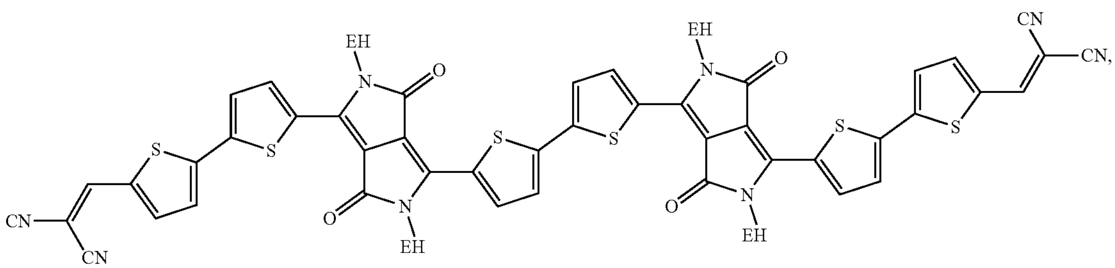
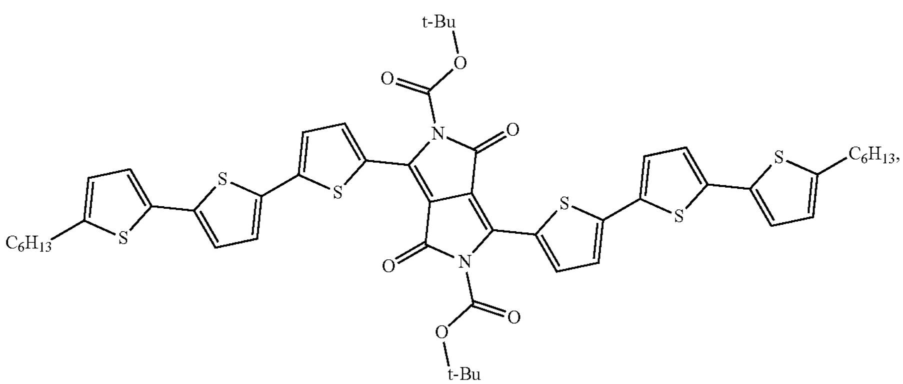
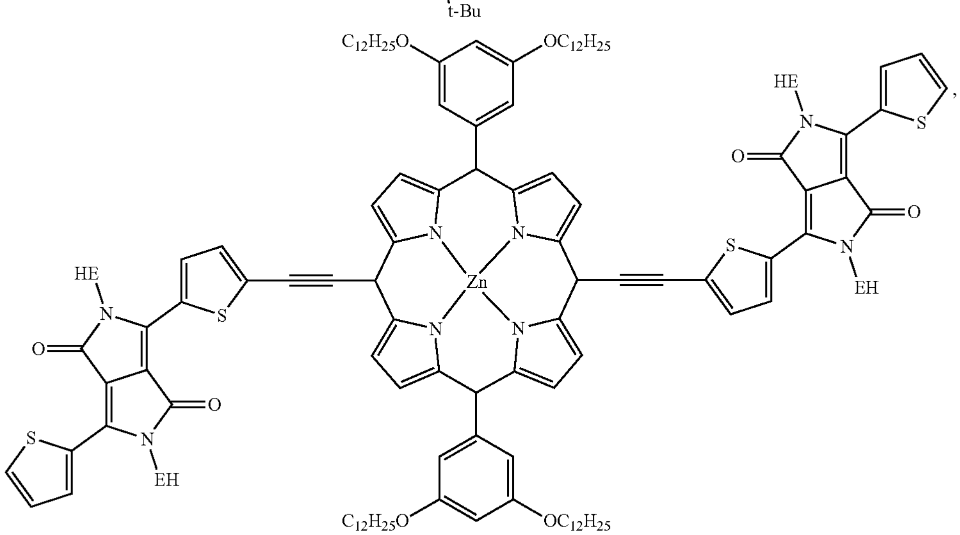

-continued
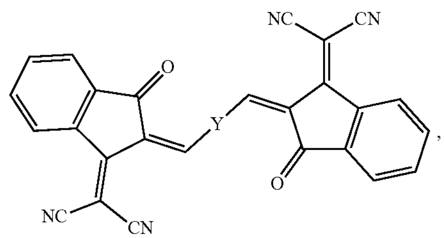
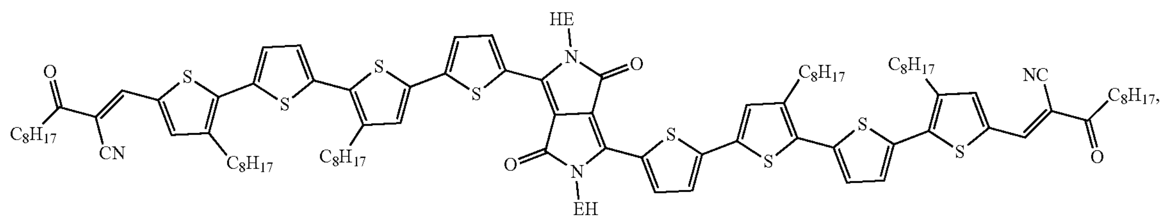
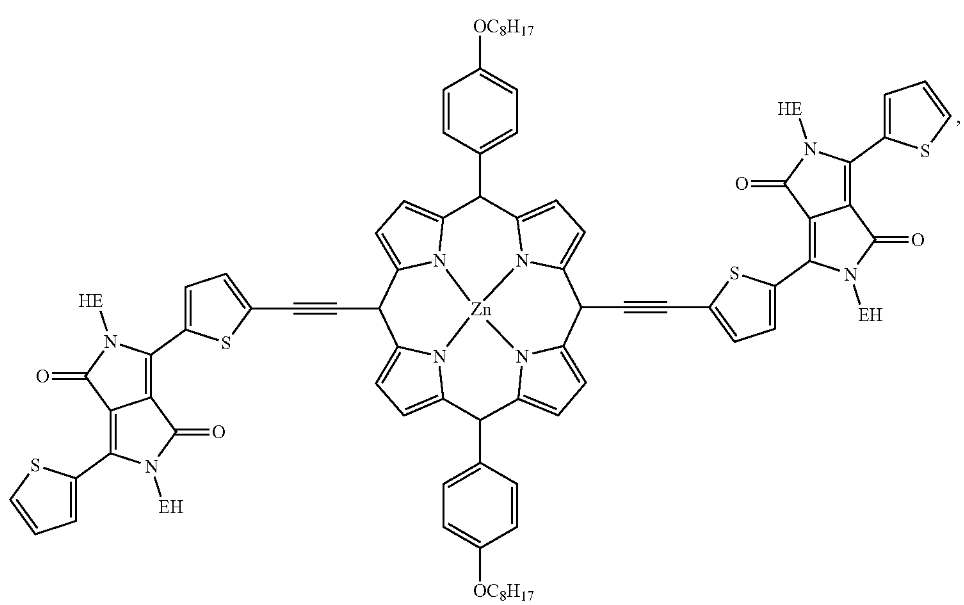
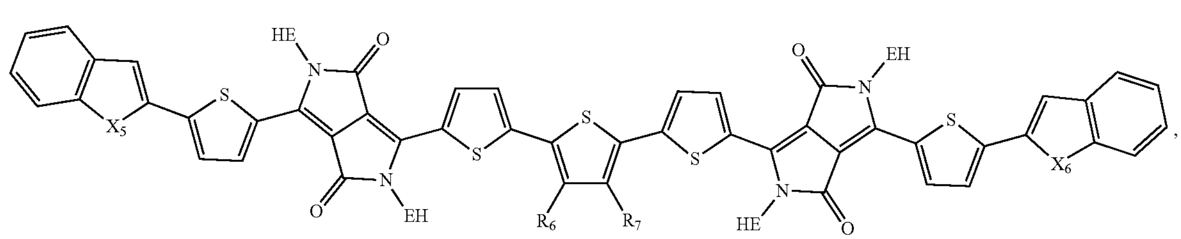
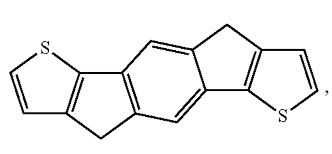

-continued
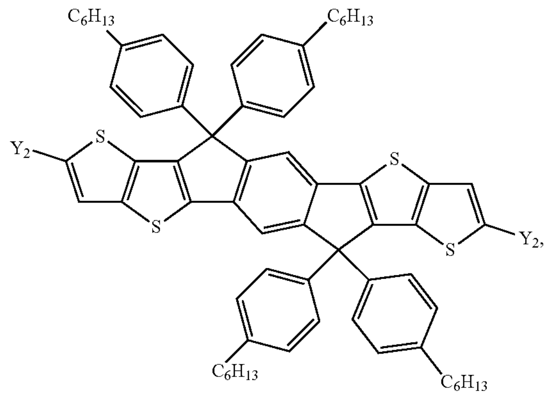
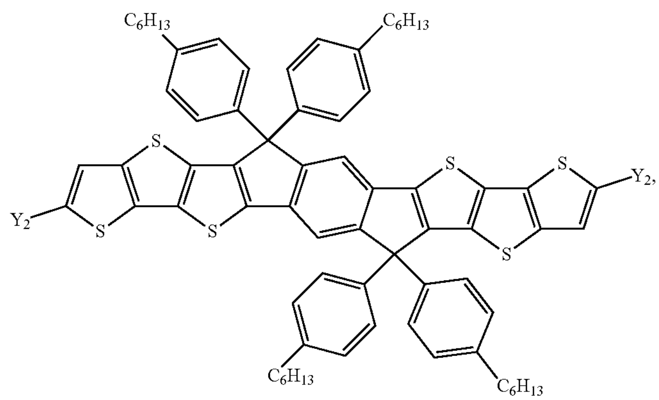
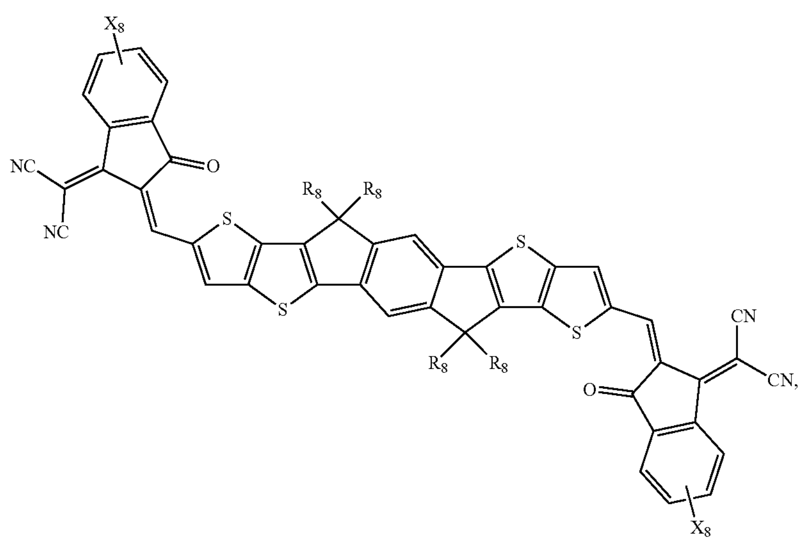

-continued
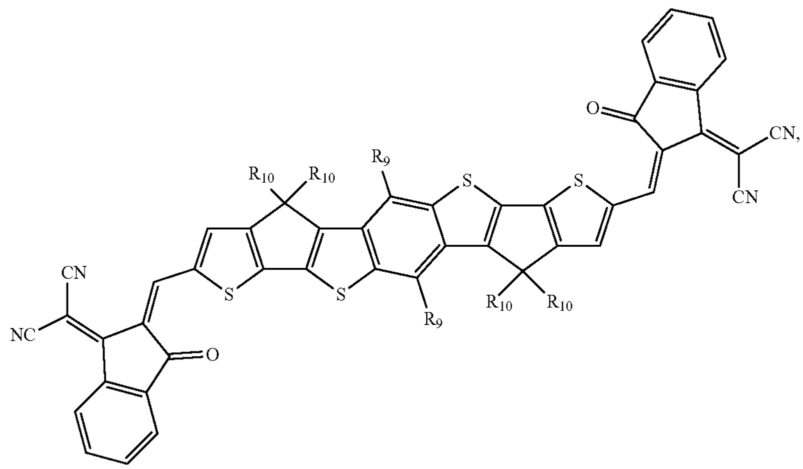
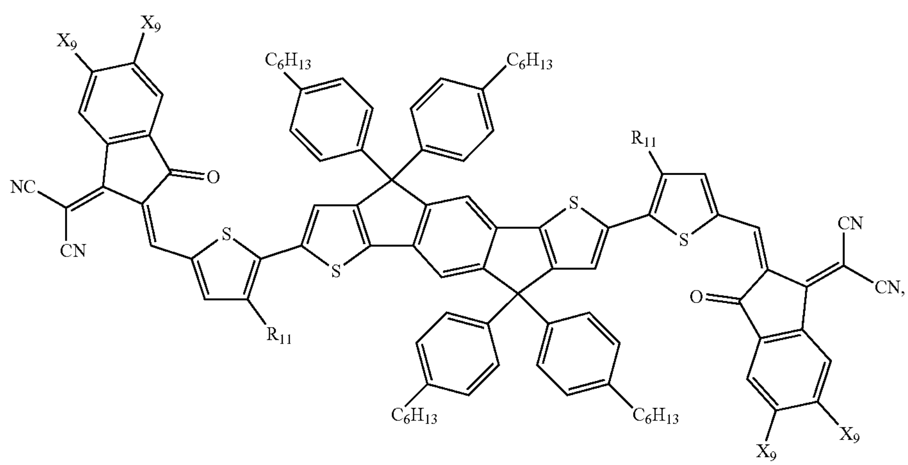
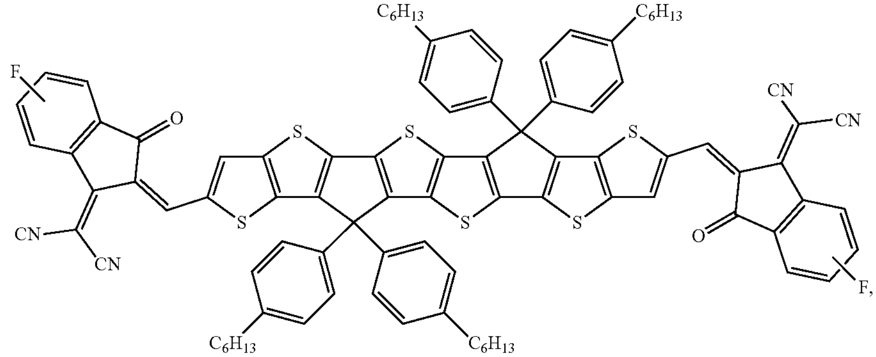

-continued
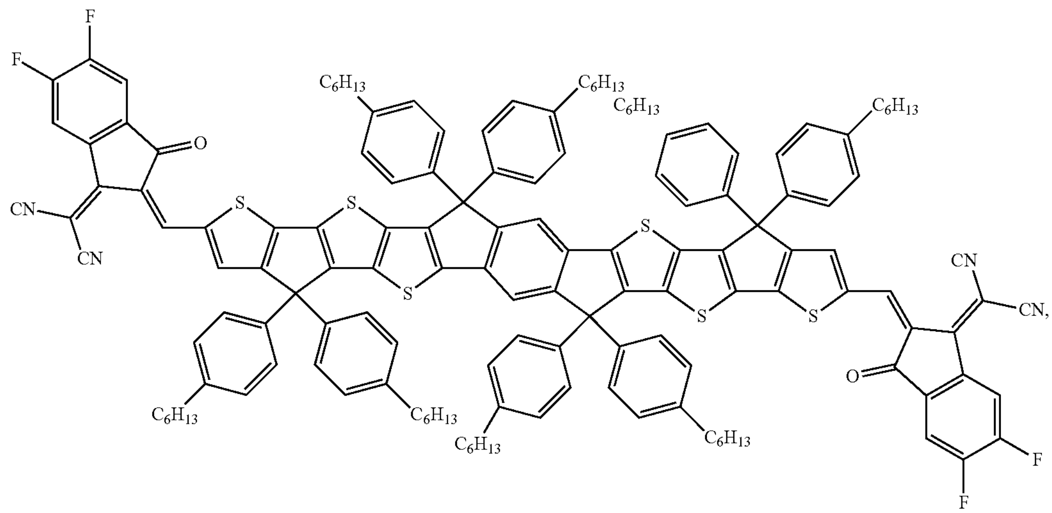
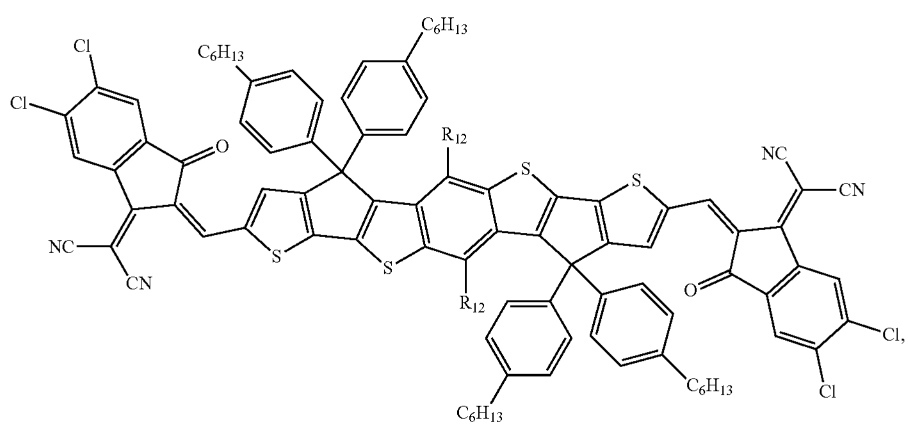
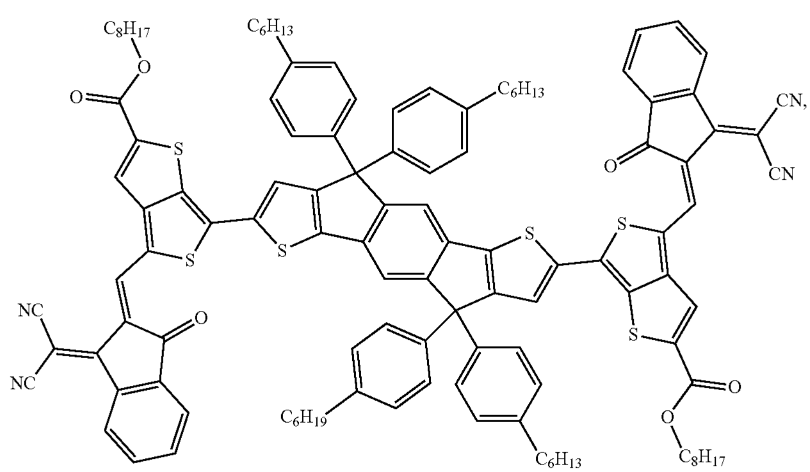

-continued
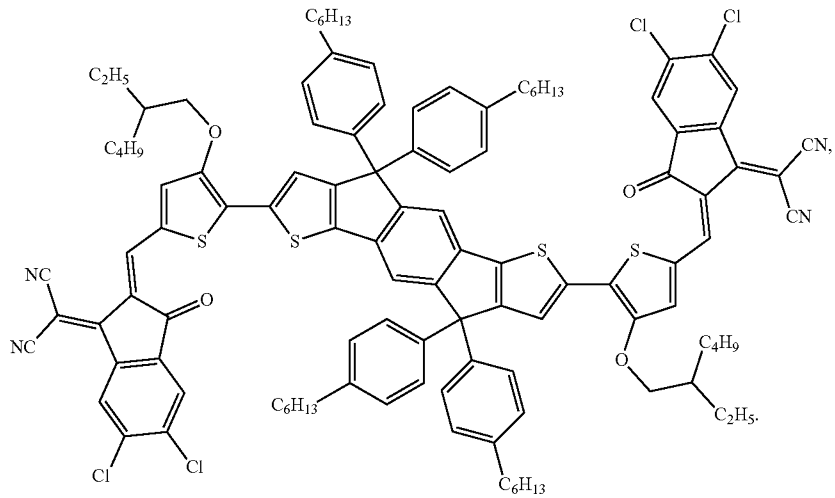
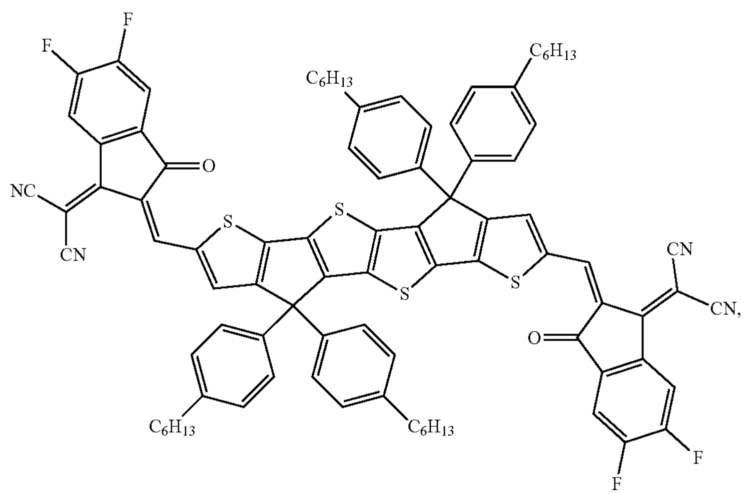
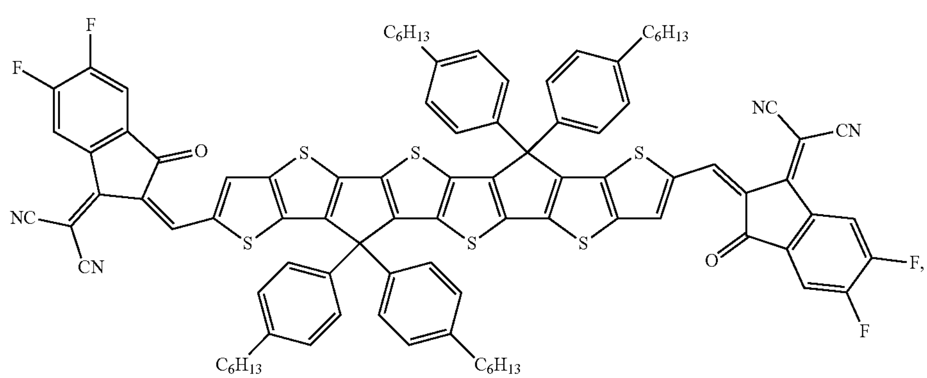

-continued
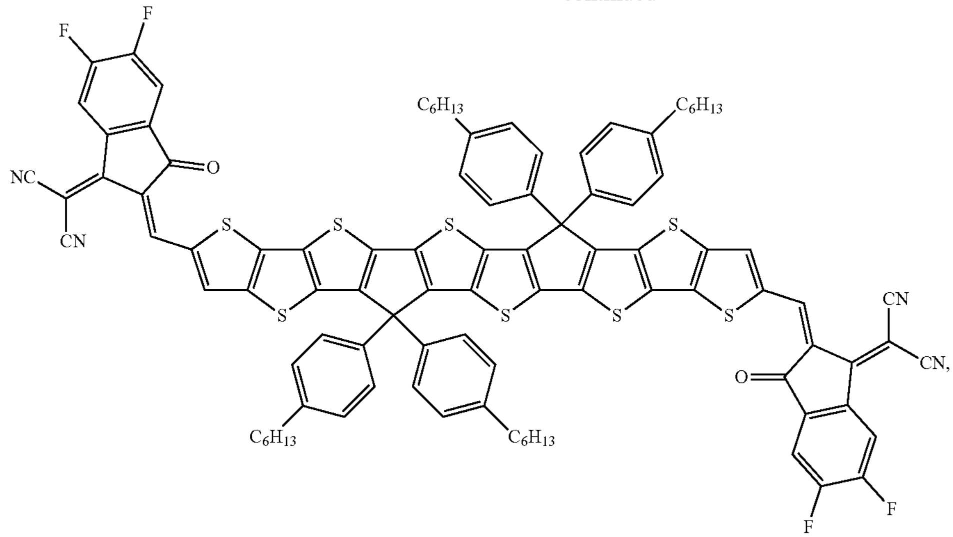
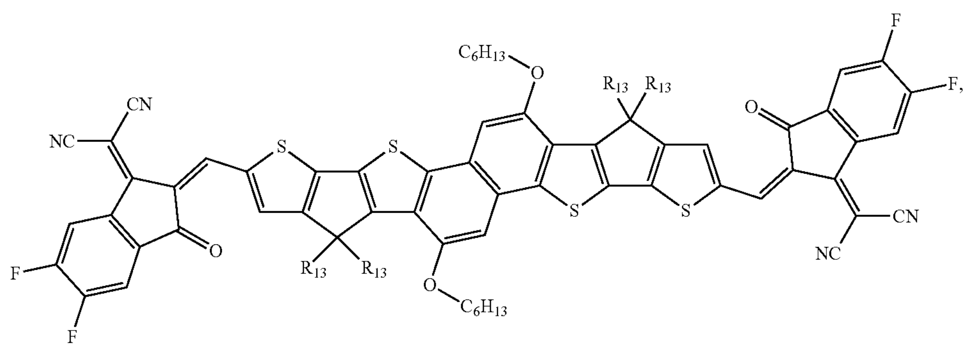
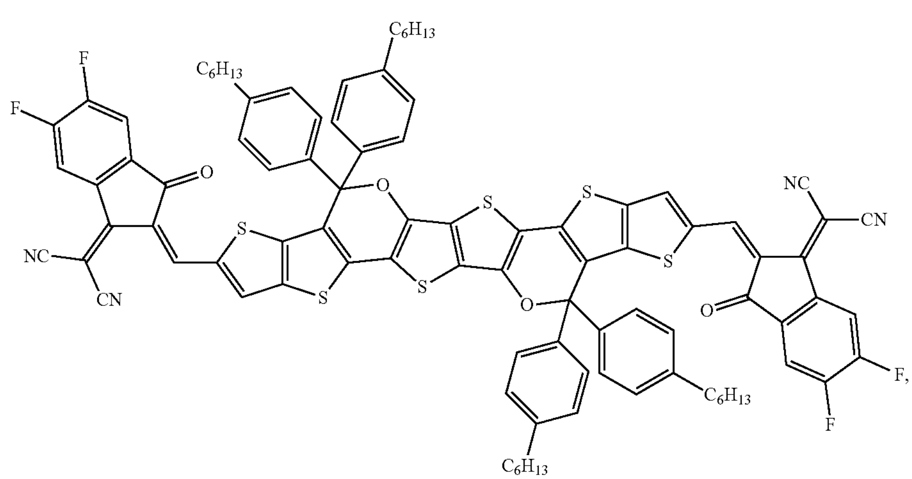

-continued
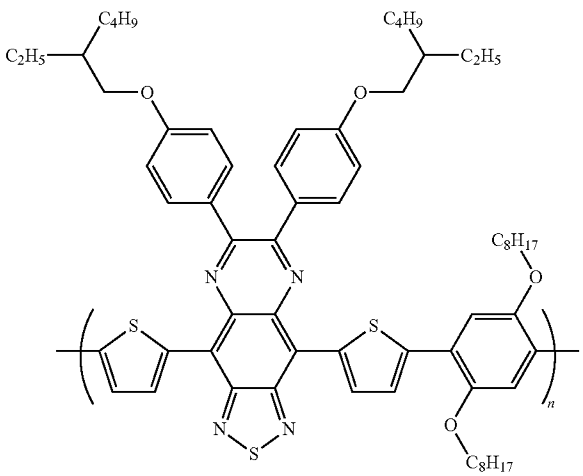
,
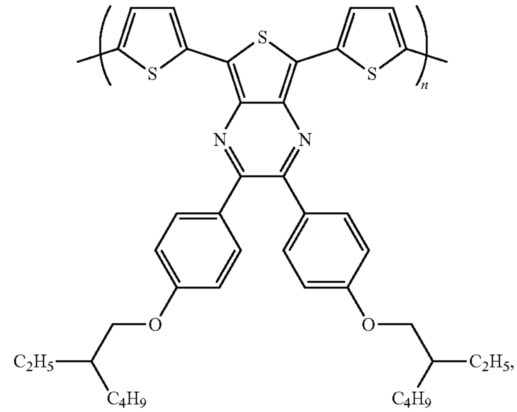
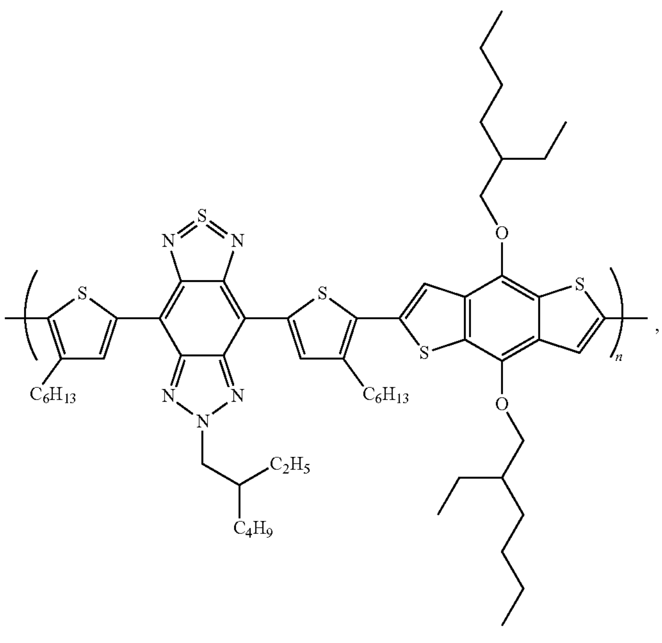
,
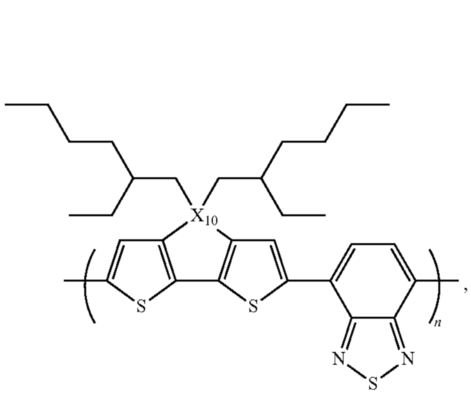
,
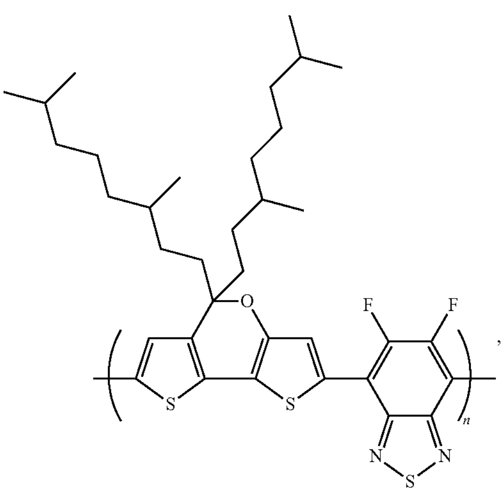
,

-continued
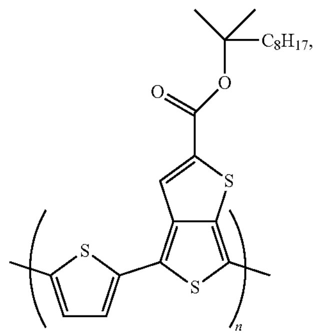
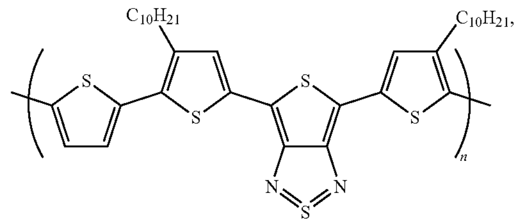
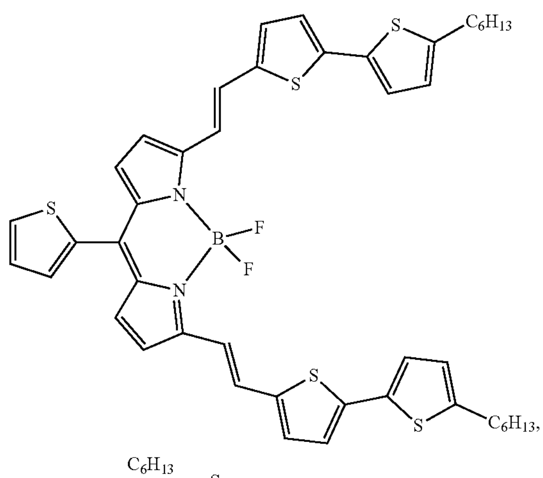
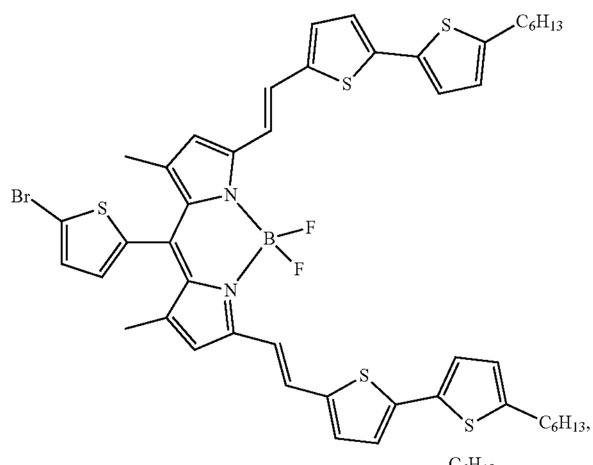
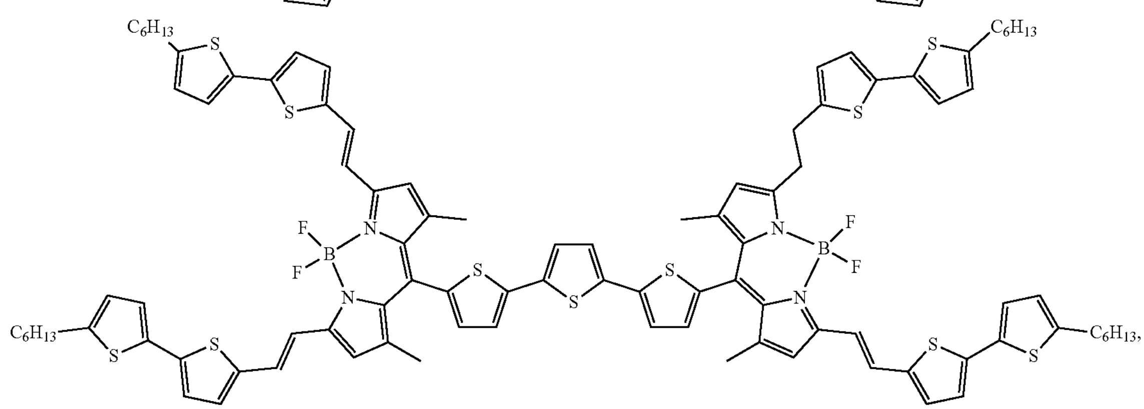
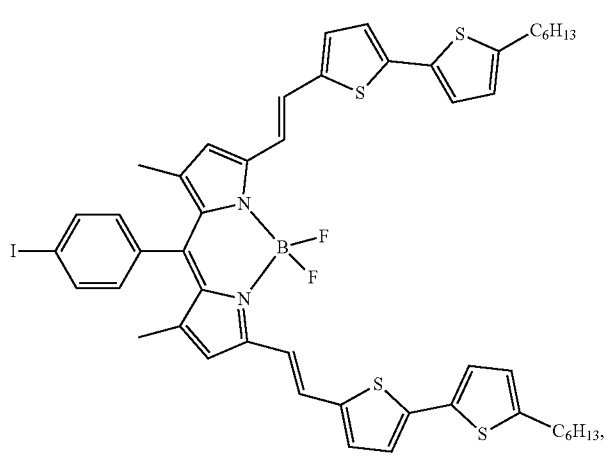

-continued

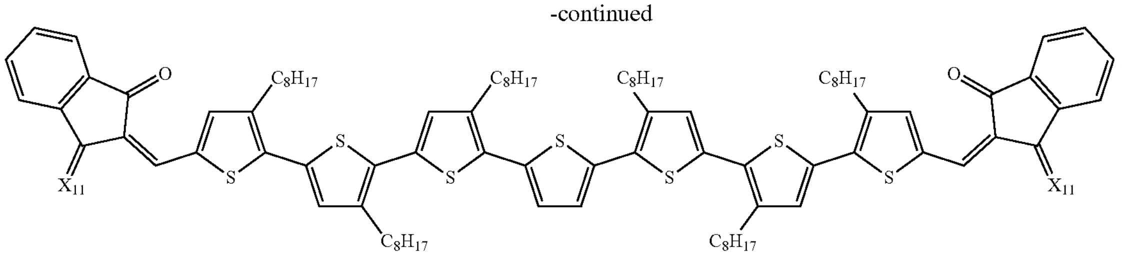

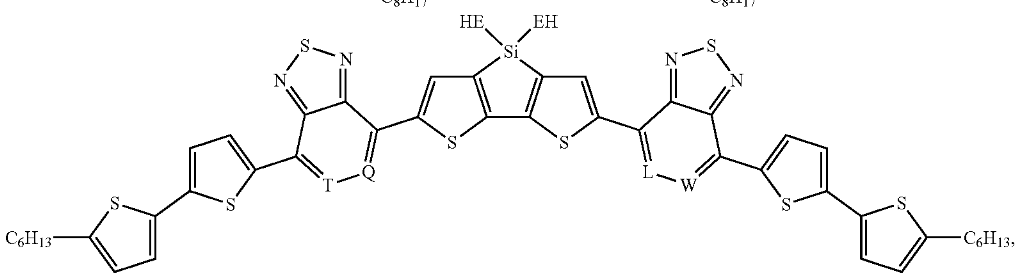

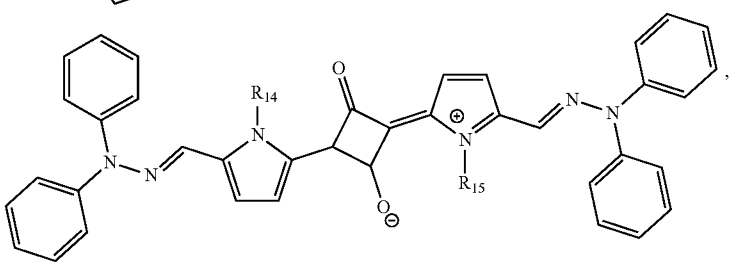

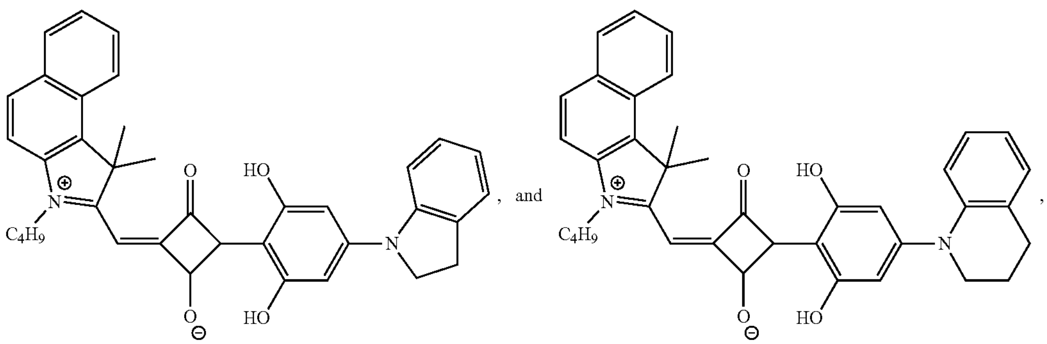

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

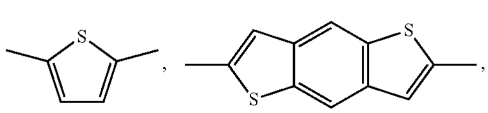

-continued

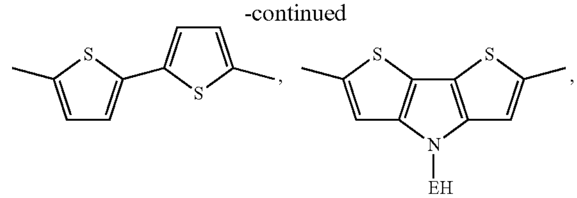

wherein EH is 2-ethylhexyl;

$R_4$ is $C_6H_{13}$ or $C_{12}H_{25}$;

$R_5$ is H or

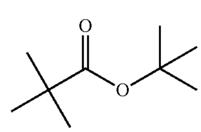

$R_6$ and $R_7$ are each independently H or $CH_3$;

$X_5$ and $X_6$ are each independently O or S;

EH is 2-ethylhexyl;
Y is selected from the group consisting of
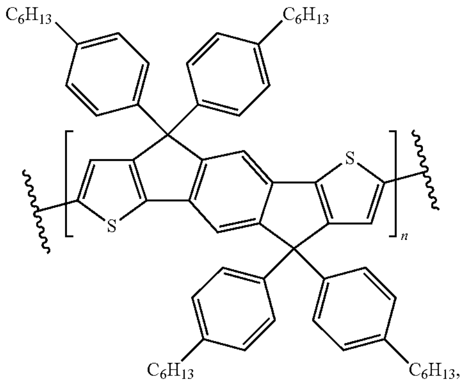
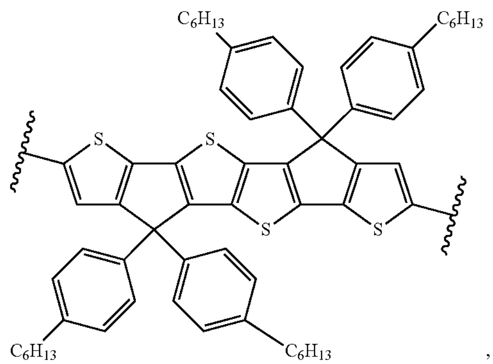
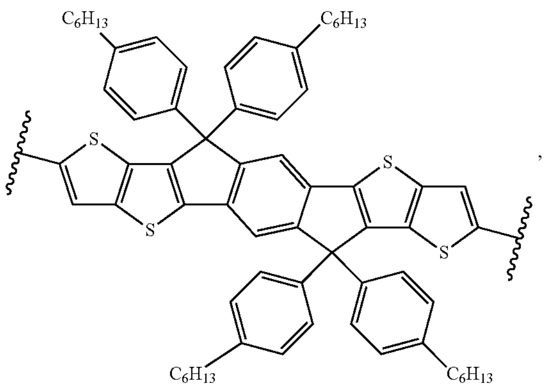
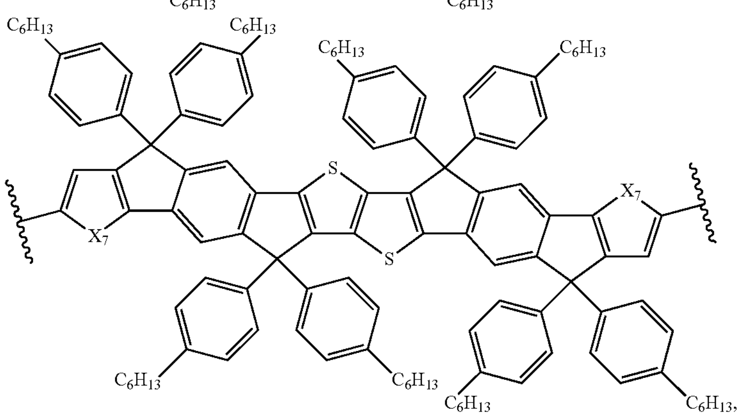
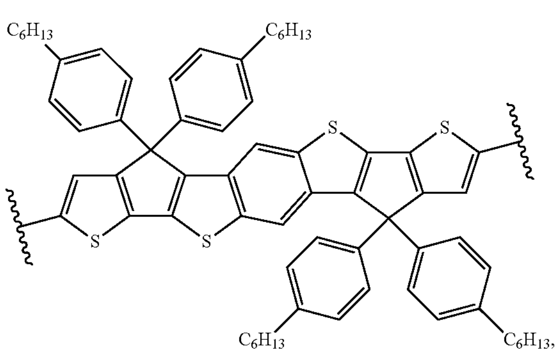
and -continued
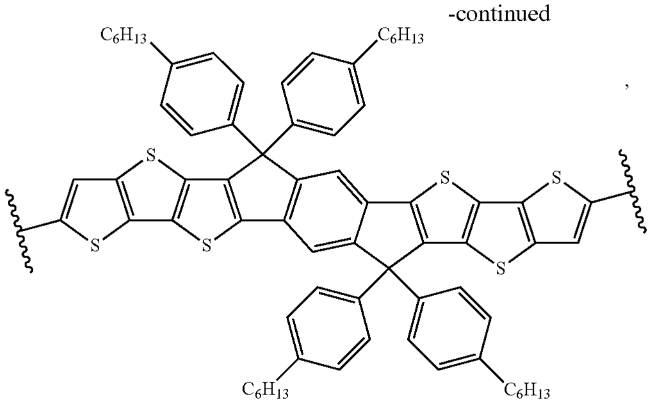
$X_7$ is S or Se;
$Y_2$ is selected from the group consisting of
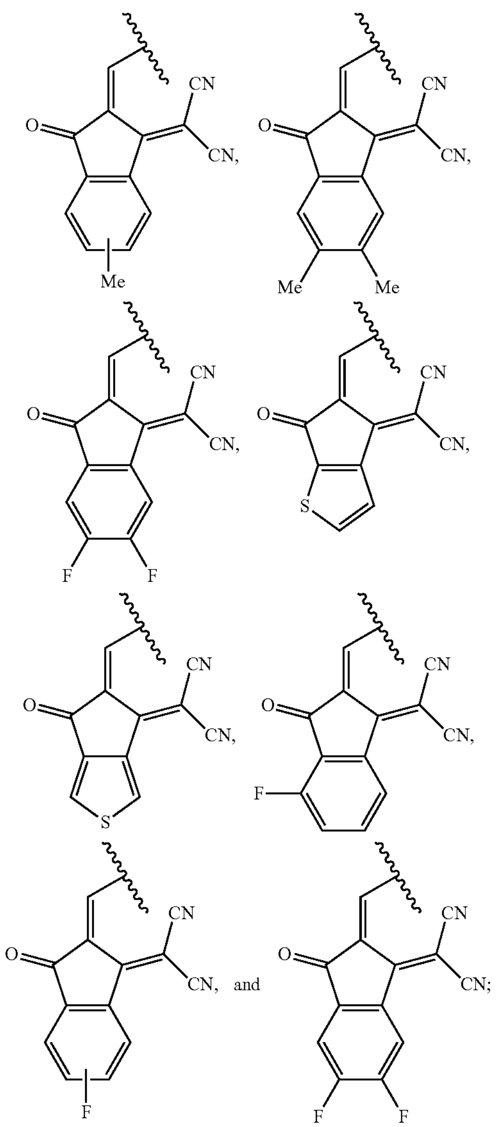
$X_8$ is H or F;
$R_8$ is
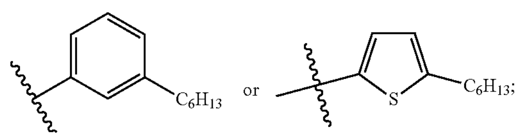
$R_9$ is
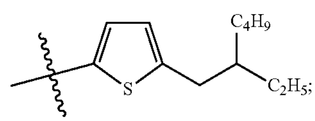
$R_{10}$ is
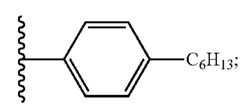
$X_9$ is H or F;
$R_{11}$ is
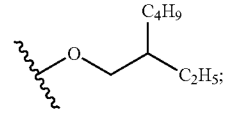
$R_{12}$ is 2-ethylhexyl;
$R_{13}$ is
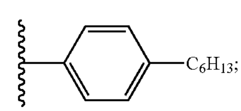
$X_{10}$ is selected from the group consisting of C, Si, and Ge;

$X_{11}$ is O or
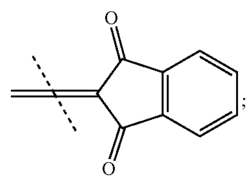
Q, L, T, and W are each independently CH or N;
$R_{14}$ and $R_{15}$ are each independently 2-ethylhexyl or n-dodecyl; and
n is an integer between 1 and 10,000.
37. The single heterojunction perovskite solar cell of any one of embodiments 26-34 or embodiment 36, wherein said near infrared sensitive semiconductor material is selected from the group consisting of
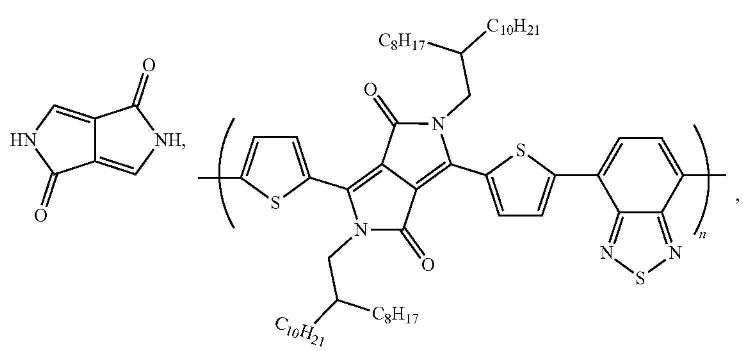
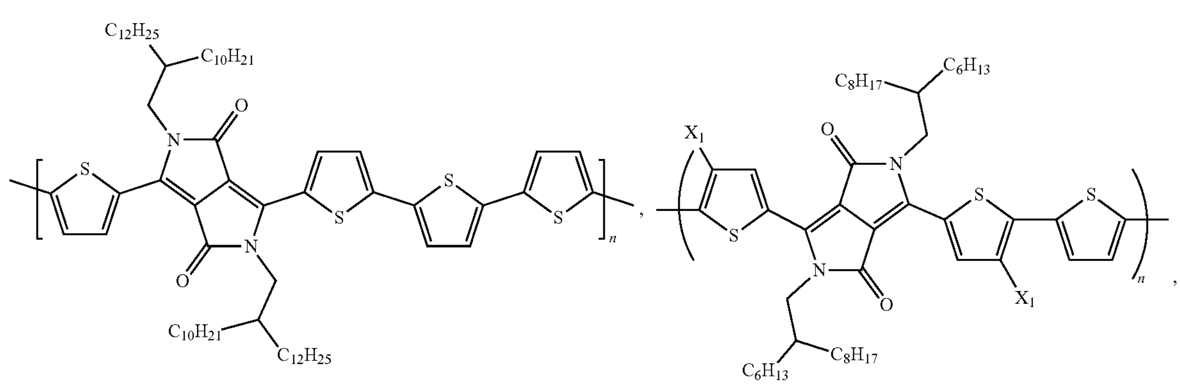

-continued
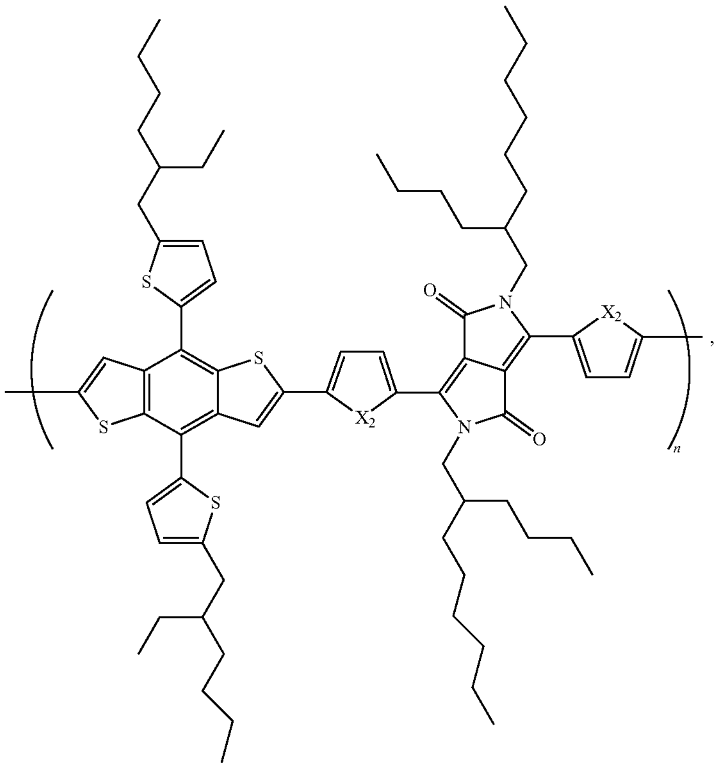
,
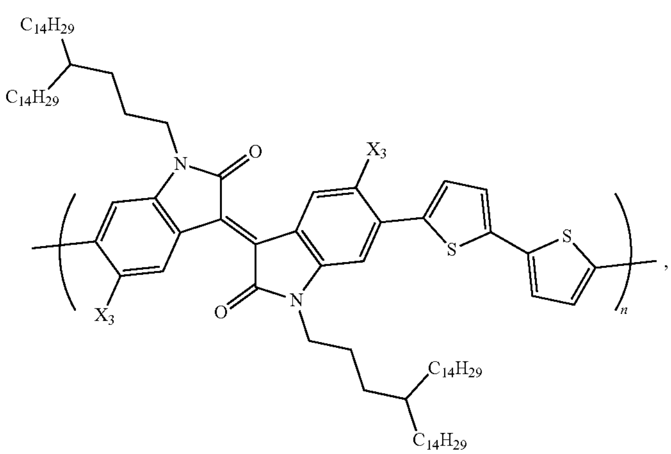
,
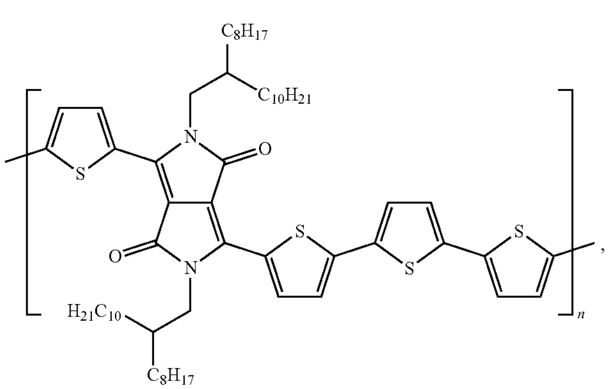
,

-continued
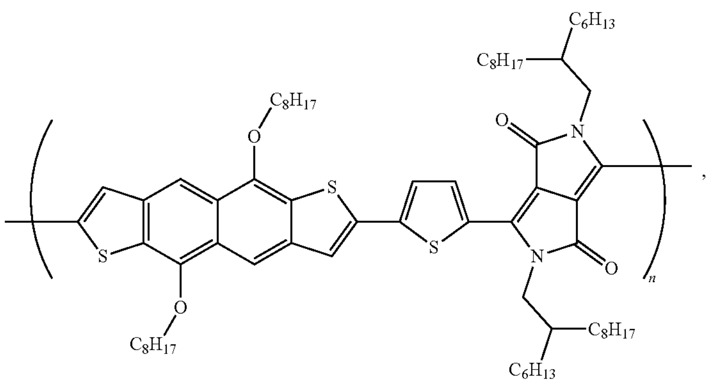
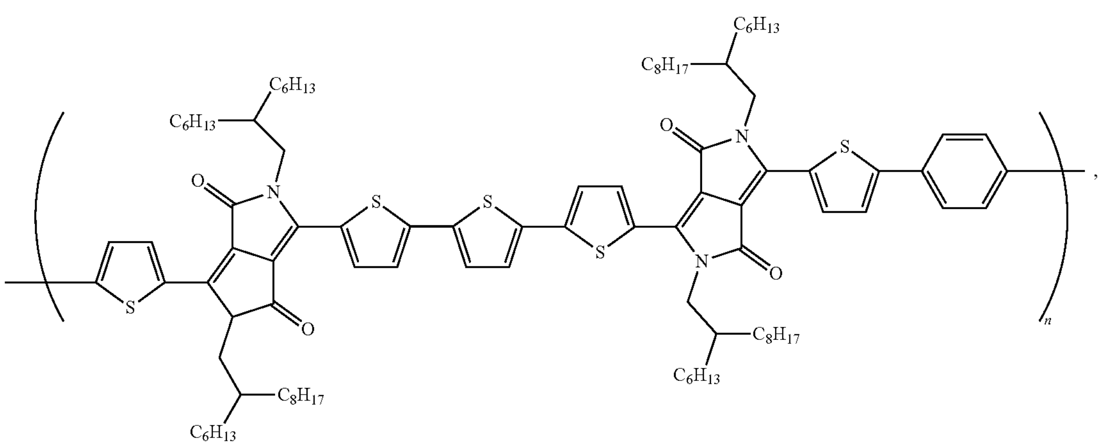
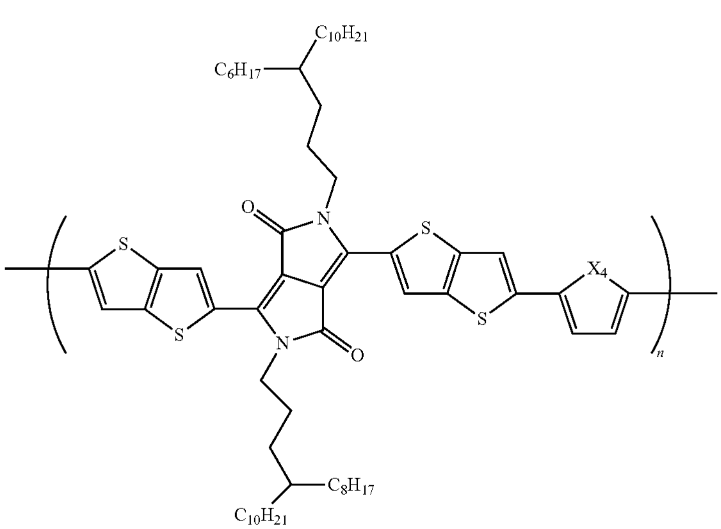

-continued
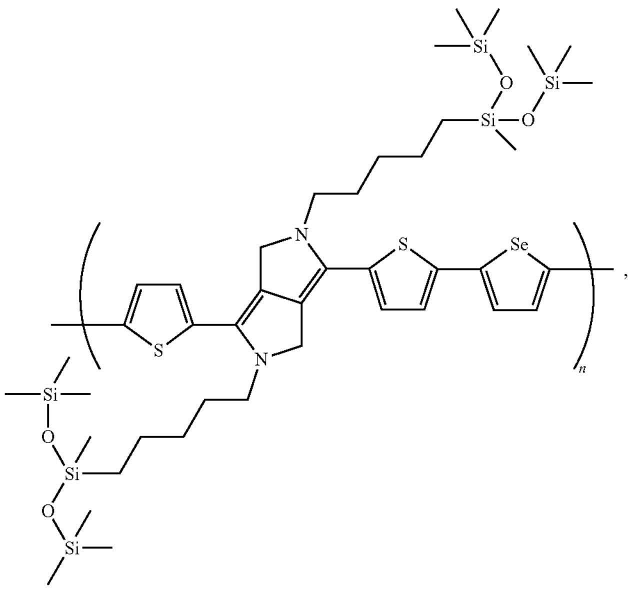
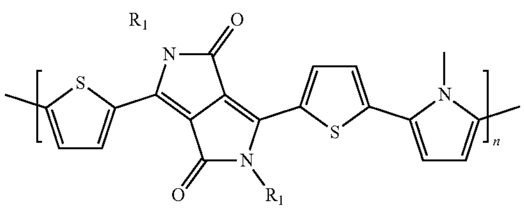
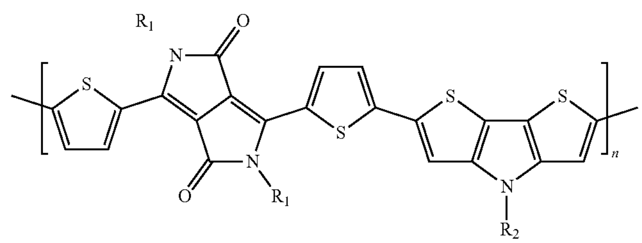
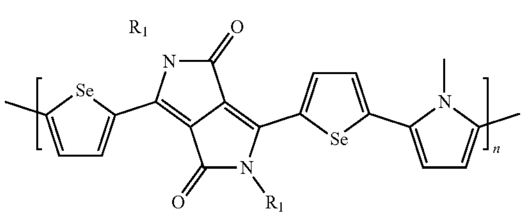
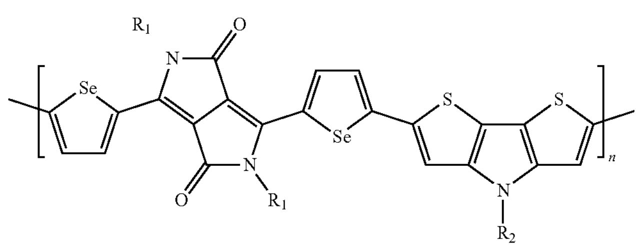
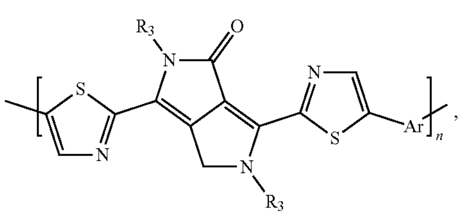
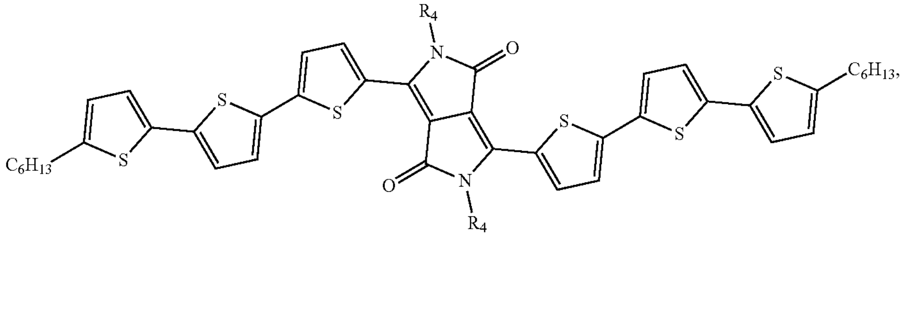

-continued
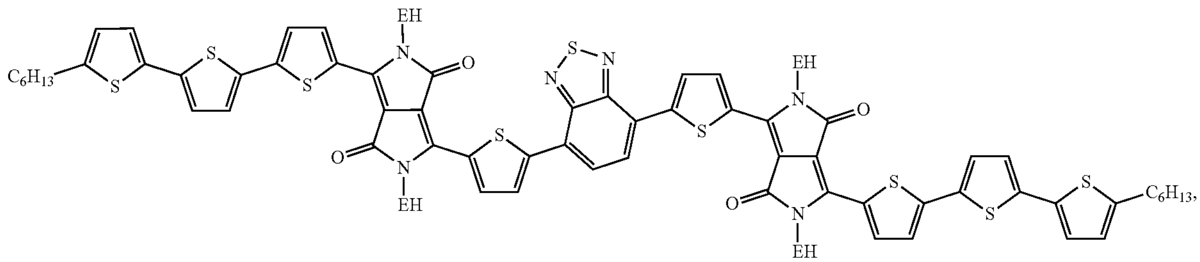
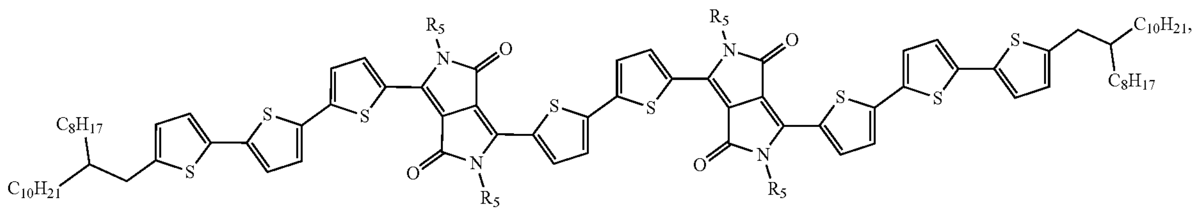
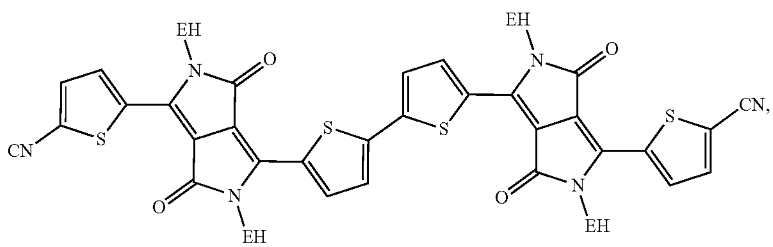
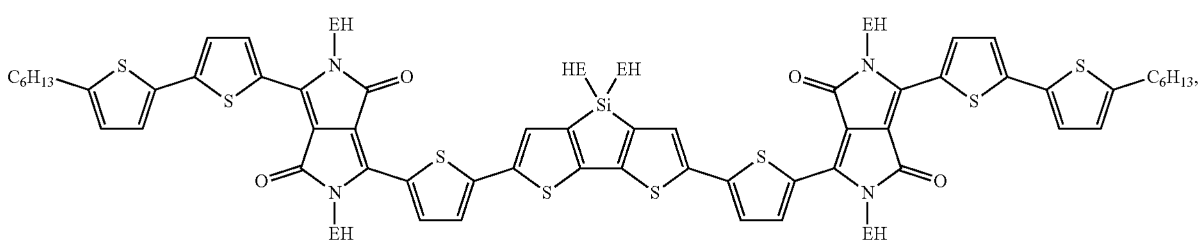
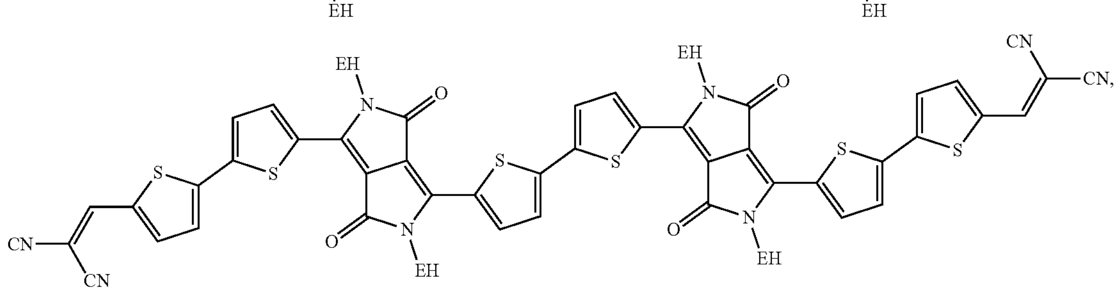
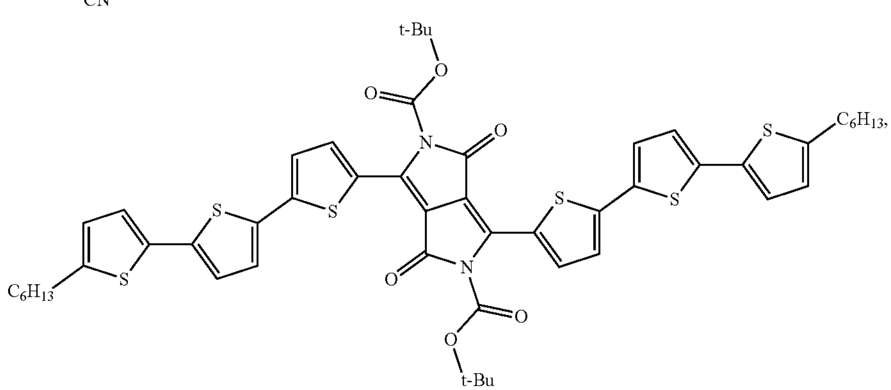

-continued
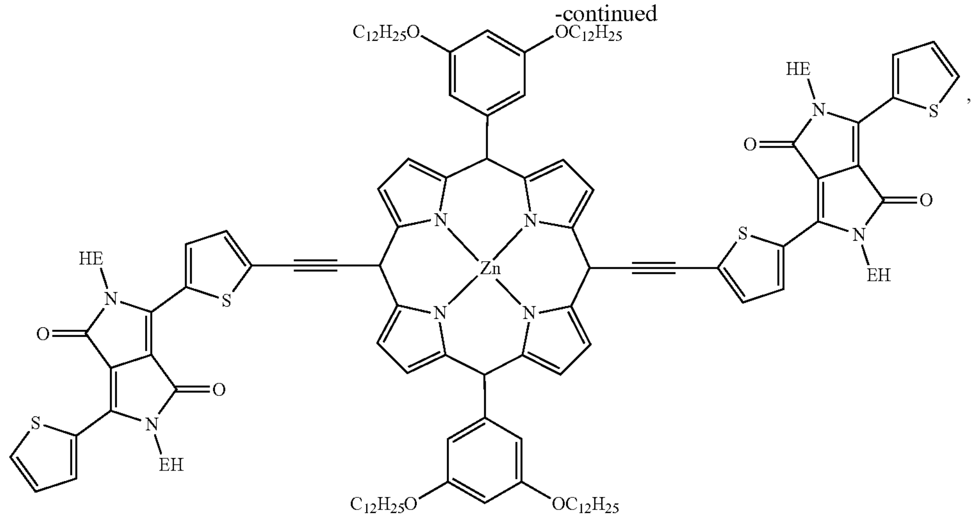
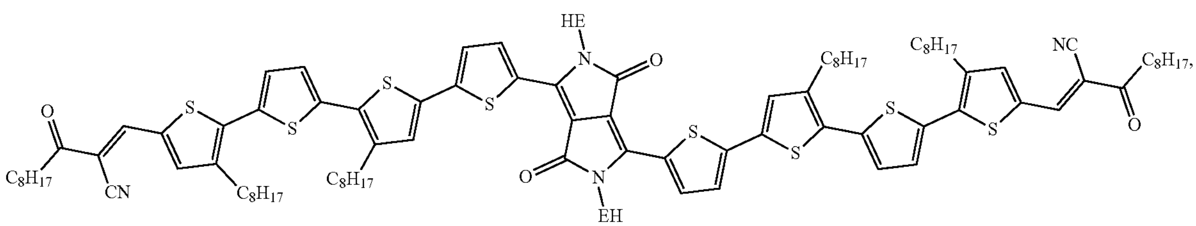
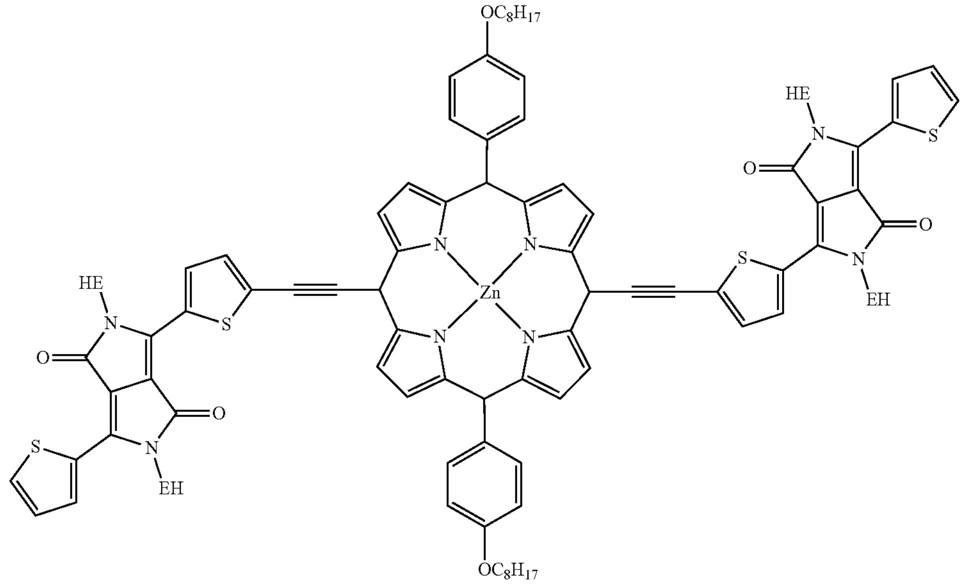
, and
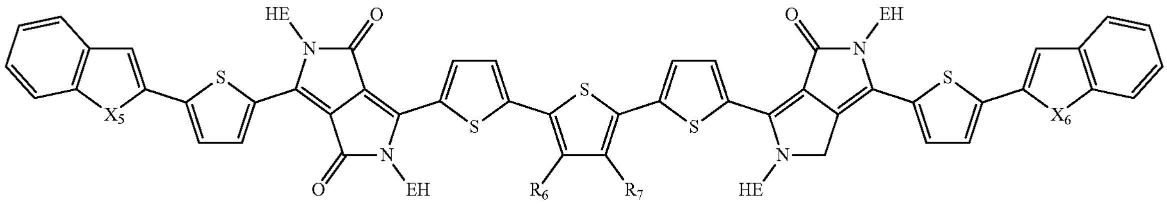
wherein:
$X_1$ is H or $CH_3$;
$X_2$ is S or Se;
$X_3$ is H or F;
$X_4$ is Se or Te;
$R_1$ is 2-hexyldecyl;
$R_2$ is 2-ethylhexyl;
$R_3$ is selected from the group consisting of 2-ethylhexyl, 2-butyloctyl, 2-hexyldecyl, and 2-decyltetradecyl;

Ar is selected from the group consisting of

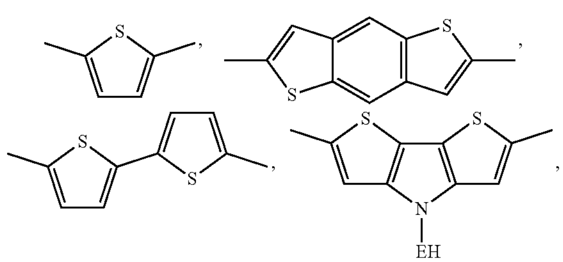

wherein EH is 2-ethylhexyl;

$R_4$ is $C_6H_{13}$ or $C_{12}H_{25}$;

$R_5$ is H or

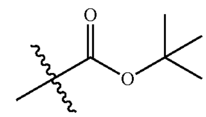 [SMILES: *C(=O)OC(C)(C)C]

$R_6$ and $R_7$ are each independently H or $CH_3$;

$X_5$ and $X_6$ are each independently O or S;

EH is 2-ethylhexyl; and n is an integer between 1 and 10,000.

38. The single heterojunction perovskite solar cell of any one of embodiments 26-34 or 36, wherein said near infrared sensitive semiconductor material is

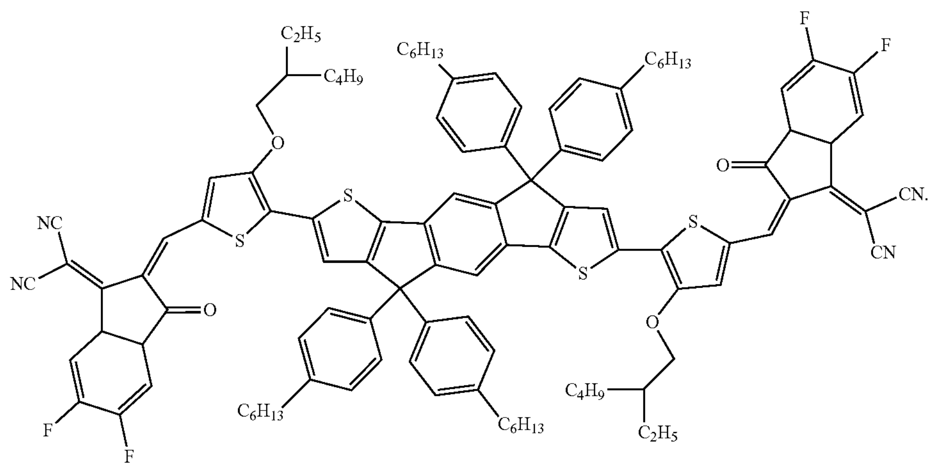

39. The single heterojunction perovskite solar cell of any one of embodiments 26-38, wherein said perovskite material is a perovskite having a structure of $ABX_3$, wherein A comprises a cation selected from the group consisting of FA, MA, Cs, Rb, and a combination thereof; B comprises a divalent metal selected from the group consisting of Pb, Sn, Ge, and a combination thereof; and X is one or more halides selected from the group consisting of I, Br, and Cl.

40. The single heterojunction perovskite solar cell of any one of embodiments 26-39, wherein said perovskite material is $Cs_{0.05}FA_{0.81}MA_{0.14}PbI_{2.55}Br_{0.45}$.

41. The single heterojunction perovskite solar cell of any one of embodiments 26-40, wherein said first transport layer is said electron transport layer and said second transport layer is said hole transport layer.

42. The single heterojunction perovskite solar cell of any one of embodiments 26-41, wherein said electron transport layer comprises said single near infrared sensitive semiconductor material.

43. The single heterojunction perovskite solar cell of any one of embodiments 26-42, wherein said electron transport layer further comprises said mesoporous material.

44. The single heterojunction perovskite solar cell of any one of embodiments 26-43, wherein said mesoporous material is mesoporous $TiO_2$.

45. The single heterojunction perovskite solar cell of any one of embodiments 26-44, wherein said first and said second electrodes are each independently selected from the group consisting of ITO, FTO, CdO, ZITO, AZO, Al, Au, Cu, Cr, Ca, Mg, Ag, and Ti.

46. The single heterojunction perovskite solar cell of any one of embodiments 26-45, wherein said first electrode is ITO.

47. The single heterojunction perovskite solar cell of any one of embodiments 26-46, wherein said second electrode is Ag.

48. The single heterojunction perovskite solar cell of any one of embodiments 26-34 or 36-47, wherein said first electrode is ITO; said first transport layer is said electron transport layer; said perovskite material is $Cs_{0.05}FA_{0.81}MA_{0.14}PbI_{2.55}Br_{0.45}$; said second transport layer is said hole transport layer; said second electrode is Ag; wherein said electron transport layer comprises $TiO_2$; said hole transport layer comprises Spiro-OmeTAD; said electron transport layer comprises said single near infrared sensitive semiconductor material, wherein said single near infrared sensitive semiconductor material is

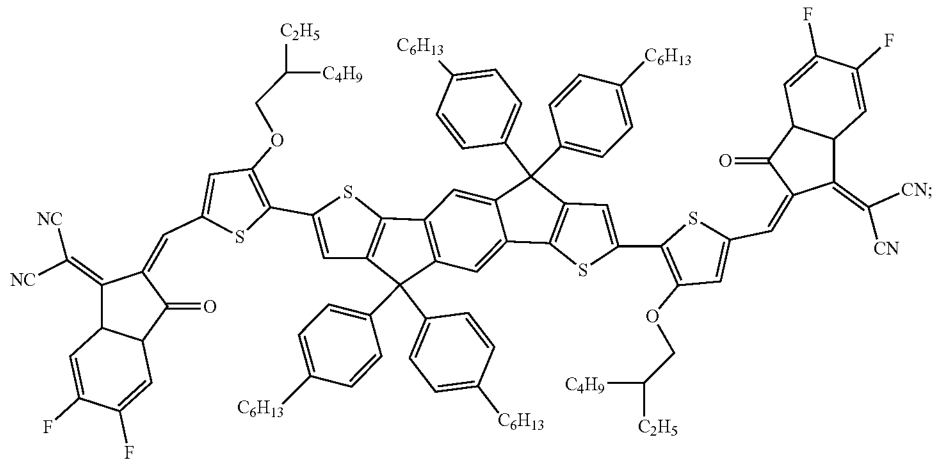

and wherein said electron transport layer further comprises a mesoporous material, wherein said mesoporous material is mesoporous $TiO_2$.

49. The single heterojunction perovskite solar cell of embodiment 48, having a having a Power Conversion Efficiency of about 13.7%.

50. The single heterojunction perovskite solar cell of embodiment 48, exhibiting a near infrared External Quantum Efficiency extended to about 950 nm.

51. A stacked bulk heterojunction perovskite solar cell, comprising:

a first electrode;

a transport layer disposed on the first electrode;

a perovskite material layer disposed on the transport layer;

a bulk heterojunction layer disposed on the perovskite material layer; and a second electrode disposed on the bulk heterojunction layer, wherein said bulk heterojunction layer comprises one of more electron donors and one or more electron acceptors, and wherein at least one of said electron donors and/or at least one of said electron acceptors is a diketopyrrole (DPP) near infrared sensitive polymer or compound selected from the group consisting of

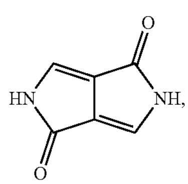

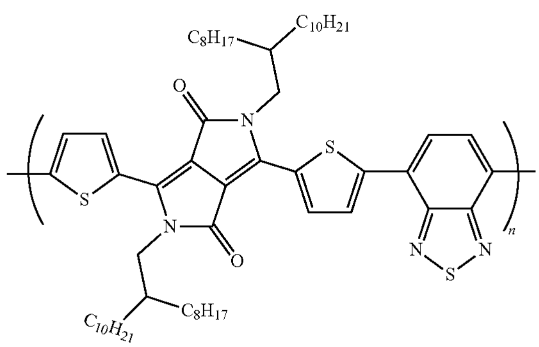

,

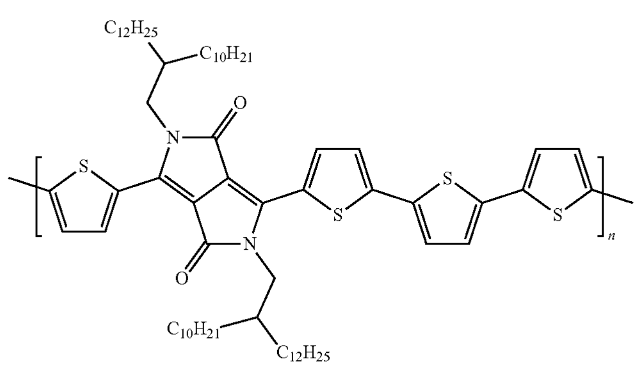

,

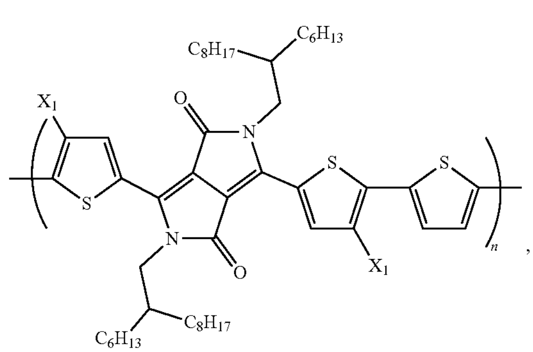

,

-continued
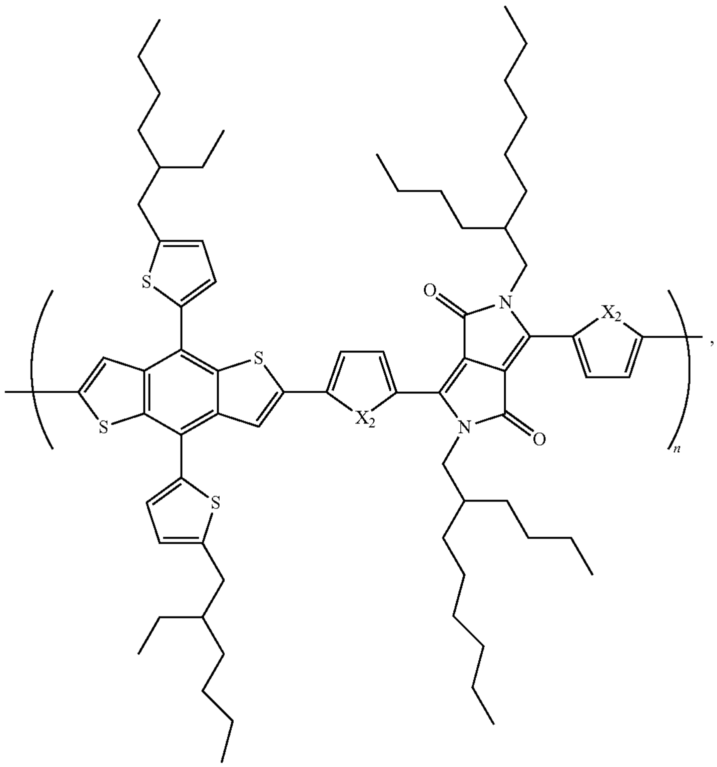
,
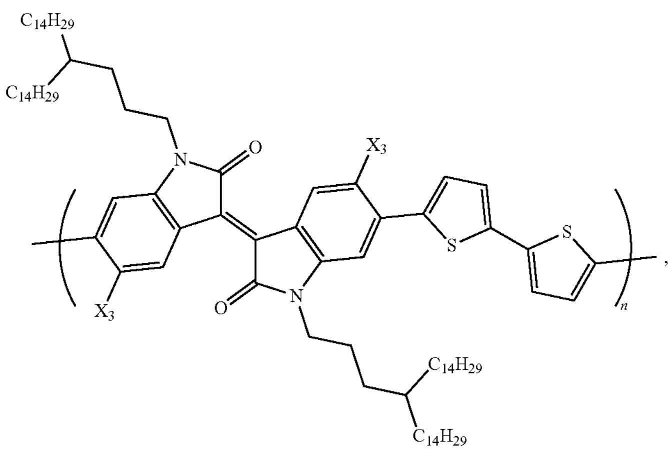
,
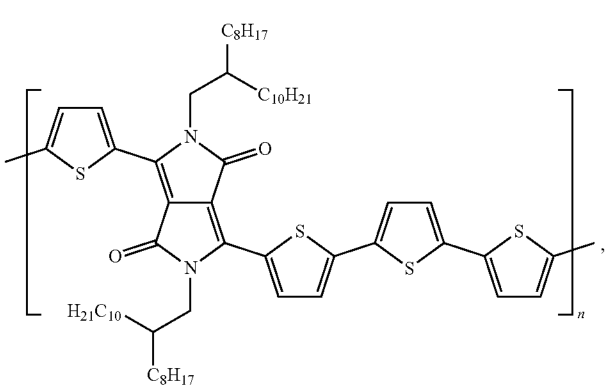
,

-continued
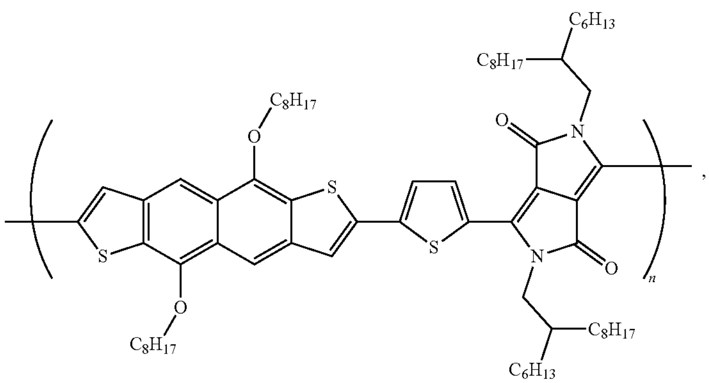
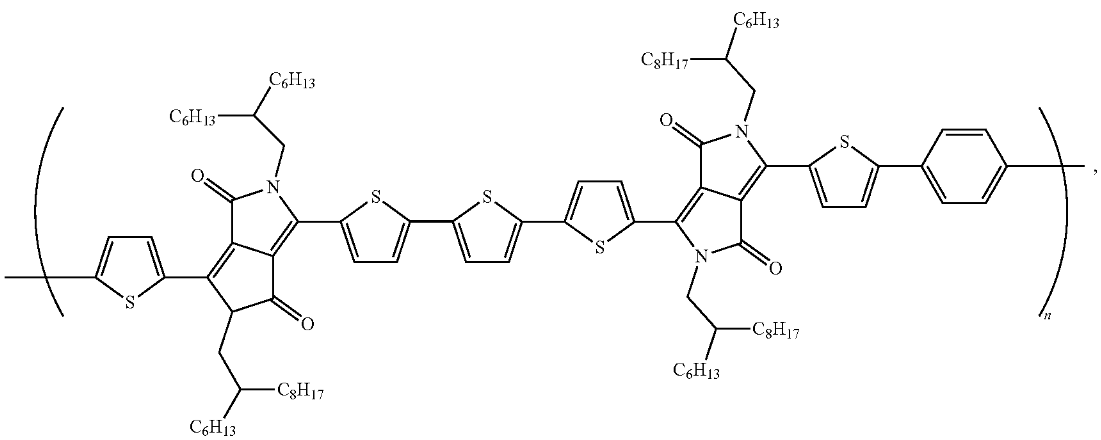
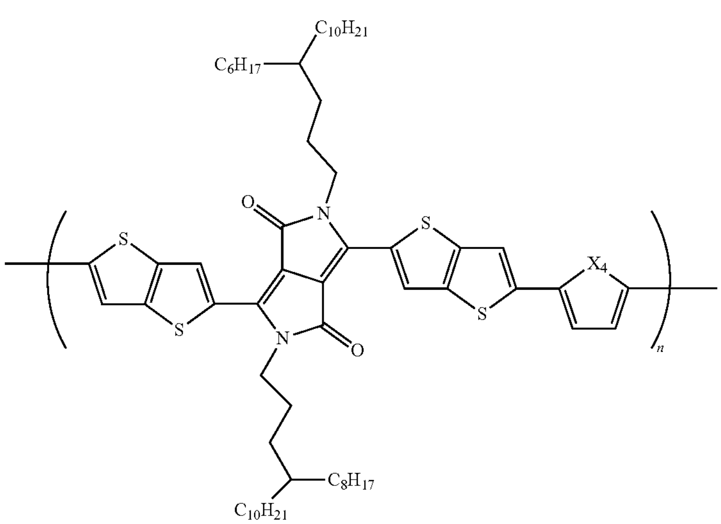

-continued
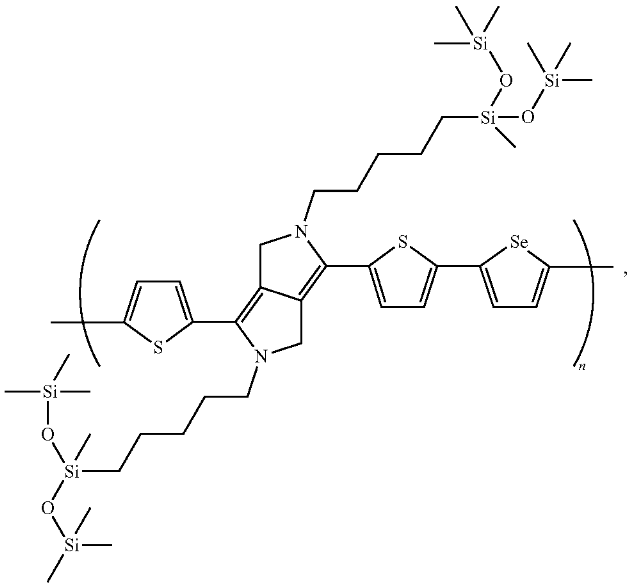
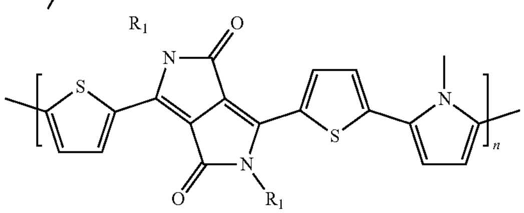
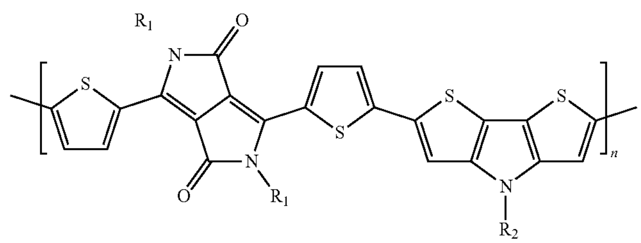
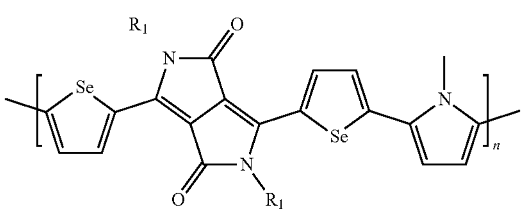
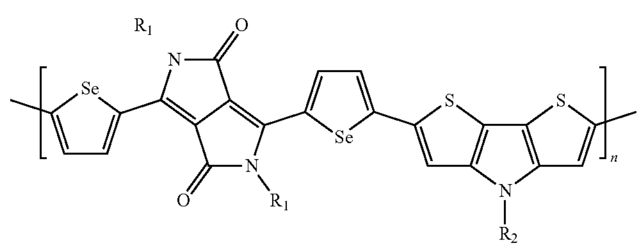
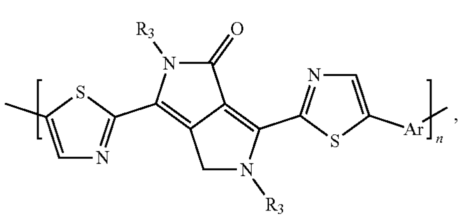
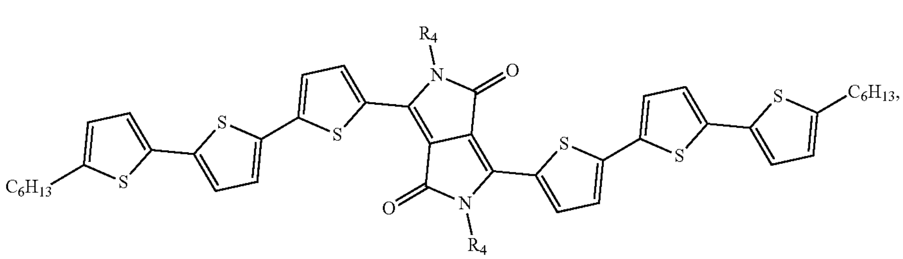

-continued
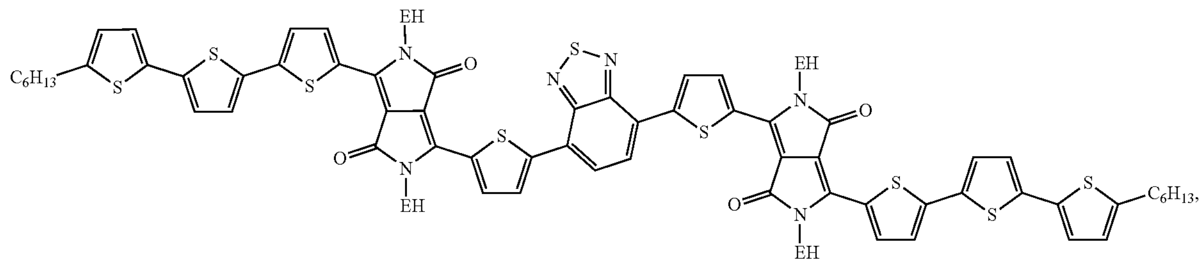
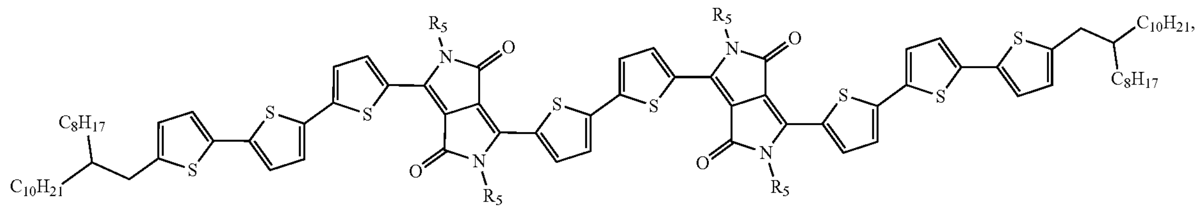
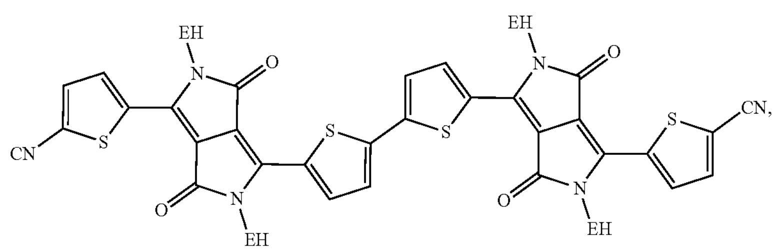
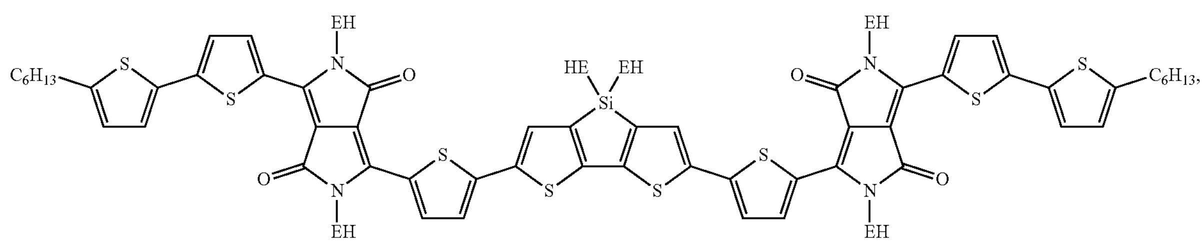
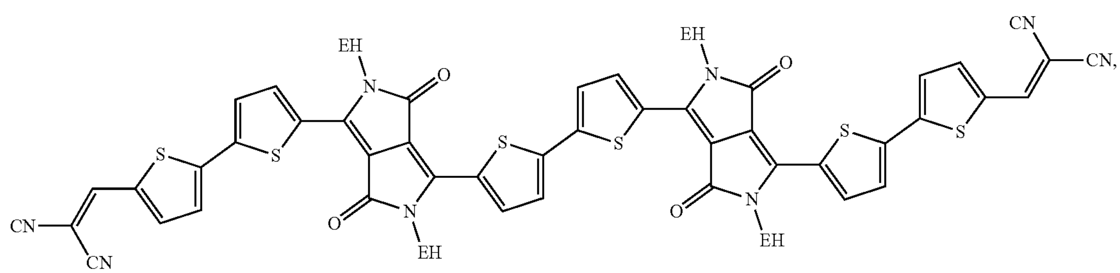
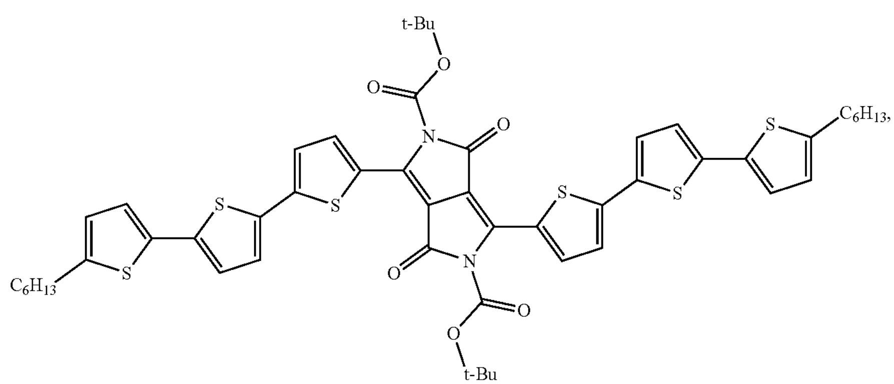

-continued
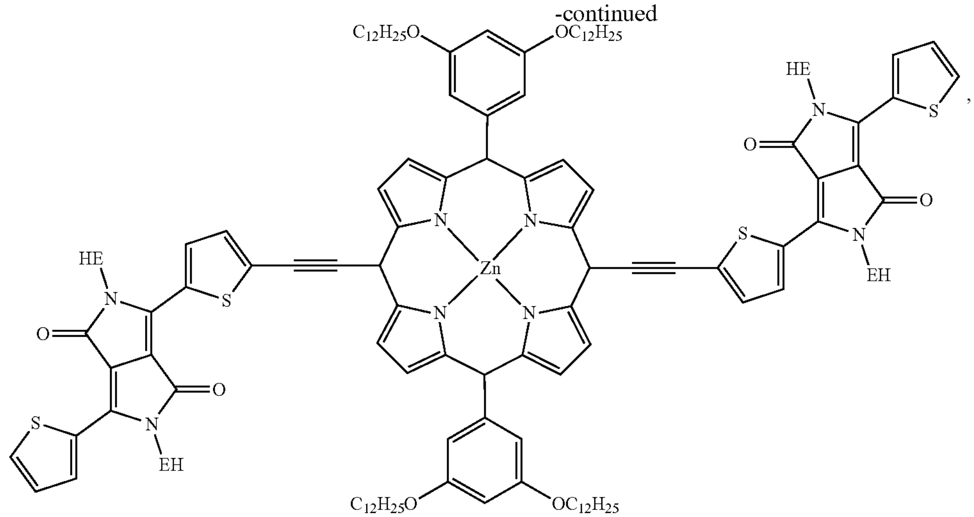
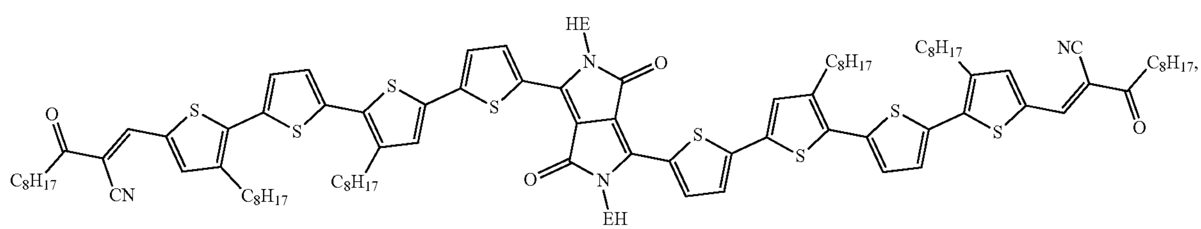
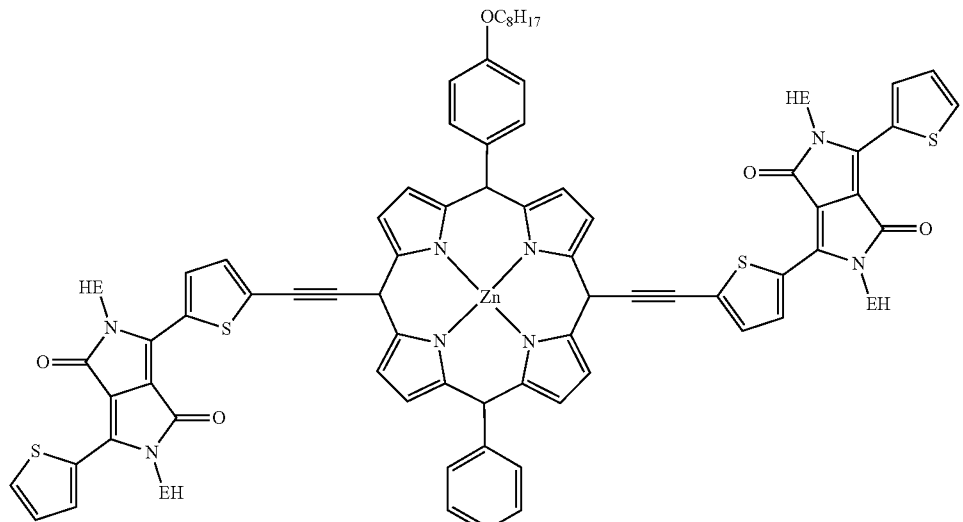
, and
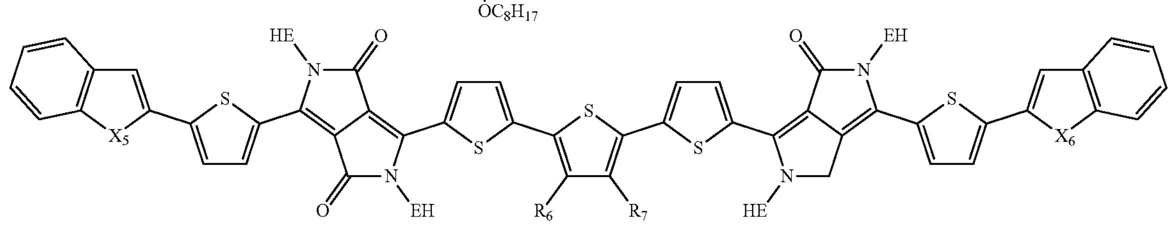
wherein:
$X_1$ is H or $CH_3$;
$X_2$ is S or Se;
$X_3$ is H or F;
$X_4$ is Se or Te;
$R_1$ is 2-hexyldecyl;
$R_2$ is 2-ethylhexyl;
$R_3$ is selected from the group consisting of 2-ethylhexyl, 2-butyloctyl, 2-hexyldecyl, and 2-decyltetradecyl;

Ar is selected from the group consisting of

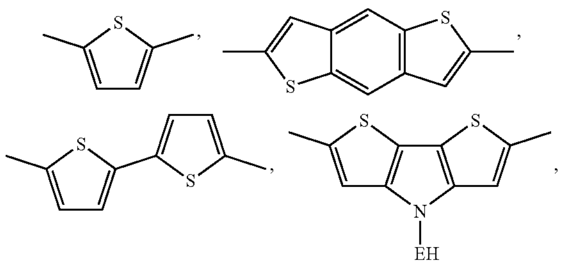

wherein EH is 2-ethylhexyl;

$R_4$ is $C_6H_{13}$ or $C_{12}H_{25}$;

$R_5$ is H or

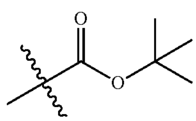 [SMILES: *C(=O)OC(C)(C)C]

$R_6$ and $R_7$ are each independently H or $CH_3$;

$X_5$ and $X_6$ are each independently O or S;

EH is 2-ethylhexyl; and n is an integer between 1 and 10,000.

52. The stacked bulk heterojunction perovskite solar cell of embodiment 51, wherein said diketopyrrole (DPP) near infrared sensitive polymer or compound are

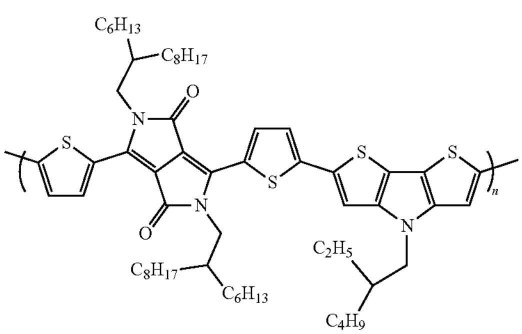

and

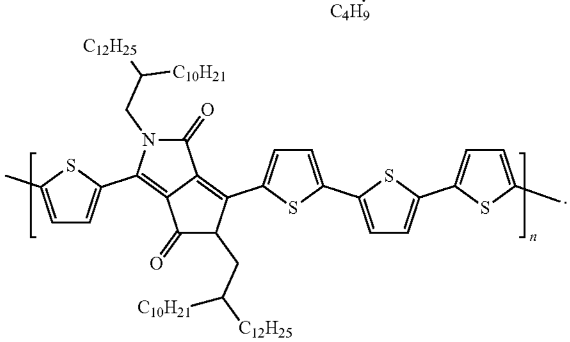

53. The stacked bulk heterojunction perovskite solar cell of embodiment 51 or 52, wherein said bulk heterojunction layer comprises

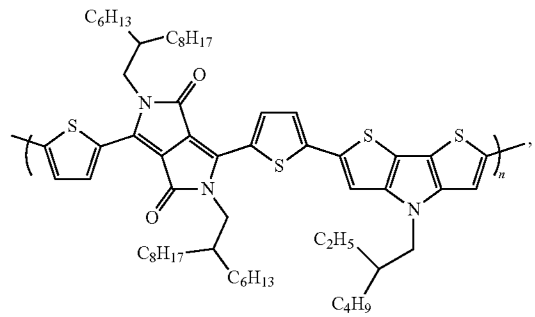

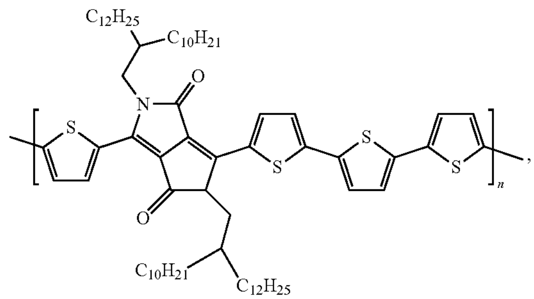

and

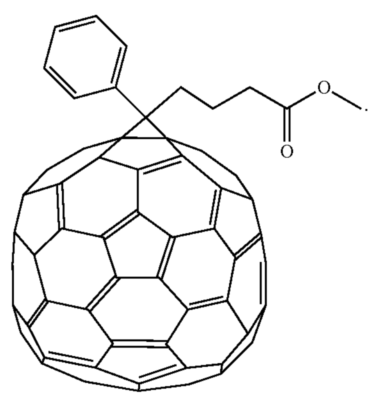

54. The stacked bulk heterojunction perovskite solar cell of embodiment 53, comprising

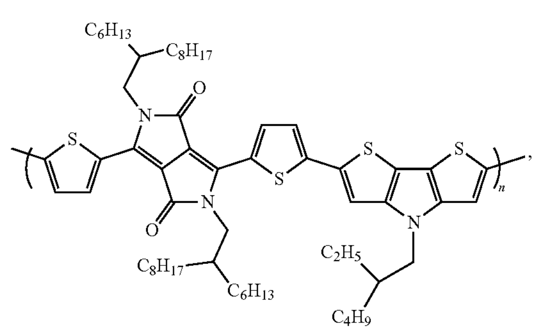

-continued

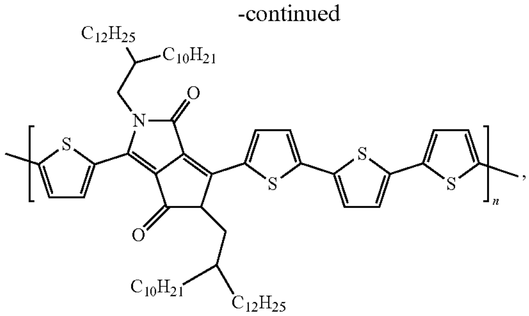

, and

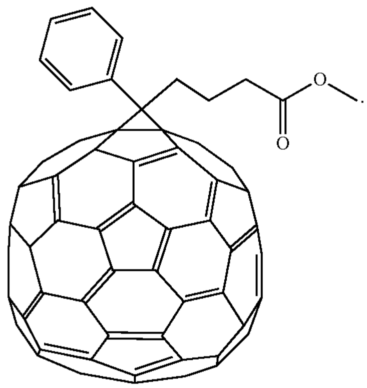

in a 1:2:4 weight ratio.

55. The stacked bulk heterojunction perovskite solar cell of any one of embodiments 51-54, wherein said perovskite material is $(FA_{0.85}MA_{0.15})_{0.95}Cs_{0.05}Pb(I_{0.85}Br_{0.15})_3$.

56. The stacked bulk heterojunction perovskite solar cell of any one of embodiments 51-55, wherein said first electrode is ITO.

57. The stacked bulk heterojunction perovskite solar cell of any one of embodiments 51-56, wherein said second electrode is Cu.

58. The stacked bulk heterojunction perovskite solar cell of any one of embodiments 55-57, wherein said transport layer disposed on said first electrode is PTAA.

59. The stacked bulk heterojunction perovskite solar cell of any one of embodiments 51-58, wherein said first electrode is ITO, said transport layer disposed on said first electrode is PTAA, said perovskite material disposed on said transport layer is $(FA_{0.85}MA_{0.15})_{0.95}Cs_{0.05}Pb(I_{0.85}Br_{0.15})_3$, said bulk heterojunction layer disposed on said perovskite layer comprises

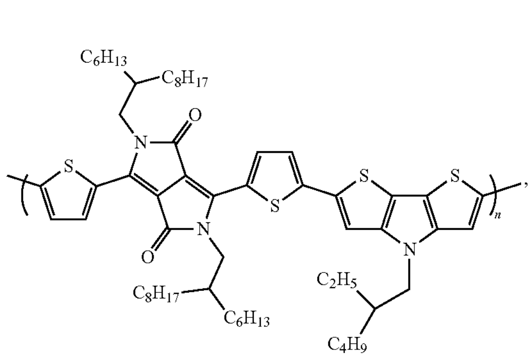

,

-continued

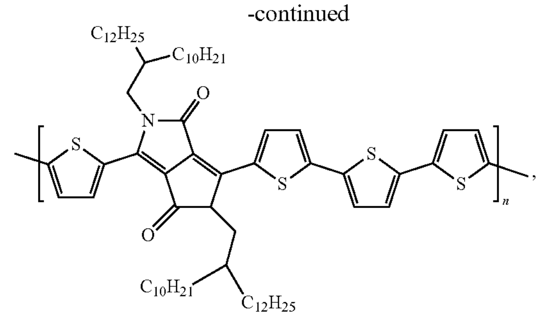

, and

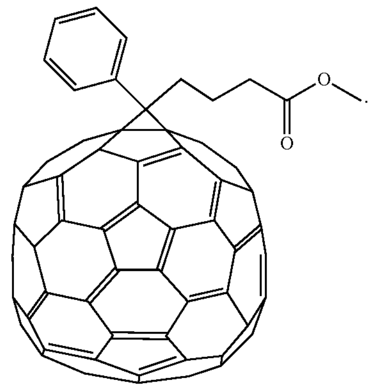

in a 1:2:4 weight ratio; wherein said bulk heterojunction solar cell further comprises a layer of LiF between said bulk heterojunction layer and said second electrode, and wherein said second electrode disposed on said bulk heterojunction layer is Cu.

60. The stacked bulk heterojunction perovskite solar cell of embodiment 59, having a Power Conversion Efficiency of about 20.3%.

61. A stacked bulk heterojunction perovskite solar cell, comprising:
a first electrode;
a transport layer disposed on the first electrode;
a perovskite material layer disposed on the transport layer;
a bulk heterojunction layer disposed on the perovskite material layer; and
a second electrode disposed on the bulk heterojunction layer,
wherein said bulk heterojunction layer comprises one of more electron donors and one or more electron acceptors, and
wherein said one or more electron donors and said one or more electron acceptors is a near infrared sensitive inorganic semiconductor material selected from the group consisting of PbS, CdTe, CIGS, GaAs, PbS, Si, $(FA_aMA_bCs_{(1-a-b)}Pb_cSn_{(1-c)}I_dBr_{3-d}$, in which $0 \leq a \leq 1$, $0 \leq b \leq 1$, $0 \leq a+b \leq 1$, $0 \leq c \leq 1$, and $0 \leq d \leq 3$, FA=HC$(NH_2)_2$, MA=$CH_3NH_3$), and $Sb_2Se_3$.

62. A stacked bulk heterojunction perovskite solar cell, comprising:
a first electrode;
a transport layer disposed on the first electrode;
a perovskite material layer disposed on the transport layer;
a bulk heterojunction layer disposed on the perovskite material layer;
and a second electrode disposed on the bulk heterojunction layer, wherein said bulk heterojunction layer comprises one of more electron donors and one or more electron acceptors, and
wherein at least one of said electron donors and/or at least one of said electron acceptors is a near infrared sensitive organic compound selected from the group consisting of
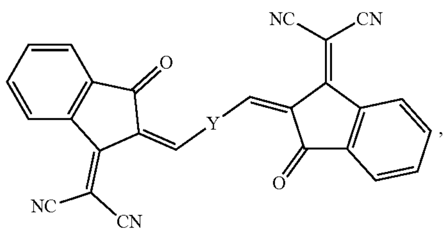
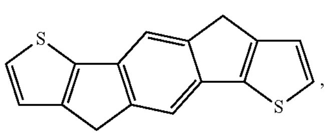
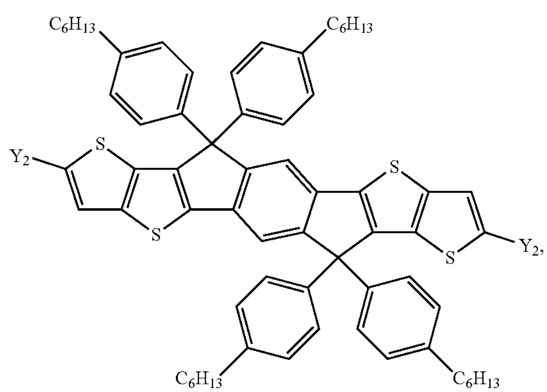
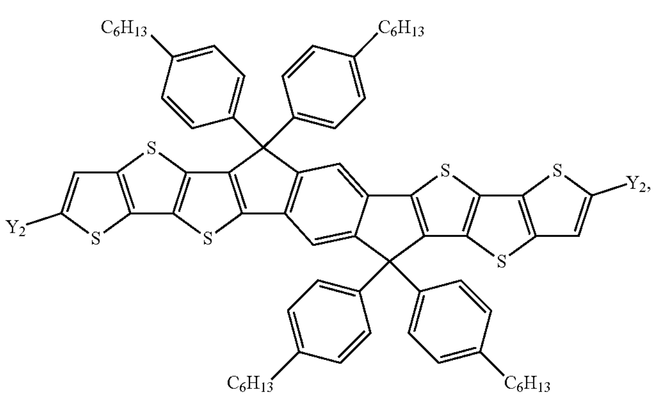

-continued
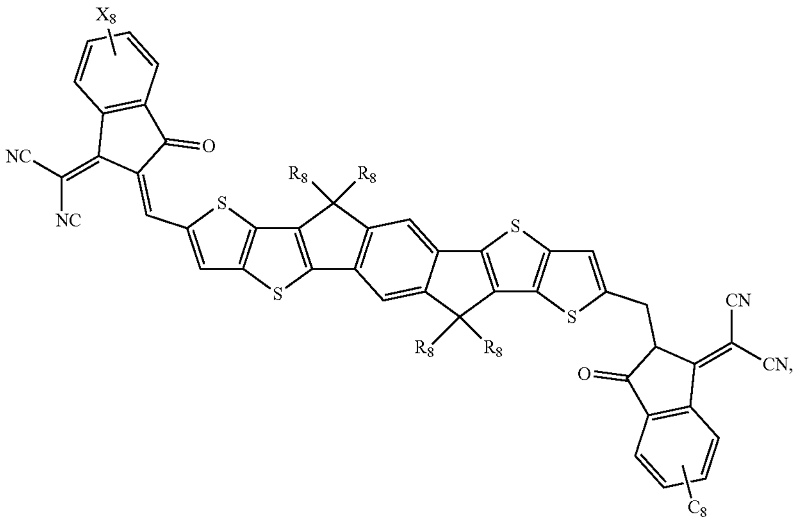
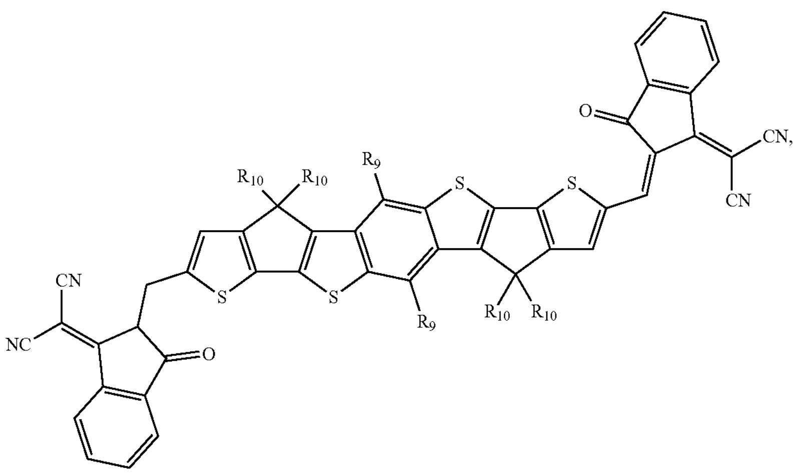
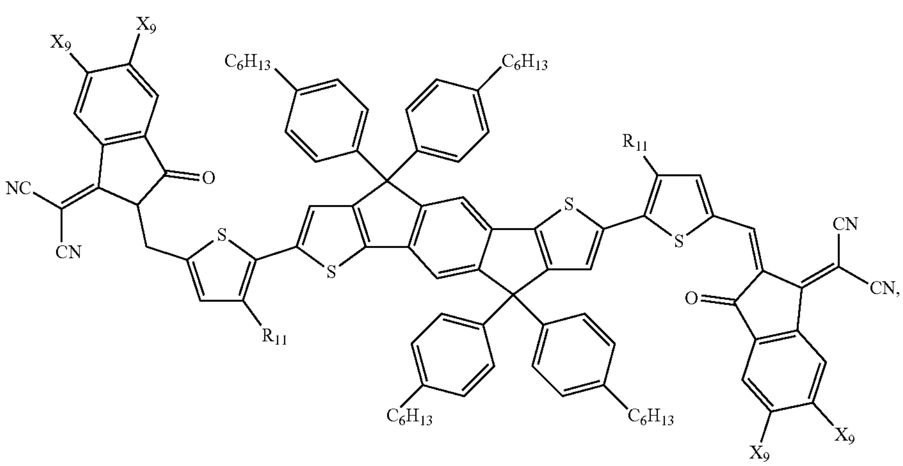

-continued
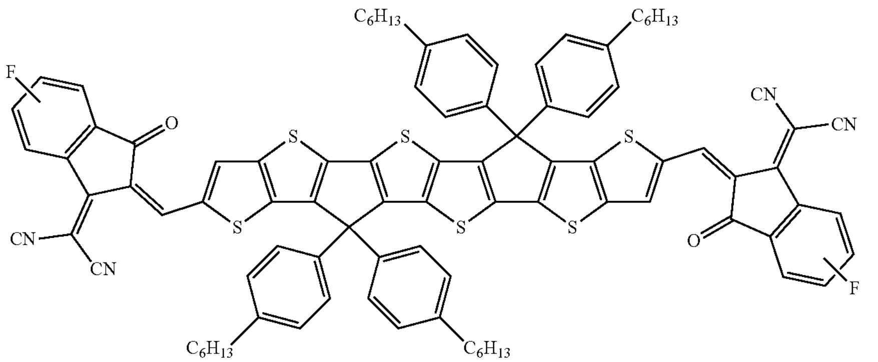
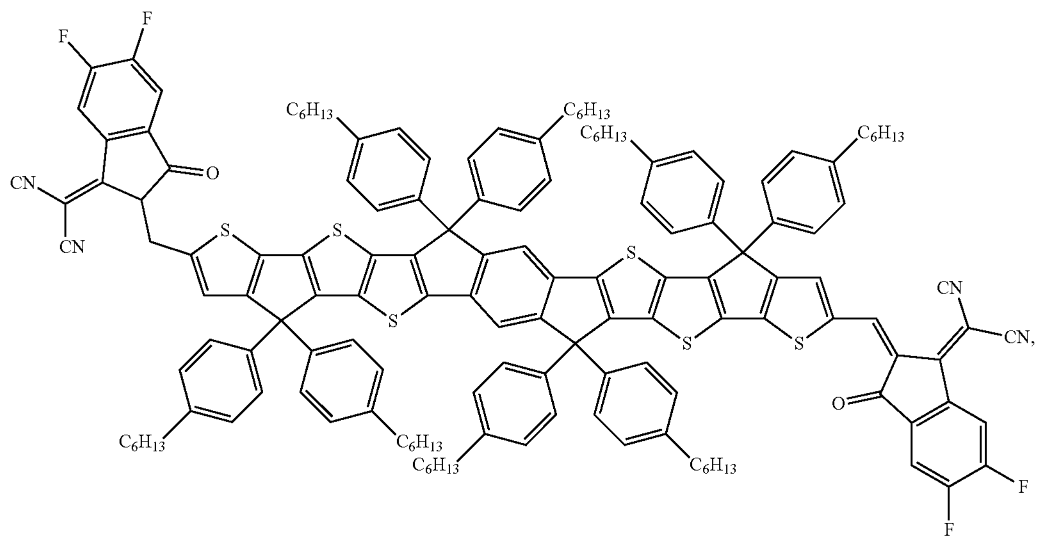
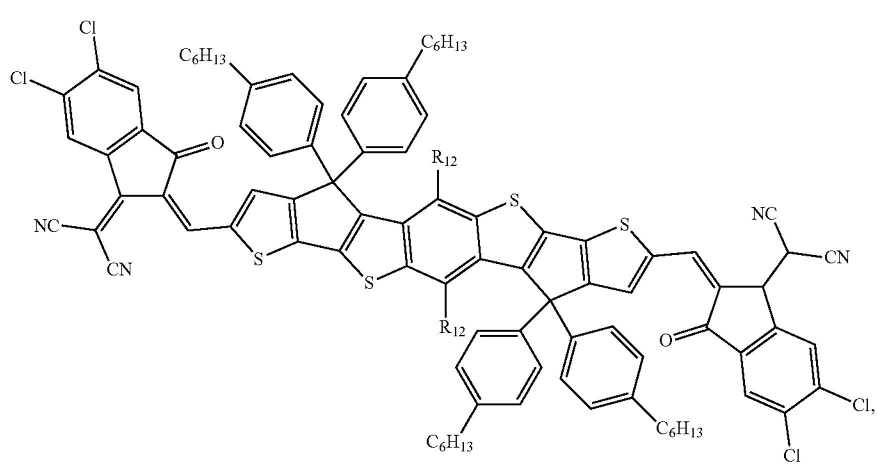

-continued
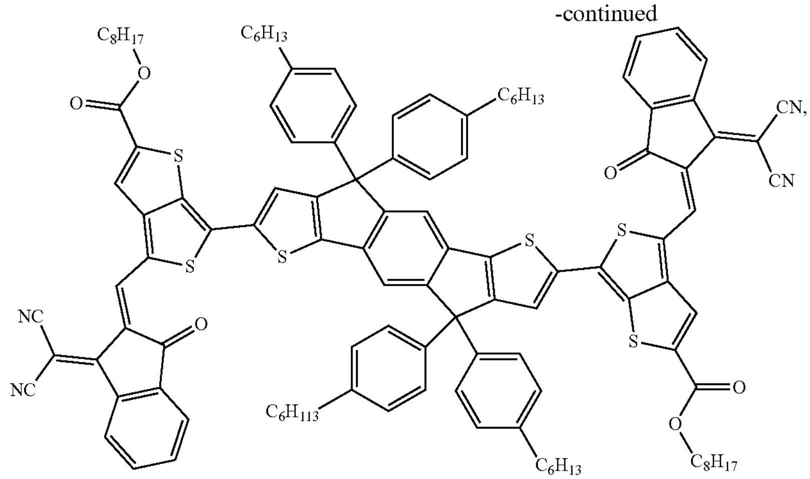
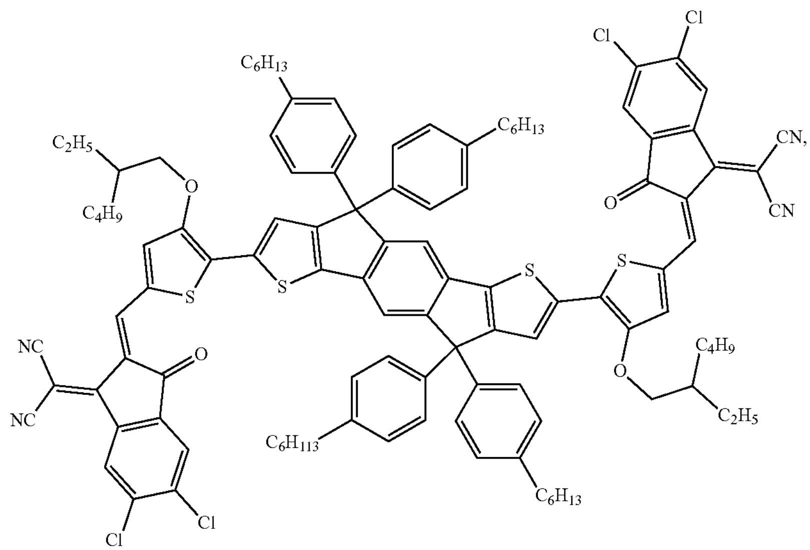
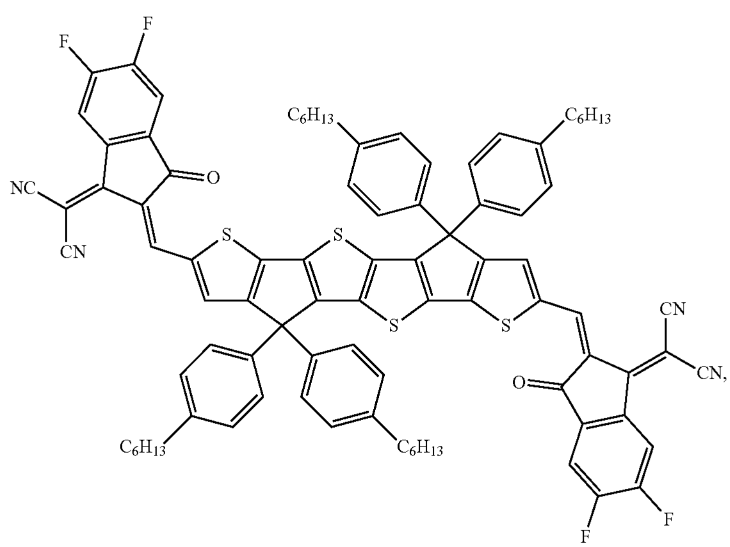

-continued
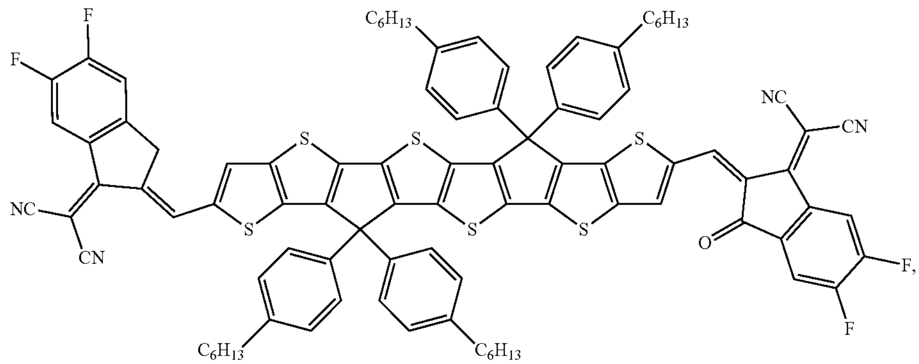
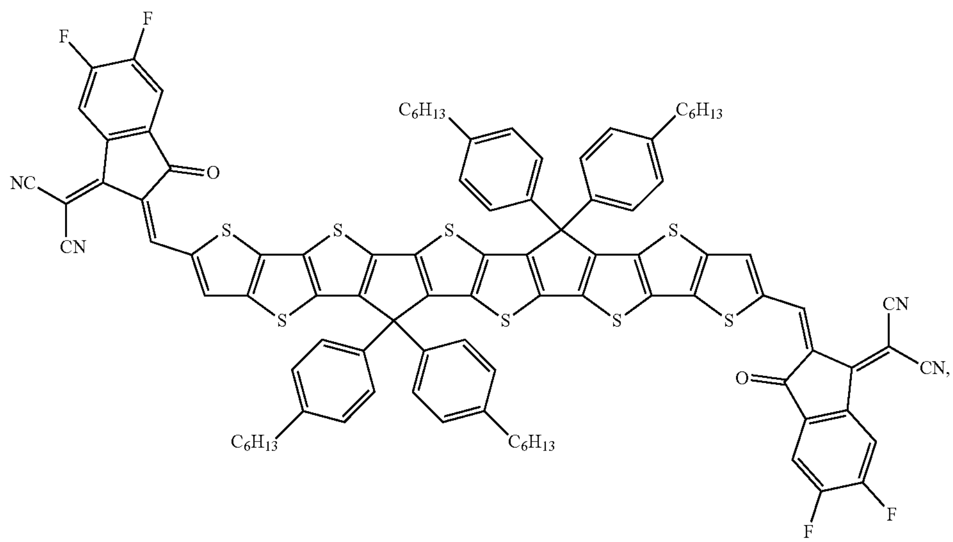
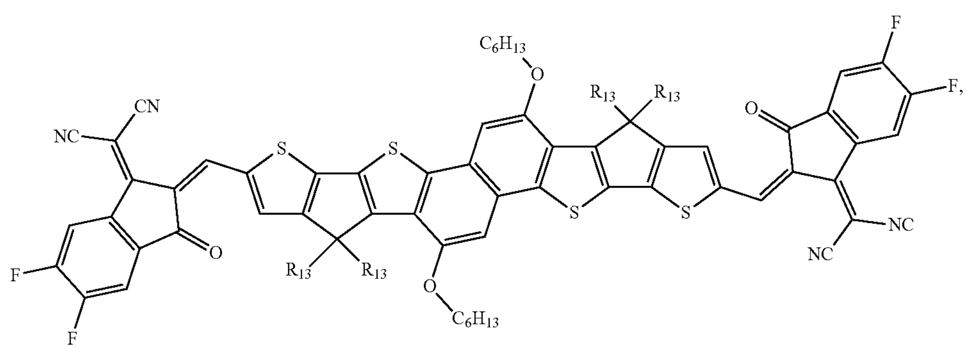
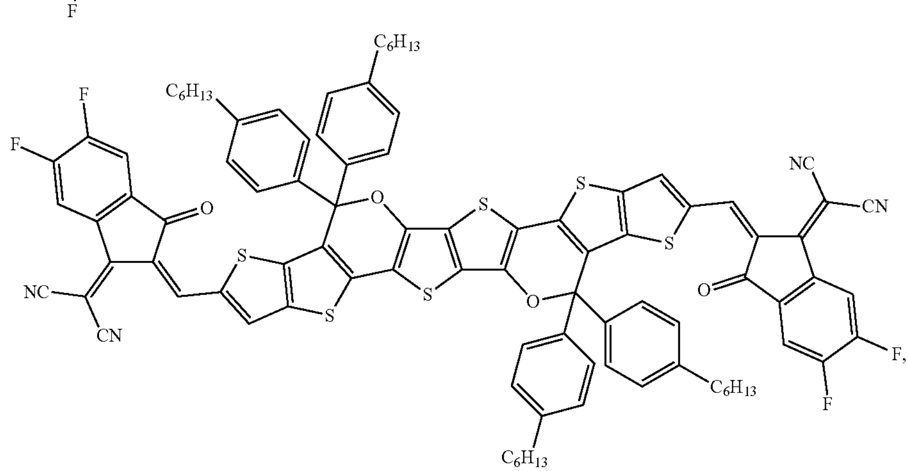

-continued
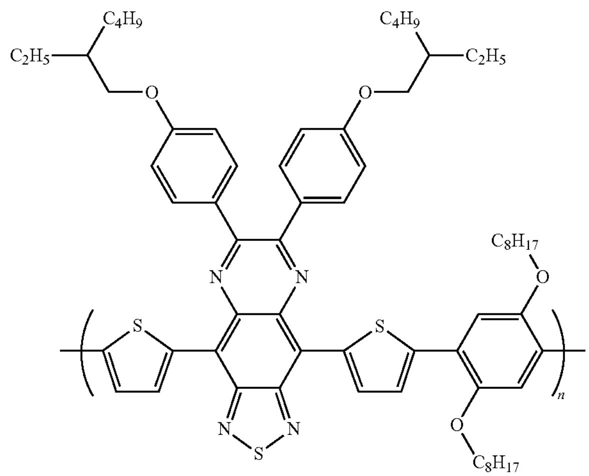
,
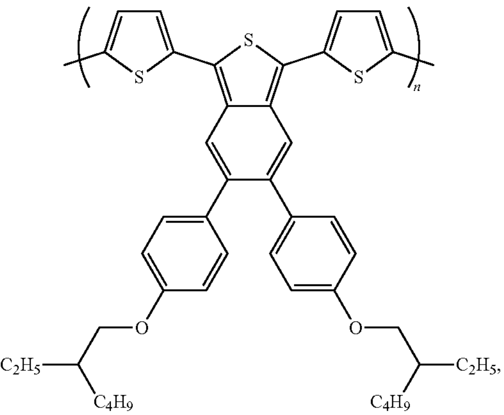
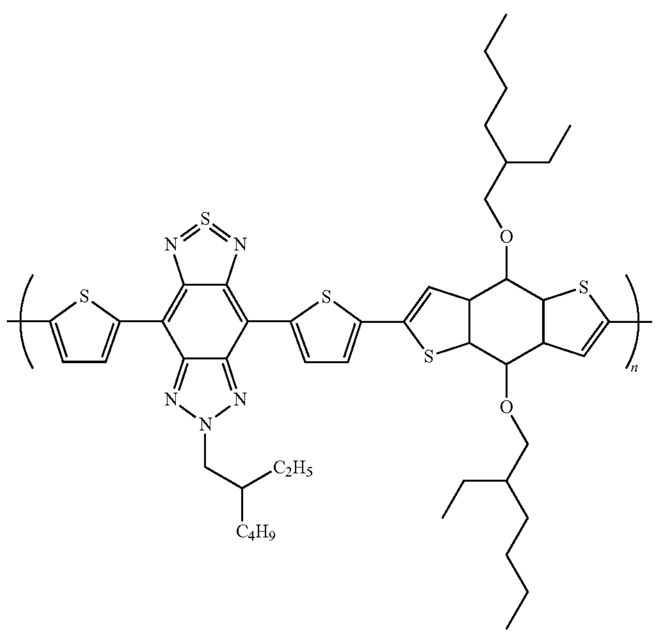
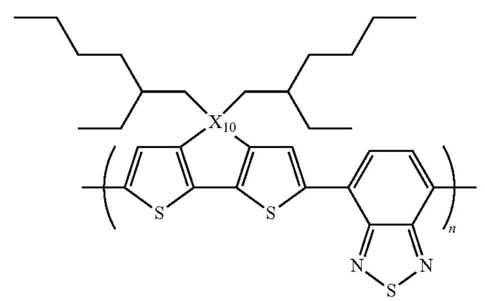
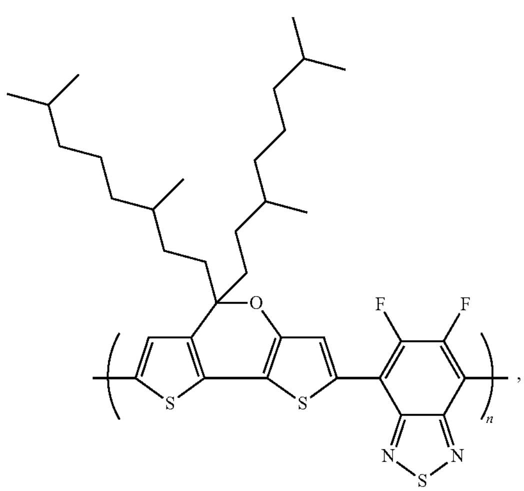
,
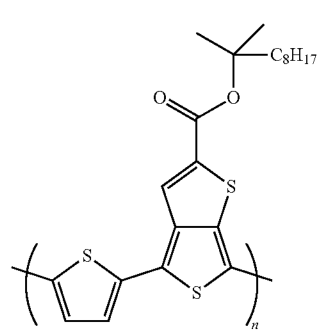

-continued
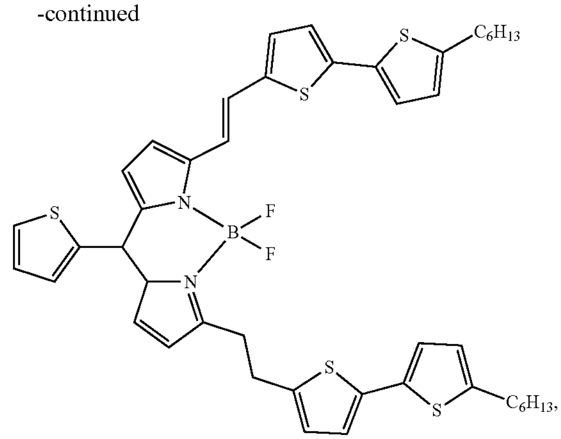
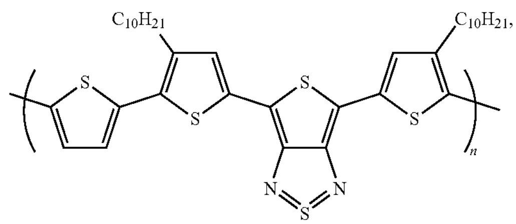
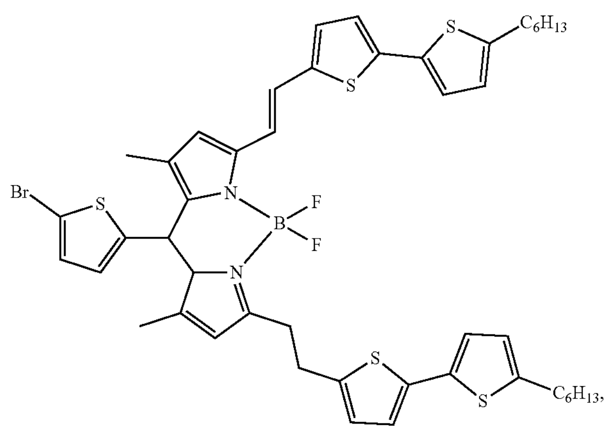
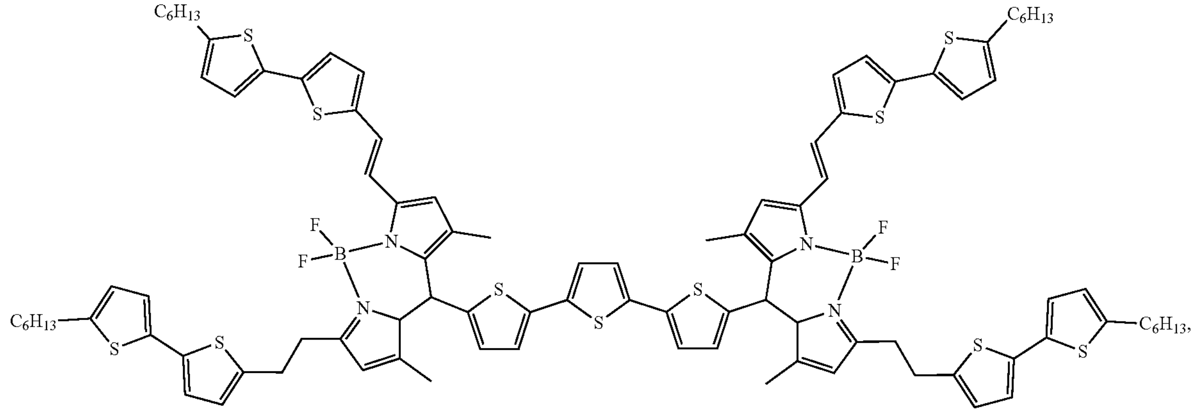

-continued
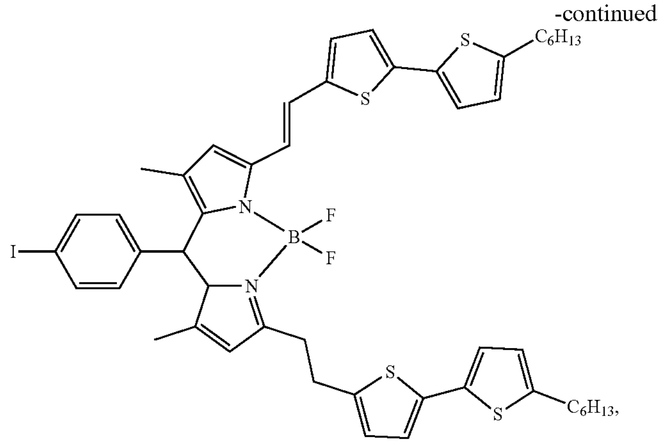
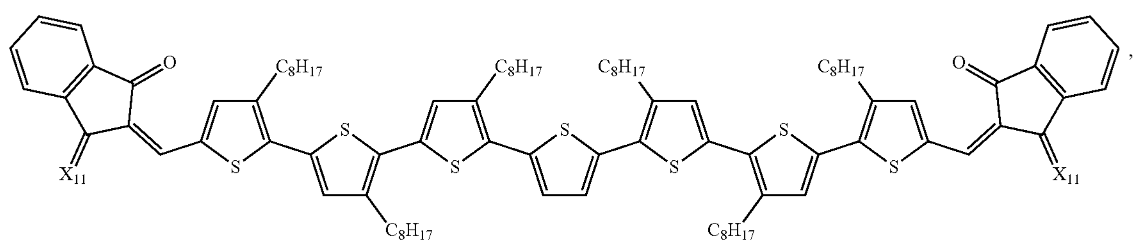
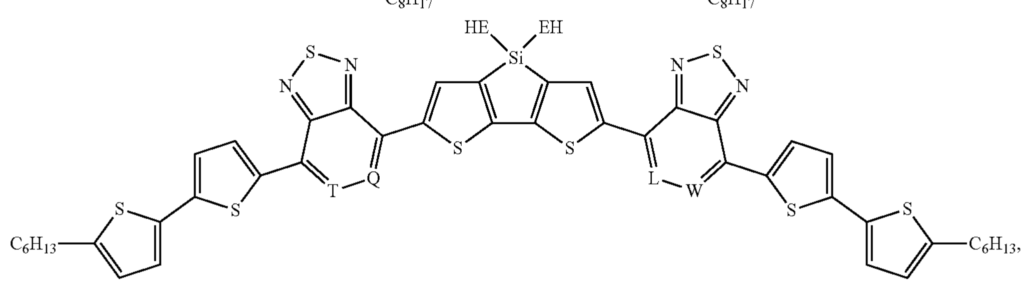
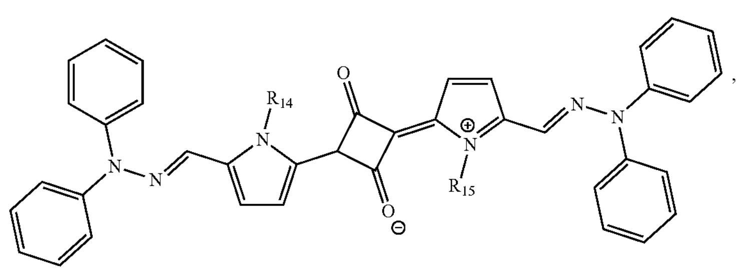
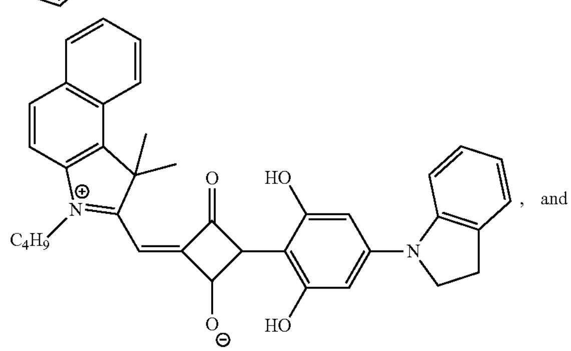

-continued
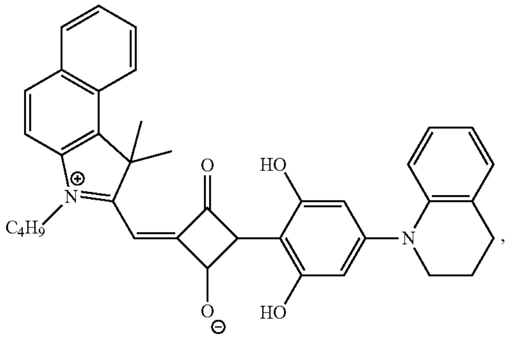
wherein:
Y is selected from the group consisting of
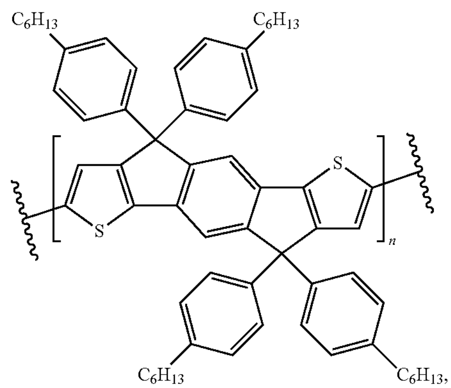
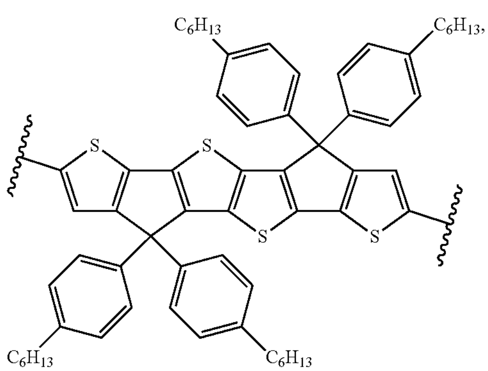
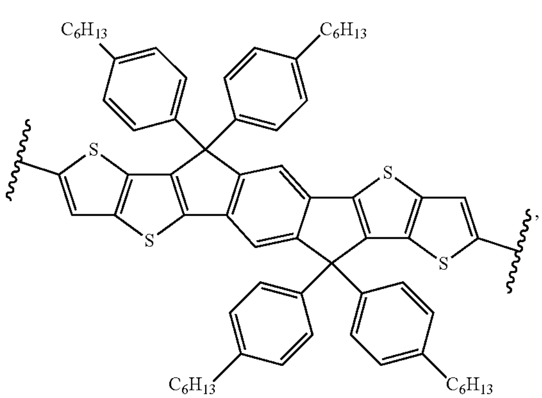
-continued
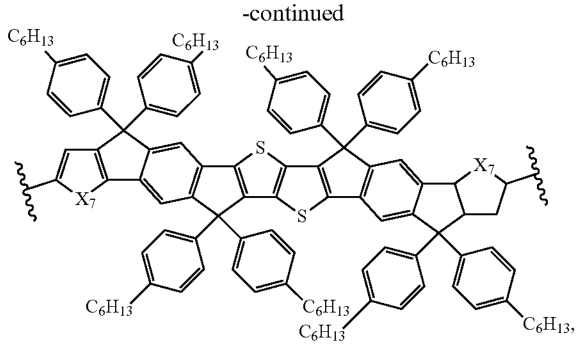
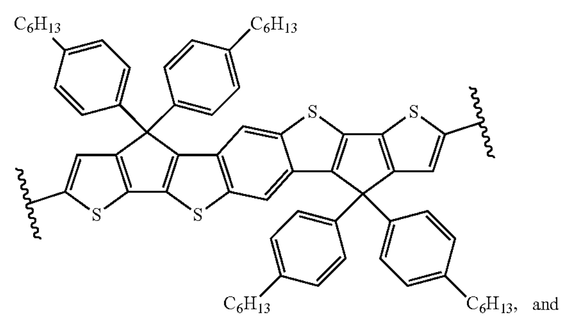
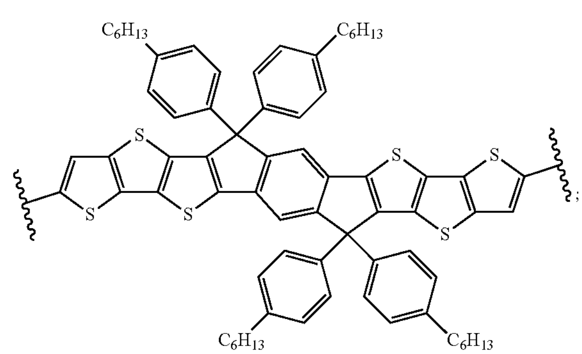

$X_7$ is S or Se;
$Y_2$ is selected from the group consisting of
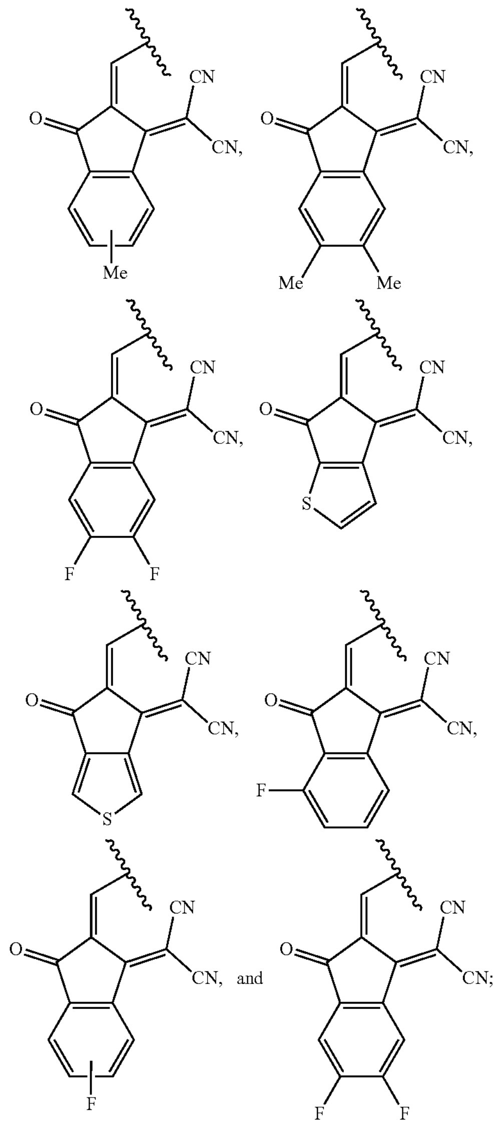
$X_8$ is H or F;
$R_8$ is
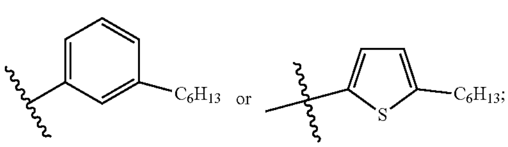
$R_9$ is
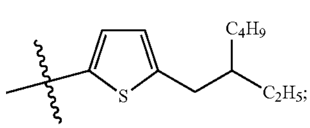
$R_{10}$ is
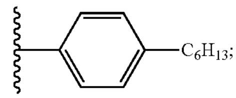
$X_9$ is H or F;
$R_{11}$ is
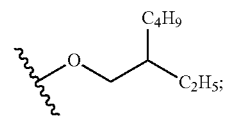
$R_{12}$ is 2-ethylhexyl;
$R_{13}$ is
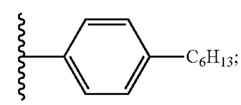
$X_{10}$ is selected from the group consisting of C, Si, and Ge;
$X_{11}$ is O or
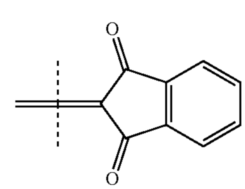
Q, L, T, and W are each independently CH or N;
$R_{14}$ and $R_{15}$ are each independently 2-ethylhexyl or n-dodecyl;
and n is an integer between 1 and 10,000, provided that said bulk heterojunction layer does not contain the following two combinations:
PTB7-Th
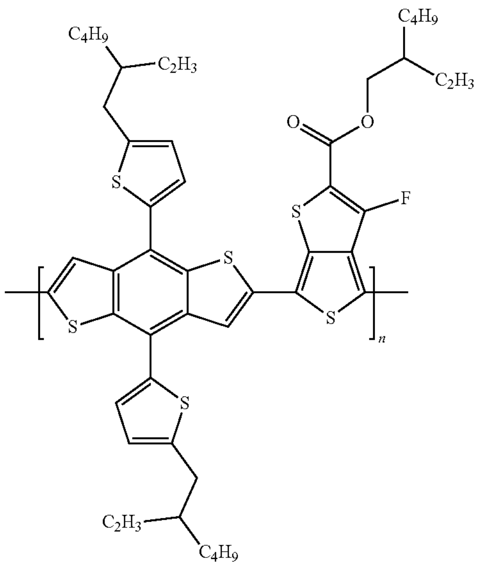
IEICO-4F
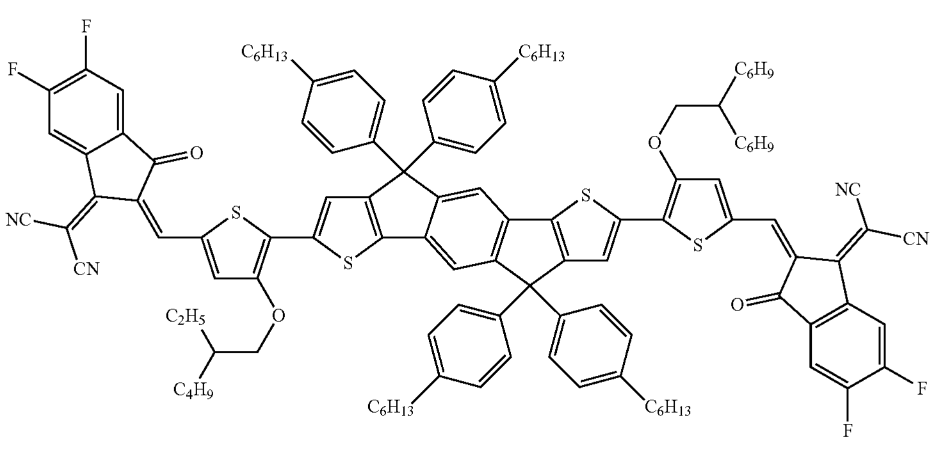
or -continued

PBDB-T

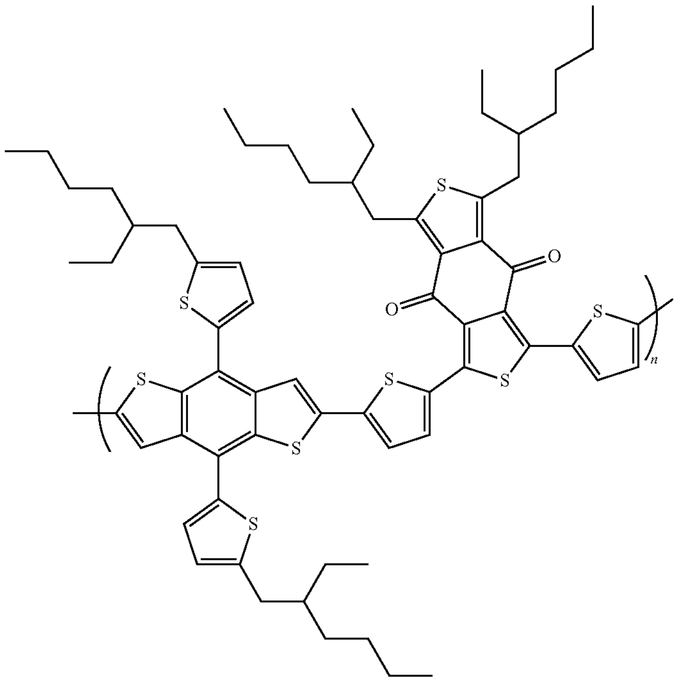

ITIC

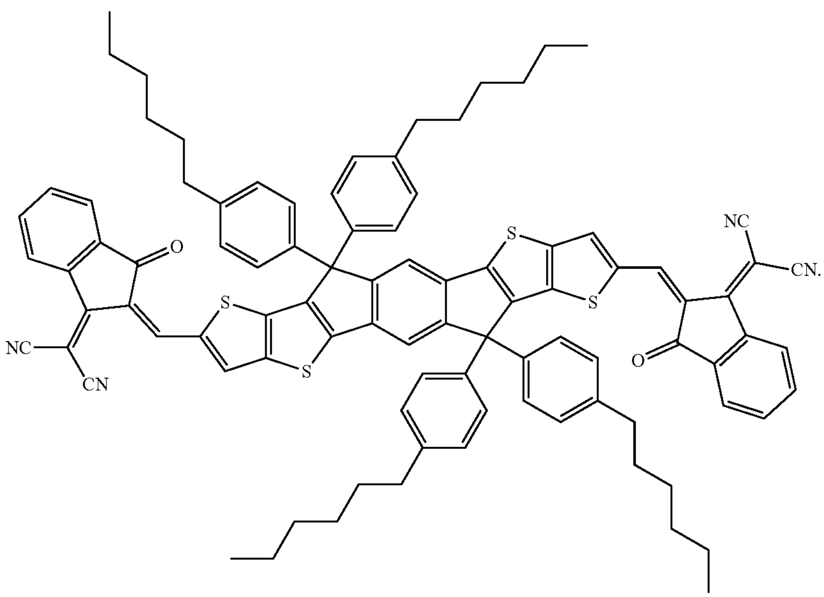

63. A stacked bulk heterojunction perovskite solar cell, comprising:
a first electrode;
a first bulk heterojunction layer provided on the first electrode;
a perovskite material layer provided on the first bulk heterojunction layer;
a second bulk heterojunction layer provided on the perovskite material layer;
and a second electrode provided on the second bulk heterojunction layer,
wherein said first bulk heterojunction layer and said second bulk heterojunction layer comprise one of more electron donors and one or more electron acceptors, and
wherein said one or more electron donors and said one or more electron acceptors is a near infrared sensitive semiconductor material.

64. The stacked bulk heterojunction perovskite solar cell of embodiment 63, wherein said near infrared sensitive semiconductor material is capable of absorbing light with a wavelength of at least 780 nm.

65. The stacked bulk heterojunction perovskite solar cell of embodiment 63, wherein said near infrared sensitive semiconductor material is an inorganic semiconductor selected from the group consisting of PbS, CdTe, CIGS, GaAs, PbS, Si, $(FA_aMA_bCs_{(1-a-b)}Pb_cSn_{(1-c)}I_dBr_{3-d}$, in which $0 \leq a \leq 1$, $0 \leq b \leq 1$, $0 \leq a+b \leq 1$, $0 \leq c \leq 1$, and $0 \leq d \leq 3$, $FA=HC(NH_2)_2$, $MA=CH_3NH_3$), and $Sb_2Se_3$.

66. The stacked bulk heterojunction perovskite solar cell of embodiment 63, wherein said near infrared sensitive semiconductor material is an organic semiconductor selected from the group consisting of
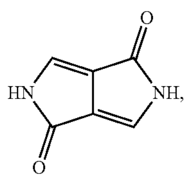
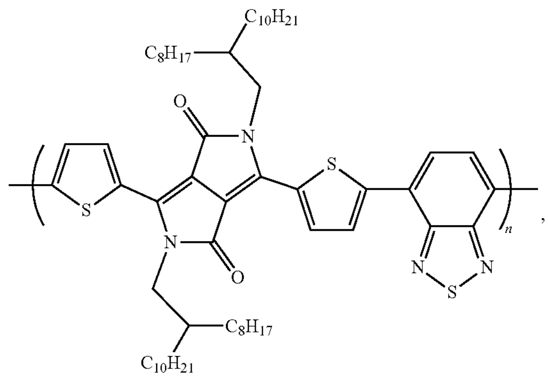
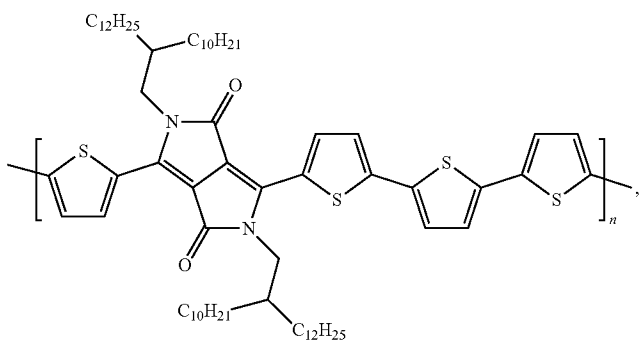
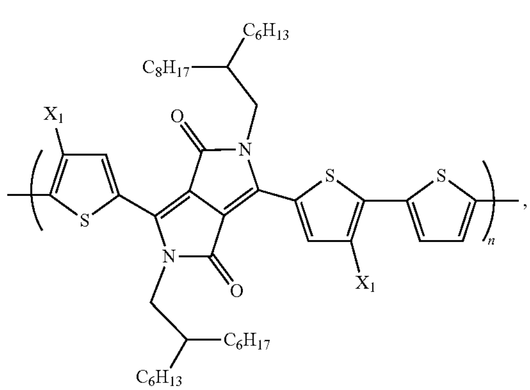

-continued
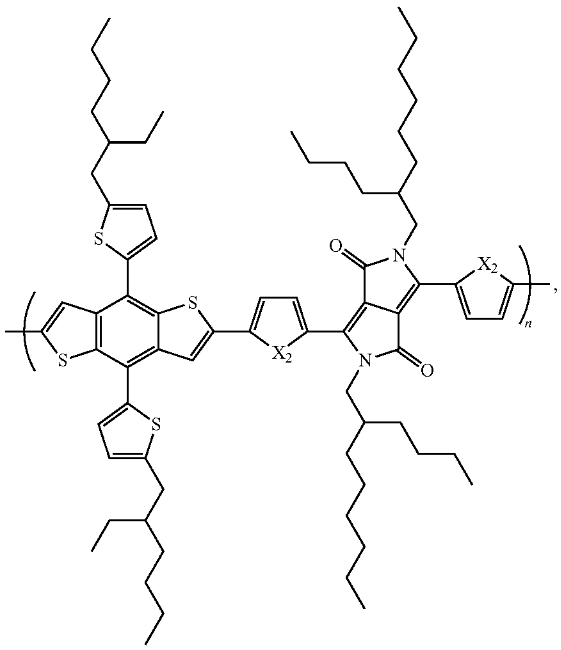
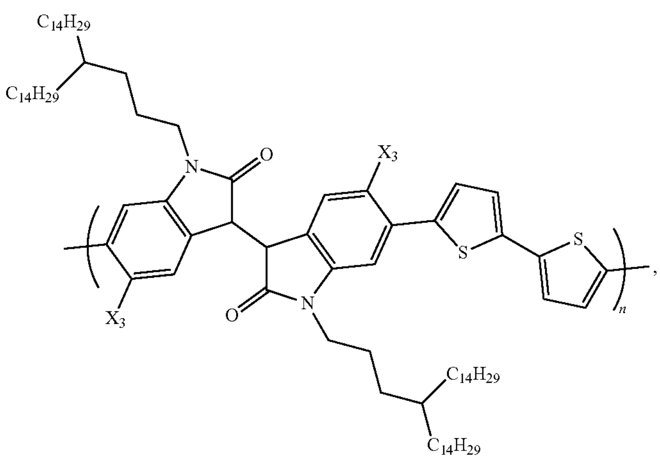
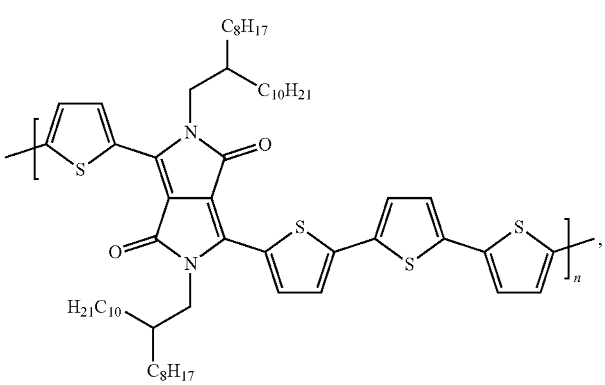

-continued
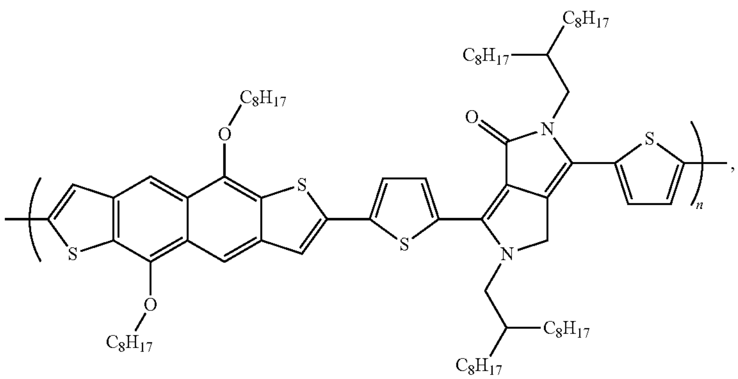
,
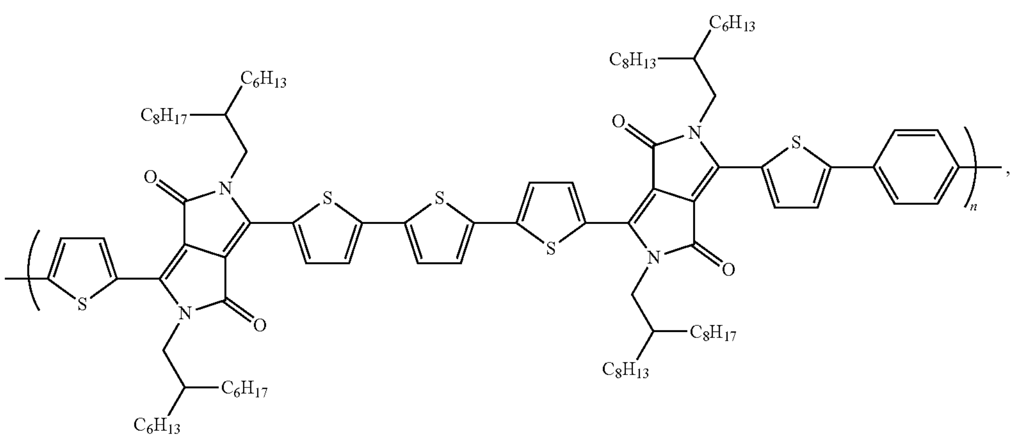
,
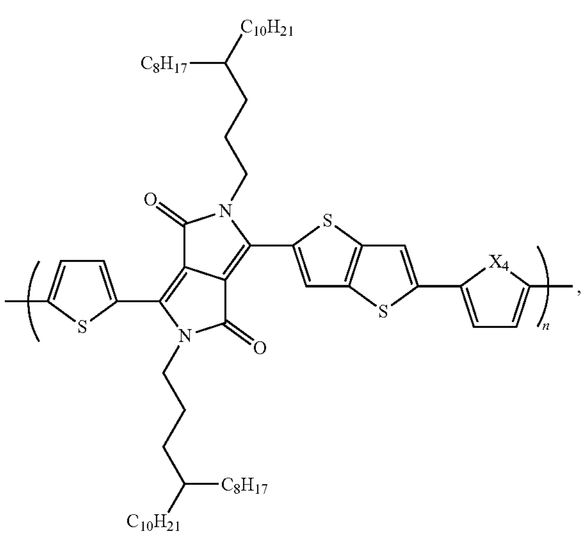
,

-continued
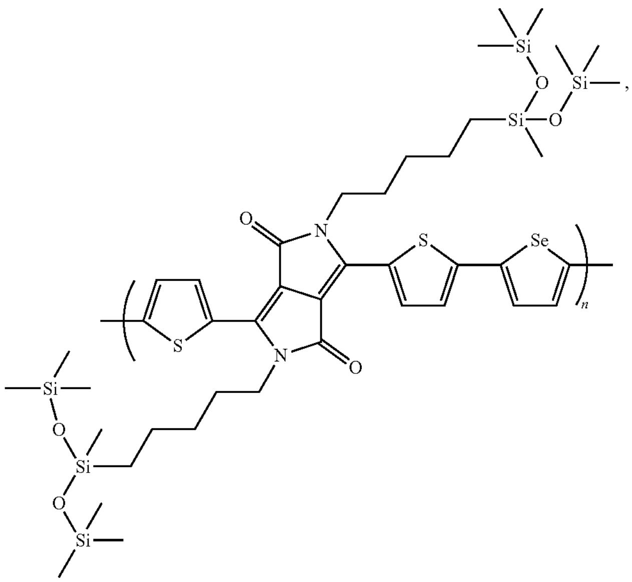
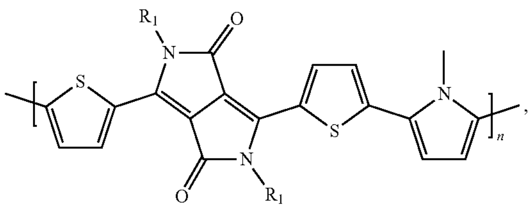
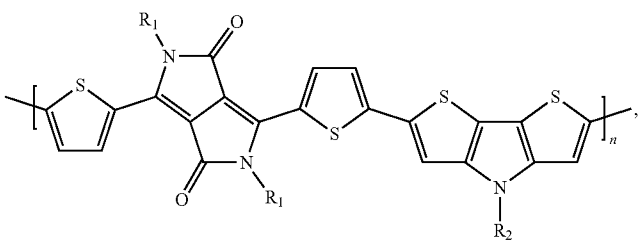
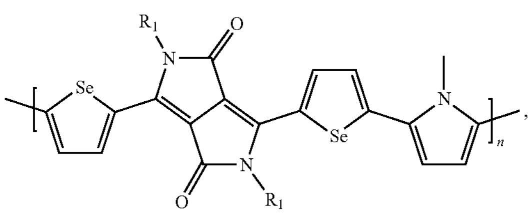
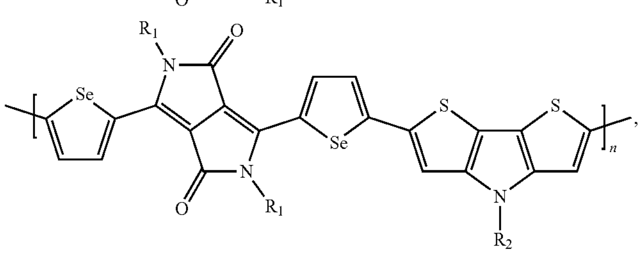
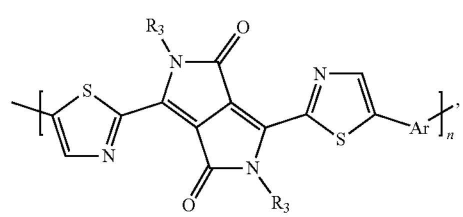
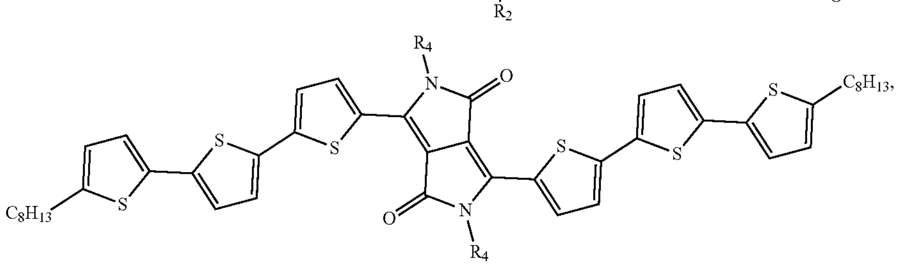

-continued
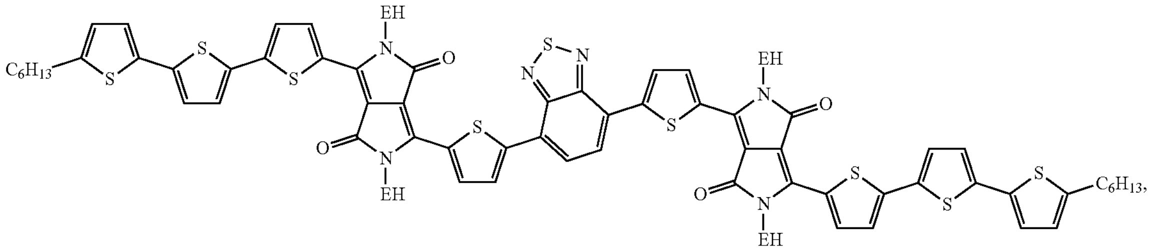
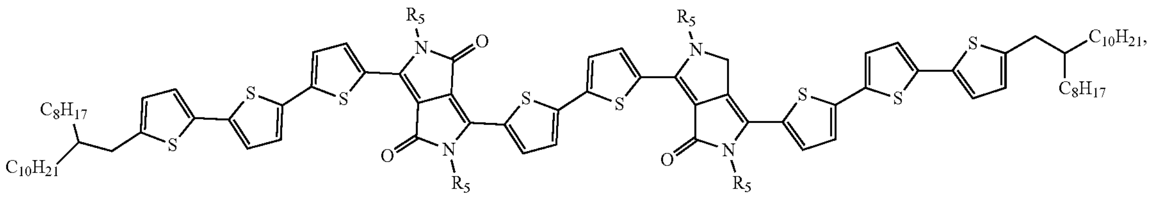
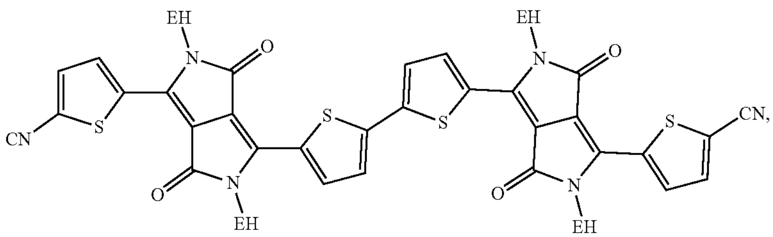
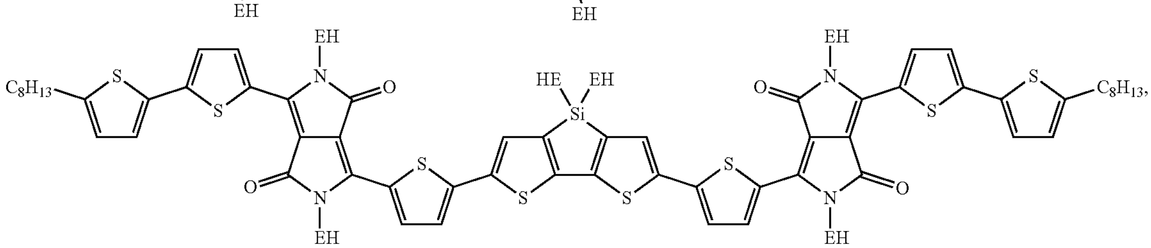
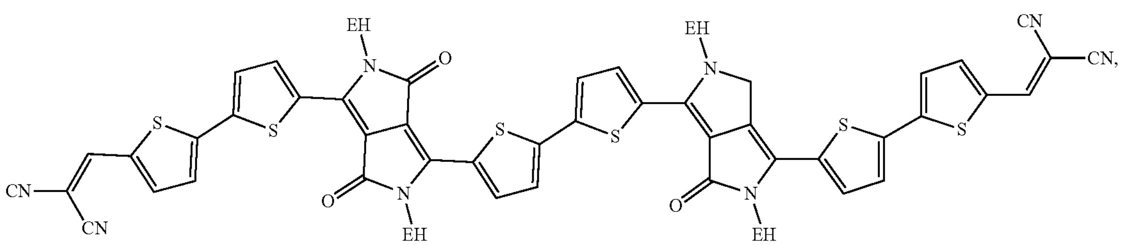
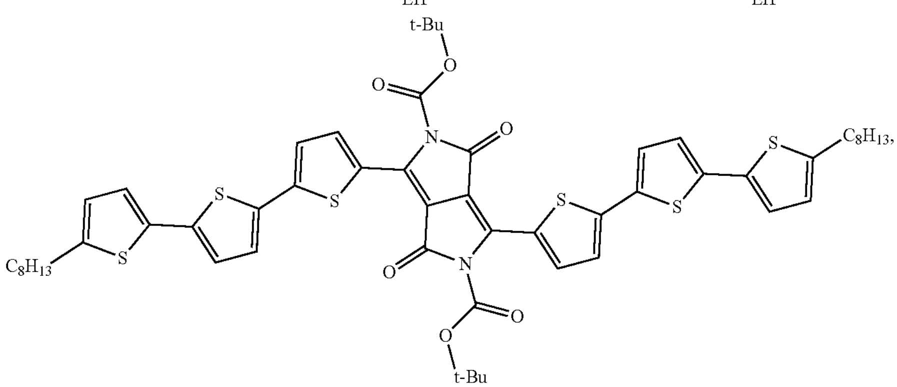
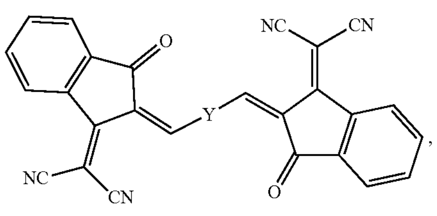

-continued
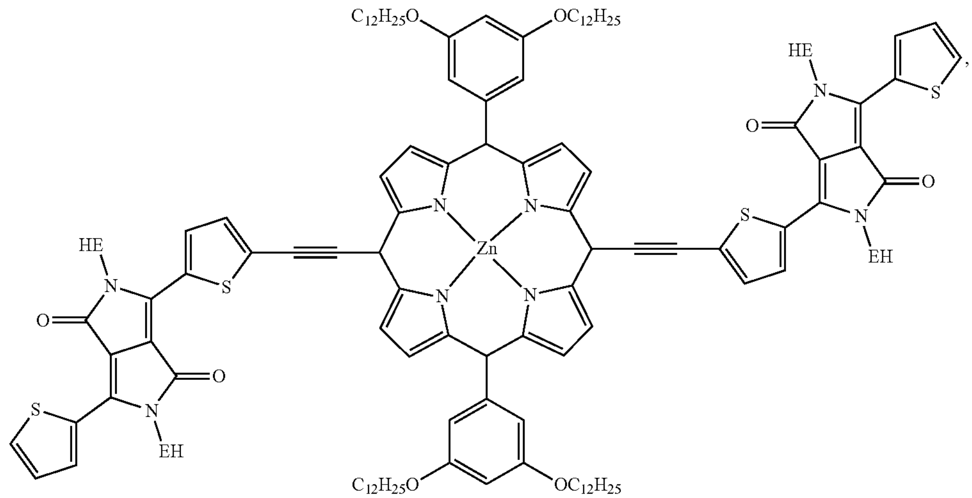
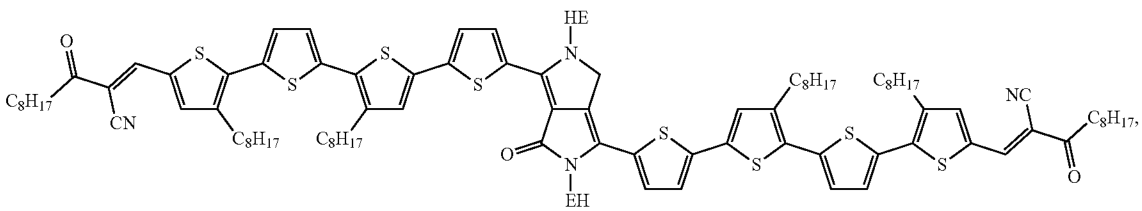
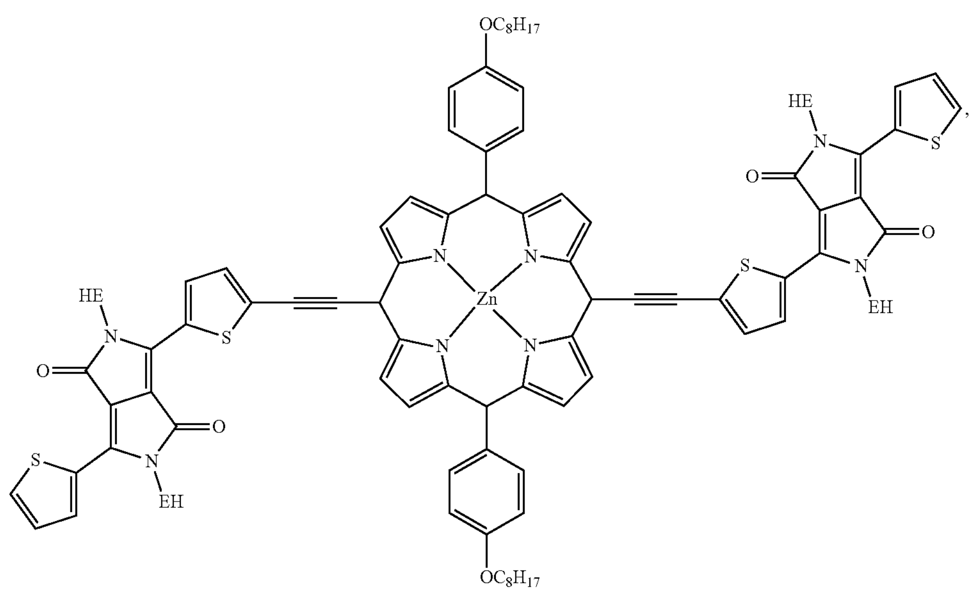
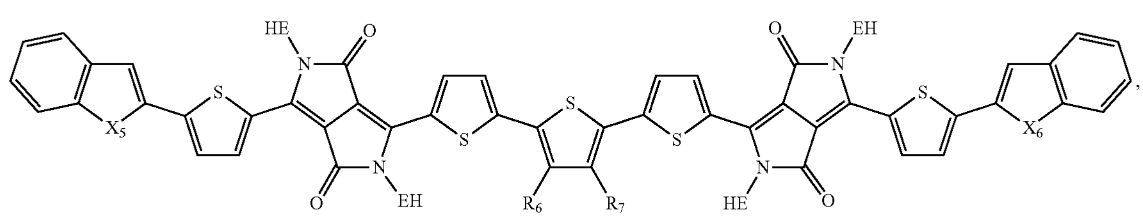

-continued
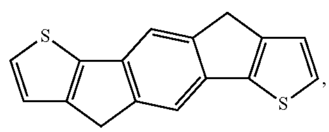
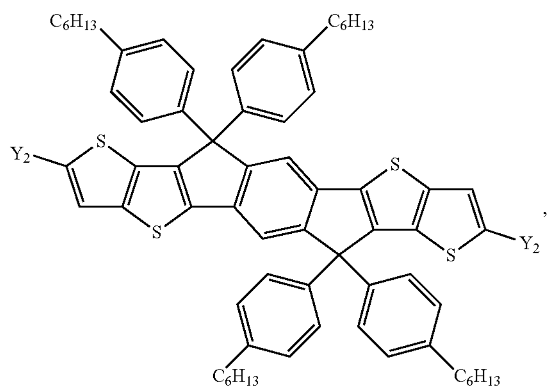
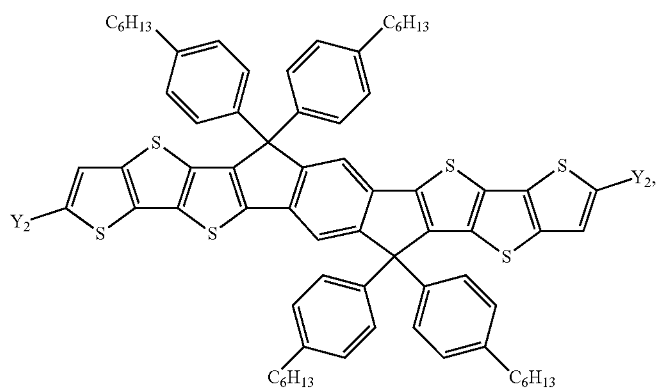
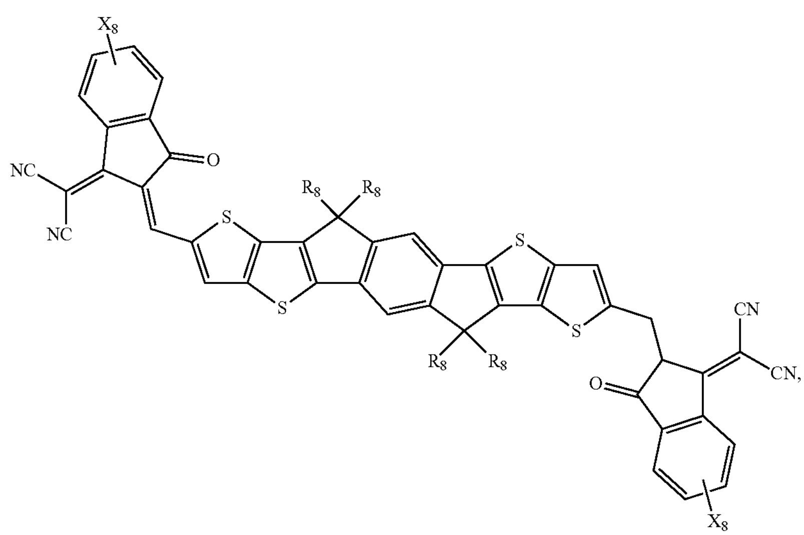

-continued
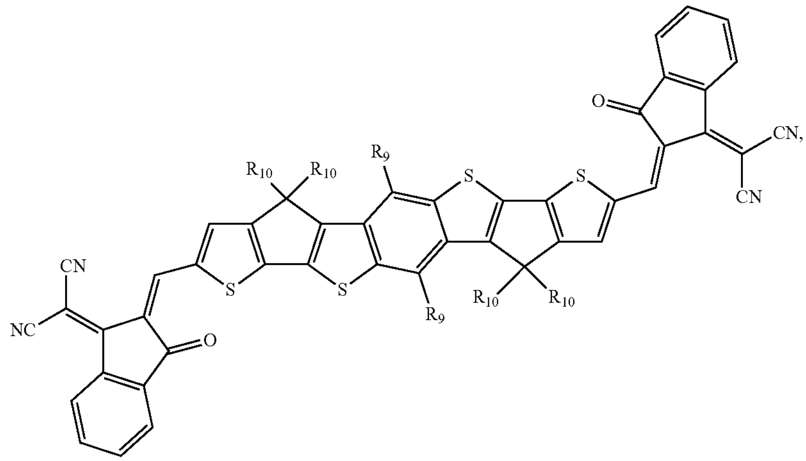
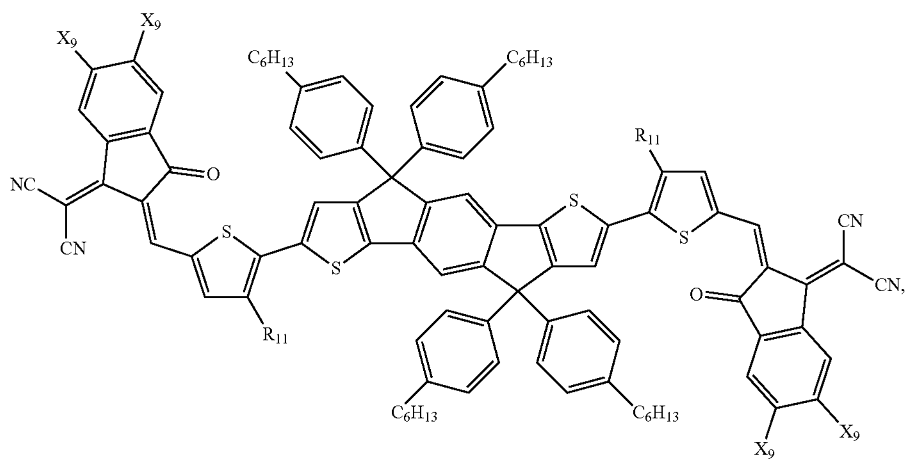
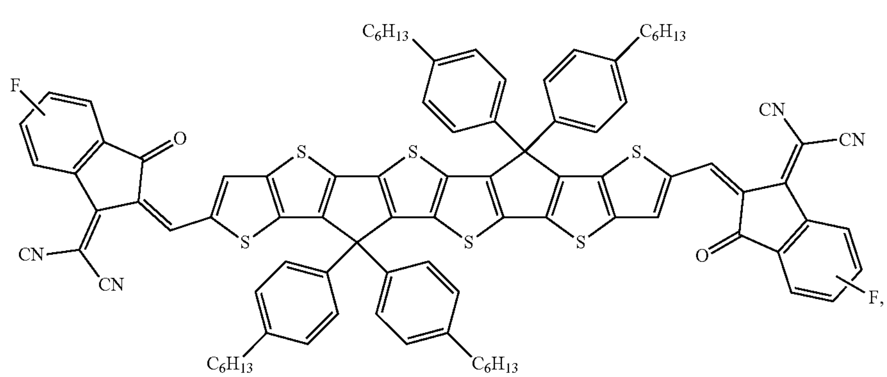

-continued
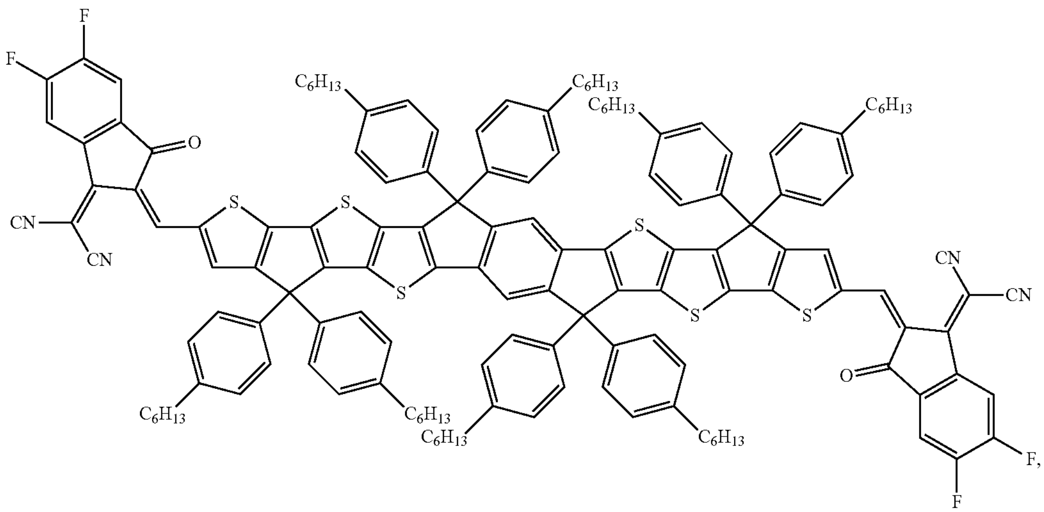
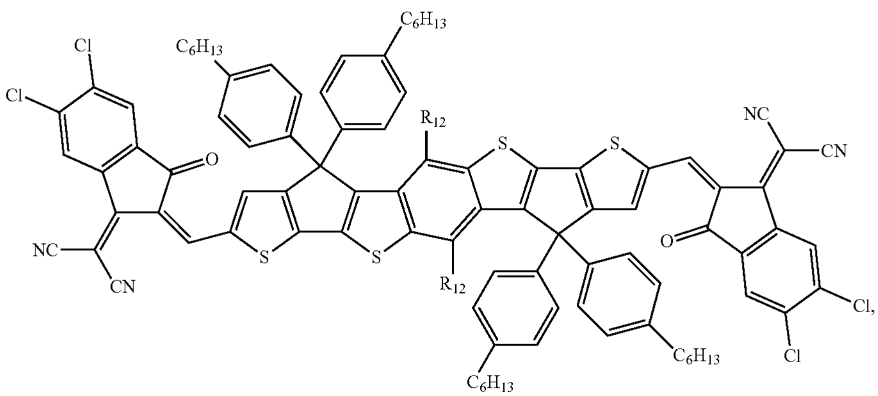
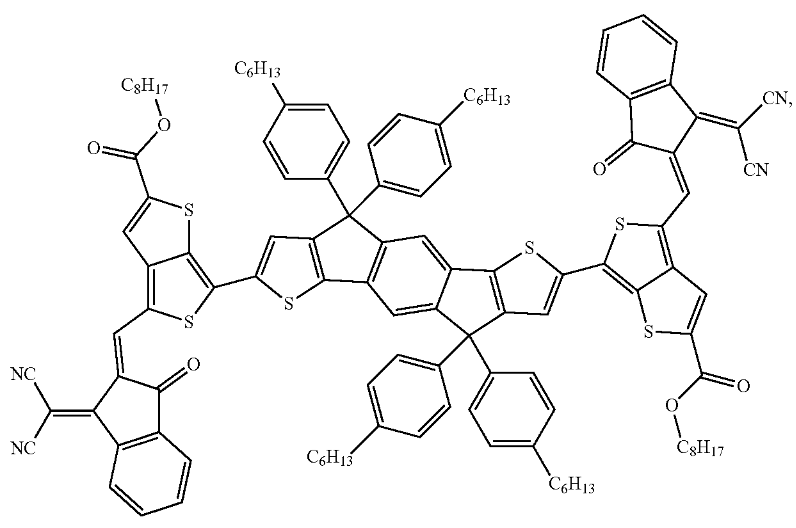

-continued
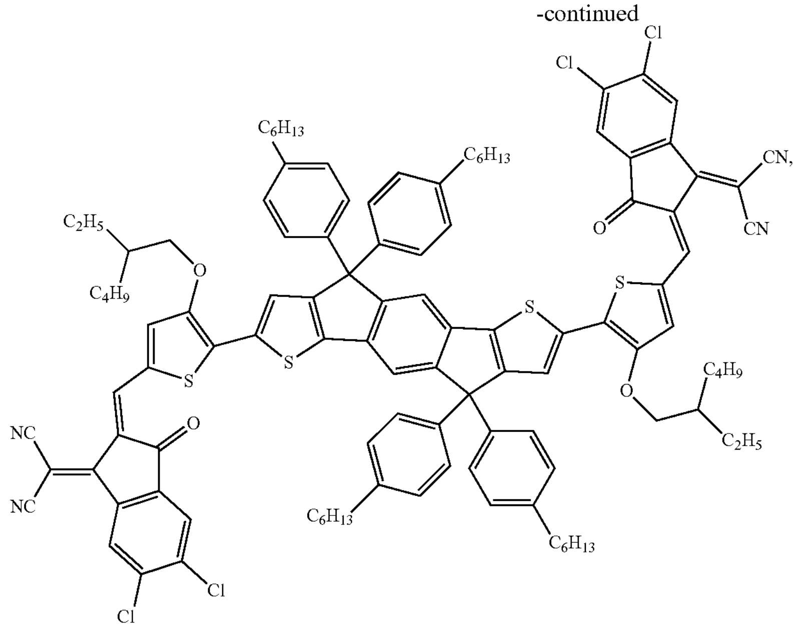
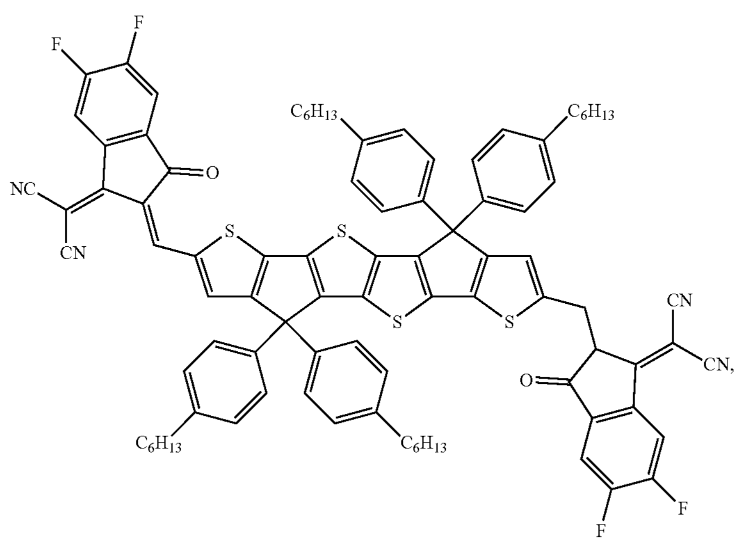
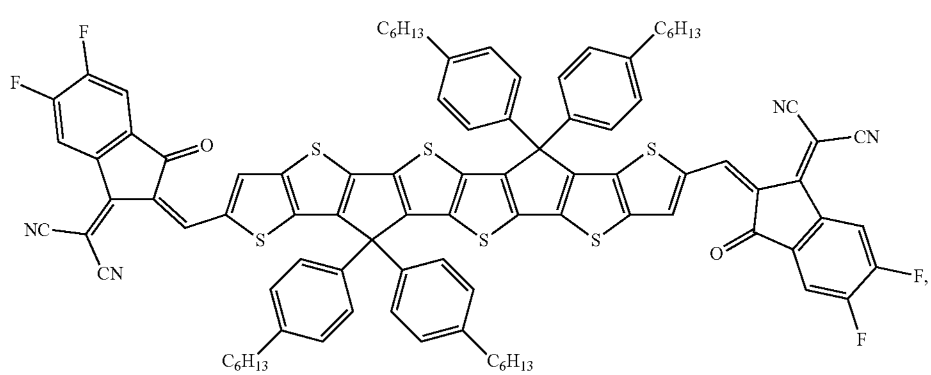

-continued
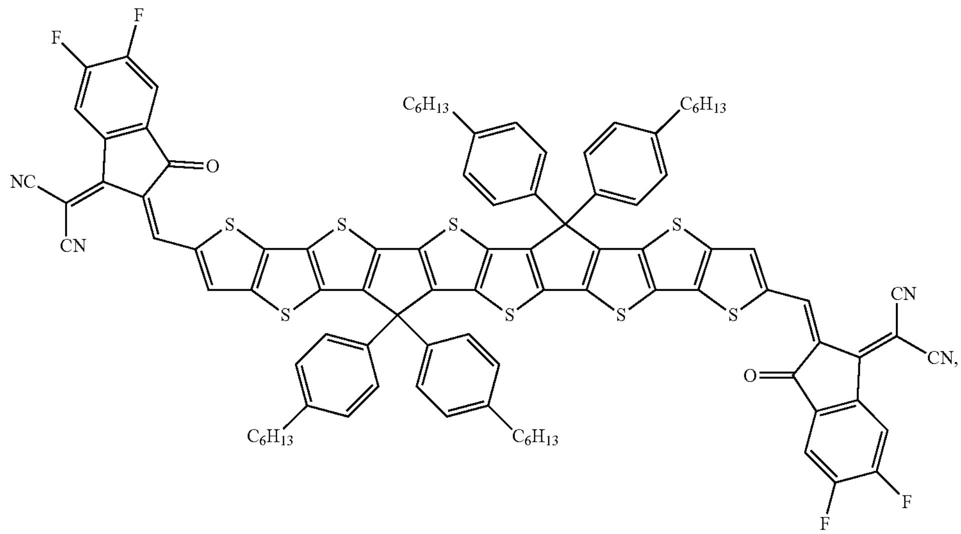
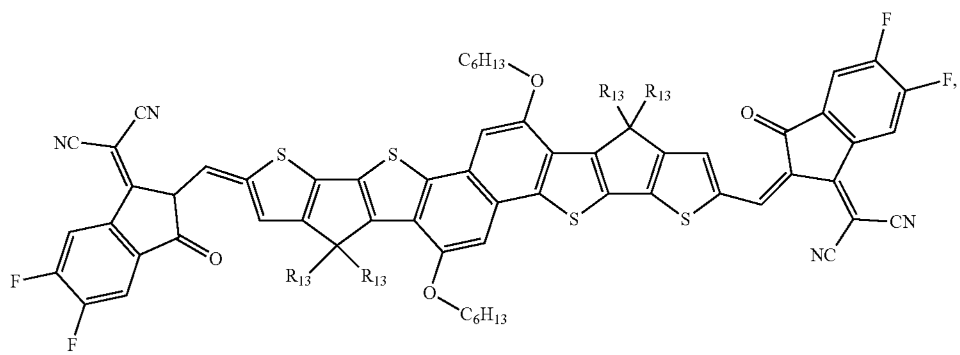
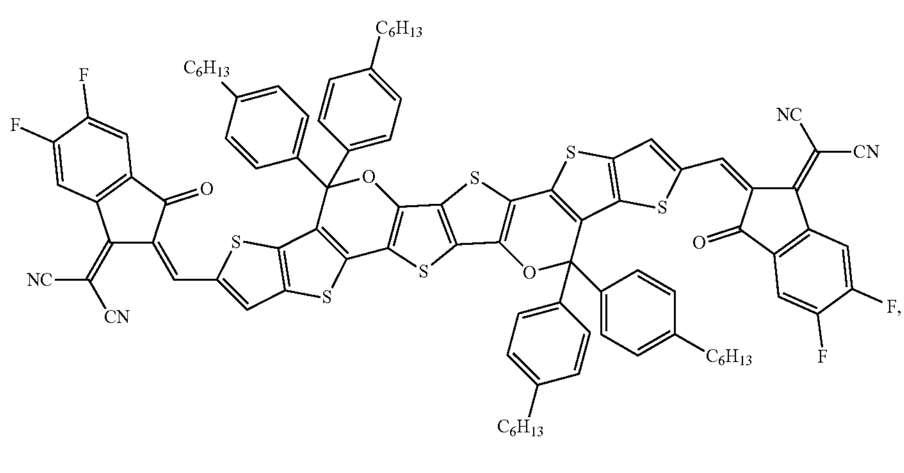

-continued
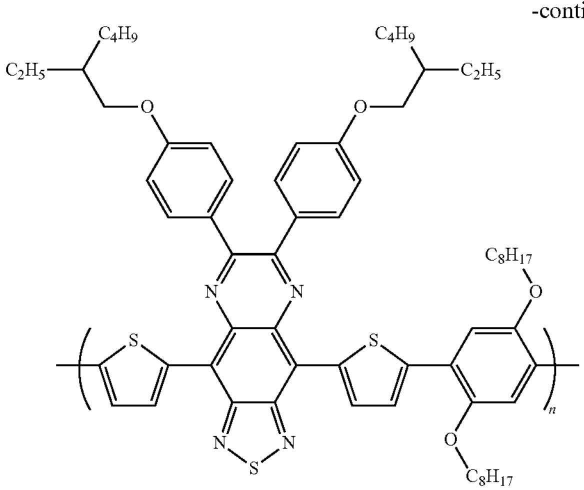
,
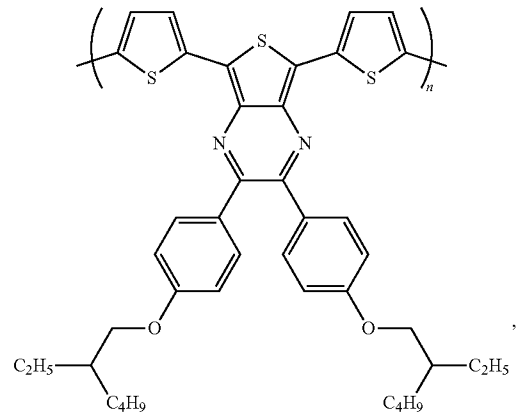
,
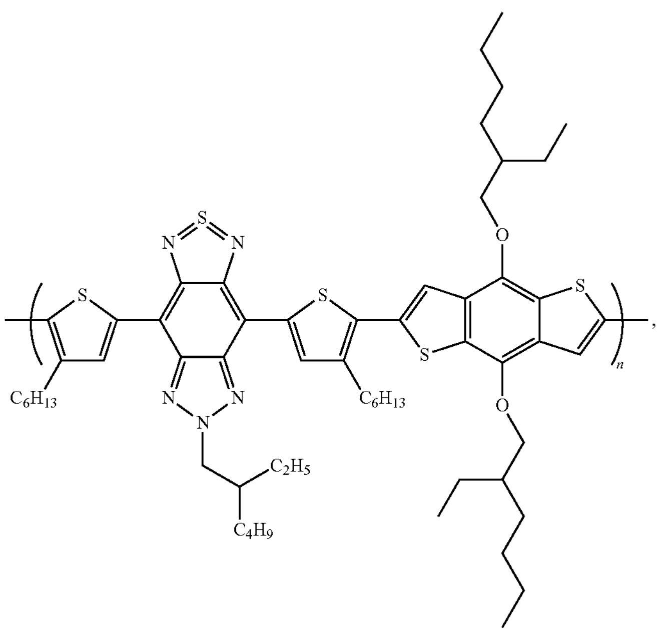
,
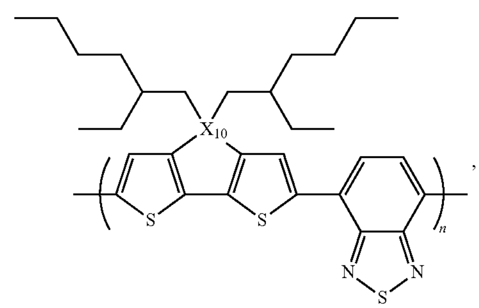
,
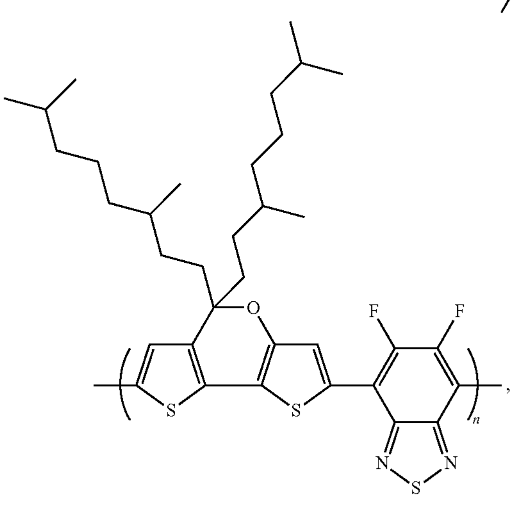
,
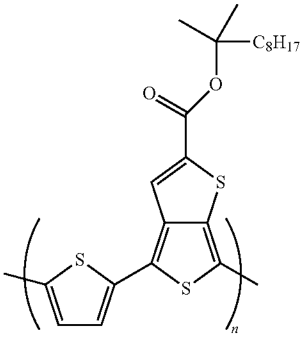
, -continued
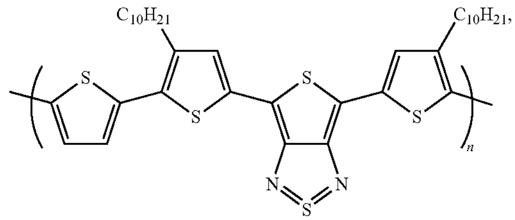
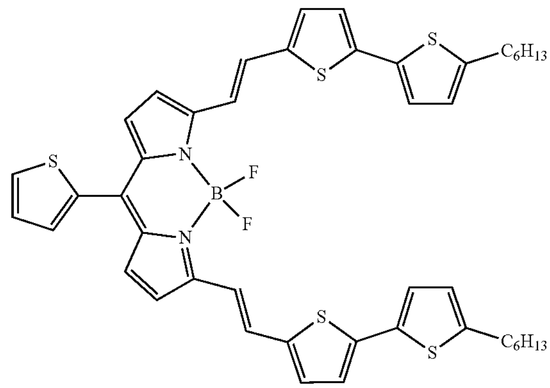
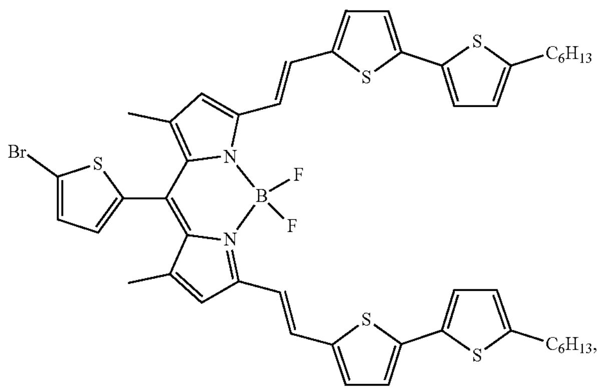
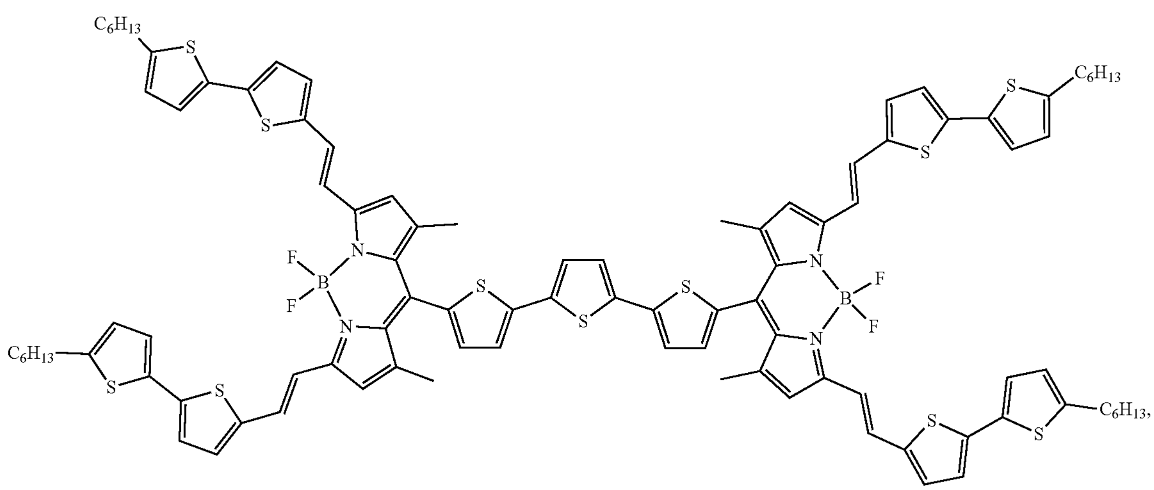
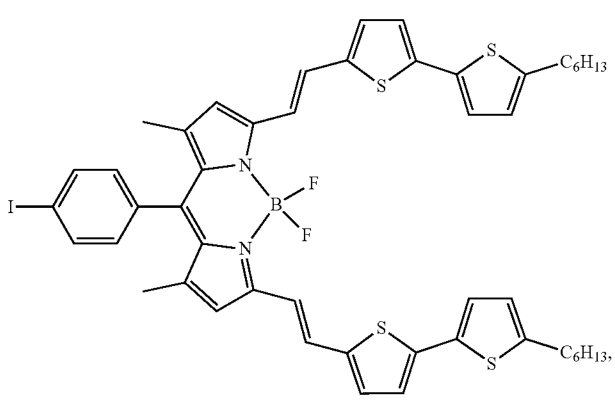

-continued

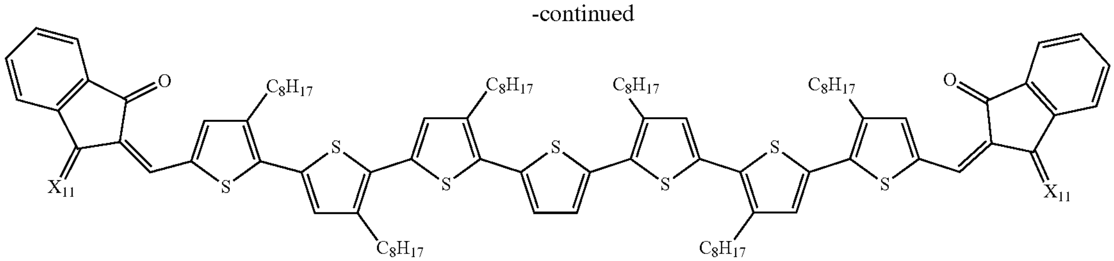

,

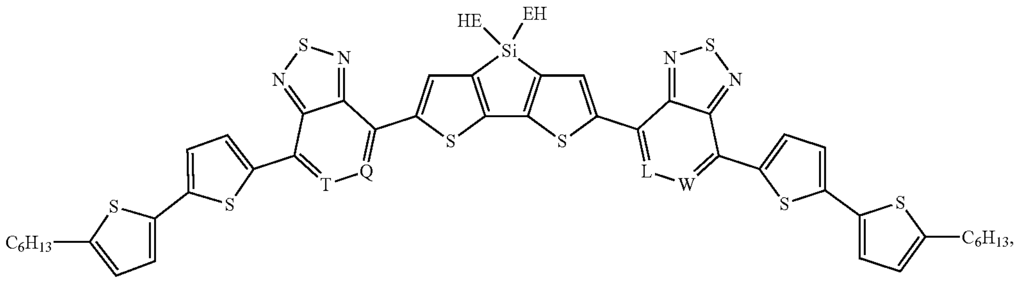

,

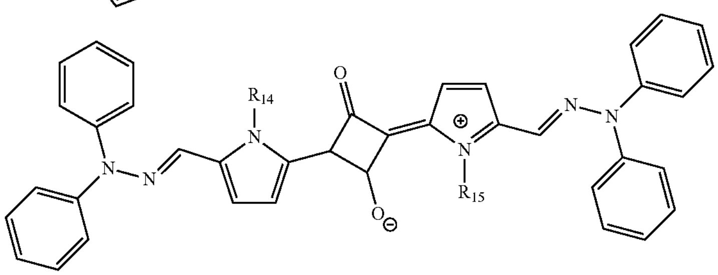

,

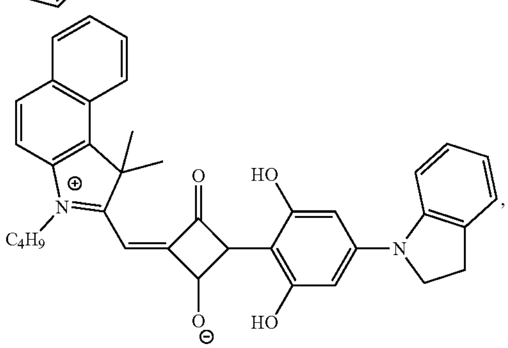

, and

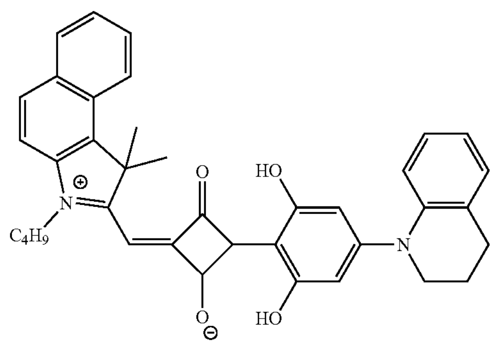

;

wherein:

$X_1$ is H or $CH_3$;

$X_2$ is S or Se;

$X_3$ is H or F;

$X_4$ is Se or Te;

$R_1$ is 2-hexyldecyl;

$R_2$ is 2-ethylhexyl;

$R_3$ is selected from the group consisting of 2-ethylhexyl, 2-butyloctyl, 2-hexyldecyl, and 2-decyltetradecyl;

Ar is selected from the group consisting of

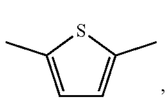

,

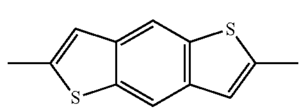

,

-continued

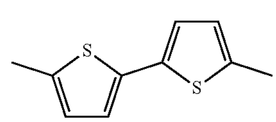

,

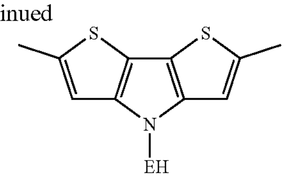

wherein EH is 2-ethylhexyl;

$R_4$ is $C_6H_{13}$ or $C_{12}H_{25}$;

$R_5$ is H or

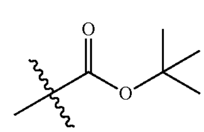 [SMILES: *C(=O)OC(C)(C)C]

$R_6$ and $R_7$ are each independently H or $CH_3$;

$X_5$ and $X_6$ are each independently O or S;

EH is 2-ethylhexyl;
Y is selected from the group consisting of
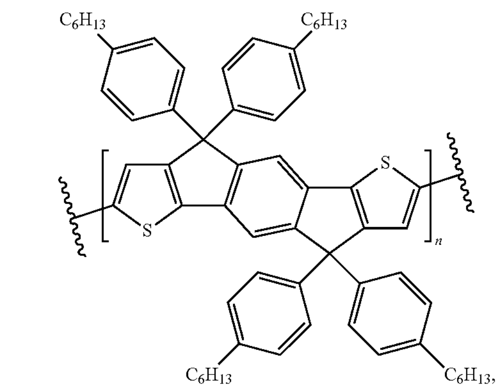
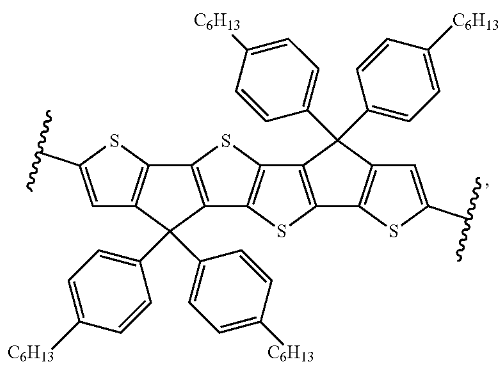
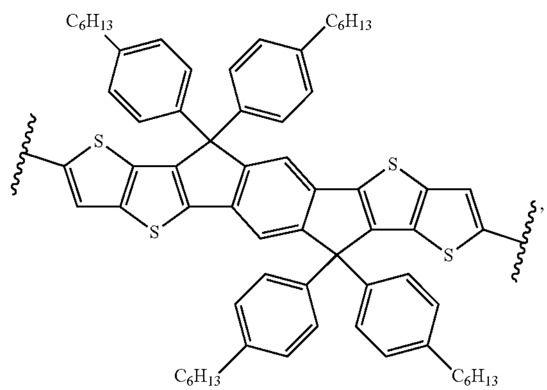
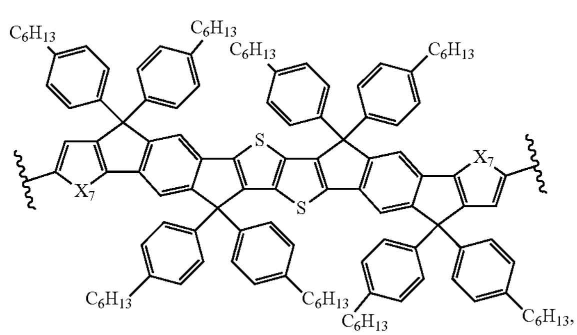
-continued
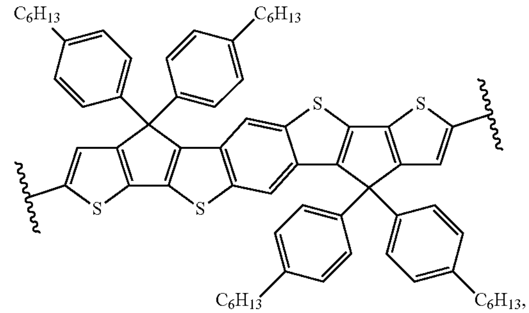
and
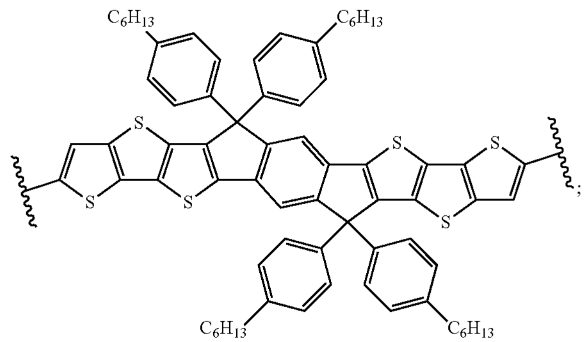
$X_7$ is S or Se;
$Y_2$ is selected from the group consisting of
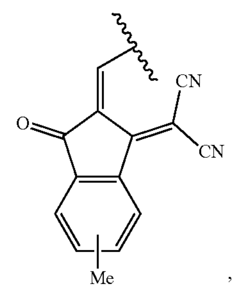
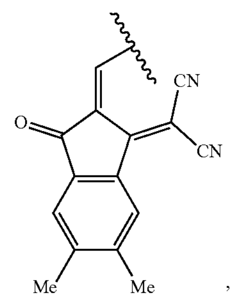
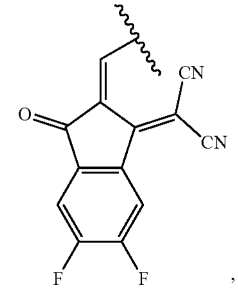
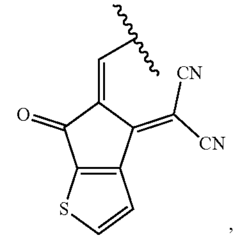
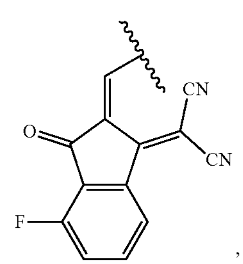
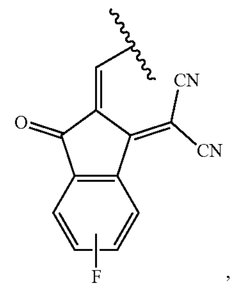
and -continued

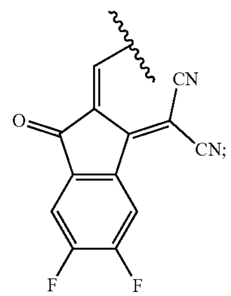

$X_8$ is H or F;

$R_8$ is or

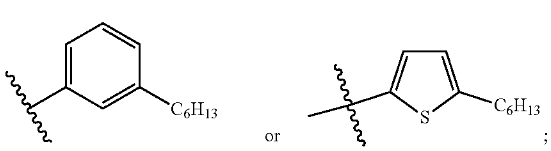

$R_9$ is

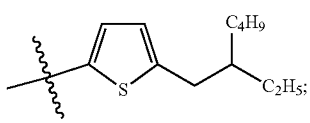

$R_{10}$ is

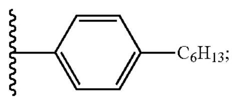

$X_9$ is H or F;

$R_{11}$ is

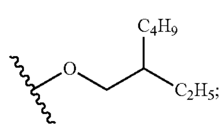

$R_{12}$ is 2-ethylhexyl;

$R_{13}$ is

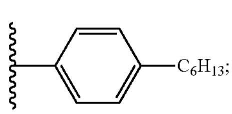

$X_{10}$ is selected from the group consisting of C, Si, and Ge;

$X_{11}$ is O or

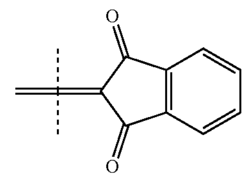

Q, L, T, and W are each independently CH or N;

$R_{14}$ and $R_{15}$ are each independently 2-ethylhexyl or n-dodecyl; and n is an integer between 1 and 10,000.

67. The stacked bulk heterojunction perovskite solar cell of embodiment 63, wherein said perovskite material is a perovskite having a structure of $ABX_3$, wherein A comprises a cation selected from the group consisting of FA, MA, Cs, Rb, and a combination thereof; B comprises a divalent metal selected from the group consisting of Pb, Sn, Ge, and a combination thereof; and X is one or more halides selected from the group consisting of I, Br, and Cl.

The following examples are offered by way of illustration and not by way of limitation.

EXAMPLES

Example 1: Structure I (1)

FIG. 2A-FIG. 2D show the photocurrent-voltage characteristics of a device employing the structure of ITO/PTAA/$MAPbI_3$/FOIC/C60/BCP/Cu (the device structure is shown in FIG. 2A and the FOIC chemical structure is shown in FIG. 2B). The photovoltaic performance parameters were determined to be $V_{OC}$ of 1.13 V, $J_{SC}$ of 23.8 mA $cm^{-2}$, FF of 0.799, and PCE of 21.5%, as shown in FIG. 2C. In comparison, devices employing PCBM ETL, which cannot absorb NIR light, exhibited relatively low PCEs of about 17-18% with a $J_{SC}$ of about 22 mA $cm^{-2}$. The EQE of the $MAPbI_3$/FOIC based-device exhibited a NIR EQE extended to about 925 nm (FIG. 2D).

Example 2: Structure I (2)

FIG. 3A-FIG. 3D show the photocurrent-voltage characteristics of the device structure, ITO/PTAA/$FA_{0.81}MA_{0.14}Cs_{0.05}PbI_{2.55}Br_{0.45}$/F8IC/C60/BCP/Cu (device structure is shown in FIG. 3A and F8IC chemical structure is shown in FIG. 3B). The photovoltaic performance parameters were determined to be $V_{OC}$ of 1.12 V, $J_{SC}$ of 24.3 mA $cm^{-2}$, FF of 0.793, and PCE of 21.53%, as shown in FIG. 3C. The EQE of the $FA_{0.81}MA_{0.14}Cs_{0.05}PbI_{2.55}Br_{0.45}$/F8IC based-device demonstrated a NIR EQE extended to about 960 nm (FIG. 3D).

Example 3: Structure II

FIG. 5A-FIG. 5D show the photocurrent-voltage characteristics of the device structure, FTO/c-$TiO_2$/m-$TiO_2$/IEICO-4F/OIHP/Spiro-OMeTAD/Ag (device structure is shown in FIG. 5A and IEICO-4F chemical structure is shown in FIG. 5B). The photovoltaic performance parameters were determined to be $V_{OC}$ of 1.07 V, $J_{SC}$ of 18.3 mA $cm^{-2}$, FF of 0.692, and PCE of 13.7%, as shown in FIG. 5C. The device EQE extended to about 950 nm (FIG. 5D).

Example 4: Structure III (1)

Figure 7C:
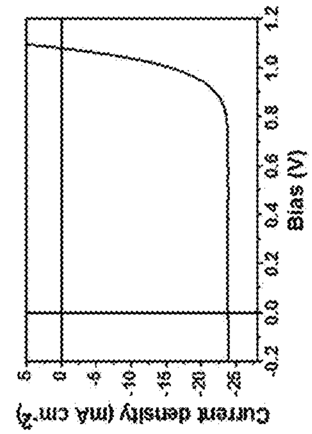
FIG. 7C shows a typical J-V curve of the ITO/PTAA/$(FA_{0.85}MA_{0.15})_{0.95}Cs_{0.05}Pb(I_{0.85}Br_{0.15})_3$/PDPPTDTPT: PDPP4T: $PC_{71}BM$/LiF/Cu device structure as depicted in FIG. 7A.
Figure 7C:
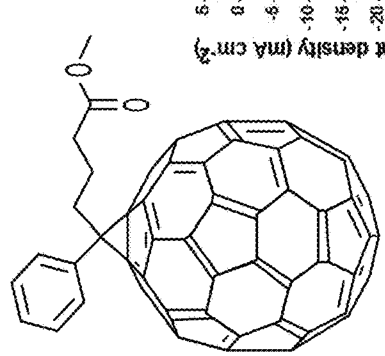
Figure 7B:
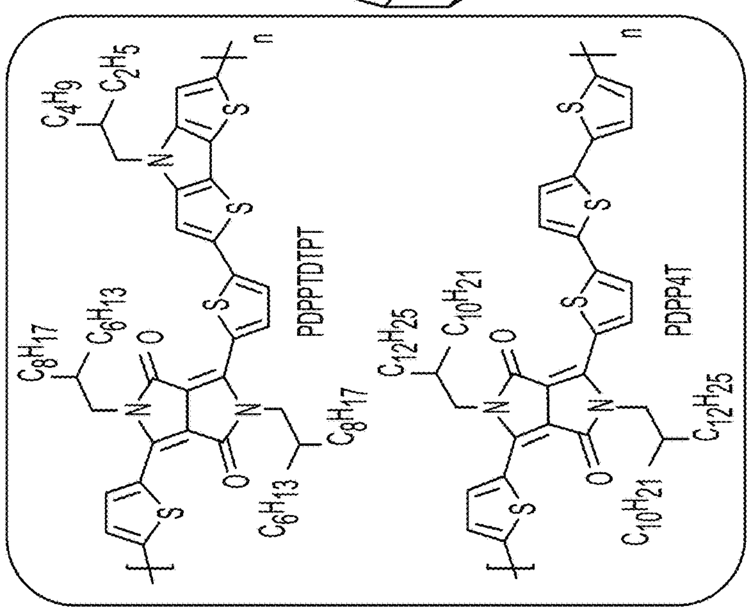
FIG. 7B shows the chemical structures of PDPPTDTPT, PDPP4T, and $PC_{71}BM$.
Figure 7A:
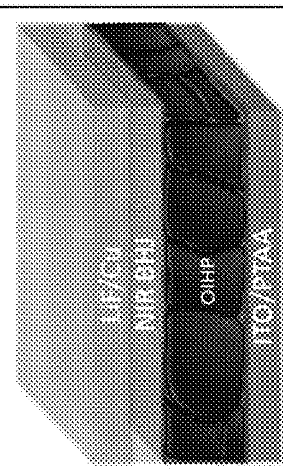
FIG. 7A shows the device structure of ITO/PTAA/$(FA_{0.85}MA_{0.15})_{0.95}Cs_{0.05}Pb(I_{0.85}Br_{0.15})_3$/PDPPTDTPT: PDPP4T: $PC_{71}BM$/LiF/Cu.

FIG. 7A-FIG. C show the photocurrent-voltage characteristics of the device structure, ITO/PTAA/$(FA_{0.85}MA_{0.15})_{0.95}Cs_{0.05}Pb(I_{0.85}Br_{0.15})_3$/PDPPTDTPT: PDPP4T: $PC_{71}BM$ (1:2:4, weight ratio)/LiF/Cu (device structure is shown in FIG. 7A and the chemical structures of PDPPTDTPT, PDPP4T and $PC_{71}BM$ are shown in FIG. 7B). The photovoltaic performance parameters were determined to be $V_{OC}$ of 1.10 V, $J_{SC}$ of 23.9 mA $cm^{-2}$, FF of 0.773, and PCE of 20.3%, as shown in FIG. 7C.

Example 5: Structure III (2)

Figure 8C:
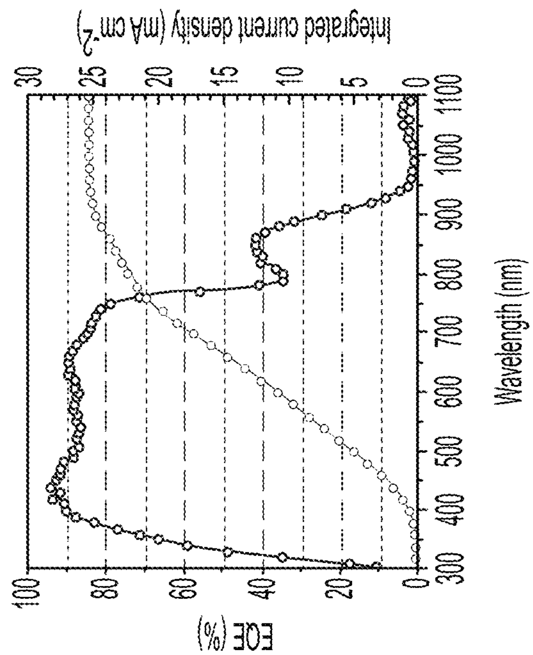
FIG. 8C shows the EQE of the ITO/$SnO_2$/$(FA_{0.85}MA_{0.15})_{0.95}Cs_{0.05}Pb(I_{0.85}Br_{0.15})_3$/PTB7-Th:IEICO-4F/$MoO_3$/Ag device structure as depicted in FIG. 8A.
Figure 8B:
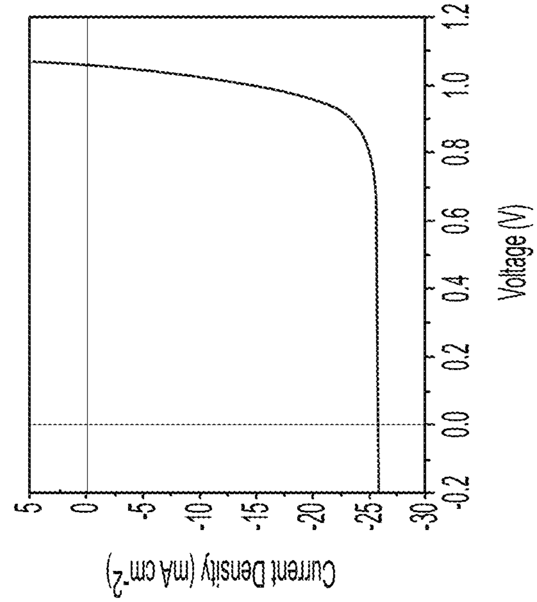
FIG. 8B shows a typical J-V curve of the ITO/$SnO_2$/$(FA_{0.85}MA_{0.15})_{0.95}Cs_{0.05}Pb(I_{0.85}Br_{0.15})_3$/PTB7-Th:IEICO-4F/$MoO_3$/Ag device structure as depicted in FIG. 8A.
Figure 8A:
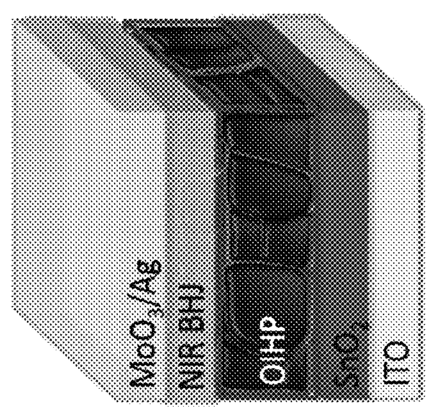
FIG. 8A shows the device structure of ITO/$SnO_2$/$(FA_{0.85}MA_{0.15})_{0.95}Cs_{0.05}Pb(I_{0.85}Br_{0.15})_3$/PTB7-Th:IEICO-4F/$MoO_3$/Ag. OIHP is the organic-inorganic halide perovskite, which is $(FA_{0.85}MA_{0.15})_{0.95}Cs_{0.05}Pb(I_{0.85}Br_{0.15})_3$.

FIG. 8A presents an example OIHP/BHJ integrated device with a structure of ITO/$SnO_2$/$(FA_{0.85}MA_{0.15})_{0.95}Cs_{0.05}Pb(I_{0.85}Br_{0.15})_3$/PTB7-Th:IEICO-4F (1:1.5, weight ratio)/$MoO_3$/Ag. The photovoltaic performance parameters were determined to be the following: PCE of 20.8%; $V_{oc}$ of 1.06 V; $J_{SC}$ of 25.62 mA $cm^{-2}$; and FF of 0.765 (FIG. 8B). The EQE spectrum (FIG. 8C) shows that the BHJ layer can contribute an additional current density of ~3 mA $cm^{-2}$ in the infrared wavelength range.

REFERENCES

The references listed below as well as all references cited in the specification are incorporated herein by reference to the extent that they supplement, explain, provide a background for or teach methodology, techniques and/or compositions employed herein. All cited patents and publications referred to in this application are herein expressly incorporated by reference.

1 Jeon, N. J. et al. A fluorene-terminated hole-transporting material for highly efficient and stable perovskite solar cells. *Nat. Energy* 3, 682-689 (2018).

2 Noel, N. K. et al. Lead-free organic-inorganic tin halide perovskites for photovoltaic applications. *Energy Environ. Sci.* 7, 3061-3068 (2014).

3 Hao, F., Stoumpos, C. C., Cao, D. H., Chang, R. P. H. & Kanatzidis, M. G. Lead-free solid-state organic-inorganic halide perovskite solar cells. *Nat Photon* 8, 489-494 (2014).

4 Liu, Y. et al. Integrated Perovskite/Bulk-Heterojunction toward Efficient Solar Cells. *Nano Lett.* 15, 662-668 (2015).

5 Dong, S. et al. Unraveling the High Open Circuit Voltage and High Performance of Integrated Perovskite/Organic Bulk-Heterojunction Solar Cells. *Nano Lett.* 17, 5140-5147 (2017).

6 Wu, G. et al. Perovskite/Organic Bulk-Heterojunction Integrated Ultrasensitive Broadband Photodetectors with High Near-Infrared External Quantum Efficiency over 70%. Small 14, 1802349 (2018).

7 Xu, G. et al. Integrating Ultrathin Bulk-Heterojunction Organic Semiconductor Intermediary for High-Performance Low-Bandgap Perovskite Solar Cells with Low Energy Loss. Adv. Funct. Mater. 28, 1804427 (2018).

Efforts have been made to ensure accuracy with respect to numbers used (e.g., amounts, temperature, etc.) but some experimental errors and deviations should be accounted for. One skilled in the art will recognize many methods and materials similar or equivalent to those described herein, which could be used in the practicing the subject matter described herein. The present disclosure is in no way limited to just the methods and materials described.

Unless defined otherwise, technical and scientific terms used herein have the same meaning as commonly understood by one of ordinary skill in the art to which this subject matter belongs, and are consistent with: Singleton et al (1994) Dictionary of Microbiology and Molecular Biology, 2nd Ed., J. Wiley & Sons, New York, NY; and Janeway, C., Travers, P., Walport, M., Shlomchik (2001) Immunobiology, 5th Ed., Garland Publishing, New York.

Throughout this specification and the claims, the words "comprise," "comprises," and "comprising" are used in a non-exclusive sense, except where the context requires otherwise. It is understood that embodiments described herein include "consisting of" and/or "consisting essentially of" embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A planar heterojunction perovskite solar cell, comprising:

a first electrode;

a first transport layer disposed on said first electrode;

a perovskite material layer disposed on said first transport layer;

a second transport layer disposed on said perovskite material layer;

and a second electrode disposed on said second transport layer, wherein one of said first or second transport layers is a hole transport layer and the other one of said first or second transport layers is an electron transport layer, and wherein at least one of said hole transport layer or said electron transport layer comprises a single near infrared sensitive semiconductor material, wherein said single near infrared sensitive semiconductor material is

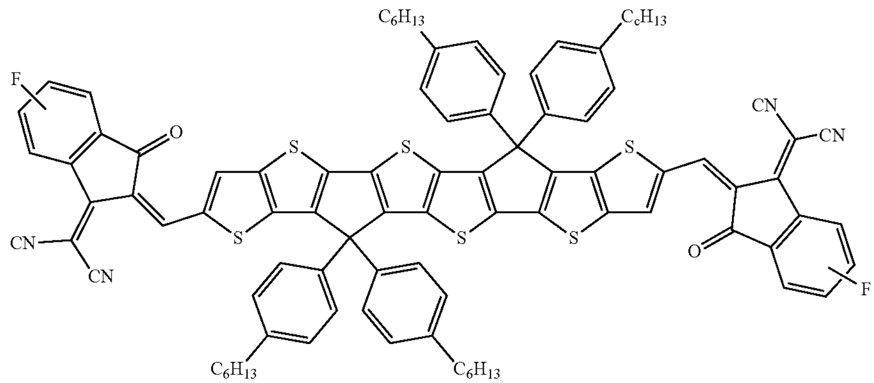

or

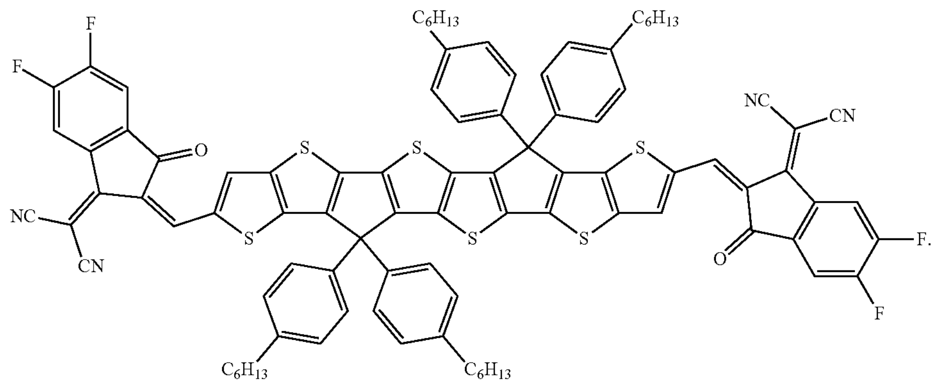

2. The planar heterojunction perovskite solar cell of claim 1, wherein said first transport layer is said hole transport layer and said second transport layer is said electron transport layer, wherein said electron transport layer comprises said single near infrared sensitive semiconductor material.

3. A single heterojunction perovskite solar cell, comprising:

a first electrode;

a first transport layer disposed on said first electrode;

a perovskite material layer disposed on said first transport layer;

a second transport layer disposed on said perovskite material layer;

and a second electrode disposed on said second transport layer, wherein one of said first or second transport layers is a hole transport layer and the other one of said first or second transport layers is an electron transport layer;

wherein at least one of said hole transport layer or said electron transport layer comprises a single near infrared sensitive semiconductor material, wherein said single near infrared sensitive semiconductor material is

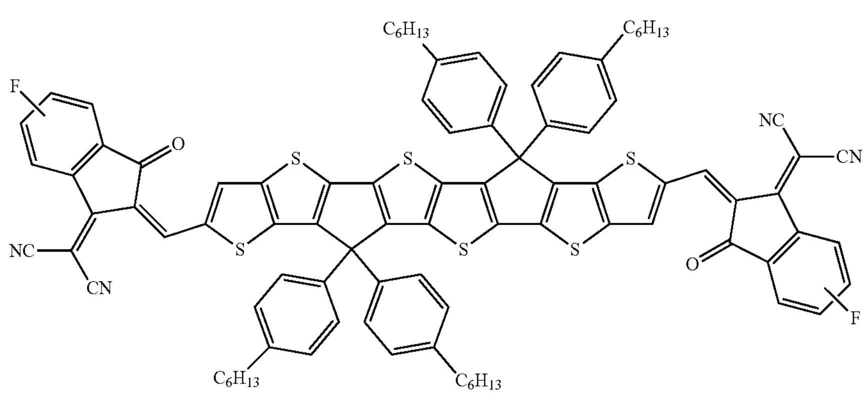

or

-continued

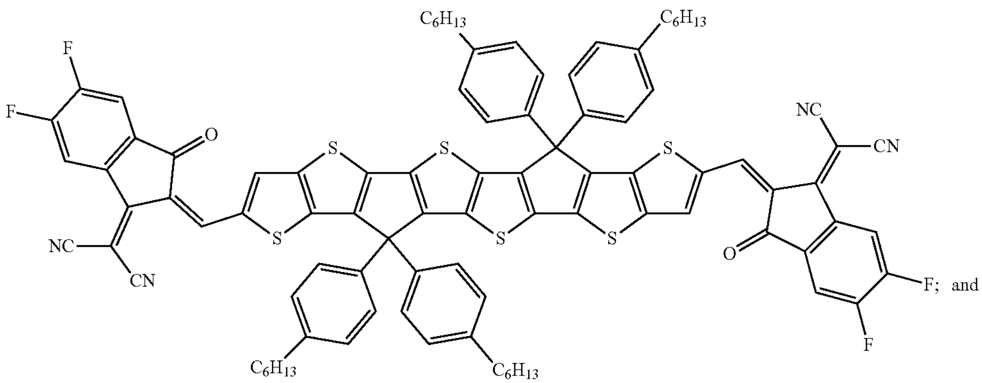

wherein at least one of said hole transport layer or said electron transport layer further comprises a mesoporous material.

4. The single heterojunction perovskite solar cell of claim 3, wherein said electron transport layer further comprises a mesoporous material selected from the group consisting of mesoporous $TiO_2$, mesoporous $SnO_2$, and mesoporous $ZrO_2$.

5. The single heterojunction perovskite solar cell of claim 3, wherein said hole transport layer further comprises a mesoporous material selected from the group consisting of mesoporous NiO, mesoporous $MoO_3$, and mesoporous $V_2O_5$.

6. The single heterojunction perovskite solar cell of claim 3, wherein said first transport layer is said electron transport layer and said second transport layer is said hole transport layer, wherein said electron transport layer comprises said single near infrared sensitive semiconductor material.

7. The single heterojunction perovskite solar cell of claim 6, wherein said electron transport layer further comprises said mesoporous material.

8. A stacked bulk heterojunction perovskite solar cell, comprising:

a first electrode;

a transport layer disposed on said first electrode;

a perovskite material layer disposed on said transport layer;

a bulk heterojunction layer disposed on said perovskite material layer; and a second electrode disposed on said bulk heterojunction layer, wherein said bulk heterojunction layer comprises one or more electron donors and one or more electron acceptors, and wherein at least one of said one or more electron donors and/or at least one of said one or more electron acceptors is a diketopyrrole (DPP) near infrared sensitive polymer or compound has having one or more of the following structures:

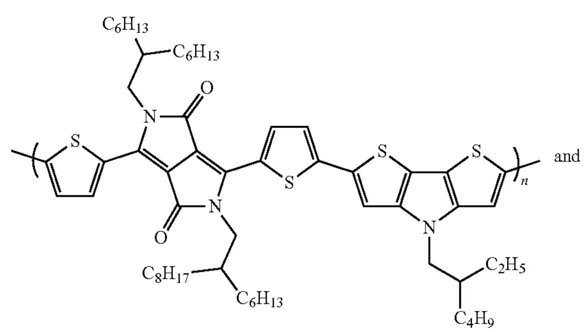

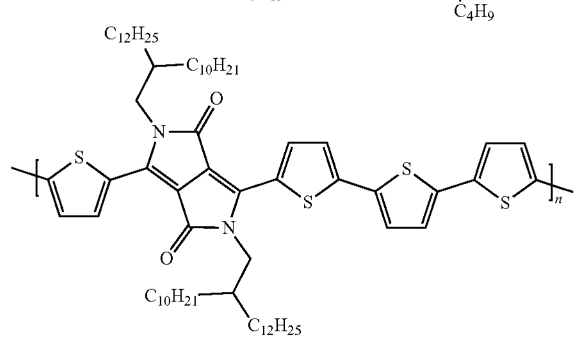

9. A stacked bulk heterojunction perovskite solar cell, comprising:

a first electrode;

a first bulk heterojunction layer provided on said first electrode;

a perovskite material layer provided on said first bulk heterojunction layer;

a second bulk heterojunction layer provided on said perovskite material layer;

and a second electrode provided on said second bulk heterojunction layer, wherein said first bulk heterojunction layer and said second bulk heterojunction layer comprise one or more electron donors and one or more electron acceptors, and wherein said one or more electron donors and said one or more electron acceptors is a single near infrared sensitive semiconductor material, wherein said single near infrared sensitive semiconductor material is

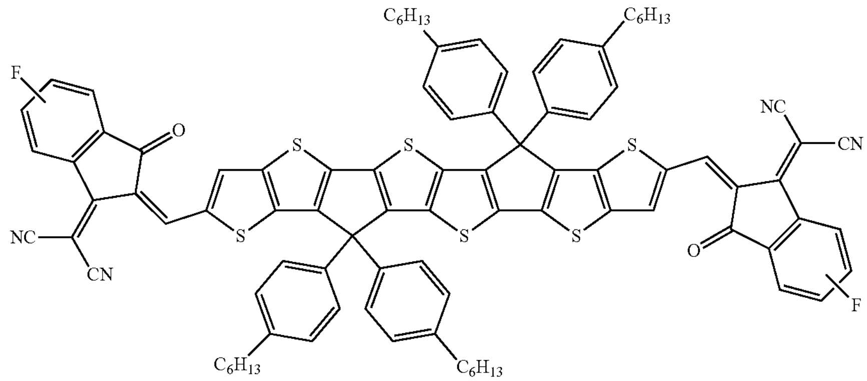
or
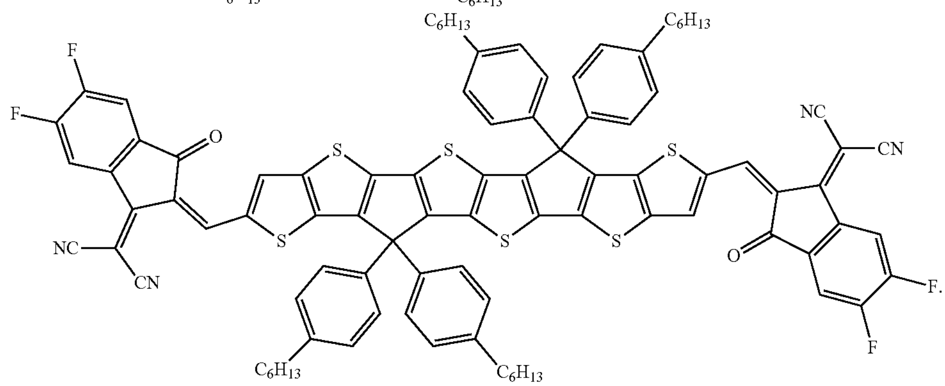
* * * * *